United States Patent
Kondo et al.

(10) Patent No.: US 7,289,671 B2
(45) Date of Patent: Oct. 30, 2007

(54) DATA PROCESSING APPARATUS AND METHOD AND RECORDING MEDIUM

(75) Inventors: Tetsujiro Kondo, Tokyo (JP);
Toshihiko Hamamatsu, Saitama (JP);
Hideo Nakaya, Kanagawa (JP);
Takeharu Nishikata, Chiba (JP);
Hideki Ohtsuka, Kanagawa (JP);
Takeshi Kunihiro, Chiba (JP);
Takafumi Morifuji, Tokyo (JP);
Masashi Uchida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/584,789

(22) Filed: Oct. 20, 2006

(65) Prior Publication Data

US 2007/0058873 A1  Mar. 15, 2007

Related U.S. Application Data

(62) Division of application No. 10/030,591, filed as application No. PCT/JP01/03873 on May 9, 2001, now Pat. No. 7,035,471.

(30) Foreign Application Priority Data

May 9, 2000   (JP)   ............................. 2000-135356
May 9, 2000   (JP)   ............................. 2000-135357

(51) Int. Cl.
*G06K 9/36*   (2006.01)
*G06K 9/62*   (2006.01)
*G06K 9/46*   (2006.01)

(52) U.S. Cl. ..................................... 382/233; 382/155

(58) Field of Classification Search ................. 382/155, 382/172, 173, 190, 224, 232, 233, 236, 238, 382/250, 251; 375/240.27; 341/67; 704/215
See application file for complete search history.

(56) References Cited

U.S. PATENT DOCUMENTS

| 5,703,793 | A | 12/1997 | Wise et al. |
| 5,821,885 | A | 10/1998 | Wise et al. |
| 5,963,154 | A | 10/1999 | Wise et al. |

(Continued)

FOREIGN PATENT DOCUMENTS

JP   6-152432   5/1994

(Continued)

OTHER PUBLICATIONS

Patent Abstracts of Japan, 07-067031, Mar. 10, 1995.

*Primary Examiner*—Amir Alavi
(74) *Attorney, Agent, or Firm*—Frommer Lawrence & Haug LLP; William S. Frommer; Paul A. Levy

(57) ABSTRACT

JPEG encoded data are entropy-decoded to quantized DCT coefficients which are sent to a prediction tap extraction circuit (41) and to a class tap extraction circuit (42). The prediction tap extraction circuit (41) and the class tap extraction circuit (42) extract what is needed from the quantized DCT coefficients to form prediction taps and class taps. A classification circuit (43) effects classification based on the class taps. A coefficient table storage unit (44) sends tap coefficients corresponding to the classes resulting from the classification to a sum of products circuit (45), which sum of products circuit (45) then effects linear predictive calculations, using the tap coefficients and the class taps, to generate decoded picture data.

12 Claims, 91 Drawing Sheets

U.S. PATENT DOCUMENTS

| | | |
|---|---|---|
| 5,974,374 A | 10/1999 | Wake |
| 6,263,105 B1 | 7/2001 | Nakaya et al. |
| 6,343,100 B1 | 1/2002 | Fujiwara et al. |
| 6,385,249 B1 | 5/2002 | Kondo et al. |
| 6,658,155 B1 | 5/2002 | Kondo et al. |
| 6,404,924 B1 | 6/2002 | Kondo |
| 6,556,725 B1 | 4/2003 | Kondo et al. |
| 6,696,993 B2 | 2/2004 | Karczewicz |
| 6,766,059 B1 | 7/2004 | Kondo |
| 7,082,220 B2 | 7/2006 | Kondo et al. |
| 2002/0031267 A1 | 3/2002 | Kondo |
| 2002/0186888 A1 | 12/2002 | Kondo et al. |
| 2003/0169931 A1 | 9/2003 | Lainema |
| 2004/0076333 A1 | 4/2004 | Zhang et al. |

FOREIGN PATENT DOCUMENTS

| | | |
|---|---|---|
| JP | 8-307835 | 11/1996 |
| JP | 8-322041 | 12/1996 |

| | | | | HORIZONTAL HIGH RANGE → | | | |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

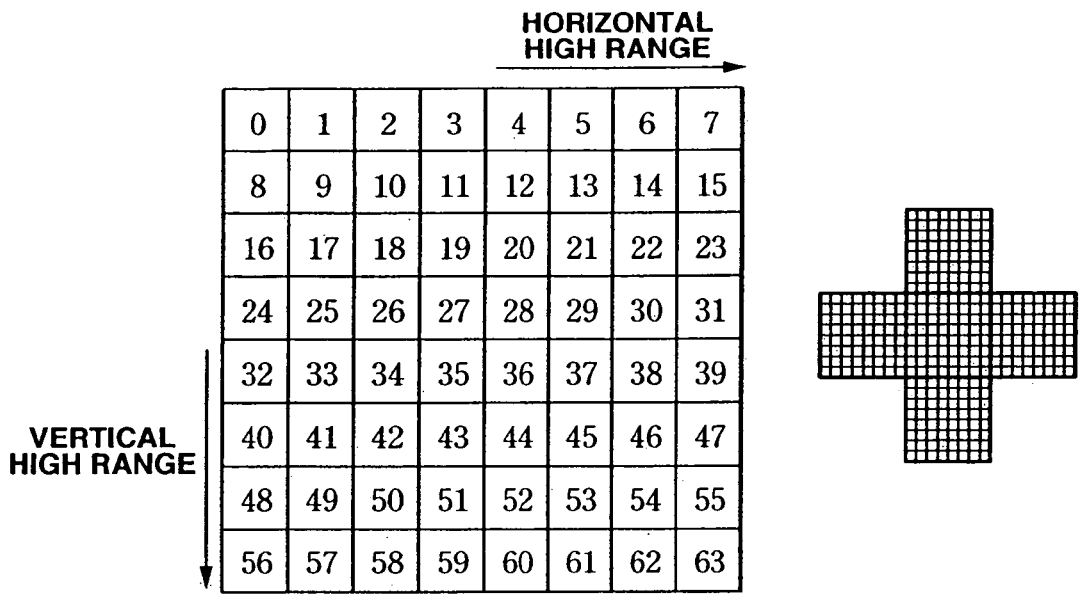
FIG.65A  FIG.65B
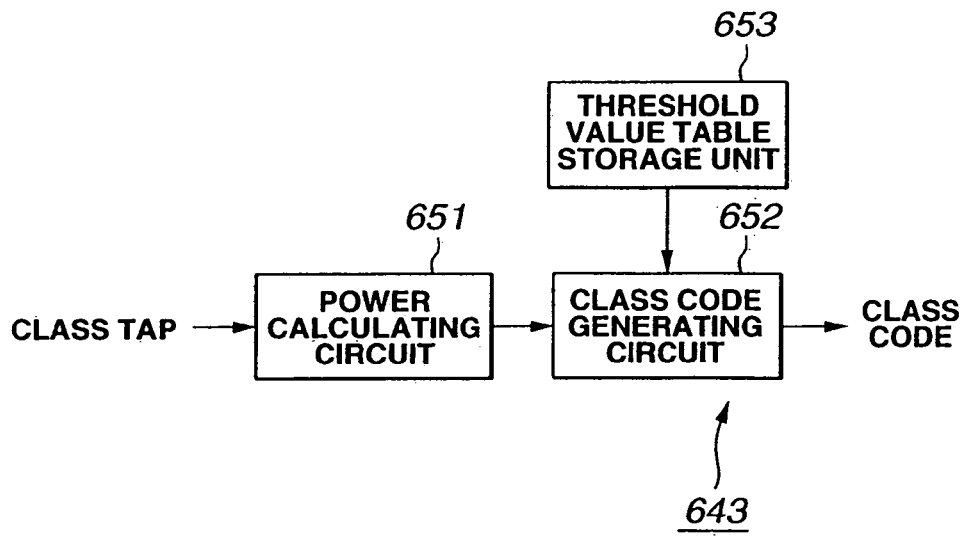
FIG.66

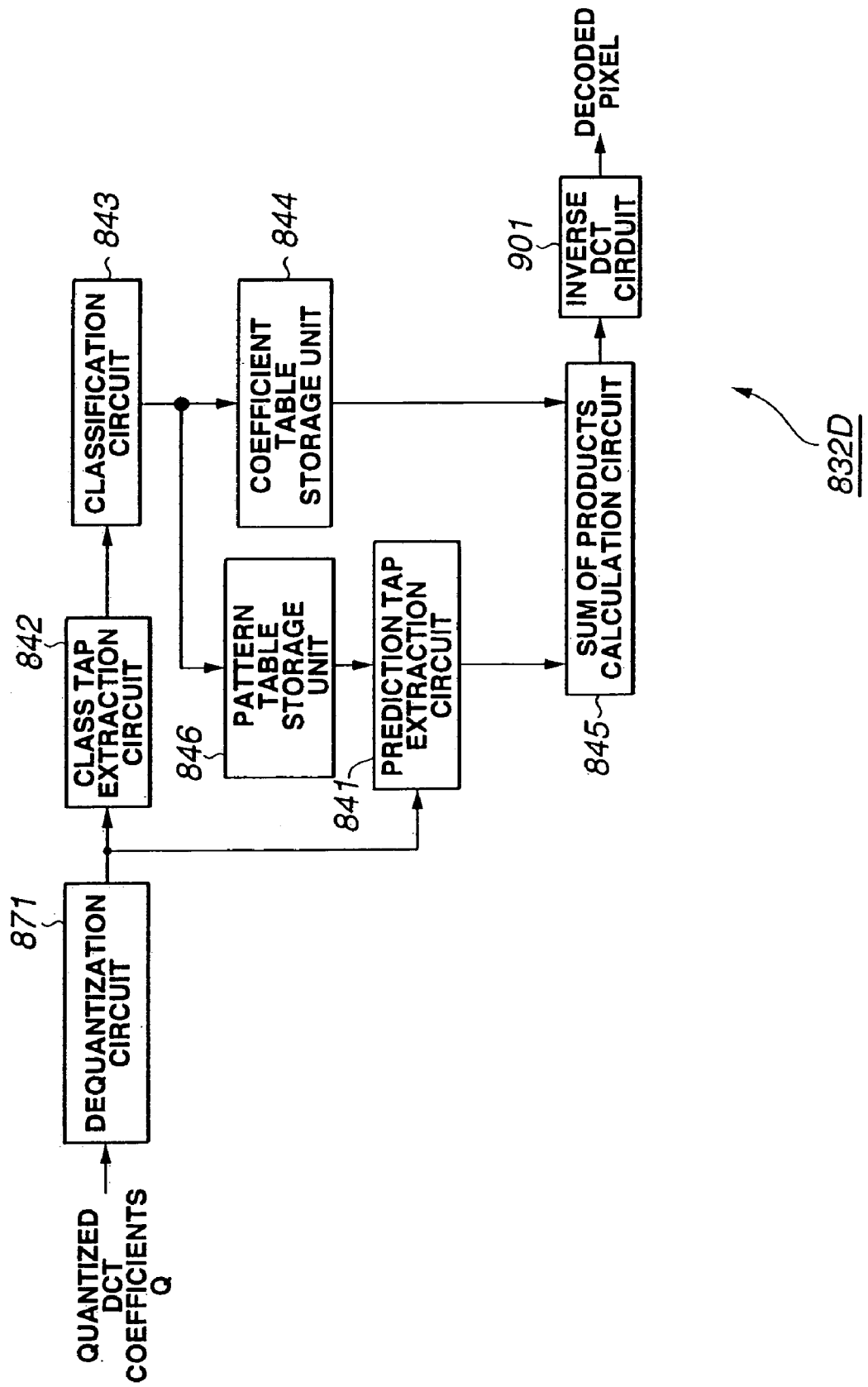

DATA PROCESSING APPARATUS AND METHOD AND RECORDING MEDIUM

This is a divisional of application Ser. No. 10/030,591, filed Jun. 3, 2002, now U.S. Pat. No. 7,035,471, granted Apr. 25, 2006, which claims priority to Japanese Patent Application No. 2000-135356, filed May 9, 2000, Japanese Patent Application No. 2000-135357 filed May 9, 2000, and International Application No. PCT/JP01/03873, filed May 9, 2001, the entirety of which are incorporated herein by reference.

TECHNICAL FIELD

This invention relates to a data processing method and apparatus and to a recording medium. More particularly, it relates to a data processing method and apparatus and a recording medium which may be used with advantage for decoding e.g., irreversibly compressed pictures.

BACKGROUND ART

Digital picture data, for example, are exorbitant in data volume, so that, if the data is to be recorded or transmitted directly, a recording medium or a transmission medium of an extremely large capacity is required. Thus, in general, picture data are compression-coded for diminishing the data volume before recording or transmission.

Among the systems for compression-coding a picture, there are a JPEG (Joint Photographic Experts Group) system, as a compression encoding system for a still picture, and an MPEG (Moving Picture Experts Group) system, as a compression encoding-system for a moving picture.

For example, the encoding and decoding of picture data in accordance with the JPEG system are performed as shown in FIG. 1.

FIG. 1A shows an illustrative structure of a conventional JPEG encoding device.

Picture data to be encoded are input to a blocking circuit 1 which then divides the input picture data into plural blocks each composed of 8×8=64 pixels. The blocks obtained in the blocking circuit 1 are routed to a discrete cosine transform (DCT) circuit 2. This DCT circuit 2 applies DCT processing to each block from the blocking circuit 1 to transform the block into a sun total of 64 DCT coefficients comprised of a sole DC (direct current) component and 63 frequency (AC (alternating current)) components. The block-based 64 DCT coefficients are routed from the DCT circuit 2 to a quantization circuit 3.

The quantization circuit 3 quantizes DCT coefficients in accordance with a preset quantization table to route the results of quantization, referred to below as quantized DCT coefficients, along with the quantization table used for quantization to an entropy encoding circuit 4.

FIG. 1B shows an instance of a quantization table used in the quantization circuit 3. In the quantization table, the quantization steps are set in general in order to take characteristics of the human visual system into account so that low frequency DCT coefficients, which are more crucial, are quantized finely, whereas high frequency DCT coefficients, which are less crucial, are quantized only coarsely. This suppresses deterioration of the picture quality of a picture to assure efficient compression.

The entropy encoding circuit 4 applies entropy encoding processing, such as Huffman encoding, to the quantized DCT coefficients, from the quantization circuit 3 and appends the quantization table from the quantization circuit 3 to output the resulting encoded data as JPEG encoding data.

FIG. 1C shows the structure of an instance of a conventional JPEG decoding device 10 used for decoding the encoded data output by a JPEG encoding device 5 of FIG. 1A.

The encoded data are input to an entropy decoding circuit 11, which then separates the encoded data into entropy encoded quantized DCT coefficients and the quantization table. The entropy decoding circuit 11 entropy decodes the quantized entropy encoded DCT coefficients to route the resulting quantized DCT coefficients along with the quantization table to a dequantization circuit 12. The dequantization circuit 12 dequantizes the quantized DCT coefficients from the entropy decoding circuit 11, in accordance with the quantization table from the entropy decoding circuit 11, to send the resulting DCT coefficients to an inverse DCT circuit 13. The inverse DCT circuit 13 applies inverse DCT processing to the DCT coefficients from the dequantization circuit 12 to send the resulting 8×8 pixel decoded block to a deblocking circuit 13. The deblocking circuit 13 deblocks the decoded blocks from the inverse DCT circuit 13 to derive an output decoded picture.

With the JPEG encoding device 5, shown in FIG. 1A, the data volume of the encoded-data can be diminished by increasing the quantization step of the quantization table used in quantizing the block, thereby realizing high compression.

However, if the quantization step is increased, the so-called quantization error is also increased to deteriorate the picture quality of the decoded picture obtained in the JPEG decoding device 10 of FIG. 1C. That is, blurring, block distortion or the mosquito noise etc are produced appreciably in the decoded picture.

Thus, if the data volume of the encoded data is to be diminished but nevertheless the picture quality of the decoded is not to be deteriorated, or if the data volume of the encoded data is maintained as the picture quality of the decoded picture is to be improved, some processing or other for improving the picture quality needs to be carried out subsequent to JPEG decoding.

However, if processing for improving the picture quality is to be performed subsequent to JPEG decoding, the processing is complicated to prolong the time until the decoded picture is ultimately produced.

DISCLOSURE OF THE INVENTION

In view of the above-described status of the art, the present invention contemplates to enable a decoded picture of high picture quality to be produced efficiently from e.g., a JPEG encoded picture.

According to the present invention, tap coefficients as found on learning are acquired, and the so acquired tap coefficients are used along with the converted data to execute preset calculations to decode the converted data to original data.

That is, the present invention provides a data processing apparatus including acquisition means for acquiring tap coefficients as found by learning, and decoding means for decoding the converted data to original data by preset predictive calculations employing the tap coefficients and the converted data.

The present invention also provides a data processing method including the steps of acquiring tap coefficients as found by learning, and decoding the converted data to original data by preset predictive calculations employing the tap coefficients and the converted data.

The present invention also provides a recording medium having recorded thereon a program including the steps of acquiring tap coefficients as found by learning, and decoding the converted data to original data by preset predictive calculations employing the tap coefficients and the converted data.

According to the present invention, pupil data, as pupil, are generated on at least orthogonal or frequency transforming teacher data as teacher, and tap coefficients are found by effecting learning so that the prediction error of prediction value of the teacher data obtained on predictive calculations using the tap coefficients and the pupil data will be statistically minimum.

That is, the present invention also provides a data processing apparatus including generating means for generating pupil data, as pupil, by at least orthogonal or frequency transforming teacher data, as teacher, and learning means for effecting learning so that a prediction error of prediction value of the teacher data obtained on predictive calculations using the tap coefficients and the pupil data will be statistically minimum, to find the tap coefficients.

The present invention also provides a data processing method including the steps of generating pupil data, as pupil, by at least orthogonal or frequency transforming teacher data, as teacher, and effecting learning so that a prediction error of the prediction value of the teacher data obtained on predictive calculations using the tap coefficients and the pupil data will be statistically minimum to find the tap coefficients.

The present invention also provides a recording medium having recorded thereon a program including the steps of generating pupil data, as pupil, by at least orthogonal or frequency transforming teacher data, as teacher, and effecting learning so that a prediction error of the prediction value of the teacher data obtained on predictive calculations using the tap coefficients and the pupil data will be statistically minimum to find the tap coefficients.

According to the present invention, tap coefficients as found on learning are acquired, and preset predictive calculations are executed using the tap coefficients and converted data to decode the converted data to original data, which original data is processed in a preset fashion to produce processed data.

That is, the present invention also provides a data processing apparatus including acquisition means for acquiring tap coefficients as found by learning, and calculating means for executing preset predictive calculations using the tap coefficients and the converted data to decode the converted data to original data and to produce processed data which is the original data subjected to preset processing.

The present invention also provides a data processing method including the steps of acquiring tap coefficients as found by learning, and executing preset predictive calculations using the tap coefficients and the converted data to decode the converted data to original data and to produce processed data which is the original data subjected to preset processing.

The present invention also provides a recording medium having recorded thereon a program including the steps of acquiring tap coefficients as found by learning, and executing preset predictive calculations using the tap coefficients and the converted data to decode the converted data to original data and to produce processed data which is the original data subjected to preset processing.

According to the present invention, teacher data as teacher are processed in a preset fashion and the resulting quasi-teacher data are at least orthogonal or frequency transformed to generate pupil data as pupil. Tap coefficients are then generated on effecting learning so that a prediction error of the predicted value of the teacher data obtained on predictive calculations employing the tap coefficients and the pupil data will be statistically minimum.

That is, the present invention also provides a data processing apparatus including quasi-teacher data-generating means for processing teacher data as teacher, based on the preset processing, to produce quasi-teacher data, pupil data generating means for generating pupil data as pupils on at least orthogonal or frequency transforming the quasi-teacher data, and learning means for effecting learning for statistically minimizing a prediction error of the predicted value of the teacher data obtained on predictive calculations employing the tap coefficients and the pupil data to find the tap coefficients.

The present invention also provides a data processing method including the steps of processing teacher data as teacher, based on the preset processing, to produce quasi-teacher data, generating pupil data as pupils on at least orthogonal or frequency transforming the quasi-teacher data and effecting learning for statistically minimizing the prediction error of the predicted value of the teacher data obtained on predictive calculations employing the tap coefficients and the pupil data to find the tap coefficients.

The present invention also provides a recording medium having recorded thereon a program including the steps of processing teacher data as teacher, based on the preset processing, to produce quasi-teacher data, generating pupil data as pupils on at least orthogonal or frequency transforming the quasi-teacher data and effecting learning for statistically minimizing the prediction error of the predicted value of the teacher data obtained on predictive calculations employing the tap coefficients and the pupil data to find the tap coefficients.

According to the present invention, data of interest among original data is assigned to one of a plural number of classes, based on subsidiary information, and tap coefficients corresponding to the class of the data of interest, among class-based tap coefficients, as found on learning, are acquired. Preset predictive calculations are then carried out, using the converted data and the tap coefficients corresponding to the class of the data of interest, to decode the converted data to original data.

That is, the present invention also provides a data processing apparatus including classification means for assigning data of interest in the original data to one of a plurality of classes, based on the subsidiary information, by way of classification, acquisition means for acquiring tap coefficients associated with the class of the data of interest, in class-based tap coefficients as found on learning and decoding means for executing preset predictive calculations, using the converted data and the tap coefficients associated with the class of the data of interest, to decode the converted data into original data.

The present invention also provides a data processing method including the steps of assigning data of interest in the original data to one of a plurality of classes, based on the subsidiary information, by way of classification, acquiring tap coefficients associated with the class of the data of interest, in class-based tap coefficients as found on learning and executing preset predictive calculations, using the converted data and the tap coefficients associated with the class of the data of interest, to decode the converted data into original data.

The present invention also provides a recording medium having recorded thereon a program including the steps of assigning data of interest in the original data to one of a plurality of classes, based on the subsidiary information, by way of classification, acquiring tap coefficients associated with the class of the data of interest, in class-based tap coefficients as found on learning, and executing preset predictive calculations, using the converted data and the tap coefficients associated with the class of the data of interest, to decode the converted data into original data.

According to the present invention, pupil data, as pupil, are generated on at least orthogonal or frequency transforming teacher data as teacher. Using the preset subsidiary information, used in generating the pupil data, teacher data of interest, among the teacher data, is assigned to one of a plural number of classes. Class-based tap coefficients are then found by effecting learning so that a prediction error of the prediction value of the teacher data obtained on predictive calculations using the tap coefficients corresponding to the class of the teacher data of interest and pupil data will be statistically minimum.

That is, the present invention also provides a data processing apparatus including generating means for generating pupil data, as pupil, at least on orthogonal or frequency transforming teacher data as teacher, classification means for assigning teacher data of interest in the teacher data to one of a plurality of classes, based on the preset subsidiary information used in generating the pupil data in the generating means, and learning means for effecting learning so that a prediction error of the prediction value of the teacher data obtained on predictive calculations using the tap coefficients corresponding to the class of the teacher data of interest and pupil data will be statistically minimum to find class-based tap coefficients.

The present invention also provides a data processing method including the steps of generating pupil data, as pupil, at least on orthogonal or frequency transforming teacher data as teacher, assigning teacher data of interest in the teacher data to one of a plurality of classes based on the preset subsidiary information used in generating the pupil data in the generating means and effecting learning so that a prediction error of the prediction value of the teacher data obtained on predictive calculations using the tap coefficients corresponding to the class of the teacher data of interest and pupil data will be statistically minimum, to find class-based tap coefficients.

The present invention also provides a recording medium having recorded thereon a program including the steps of generating pupil data, as pupil, at least on orthogonal or frequency transforming teacher data as teacher, assigning teacher data of interest in the teacher data to one of a plurality of classes based on the preset subsidiary information used in generating the pupil data in the generating means and effecting learning so that a prediction error of the prediction value of the teacher data obtained on predictive calculations using the tap coefficients corresponding to the class of the teacher data of interest and pupil data will be statistically minimum, to find class-based tap coefficients.

According to the present invention, converted data used in assigning processed data of interest to one of a plural number of classes is extracted, at least from a block other than a block corresponding to processed data of interest, for use as class tap. Based on the class tap, thus found, the class of the processed data of interest is found by way of classification. Using the tap coefficients of the class of the processed data of interest, preset calculations are carried out to find a prediction value of the processed data of interest.

That is, the present invention also provides a processing apparatus including acquisition means for acquiring tap coefficients as found on learning, class tap extraction means for extracting the converted data, used for assigning processed data of interest, to one of a plurality of classes, from at least a block other than the block associated with the processed data of interest, by way of classification, and for outputting the extracted data as class tap, classification means for finding a class of the processed data of interest based on the class tap, and calculating means for executing preset predictive calculations, using the tap coefficients of the class of the processed data of interest, and the converted data, to find a prediction value of the processed data of interest.

The present invention also provides a data processing method including the steps of acquiring tap coefficients as found on learning, extracting the converted data, used for assigning processed data of interest, to one of a plurality of classes, from at least a block other than the block associated with the processed data of interest, by way of classification, and for outputting the extracted data as class tap, finding a class of the processed data of interest based on the class tap, and executing preset predictive calculations, using the tap coefficients of the class of the processed data of interest, to find a prediction value of the processed data of interest.

The present invention also provides a recording medium including the steps of acquiring tap coefficients as found on learning, extracting the converted data, used for assigning processed data of interest, to one of a plurality of classes, from at least a block other than the block associated with the processed data of interest, by way of classification, and for outputting the extracted data as class tap, and finding a class of the processed data of interest based on the class tap, and executing preset predictive calculations, using the tap coefficients of the class of the processed data of interest, to find a prediction value of the processed data of interest.

According to the present invention, pupil data used for assigning teacher data of interest to one of a plural number of classes, are extracted at least from a block other than a block corresponding to teacher data of interest, for use as class taps. Based on these class taps, the class of the teacher data of interest is found by way of classification. Predictive calculations are carried out based on class-based tap coefficients and the pupil data and learning is then carried out so that a prediction error of the prediction value of the teacher data obtained on predictive calculations using the class-based tap coefficients and pupil data will be statistically minimum, to find tap coefficients from class to class.

That is, the present invention also provides a data processing apparatus including generating means for generating the block-based converted data as pupil data as pupil in learning, class tap extraction means for extracting pupil data used for assigning teacher data of interest to one of a plurality of classes, at least from a block other than a block corresponding to the teacher data of interest, with the processed data as teacher data as teacher in learning, and for outputting the extracted data as class tap, classification means for finding a class of the teacher data of interest, based on the class tap, and learning means for effecting learning so that a prediction error of the prediction value of the teacher data obtained on predictive calculations using the class-based tap coefficients and pupil data will be statistically minimum to find the tap coefficients from class to class.

The present invention also provides a data processing method including the steps of generating the block-based converted data as pupil data as pupil in learning, extracting pupil data used for assigning teacher data of interest to one of a plurality of classes, at least from a block other than a block corresponding to the teacher data of interest, with the processed data as teacher data as teacher in learning, and for outputting the extracted data as class tap, finding a class of the teacher data of interest, based on the class tap, and effecting learning so that a prediction error of the prediction value of the teacher data obtained on predictive calculations using the class-based tap coefficients and pupil data will be statistically minimum to find the tap coefficients from class to class.

The present invention also provides a recording medium having recorded thereon a program including the steps of generating the block-based converted data as pupil data as pupil in learning, extracting pupil data used for assigning teacher data of interest to one of a plurality of classes, at least from a block other than a block corresponding to the teacher data of interest, with the processed data as teacher data as teacher in learning, and for outputting the extracted data as class tap, finding a class of the teacher data of interest, based on the class tap, and effecting learning so that a prediction error of the prediction value of the teacher data obtained on predictive calculations using the class-based tap coefficients and pupil data will be statistically minimum to find the tap coefficients from class to class.

According to the present invention, converted data used in predictive calculations used for decoding data of a data block of interest among data blocks is extracted at least from a converted block corresponding to a data block other than the data block of interest for use as prediction taps. Using the tap coefficients and the prediction taps, preset predictive calculations are carried out to decode the converted data to original data.

That is, the present invention also provides a data processing apparatus including acquisition means for acquiring tap coefficients as found on learning, prediction tap extraction means for extracting the converted data used for predictive calculations for decoding data of a data block of interest among data blocks, each of which is a block of the data, at least from a converted block as a block of the converted data, corresponding to a data block other than the data block of interest, to output the extracted data as prediction tap, and calculating means for performing preset predictive calculations, using the tap coefficients and prediction taps, to decode the converted data to original data.

The present invention also provides a data processing method including the steps of acquiring tap coefficients as found on learning, extracting the converted data used for predictive calculations for decoding data of a data block of interest among data blocks each of which is a block of the data, at least from a converted block as a block of the converted data, corresponding to a data block other than the data block of interest, to output the extracted data as prediction tap, and performing preset predictive calculations, using the tap coefficients and prediction taps, to decode the converted data to original data.

The present invention also provides a recording medium having recorded thereon a program including the steps of acquiring tap coefficients as found on learning, extracting the converted data used for predictive calculations for decoding data of a data block of interest among data blocks each of which is a block of the data, at least from a converted block as a block of the converted data, corresponding to a data block other than the data block of interest, to output the extracted data as prediction tap, and performing preset predictive calculations, using the tap coefficients and prediction taps, to decode the converted data to original data.

According to the present invention, pupil data as pupil are generated at least on orthogonal or frequency converting teacher data as teacher, and pupil data used in predictive calculations for decoding teacher data in a teacher block of interest among teacher blocks is extracted at least from a pupil block corresponding to a teacher block other than the teacher block of interest for use as prediction tap. Tap coefficients are then found by effecting learning so that a predictive error of the prediction value of the teacher data obtained on performing predictive calculations using the tap coefficients and the prediction taps will be statistically minimum.

That is, the present invention also provides a data processing apparatus including generating means for generating pupil data as pupil, by at least applying orthogonal or frequency transform to teacher data as teacher, prediction tap extracting means for extracting the pupil data used for predictive calculations used for decoding teacher data of a teacher block of interest among teacher blocks each being a block of the teacher data, from at least a block of pupils as block of the pupil data corresponding to the teacher blocks other than the teacher block of interest, to output the extracted data as predictive taps, and learning means for effecting learning so that a predictive error of the prediction value of the teacher data obtained on performing predictive calculations using the tap coefficients and the prediction taps will be statistically minimum.

The present invention also provides a data processing method including the steps of generating pupil data as pupil, by at least applying orthogonal or frequency transform to teacher data as teacher, extracting the pupil data used for predictive calculations used for decoding teacher data of a teacher block of interest among teacher blocks, each being a block of the teacher data, from at least a block of pupils as block of the pupil data corresponding to the teacher blocks other than the teacher block of interest, to output the extracted data as predictive taps, and effecting learning so that a predictive error of the prediction value of the teacher data obtained on performing predictive calculations using the tap coefficients and the prediction taps will be statistically minimum, to find tap coefficients.

The present invention also provides a recording medium having recorded thereon a program including the steps of generating pupil data as pupil, by at least applying orthogonal or frequency transform to teacher data as teacher, extracting the pupil data used for predictive calculations used for decoding teacher data of a teacher block of interest among teacher blocks each being a block of the teacher data, from at least a block of pupils as block of the pupil data corresponding to the teacher block other than the teacher block of interest, to output the extracted data as predictive taps, and effecting learning so that a predictive error of the prediction value of the teacher data obtained on performing predictive calculations using the tap coefficients and the prediction taps will be statistically minimum to find the tap coefficients.

According to the present invention, using first data for learning of an extraction pattern and second data, the correlation of the first data showing a preset position relationship with respect to the second data lying in a preset position is found from one preset position relationship to another. An extraction pattern of the first data to be used as the prediction tap used for the predictive calculations executed for obtaining the second data is set based on the so found correlation.

That is, the present invention also provides a data processing apparatus including correlation calculating means for finding the correlation of the first data showing a preset position relationship with respect to second data lying in a preset position, the first and second data being used for learning the extraction pattern, from one the position relationship to another, and setting means for setting the extraction pattern of the first data to be used as the prediction tap used for the predictive calculations executed for obtaining the second data, based on the correlation.

The present invention also provides a data processing method including the steps of finding the correlation of the first data showing a preset position relationship with respect to second data lying in a preset position, the first and second data being used for learning the extraction pattern, from one the position relationship to another, and setting the extraction pattern of the first data to be used as the prediction tap used for the predictive calculations executed for obtaining the second data, based on the correlation.

The present invention also provides a recording medium having recorded thereon a program including the step of finding the correlation of the first data showing a preset position relationship with respect to second data lying in a preset position, the first and second data being used for learning the extraction pattern, from one the position relationship to another, and setting the extraction pattern of the first data to be used as the prediction tap used for the predictive calculations executed for obtaining the second data, based on the correlation.

BRIEF DESCRIPTION OF THE DRAWINGS

FIGS. 65A and 65B illustrate an instance of a cluster tap in the coefficient conversion circuit.

FIG. 66 is a block diagram showing an illustrative structure of a classification circuit in the coefficient conversion circuit.

FIG. 96 is a block diagram showing another illustrative structure of the coefficient conversion circuit.

BEST MODE FOR CARRYING OUT THE INVENTION

Figure 1A:
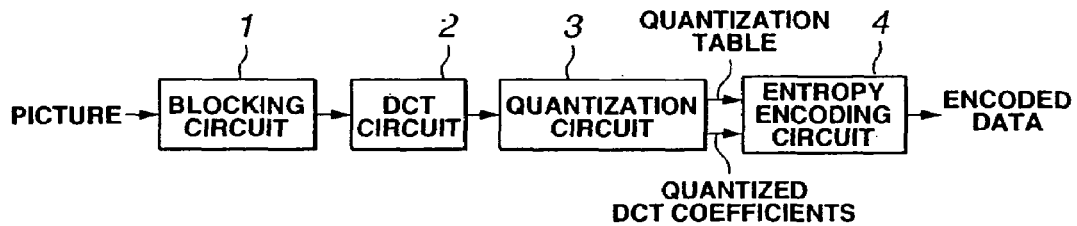
FIGS. 1A, 1B and 1C illustrate conventional JPEG encoding/decoding.

Referring to the drawings, the best mode for carrying out the present invention is explained in detail.

Figure 2:
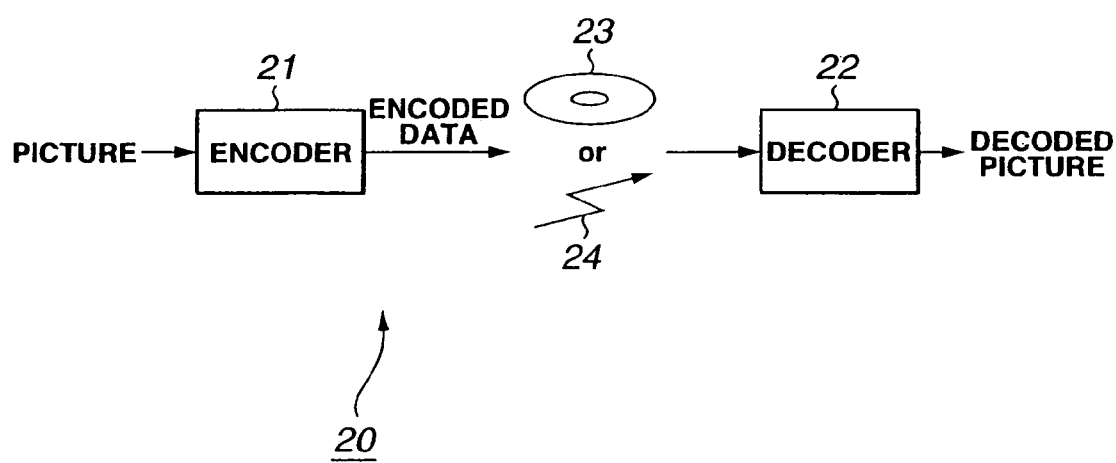
FIG. 2 shows an illustrative structure of a picture transmission system embodying the present invention.

The present invention is applied to a picture transmission system 20 configured for example in FIG. 2.

In this picture transmission system 20, picture data to be transmitted is supplied to an encoder 21. The encoder 21 encodes the picture data transmitted thereto by e.g., JPEG encoding to form encoded data. That is, the encoder 21 is configured similarly to a JPEG encoding device 5 shown in FIG. 1A and encodes picture data by JPEG encoding. The encoding data, obtained on JPEG encoding by the encoder 21, is recorded on a recording medium 23, such as a semiconductor memory, magneto-optical disc, a magnetic disc, an optical disc, a magnetic tape or a phase change disc, or is transmitted over a transmission medium 24, such as ground waves, satellite network, CATV (cable television) network, Internet or public network.

The decoder 22 receives encoded data transmitted from the recording medium 23 or over the transmission medium 24 for decoding to the original picture data. The so decoded picture data are supplied to a monitor, not shown, for e.g., display.

Figure 3:
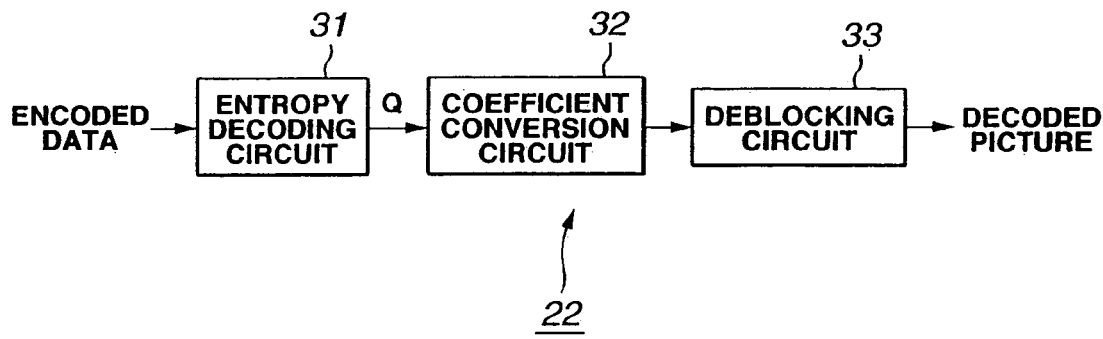
FIG. 3 is a block diagram showing an illustrative structure of a decoder in the picture transmission system.

The decoder 22 includes an entropy decoding circuit 31, a coefficient conversion circuit 32 and a deblocking circuit 33, as shown in FIG. 3.

The encoded data are sent to the entropy decoding circuit 31, which then entropy-decodes the encoded data to send the resulting block-based quantized DCT coefficients Q to the coefficient conversion circuit 32. As explained in connection with the entropy decoding circuit 11 of FIG. 1C, not only the entropy encoded quantized DCT coefficients but also the quantization table is contained in the encoded data. This quantization table can be used as necessary for decoding the quantized DCT coefficients, as will be explained subsequently.

Using the quantized DCT coefficients Q from the entropy decoding circuit 31 and tap coefficients as found by learning, as later explained, the coefficient conversion circuit 32 performs preset predictive calculations for decoding the block-based quantized DCT coefficients to an original block of 8×8 pixels.

The deblocking circuit 33 deblocks the decoded block, obtained in the coefficient conversion circuit 32, to produce an output decoded picture.

Figure 4:
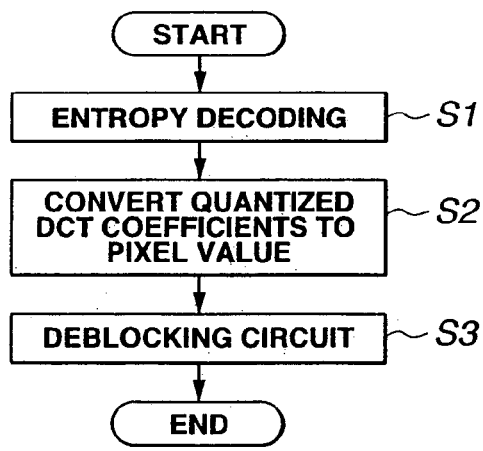
FIG. 4 is a flowchart showing the processing in a decoder.

Referring to a flowchart of FIG. 4, the processing by the decoder 22 of FIG. 3 is explained.

The encoded data is sequentially supplied to the entropy decoding circuit 31. At step S1, the entropy decoding circuit 31 entropy-decodes the encoded data to send block-based quantized DCT coefficients Q to the coefficient conversion circuit 32. The coefficient conversion circuit executes predictive calculations, using tap coefficients, to decode the block-based quantized DCT coefficients Q from the entropy decoding circuit 31 into block-based pixel values, which then are sent to the deblocking circuit 33. The deblocking circuit 33 at step S3 executes deblocking of pixel values from the coefficient conversion circuit 32 to output the resulting decoded picture to finish the processing.

The coefficient conversion circuit 32 exploits the classification processing to decode the quantized DCT coefficients into pixel values.

The classification adaptive processing is comprised of a classification processing and an adaptive processing. By the classification processing, data is classified according to properties thereof and adaptive processing is performed from class to class. This adaptive processing uses the following technique:

That is, the adaptive processing finds estimated values of the original pixel by linear combination of, for example, quantized DCT coefficients and preset tap coefficients, to decode the quantized DCT coefficients to the original pixel values.

Specifically, it is now contemplated that a certain picture is teacher data, and another similar picture is DCTed on the block basis and quantized to give quantized DCT coefficients as pupil data, and that an estimated value E[y] of a pixel value y of a pixel of the picture as teacher data is found by a linear combination model prescribed by a linear combination of a set of a plural number of quantized DCT coefficients $x_1$, $x_2$, . . . and preset tap coefficients $w_1$, $w_2$, . . . .

In this case, the estimated value E[y] may be represented by the following equation (1):

$$E[y] = w_1 x_1 + w_2 x_2 + \ldots \quad (1).$$

If, for generalizing the equation (1), a matrix W, comprised of a set of tap coefficients $w_j$, a matrix X, comprised of a set of pupil data $x_{ij}$ and a matrix Y' comprised of a set of estimated values $E[y_i]$ are defined as $$X = \begin{pmatrix} x_{11} & x_{12} & \cdots & x_{1J} \\ x_{21} & x_{22} & \cdots & x_{2J} \\ \cdots & \cdots & \cdots & \cdots \\ x_{I1} & x_{I2} & \cdots & x_{IJ} \end{pmatrix}$$

$$W = \begin{pmatrix} w_1 \\ w_2 \\ \cdots \\ w_J \end{pmatrix}$$

$$Y' = \begin{pmatrix} E[y_1] \\ E[y_2] \\ \cdots \\ E[y_I] \end{pmatrix}$$

the following observation equation (2) holds:

$$XW = Y' \quad (2)$$

where a component $x_{ij}$ of the matrix X means number j pupil data of a number i pupil data set (a set of pupil data used for estimation of a number i teacher data $y_i$) and a component $w_j$ of the matrix W is a tap coefficient the product of which with the number j pupil data in the pupil data set. On the other hand, $y_i$ denotes number i teacher data so that E[yi] denotes an estimated value of the number i teacher data. Meanwhile, in y in the left side of the equation (1), a suffix i in the component $y_i$ of the matrix Y is omitted, whereas, in $x_1$, $x_2$, . . . in the right side of the equation (1), the suffix i in the component $x_{ij}$ of the matrix X is omitted.

It is now contemplated to apply the least square method to this observation equation to find an estimated value E[y] approximate to the original pixel value y. If a matrix Y comprised of a set of true pixel values y as teacher data and a matrix E comprised of a set of residues e of the estimated value E[y] with respect to the pixel value y are defined as $$E = \begin{pmatrix} e_1 \\ e_2 \\ \cdots \\ e_I \end{pmatrix}$$

$$Y = \begin{pmatrix} y_1 \\ y_2 \\ \cdots \\ y_I \end{pmatrix}$$

the following residue equation (3):

$$XW = Y + E \quad (3)$$

becomes valid from the equation (2).

In this case, a tap coefficient $w_j$ for finding the estimated value E[y] approximate to the original pixel value y may be found by minimizing the square error $$\sum_{i=1}^{I} e_i^2$$

Therefore, the tap coefficient $w_j$ for which the above square error differentiated with respect to the tap coefficient $w_j$ is zero, that is the tap coefficient $w_j$ which satisfies the following equation (4):

$$e_1 \frac{\partial e_1}{\partial w_j} + e_1 \frac{\partial e_2}{\partial w_j} + \cdots + e_1 \frac{\partial e_I}{\partial w_j} = 0 \quad (4)$$

$$(j = 1, 2, \cdots, J)$$

represents an optimum value for finding the estimated value E proximate to the original pixel value y.

Thus, by differentiating the equation with respect to the tap coefficient $w_j$, the following equation (5) is obtained:

$$\frac{\partial e_1}{\partial w_1} = x_{i1}, \frac{\partial e_1}{\partial w_2} = x_{i2}, \cdots, \frac{\partial e_i}{\partial w_J} = x_{iJ} \quad (5)$$

$$(i = 1, 2, \cdots, I).$$

From the equations (4) and (5), the following equation (6) is obtained:

$$\sum_{i=1}^{I} e_i x_{i1} = 0, \sum_{i=1}^{I} e_i x_{i2} = 0, \cdots, \sum_{i=1}^{I} e_i x_{iJ} = 0. \quad (6)$$

If further the relation among pupil data $x_{ij}$, tap coefficients $w_j$, teacher data $y_i$ and the residues $e_i$ in the residue equation (3) is considered, the following normal equation (7) is obtained:

$$\begin{cases} \left(\sum_{i=1}^{I} x_{i1} x_{i1}\right) w_1 + \left(\sum_{i=1}^{I} x_{i1} x_{i2}\right) w_2 + \cdots + \left(\sum_{i=1}^{I} x_{i1} x_{iJ}\right) w_J = \left(\sum_{i=1}^{I} w_{i1} y_i\right) \\ \left(\sum_{i=1}^{I} x_{i2} x_{i1}\right) w_1 + \left(\sum_{i=1}^{I} x_{i2} x_{i2}\right) w_2 + \cdots + \left(\sum_{i=1}^{I} x_{i2} x_{iJ}\right) w_J = \left(\sum_{i=1}^{I} w_{i2} y_i\right) \\ \left(\sum_{i=1}^{I} x_{iJ} x_{i1}\right) w_1 + \left(\sum_{i=1}^{I} x_{iJ} x_{i2}\right) w_2 + \cdots + \left(\sum_{i=1}^{I} x_{iJ} x_{iJ}\right) w_J = \left(\sum_{i=1}^{I} w_{iJ} y_i\right) \end{cases} \quad (7)$$

Meanwhile, if the matrix (covariance matrix) A and a vector v are defined by $$A = \begin{pmatrix} \sum_{i=1}^{I} x_{i1} x_{i2} & \sum_{i=1}^{I} x_{i1} x_{i2} & \cdots & \sum_{i=1}^{I} x_{i1} x_{iJ} \\ \sum_{i=1}^{I} x_{i2} x_{i1} & \sum_{i=1}^{I} x_{i2} x_{i2} & \cdots & \sum_{i=1}^{I} x_{i2} x_{iJ} \\ & & \cdots & \\ \sum_{i=1}^{I} x_{iJ} x_{i1} & \sum_{i=1}^{I} x_{iJ} x_{i2} & \cdots & \sum_{i=1}^{I} x_{iJ} x_{iJ} \end{pmatrix}$$

$$v = \begin{pmatrix} \sum_{i=1}^{I} x_{i1} y_i \\ \sum_{i=1}^{I} x_{i2} y_i \\ \cdots \\ \sum_{i=1}^{I} x_{iJ} y_i \end{pmatrix}$$

respectively and the vector W is defined as indicated in the equation 1, the normal equation shown in the equation (7) may be represented by the following equation (8):

$$AW = v \quad (8)$$

By providing a certain plural number of sets of the pupil data $x_{ij}$ and sets of teacher data $y_i$, a number of normal equations of (7) equal to the number J of the tap coefficients $w_j$ to be found may be established. Thus, by solving the equation (8) with respect to the vector W, an optimum number of tap coefficients (here, the tap coefficients that minimize the square error) $w_j$ may be found. It is noted that, for solving the equation (8), the matrix A in the equation (8) needs to be regular. Meanwhile, a sweep-out method (Gauss-Jordan elimination method), for example, may be used.

Finding an optimum tap coefficient $w_j$ as described above, and finding an estimated value E[y], proximate to the original pixel value y, by the equation (1), using the tap coefficient $w_j$, represents adaptive processing.

Meanwhile, if a picture which is of the picture quality as a picture to be encoded by JPEG is used as teacher data, and quantized DCT coefficients obtained on DCTing and quantizing the teacher data is used as pupil data, such a tap coefficient is obtained which will give a statistically minimum prediction error for decoding the JPEG encoded picture data to original picture data.

Thus, even if the compression ratio at the time of performing JPEG encoding is raised, that is if the quantization step used for quantization is roughed, such decoding processing which statistically minimizes the prediction error may be realized by the adaptive processing, so that, in substance, the decoding processing of a JPEG encoded picture and the processing for improving the picture quality may be performed simultaneously. As a result, the picture quality of the decoded picture may be maintained even if the compression ratio is raised.

If, for example, a picture of a higher quality than the picture to be JPEG encoded is used as teacher data, and quantized DCT coefficients, obtained on deteriorating the picture quality of the teacher data to the same picture quality as that of the picture to be JPEG encoded, followed by DCT and quantization, are used as pupil data, such tap coefficients are obtained which will statistically minimize the prediction error in decoding the JPEG encoded picture data to picture data of high picture quality.

Thus, with the present adaptive processing, the decoding processing of the JPEG encoded picture and the processing for improving the picture quality in this case may be performed simultaneously. Meanwhile, it may be seen from above that, by varying the picture quality of the picture which proves teacher or pupil data, it is possible to produce tap coefficients which will raise the picture quality of the decoded picture to an arbitrary level.

Figure 5:
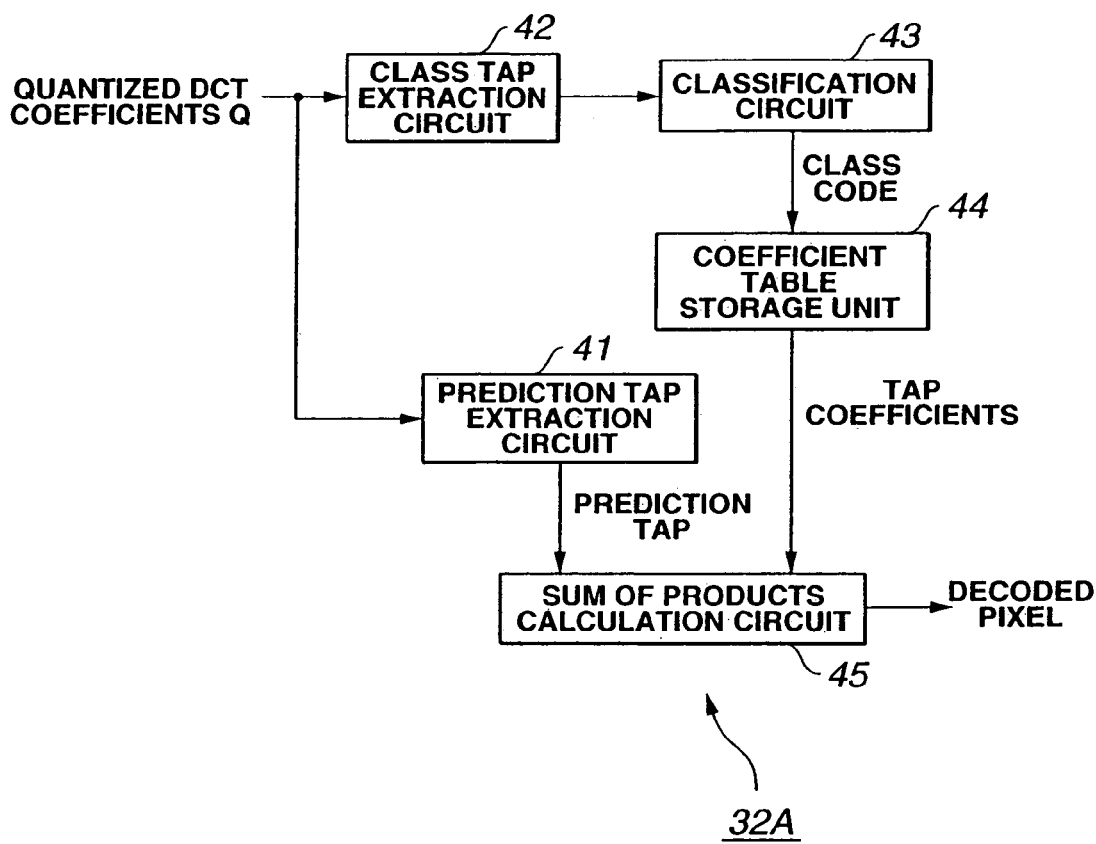
FIG. 5 is a block diagram showing an illustrative structure of a coefficient conversion circuit in the decoder.

FIG. 5 shows an illustrative structure of the coefficient conversion circuit 32 of FIG. 3 which will decode the quantized DCT coefficients into pixel values by the above-described classification adaptive processing.

In a coefficient conversion circuit 32A, shown in FIG. 5, block-based quantized DCT coefficients, output by the entropy decoding circuit 31 (FIG. 3), are sent to a prediction tap extraction circuit 41 and to a class tap extraction circuit 42.

The prediction tap extraction circuit 41 sequentially renders a block of pixel values corresponding to a block of the quantized DCT coefficients (incidentally referred to below as a DCT block), supplied thereto, a pixel block of interest. It is noted that the block of the pixel values, not present in the present stage but virtually presupposed, is incidentally referred to below as a pixel block. The prediction tap extraction circuit 41 also sequentially renders respective pixels making up the pixel block of interest respective pixels of interest in e.g., a raster scanning sequence. Moreover, the prediction tap extraction circuit 41 extracts the quantized DCT coefficients used for predicting the pixel values of the pixels of interest for use as predication taps.

Figures 6, 7:
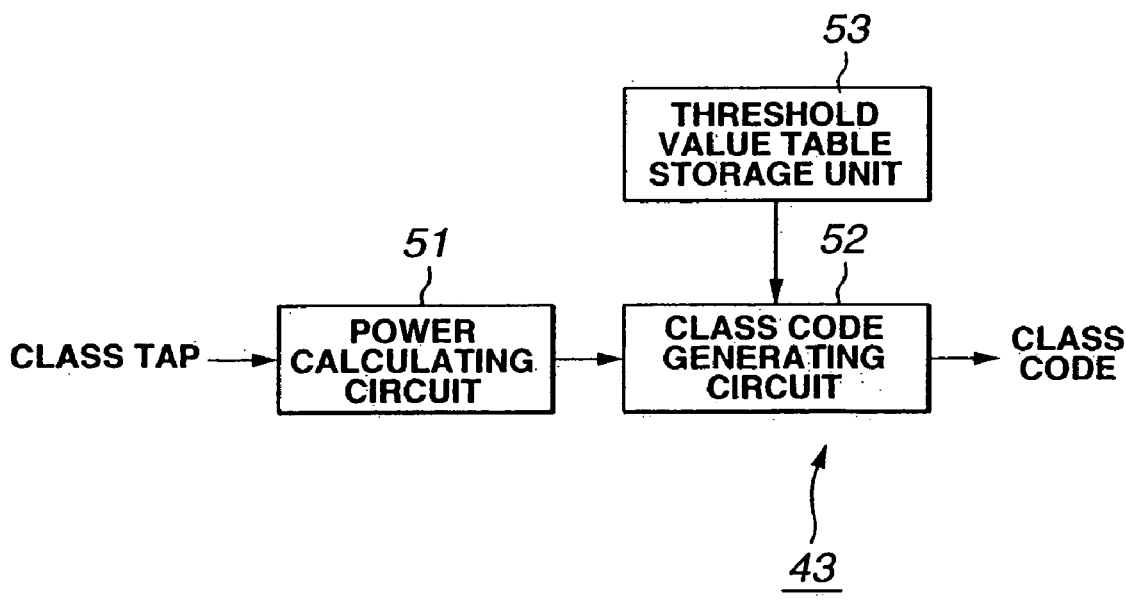
FIG. 6 illustrates instances of a prediction tap and a class tap in the decoder.
FIG. 7 is a block diagram showing an illustrative structure of the classification circuit in the coefficient conversion circuit.

That is, the prediction tap extraction circuit 41 extracts the totality of the quantized DCT coefficients of a DCT block corresponding to the pixel block to which belongs the pixel of interest, that is 8×8=64 quantized DCT coefficients, as prediction taps, as shown in FIG. 6. Thus, in the present embodiment, the same prediction taps are constituted for all pixels of a given pixel block. It should be noted that the prediction taps may also be formed by different quantized DCT coefficients from one pixel of interest to another.

The prediction taps for respective pixels forming a pixel block obtained in the prediction tap extraction circuit 41, that is 64 sets of prediction taps for each of 64 pixels, are sent to a sum-of-products circuit 45. However, in the present embodiment, since the same prediction tap is formed for all pixels of one pixel block, it is sufficient if one set of prediction taps is supplied to the sum-of-products circuit 45 for one pixel block.

The class tap extraction circuit 42 extracts quantized DCT coefficients used for classifying the pixels of interest into one of plural classes, for use as class taps.

Meanwhile, in JPEG encoding, since a picture is encoded (DCTed and quantized) from one pixel block to another, the pixels belonging to one pixel block are classified in their entirety to, for example, the same class. Therefore, the class tap extraction circuit 42 forms the same class tap for respective pixels of a given pixel block. That is, the class tap extraction circuit 42 extracts the totality of 8×8 quantized DCT coefficients of a DCT block, corresponding to the pixel block, to which belongs the pixel of interest, as a class tap, in the same way as in e.g., the prediction tap extraction circuit 41.

It is noted that classifying the respective pixels belonging to a pixel block to the same class is equivalent to classifying the pixel block. Thus, it is sufficient if the class tap extraction circuit 42 forms not 64 sets of the class taps for classifying each of 64 pixels making up the pixel block of interest, but one set of the class taps for classifying the pixel block of interest. So, the class tap extraction circuit 42 extracts 64 quantized DCT coefficients of the DCT block associated with the pixel block, in order to classify the pixel blocks, from one pixel block to another, for use as class taps.

Meanwhile, the quantized DCT coefficients, forming prediction tap or class tap, are not limited to those of the above-mentioned patterns.

The class taps of the pixel block of interest, obtained in the class tap extraction circuit 42, are supplied to the classification circuit 43. The classification circuit classifies the pixel blocks of interest, based on the class tap from the class tap extraction circuit 42, to output a class code corresponding to the so obtained class.

As a classification method, ADRC (adaptive dynamic range coding), for example, may be used.

With the method employing ADRC, the quantized DCT coefficients, forming the class tap, are processed with ADRC. The class of the pixel block of interest is determined based on the resultant ADRC code.

Meanwhile, in the K-bit ADRC, the maximum value MAX and the minimum value MIN of the quantized DCT coefficients forming the class taps are detected, and DR=MAX−MIN is rendered a local dynamic range DR of a set. Based on this dynamic range DR, the quantized DCT coefficients, forming the class tap, are re-quantized to K bits. That is, the minimum value MIN is subtracted from the quantized DCT coefficients, forming the class tap, with the value resulting from the subtraction being then divided by DR/2K (quantization). The sequence of bits, obtained on arraying, in a preset order, the respective quantized K-bit DCT coefficients, forming the class taps, is output as the ADRC code. Thus, if the class tap is processed e.g., with 1-bit ADRC, the minimum value MIN is subtracted from the respective quantized DCT coefficients, forming the class taps, and the resulting difference is then divided by a mean value of the maximum value MAX and the minimum value MIN, whereby the respective quantized DCT coefficients are made into one-bit form, that is binary-coded. These 1-bit quantized DCT coefficients are arrayed in a preset order to form a bit sequence which is output as ADRC code.

The classification circuit 43 may output a pattern of level distribution of the quantized DCT coefficients, forming e.g., the class taps, directly as class codes. If, in this case, the class taps are formed by N quantized DCT coefficients, and K bits are allocated to the respective quantized DCT coefficients, the number of the class codes output by the classification circuit 43 is $(2^N)^K$, which is an exorbitant figure exponentially proportionate to the number of bits K of the quantized DCT coefficients.

So, in the classification circuit 43, it is desirable to perform compression of the information of the class taps by the above-described ADRC processing or vector quantization, followed by classification.

Meanwhile, in the present embodiment, the class taps are formed by the 64 quantized DCT coefficients, as described above. Thus, if the classification is executed by 1-bit ADRC processing of the class taps, the number of the class codes is a large figure of $2^{64}$.

Meanwhile, in the present embodiment, the classification circuit 43 extracts characteristic values of high cruciality from the quantized DCT coefficients forming the class taps and undertakes classification based on these characteristic values to diminish the number of the classes.

That is, FIG. 7 shows an illustrative structure of the classification circuit 43 of FIG. 5.

The class taps are adapted to be supplied to a power calculating circuit 51. The power calculating circuit splits the quantized DCT coefficients forming the class tap into a plural number of spatial frequency bands and calculates the power values of the respective frequency bands.

Figure 8:
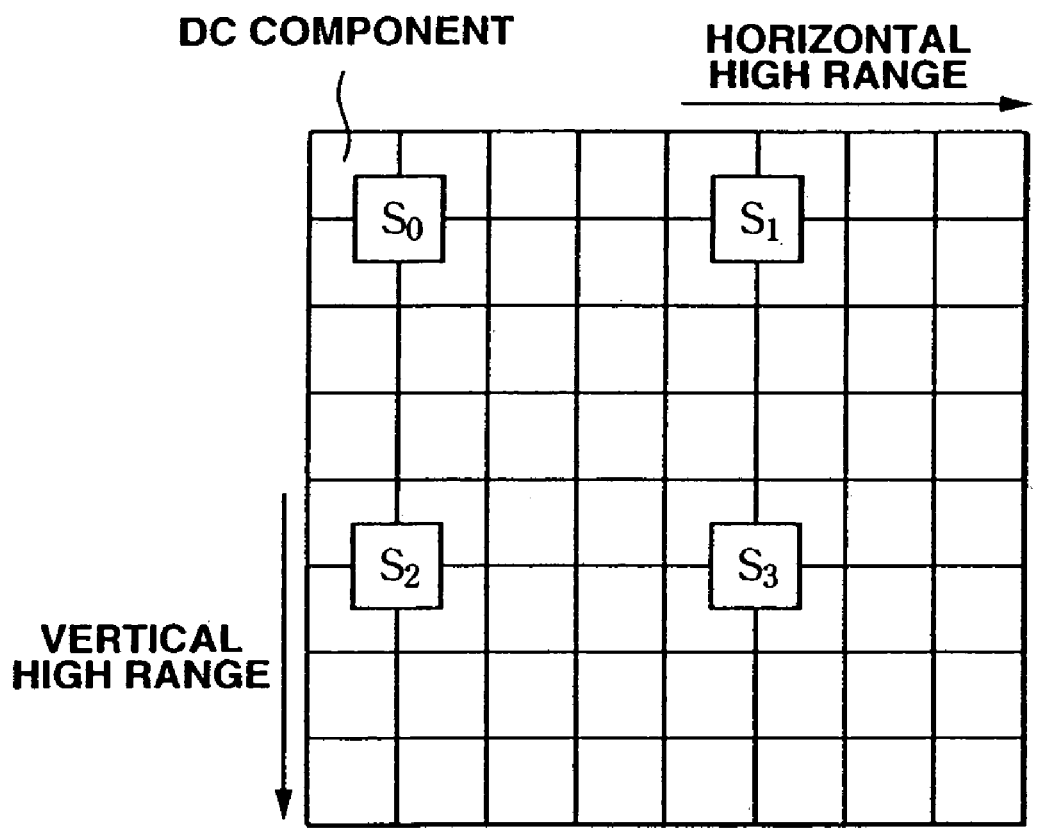
FIG. 8 illustrates the processing of a power calculation circuit in the coefficient conversion circuit.

That is, the power calculating circuit 51 splits the 8×8 quantized DCT coefficients, forming the class taps, into four spatial frequency bands $S_0$, $S_1$, $S_2$ and $S_3$, shown for example in FIG. 8.

If now the 8×8 quantized DCT coefficients making up the class tap are represented with sequential integral numbers from 0 in the raster scanning sequence, as shown in FIG. 6, the spatial frequency band $S_0$ is made up of four quantized DCT coefficients $x_0$, $x_1$, $x_8$, $x_9$, the spatial frequency band $S_0$ is made up of 12 quantized DCT coefficients $x_2$, $x_3$, $x_4$, $x_5$, $x_6$, $x_7$, $x_{10}$, $x_{11}$, $x_{12}$, $x_{13}$, $x_{14}$, $x_{15}$, the spatial frequency band $S_0$ is made up of 12 quantized DCT coefficients $x_{16}$, $x_{17}$, $x_{24}$, $x_{25}$, $x_{32}$, $x_{33}$, $x_{40}$, $x_{41}$, $x_{48}$, $x_{49}$, $x_{56}$, $x_{57}$ and the spatial frequency band $S_0$ is made up of 36 quantized DCT coefficients $x_{18}$, $x_{19}$, $x_{20}$, $x_{21}$, $x_{22}$, $x_{23}$, $x_{26}$, $x_{27}$, $x_{28}$, $x_{29}$, $x_{30}$, $x_{31}$, $x_{34}$, $x_{35}$, $x_{36}$, $x_{37}$, $x_{38}$, $x_{39}$, $x_{42}$, $x_{43}$, $x_{44}$, $x_{45}$, $x_{46}$, $x_{47}$, $x_{50}$, $x_{51}$, $x_{52}$, $x_{53}$, $x_{54}$, $x_{55}$, $x_{58}$, $x_{59}$, $x_{60}$, $x_{61}$, $x_{62}$, $x_{63}$.

Moreover, the power calculating circuit 51 calculates power values $P_0$, $P_1$, $P_2$ and $P_3$ of the AC components of the quantized DCT coefficients of the spatial frequency bands $S_0$ to S3 to output the so calculated power values $P_0$, $P_1$, $P_2$ and $P_3$ to a class code generating circuit 52.

That is, the power calculating circuit 51 finds a square sum value $x_1^2+x_8^2+x_9^2$ of the AC components $x_1$, $x_8$, $x_9$ of the four quantized DCT coefficients $x_0$, $x_1$, $x_8$, $x_9$ to output the resulting square sum to the class code generating circuit 52 as power $P_0$. The power calculating circuit 51 also finds a square sum of the AC components of the 12 quantized DCT coefficients for the spatial frequency band $S_1$, that is the totality of the 12 quantized DCT coefficients, to output the resulting square sum to the class code generating circuit 52 as power $P_1$. The power calculating circuit 51 also finds the power values $P_2$ and $P_3$ for the spatial frequency bands $S_2$ and $S_3$, as in the case of the spatial frequency band $S_1$, described above, to output the resulting power values to the class code generating circuit 52.

The class code generating circuit 52 compares the power values $P_0$ $P_1$, $P_2$ and $P_3$ from the power calculating circuit 51 to corresponding threshold values $TH_0$, $TH_1$, $TH_2$ and $TH_3$ stored in a threshold value storage unit 53 to output class codes based on the magnitude relationships thereof. That is, the class code generating circuit 52 compares the power $P_0$ to the threshold value $TH_0$ to produce a one-bit code representing the magnitude relationship. In similar manner, the class code generating circuit 52 compares the power $P_1$ to the threshold value $TH_1$, the power $P_2$ to the threshold value $TH_2$ and the power $P_3$ to the threshold value $TH_3$ to produce a one-bit code for each of the power-threshold value combinations. The class code generating circuit 52 outputs the four one-bit codes (thus any of values from 0 to 15), obtained as described above, in e.g., a preset sequence, as class codes representing the classes of the pixel blocks of interest. Thus, in the present embodiment, the pixel blocks of interest are classified into $2^4=16$ classes.

The threshold value storage unit 53 memorizes the threshold values $TH_0$ to $TH_3$ to be compared to the power values $P_0$ to $P_3$ of the spatial frequency bands $S_0$ to S3.

In the above case, the DC component $x_0$ of the quantized DCT coefficients is not used for classification. However, the DC component $x_0$ may also be used for classification.

Reverting to FIG. 5, the class codes, output by the classification circuit 43, as described above, are afforded as addresses to a coefficient table storage unit 44.

The coefficient table storage unit 44 memorizes a coefficient table, having registered therein tap coefficients obtained by learning processing, as will be explained subsequently, and outputs tap coefficients, stored in addresses associated with the class codes, output by the classification circuit 43, to the sum-of-products circuit 45.

In the present embodiment, since the pixel blocks are classified, one class code is obtained for the pixel block of interest. On the other hand, since the pixel block in the present embodiment is made up of 8×8=64 pixels, 64 sets of tap coefficients are required for decoding 64 pixels making up a pixel block of interest. Thus, the coefficient table storage unit 44 memorizes 64 sets of tap coefficients for an address corresponding to one class code.

The sum-of-products circuit 45 acquires the prediction taps output by the prediction tap extraction circuit 41 and the tap coefficients output by the coefficient table storage unit 44 and, using the prediction taps and the tap coefficients, executes linear predictive processing (sum of products processing) shown in the equation (1), to output the pixel values of the 8×8 pixels of the pixel block of interest as decoded results of the corresponding DCT block to the deblocking circuit 33 (FIG. 3).

In the prediction tap extraction circuit 41, each pixel of the pixel block of interest sequentially proves a pixel of interest. The sum-of-products circuit 45 then performs processing in an operating mode associated with the position of a pixel which is currently the pixel of interest of the pixel block of interest. This operating mode is incidentally referred to below as the pixel position mode.

That is, if a number i pixel of the pixels of the pixel block of interest, in the raster scanning sequence, is denoted $p_i$, with the pixel $p_i$ being the pixel of interest, the sum-of-products circuit 45 performs the processing of the pixel position mode #1.

Specifically, the coefficient table storage unit 44 outputs 64 sets of tap coefficients for decoding each of the 64 pixels making up a pixel block of interest. If the set of tap coefficients for decoding the pixel $p_i$ is denoted $W_i$, and the operating mode is the pixel position mode #1, the sum-of-products circuit 45 performs the sum of product processing of the equation (1), using the prediction taps and the set $W_i$, among the 64 sets of the tap coefficients, and renders the results of the sum of product processing the results of the decoding of the pixel $p_i$.

Figure 9:
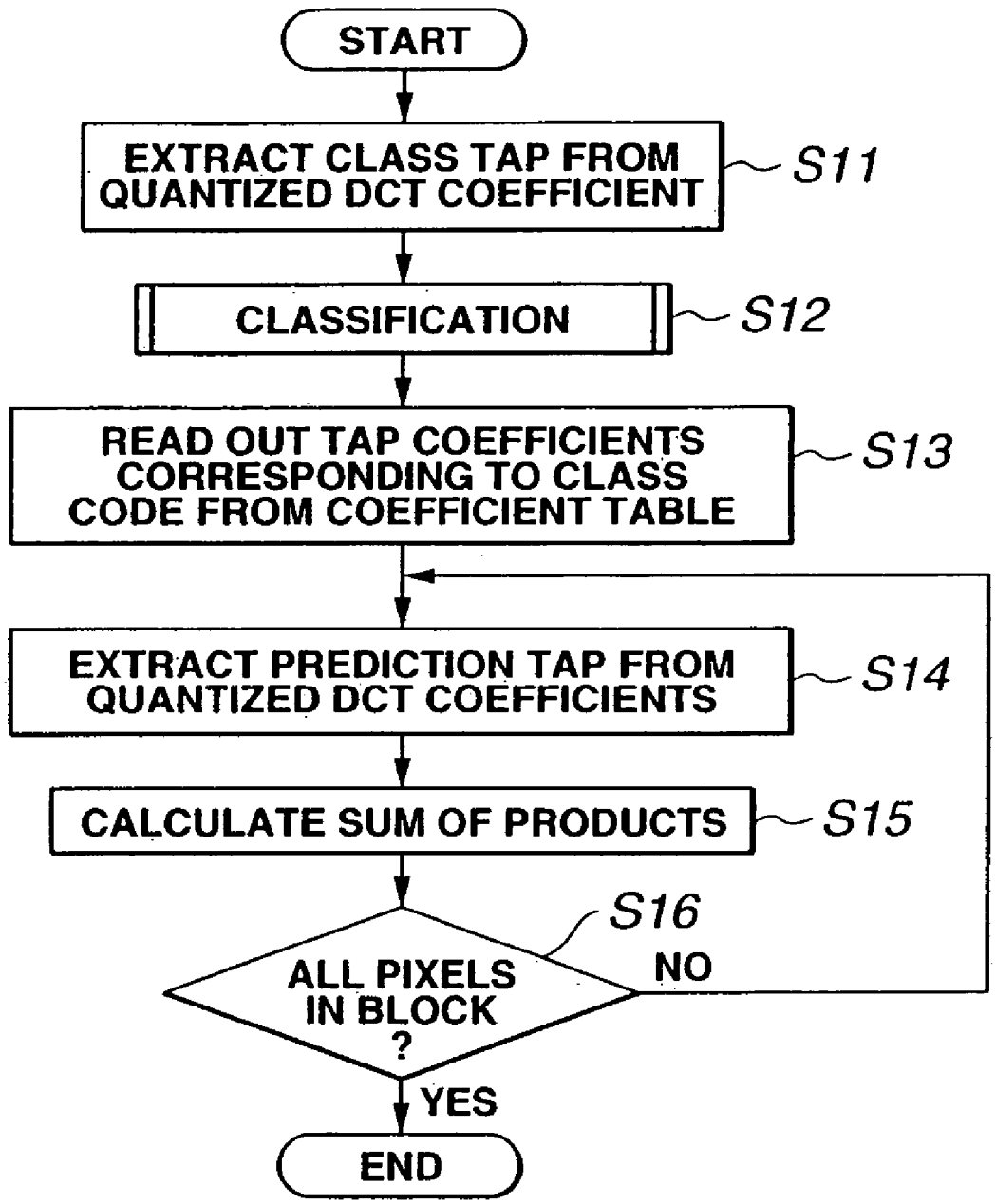
FIG. 9 is a flowchart for illustrating the processing in the coefficient conversion circuit.

Referring to the flowchart of FIG. 9, the processing of the coefficient conversion circuit 32A of FIG. 5 is explained.

The block-based DCT coefficients, output by the entropy decoding circuit 31, are sequentially received by the prediction tap extraction circuit 41 and by the class tap extraction circuit 42. The prediction tap extraction circuit 41 sequentially renders the pixel block, corresponding to the block of the quantized DCT coefficients (DCT block), supplied thereto, a pixel block of interest.

At step S11, the class tap extraction circuit 42 extracts the quantized DCT coefficients received and used for classifying the pixel block of interest, to form class taps, which then are output to the classification circuit 43.

At step S12, using the class taps from the class tap extraction circuit 42, the classification circuit 43 classifies the pixel blocks of interest to output the resulting class codes to the coefficient table storage unit 44.

Figure 10:
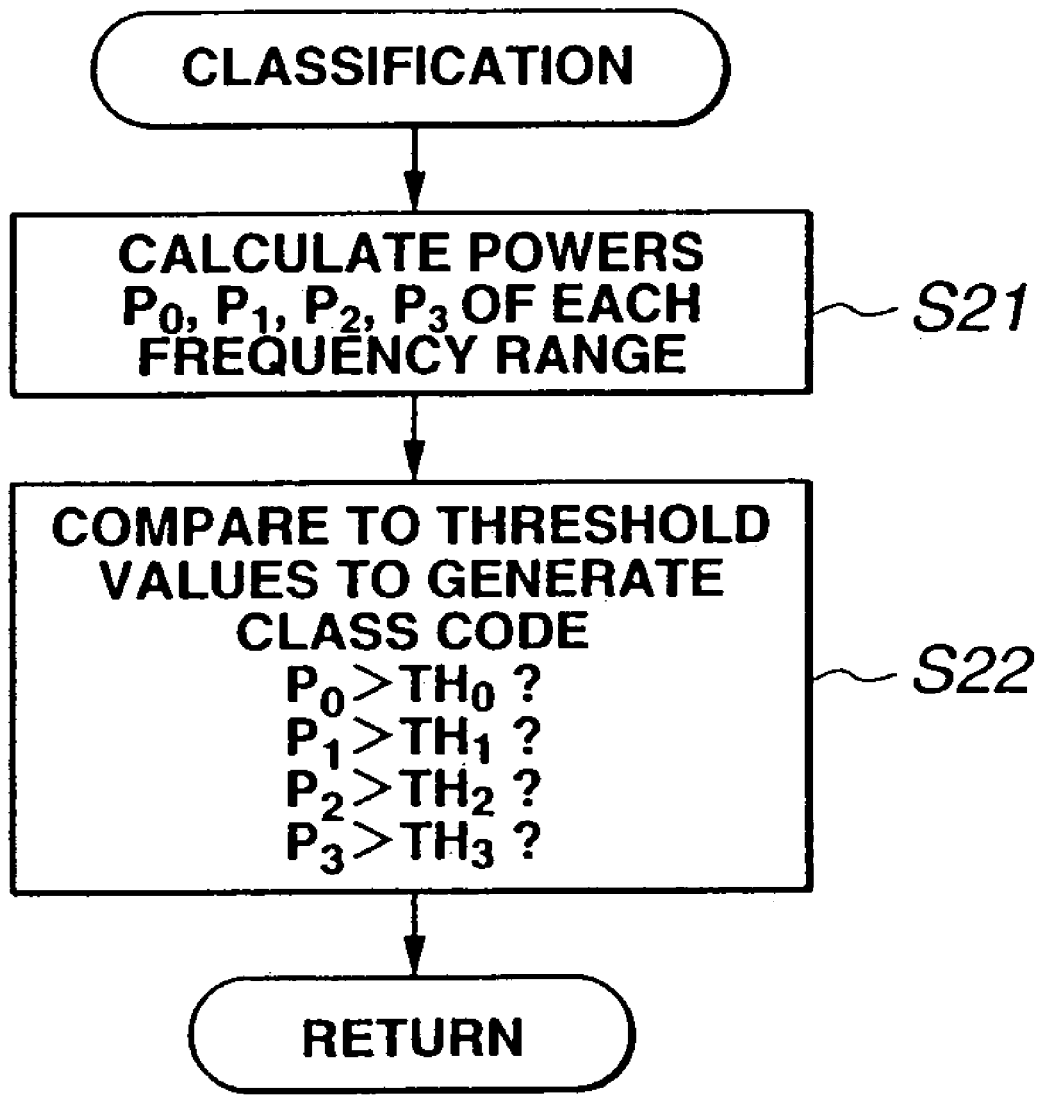
FIG. 10 is a flowchart for illustrating the processing in the coefficient conversion circuit in more detail.

That is, at step S12 in the flowchart of FIG. 10, the power calculating circuit 51 of the classification circuit 43 (FIG. 7)

splits, first at step S21, the 8×8 quantized DCT coefficients, making up the class taps, into four spatial frequency bands $S_0$ to $S_3$ to calculate the respective power values $P_0$ to $P_3$. These power values $P_0$ to $P_3$ are output from the power calculating circuit 51 to the class code generating circuit 52.

The class code generating circuit 52 at step S22 reads out the threshold values $TH_0$ to $TH_3$ to compare the power values $P_0$ to $P_3$ from the power calculating circuit 51 to the threshold values $TH_0$ to $TH_3$ to generate the class codes based on the respective magnitude relationships. The program return then is performed.

Reverting to FIG. 9, the class codes, obtained at step S12 as described above, is given from the classification circuit 43 to the coefficient table storage unit 44 as address.

On receipt of the class code from the classification circuit 43 as addresses, the coefficient table storage unit 44 at step S13 reads out the 64 sets of the tap coefficients stored in the address to output the tap coefficients so read out to the sum-of-products circuit 45.

The program then moves to step S14 where the prediction tap extraction circuit 41 extracts quantized DCT coefficients used for predicting the pixel values of the pixels of interest of the pixel block of interest not as yet rendered the pixels of interest in the raster scanning sequence to form prediction taps. These prediction taps are sent from the prediction tap extraction circuit 41 to the sum-of-products circuit 45.

In the present embodiment, since the same prediction tap is formed for the totality of the pixels of the pixel block, from one pixel block to another, it is sufficient if the processing of step S14 is performed only for the pixel initially rendered a pixel of interest, while it is unnecessary to perform the processing for the remaining 63 pixels.

At step S15, the sum-of-products circuit 45 acquires a set of tap coefficients corresponding to the pixel position mode for the pixel of interest, from among the 64 sets of the tap coefficients output at step S13 from the coefficient table storage unit 44 and, using the set of the tap coefficients and the prediction taps supplied from the prediction tap extraction circuit 41, the sum-of-products circuit 45 executes the sum of product processing, shown in the equation (1), to acquire a value of the decoded pixel of interest.

The program then moves to step S16 where the prediction tap extraction circuit 41 verifies whether or not the processing has been executed with the totality of the pixels of the pixel block of interest as the pixels of interest. If it is verified at step S16 that the processed has not been executed with the totality of the pixels of the pixel block of interest as the pixels of interest, the program reverts to step S14 where the prediction tap extraction circuit 41 repeats similar processing with the pixels of the pixel block of interest not as yet rendered the pixels of interest in the raster scanning sequence as the pixels of interest.

If it is verified at step S16 that the processing has been done with the totality of the pixels of the pixel block of interest as the pixels of interest, that is if the decoded values of the totality of the pixels of the pixel block of interest have been acquired, the sum-of-products circuit 45 outputs the pixel block (decoded block) made up of the decoded values to the deblocking circuit 33 (FIG. 3) to finish the processing.

Meanwhile, the processing conforming to the flowchart of FIG. 9 is executed repeatedly each time the prediction tap extraction circuit 41 sets a new pixel block of interest.

Figure 11:
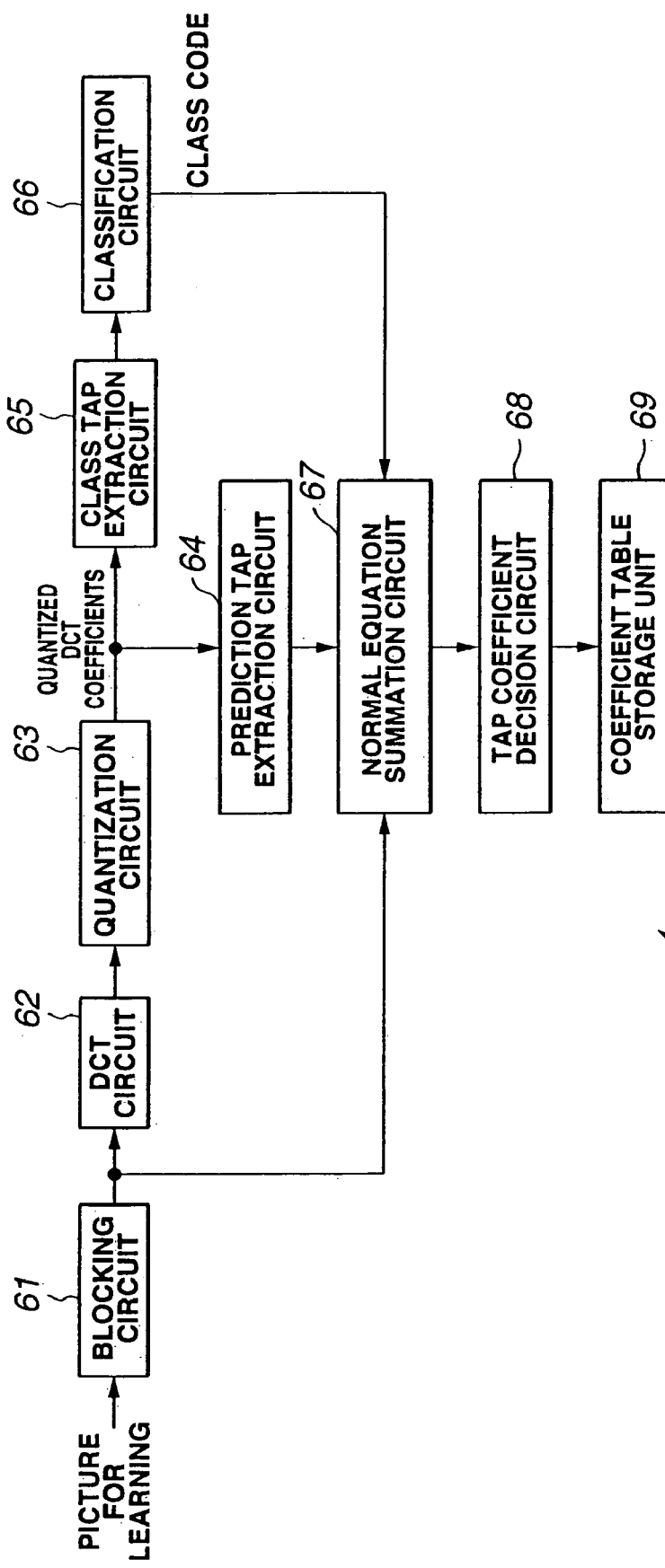
FIG. 11 is a block diagram showing an illustrative structure of a leaning device used for learning the tap coefficients in the coefficient conversion circuit.

FIG. 11 shows an illustrative structure of a learning device 60A executing the learning processing for tap coefficients to be stored in the coefficient table storage unit 44 of FIG. 5.

A blocking circuit 61 is fed with one or more pictures of learning picture data as teacher data serving as a teacher at the time of learning. The blocking circuit 61 blocks a picture as teacher data into pixel blocks each composed of 8×8 pixels as in the case of the JPEG encoding.

A DCT circuit 62 sequentially reads out pixel blocks, formed by the blocking circuit 61, as pixel blocks of interest, and applies DCT processing to the pixel blocks of interest to render the pixel block of interest a block of DCT coefficients. This block of DCT coefficients is routed to a quantization circuit 63.

The quantization circuit 63 quantizes the blocks of the DCT coefficients from the DCT circuit 62 in accordance with the same quantization table as that used in JPEG encoding, and sequentially sends the resulting blocks of the quantized DCT coefficients (DCT blocks) to the prediction tap extraction circuit 64 and to the class tap extraction circuit 42.

The prediction tap extraction circuit 64 forms the same prediction taps as those formed by the prediction tap extraction circuit 41 of FIG. 5, for the pixel of interest among the pixels of the pixel block of interest which is as yet not rendered the pixel of interest, in the raster scanning sequence, by extracting the needed quantized DCT coefficients from the output of the quantization circuit 63. These prediction taps are sent as pupil data as pupils for learning from the prediction tap extraction circuit 64 to the normal equation summation circuit 67.

The class tap extraction circuit 65 forms the same class tap as that formed by the class tap extraction circuit 42 of FIG. 5, by extracting the needed quantized DCT coefficients from the output of the quantization circuit 63. This class tap is sent from the class tap extraction circuit 65 to the classification circuit 66.

Using the class tap from the class tap extraction circuit 65, the classification circuit 66 performs the same processing as that of the classification circuit 43 of FIG. 5 to classify the pixel blocks of interest to route the resulting class codes to a normal equation summation circuit 67.

The normal equation summation circuit 67 reads out a pixel value of the pixel of interest as teacher data from the prediction tap extraction circuit 64 and effects summation processing on the quantized DCT coefficients forming prediction taps as pupil data and on the pixel of interest.

That is, the normal equation summation circuit 67 executes calculations corresponding to multiplication $(x_{in}x_{im})$ and summation $\Sigma$ of pupil data to pupil data, as respective components of the matrix A of the equation 8, using prediction taps (pupil data) from one class corresponding to the class code supplied from the classification circuit 66 to another.

The normal equation summation circuit 67 also executes calculations corresponding to multiplication $(x_{in}y_i)$ and summation $\Sigma$ of prediction taps (pupil data), and the pixel of interest (teacher data), as components of the vector v of equation (8), using the prediction taps (pupil data) and the pixel of interest (teacher data), from one class corresponding to the class code supplied from the classification circuit 66 to another.

The aforementioned summation in the normal equation summation circuit 67 is performed for each class from one pixel position mode for the pixel of interest to another.

The normal equation summation circuit 67 executes the above-described summation, with the totality of the pixels making up the teacher picture supplied to the blocking circuit 61 as pixels of interest, whereby a normal equation shown in the equation (8) is established for each pixel position mode for each class.

A tap coefficient decision circuit 68 solves the normal equation, generated for each class, from one pixel position mode to another, in the normal equation summation circuit 67, to find 64 sets of the tap coefficients, from class to class, to send the tap coefficients thus found to the addresses corresponding to the respective classes of a coefficient table storage unit 69.

Depending on the number of pictures provided as pictures for learning, or on the picture contents, it may be an occurrence that a class is produced in which the number of the normal equations necessary to find the tap coefficients cannot be obtained. For such class, the tap coefficient decision circuit 68 outputs e.g., default tap coefficients.

The coefficient table storage unit 69 memorizes 64 sets of the tap coefficients for each class supplied thereto from the tap coefficient decision circuit 68.

Figure 12:
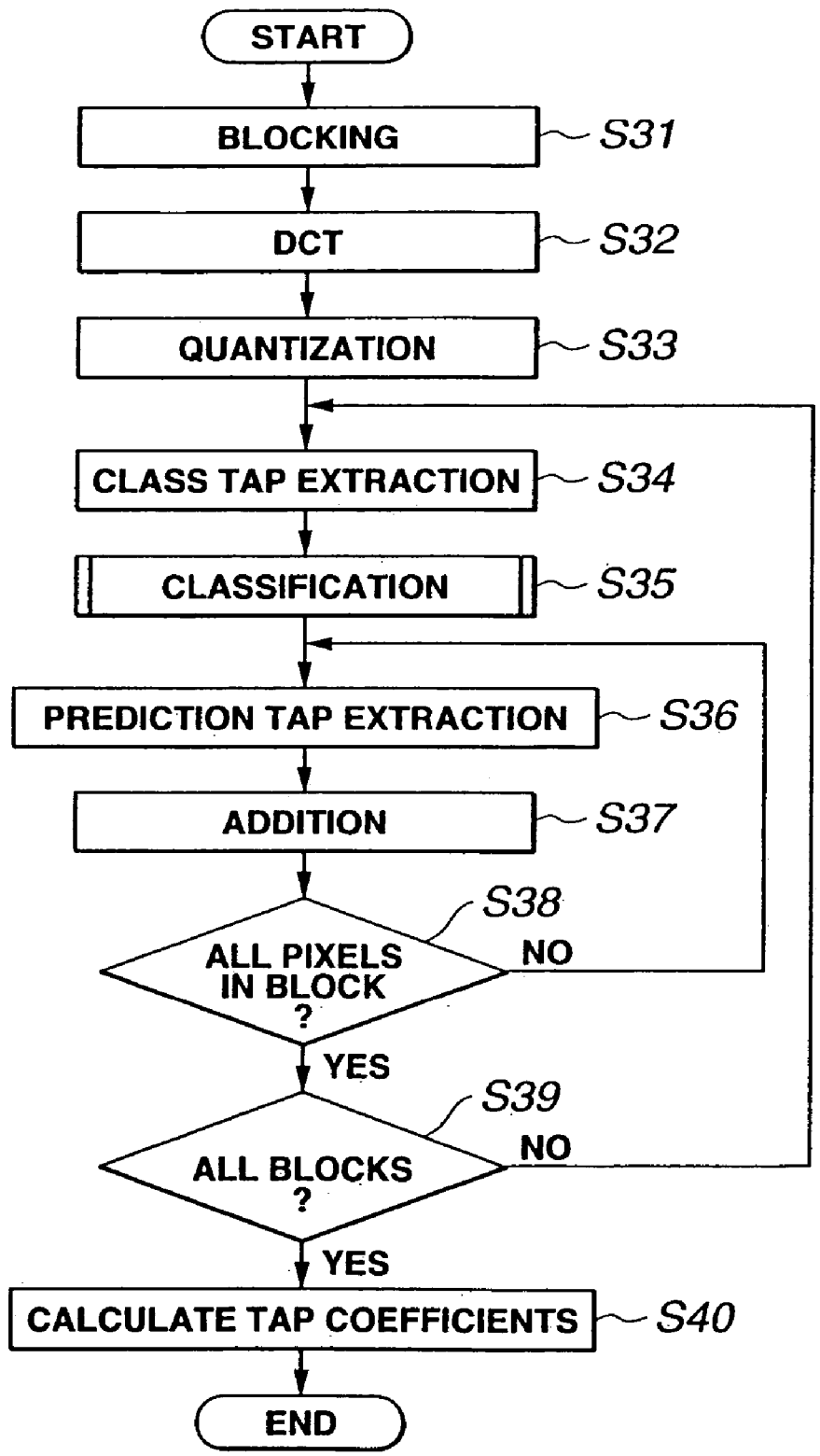
FIG. 12 is a flowchart for illustrating the processing of the leaning device.

Referring now to the flowchart of FIG. 12, the processing (learning processing) of a learning device 60A of FIG. 11 is explained.

The blocking circuit 61, fed with picture data for learning as teacher data, blocks the picture data as teacher data into an 8×8 pixel block, as in the case of JPEG encoding. The program then moves to step S32 where the DCT circuit 62 sequentially reads out the pixel blocks, formed by the blocking circuit 61, and applies DCT processing to the pixel block of interest to render the pixel block a block of DCT coefficients. The program then moves to step S33 where the quantization circuit 63 sequentially reads out the blocks of the DCT coefficients obtained for JPEG encoding to form blocks each made up of quantized DCT coefficients (DCT block).

The program then moves to step S34 where the class tap extraction circuit 65 makes the pixel blocks blocked by the blocking circuit 61 and which are not as yet rendered pixel blocks of interest into pixel blocks of interest. The class tap extraction circuit 65 also extracts the quantized DCT coefficients used for classifying the pixel blocks of interest from the DCT block obtained at the quantization circuit 63 to form a class tap which is routed to the classification circuit 66. As in the case explained with reference to the flowchart of FIG. 10, the classification circuit 66 at step S35 classifies the pixel blocks of interest, using the class tap from the class tap extraction circuit 65, and routes the resulting class codes to the normal equation summation circuit 67. The program then moves to step S36.

At step S36, the prediction tap extraction circuit 64 makes the pixels of the pixel block of interest which have not been made into the pixels of interest, in the raster scanning sequence, into pixels of interest, and extracts the needed quantized DCT coefficients from the output of the quantization circuit 63 to form the same prediction taps as those formed by the prediction tap extraction circuit 41 of FIG. 5. The prediction tap extraction circuit 64 sends prediction taps for the pixels of interest as pupil data to the normal equation summation circuit 67. The program then moves to step S37.

At step S37, the normal equation summation circuit 67 reads out pixels of interest, as teacher data, from the blocking circuit 61, and executes the processing of summation of the matrix A of the equation 8 and the vector v, as described above, on the quantized DCT coefficients forming the prediction tap as pupil data and pixels of interest as teacher data. This summation is executed for each of the classes corresponding to the class codes from the classification circuit classification circuit 66 for each of the pixel position modes for the pixels of interest.

The program then moves to step S38 where the prediction tap extraction circuit 64 verifies whether or not the summation has been done with the totality of the pixels of the pixel block of interest as the pixels of interest. If summation has not been done for the totality of the pixels of the pixel block of interest as the pixels of interest, the program reverts to step S36 where the prediction tap extraction circuit 64 makes the pixels of the pixel block of interest not as yet rendered the pixels of interest in the raster scanning sequence into new pixels of interest. The above-described processing is repeated.

If it is verified at step S38 that the summation has been done with the totality of the pixels of the pixel block of interest as the pixels of interest, the program moves to step S39 where the blocking circuit 61 verifies whether or not the processing has been done with the totality of the pixel blocks obtained form the picture as teacher data as the pixel blocks of interest. If it is verified at step S39 that the totality of the pixel blocks obtained from the picture as the teacher data have not been processed as yet as the pixel blocks of interest, the program reverts to step S34 where the pixel blocks formed by the blocking circuit 61 and which have as yet not been made into the pixel blocks of interest are newly rendered the pixel blocks of interest. Then, similar processing is carried out repeatedly.

If it is verified at step S39 that the totality of the pixel blocks obtained from the picture as teacher data have been processed as the pixel blocks of interest, that is if a normal equation for each pixel position mode has been obtained in the normal equation summation circuit 67 for each class, the program then moves to step S40 where the tap coefficient decision circuit 68 solves the normal equation generated from one pixel position mode of each class to another to find 64 sets of tap coefficients for each of respective 64 pixel position modes of each class to route the tap coefficients thus found to the address for each class of the coefficient table storage unit 69 for storage therein. The program then comes to a close.

As described above, the tap coefficients for the respective classes, stored in the coefficient table storage unit 69, are stored in the coefficient table storage unit 44 of FIG. 5.

So, the tap coefficients stored in the coefficient table storage unit 44 have been found by effecting learning so that the prediction errors (herein the square errors) of the predicted values of the original pixel values, obtained on linear prediction calculations, will be statistically minimum. The result is that, with the coefficient conversion circuit 32A of FIG. 5, a JPEG encoded picture can be decoded to a picture limitlessly proximate to the original picture.

Moreover, since the processing of decoding the JPEG encoded picture and the processing for improving the picture quality are carried out simultaneously, a decoded picture of high picture quality can be efficiently produced from the JPEG encoded picture.

Figure 13:
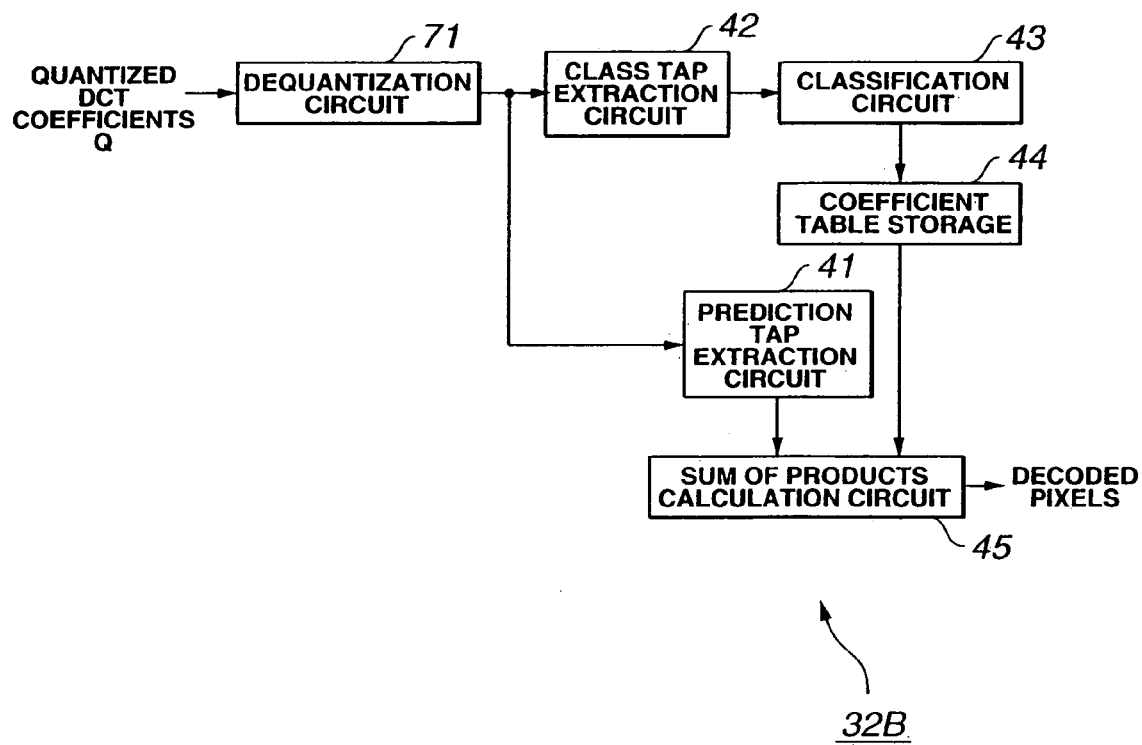
FIG. 13 is a block diagram showing an illustrative structure of the coefficient conversion circuit.

FIG. 13 shows another illustrative structure of the coefficient conversion circuit 32 of FIG. 3. Meanwhile, parts or components similar to those shown in FIG. 5 are depicted by the same reference numerals That is, coefficient conversion circuit 32B shown in FIG. 13 is basically constructed similarly to the circuit shown in FIG. 5 except that there is newly provided a dequantization circuit 71.

In the coefficient conversion circuit 32B, shown in FIG. 13, the dequantization circuit 71 is fed with block-based quantized DCT coefficients, obtained on entropy decoding the encoded data in the entropy decoding circuit 31 (FIG. 3).

Meanwhile, in the entropy decoding circuit 31, not only the quantized DCT coefficients but also the quantization table is obtained form the encoded data. In the coefficient conversion circuit 32B of FIG. 13, this quantization table is supplied from the entropy decoding circuit 31 to the dequantization circuit 71.

The dequantization circuit 71 dequantizes the quantized DCT coefficients from the entropy decoding circuit 31 to send the resulting DCT coefficients to the prediction tap extraction circuit 41 and to the class tap extraction circuit 42.

Thus, in the prediction tap extraction circuit 41 and in the class tap extraction circuit 42, the prediction taps and the class taps are formed for the DCT coefficients instead of for the quantized DCT coefficients. The processing similar to that shown in FIG. 5 is subsequently performed on the DCT coefficients.

Thus, the coefficient conversion circuit 32B of FIG. 13 performs processing not on the quantized DCT coefficients but on the DCT coefficients, so that it is necessary for the tap coefficients stored in the coefficient table storage unit 44 to be different from those shown in FIG. 5.

Figure 14:
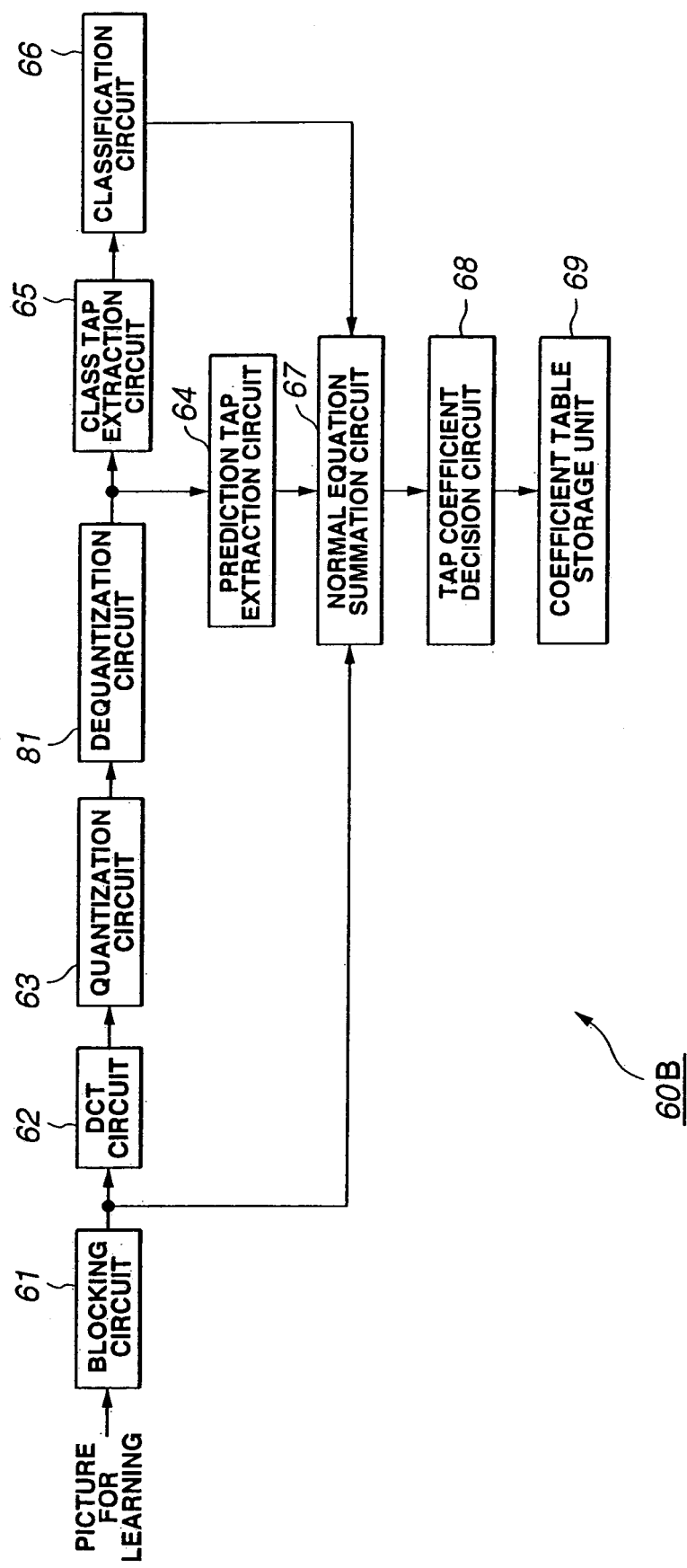
FIG. 14 is a block diagram showing an illustrative structure of the learning device.

FIG. 14 shows another illustrative structure of a learning device 60B adapted for learning the tap coefficients stored in the coefficient table storage unit 44 of FIG. 13. The parts or components of FIG. 14 corresponding to those shown in FIG. 11 are indicated by the same reference numerals and the corresponding explanation is sometimes omitted for clarity. That is, the learning device 60B shown in FIG. 14 is basically configured similarly to the circuit shown in FIG. 11 except that a dequantization circuit 81 is newly provided at back of the quantization circuit 63.

In the learning device 60B of FIG. 14, similarly to the dequantization circuit 71 of FIG. 13, the dequantization circuit 81 dequantizes the quantized DCT coefficients, output by the dequantization circuit 63. The resulting DCT coefficients are routed to the prediction tap extraction circuit 64 and to the class tap extraction circuit 65.

Thus, in the prediction tap extraction circuit 64 class tap extraction circuit 65, not the quantized DCT coefficients but the prediction taps and class taps are formed for the DCT coefficients. Subsequently, processing similar to that shown in FIG. 11 is performed on the DCT coefficients.

The result is that there are produced tap coefficients that diminish the effect of the quantization error resulting from quantization and dequantization of the DCT coefficients.

Figure 15:
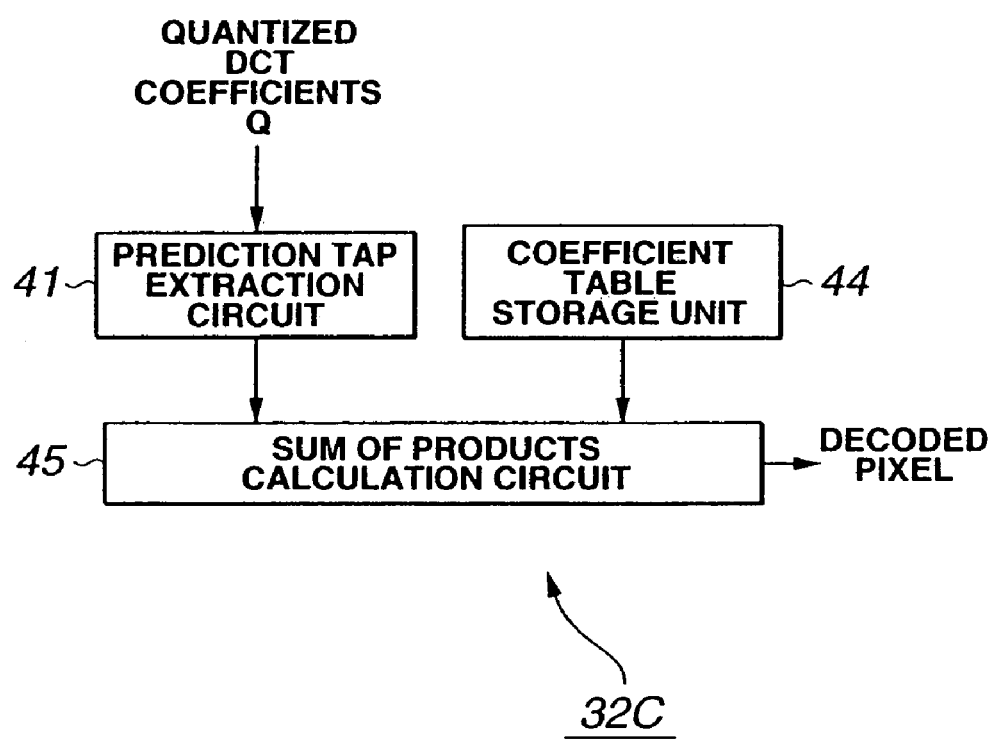
FIG. 15 is a block diagram showing another illustrative structure of the coefficient conversion circuit.

FIG. 15 shows a modified illustrative structure of the coefficient conversion circuit 32 of FIG. 3. The parts or components of FIG. 15 corresponding to those shown in FIG. 5 are indicated by the same reference numerals and the corresponding explanation is sometimes omitted for clarity. That is, the coefficient conversion circuit 32C shown in FIG. 13 is basically configured similarly to the circuit shown in FIG. 5 except that it is destitute of the class tap extraction circuit 42 and the classification circuit 43.

So, the coefficient conversion circuit 32C shown in FIG. 15 lacks in the concept of the class, which may be said to be equivalent to the number of the classes being one. Thus, only one class of the tap coefficients is stored in the coefficient table storage unit 44 such that processing is executed using this one class of the tap coefficients.

That is, in the coefficient conversion circuit 32C of FIG. 15, the tap coefficients memorized in the coefficient table storage unit 44 differ from those shown in FIG. 5.

Figure 16:
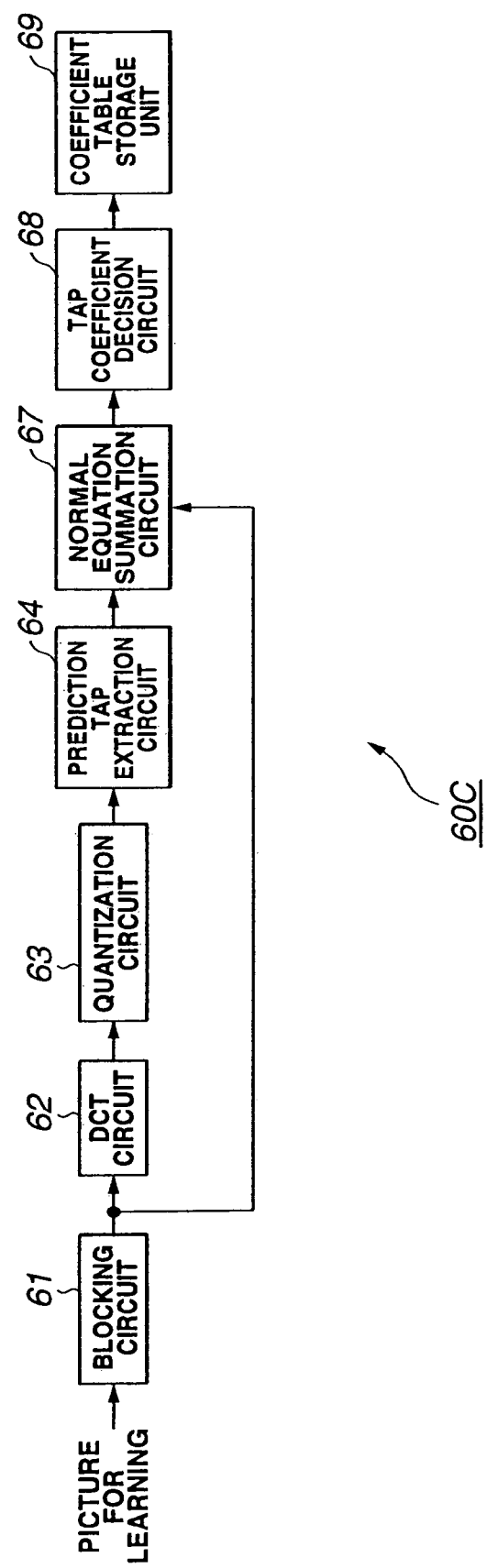
FIG. 16 is a block diagram showing still another illustrative structure of the learning device.

FIG. 16 shows an illustrative structure of the learning device 60C adapted for executing the processing of learning the tap coefficients to be stored in the coefficient table storage unit 44 of FIG. 15. Meanwhile, the parts or components of FIG. 16 corresponding to those shown in FIG. 11 are indicated by the same reference numerals and the corresponding explanation is sometimes omitted for clarity.

That is, the coefficient conversion circuit 60C shown in FIG. 16 is basically configured similarly to the circuit shown in FIG. 11 except that it is destitute of the class tap extraction circuit 65 and the classification circuit 66.

Thus, in the learning device 60C of FIG. 16, the above-described summation is carried out without dependency on the class in the normal equation summation circuit 67. The tap coefficient decision circuit 68 solves the normal equations generated from one pixel position mode to another to find the tap coefficients.

Figure 17:
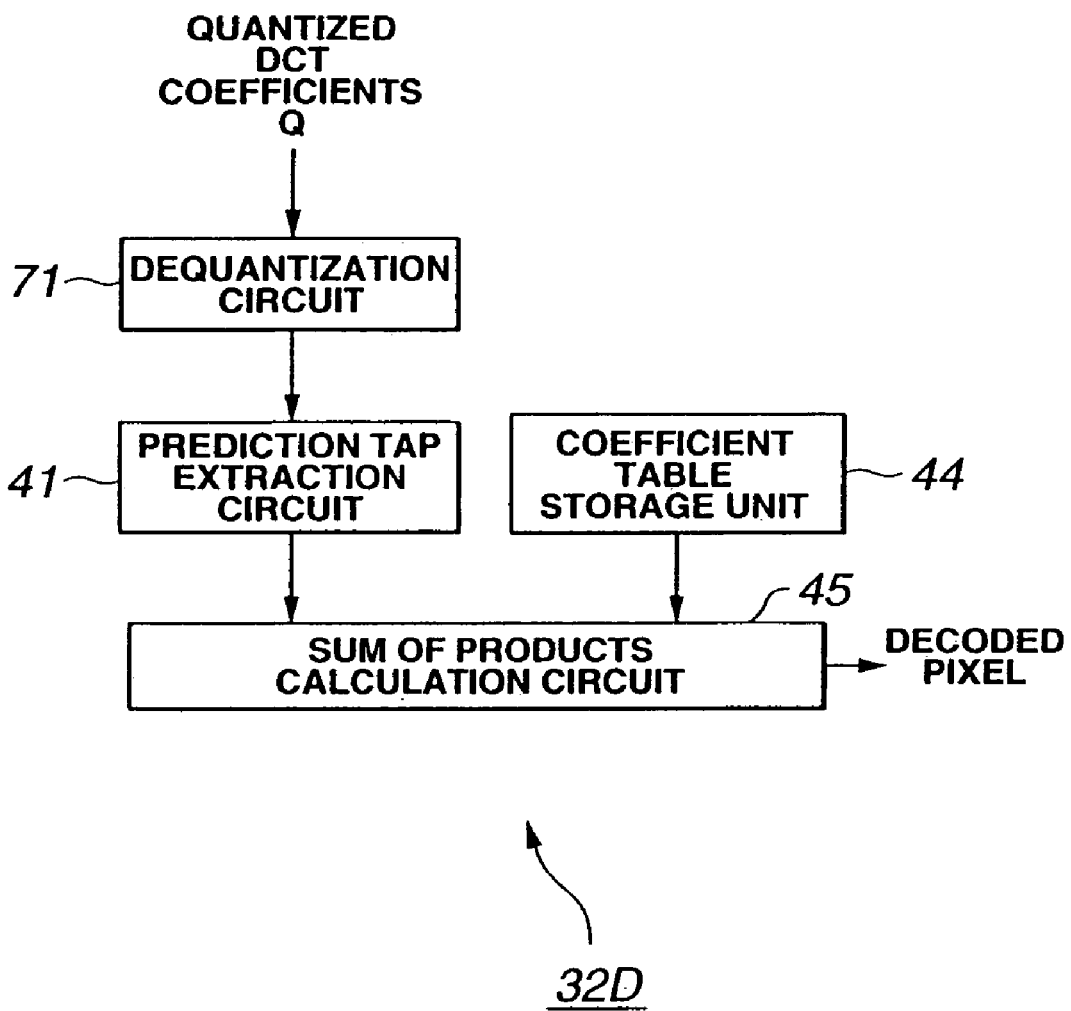
FIG. 17 is a block diagram showing still another illustrative structure of the coefficient conversion circuit.

FIG. 17 shows another illustrative structure of the coefficient conversion circuit 32 of FIG. 3. Meanwhile, the parts or components of FIG. 17 corresponding to those shown in FIG. 5 or 13 are indicated by the same reference numerals and the corresponding explanation is sometimes omitted for clarity. That is, the coefficient conversion circuit 32D shown in FIG. 17 is basically configured similarly to the circuit shown in FIG. 5 except that it is destitute of the class tap extraction circuit 42 and the classification circuit 43 and that there is newly provided the dequantization circuit 71.

Thus, similarly to the coefficient conversion circuit 32C of FIG. 15, the coefficient conversion circuit 32D of FIG. 17 memorizes only the class coefficients of one class and processing is carried out using these one-class tap coefficients.

Moreover, in the coefficient conversion circuit 32D of FIG. 17, prediction taps are formed not on the quantized DCT coefficients but on the DCT coefficients output by the dequantization circuit 71, as in the coefficient conversion circuit 32B of FIG. 13. Subsequently, processing is further performed on the DCT coefficients.

Thus, in the coefficient conversion circuit 32D, shown in FIG. 17, the tap coefficients stored in the coefficient table storage unit 44 differ from those shown in FIG. 5.

Figure 18:
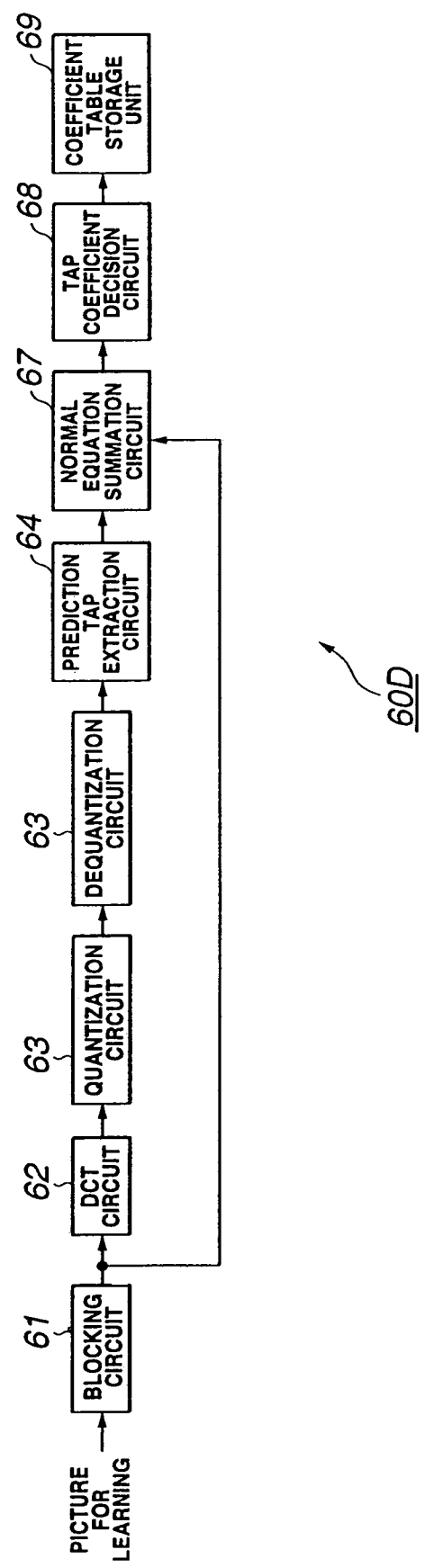
FIG. 18 is a block diagram showing still another illustrative structure of the learning device.

Thus, FIG. 18 shows an illustrative structure of a learning device 60D executing the learning processing of tap coefficients to be stored in the coefficient table storage unit 44 of FIG. 17. Meanwhile, the parts or components of FIG. 18 corresponding to those shown in FIG. 11 or 14 are indicated by the same reference numerals and the corresponding explanation is sometimes omitted for clarity. That is, the learning device 60D shown in FIG. 18 is basically configured similarly to the learning device shown in FIG. 18 except that it is destitute of the class tap extraction circuit 65 and the classification circuit 66 and that there is newly provided the dequantization circuit 81.

Thus, in the learning device 60D, shown in FIG. 18, prediction taps are formed in the prediction tap extraction circuit 64 for the DCT coefficients, instead of for the quantized DCT coefficients. Subsequently, processing is further performed on the DCT coefficients. Moreover, the normal equation summation circuit 67 executes the aforementioned summation without dependency on the class, such that the tap coefficient decision circuit 68 solves the normal equations generated without dependency on the class to find the tap coefficients.

Although the foregoing description has been made in connection with the image produced on JPEG encoding designed for compression encoding a still image, it is also possible to process e.g., a picture obtained on MPEG encoding.

Figure 19:
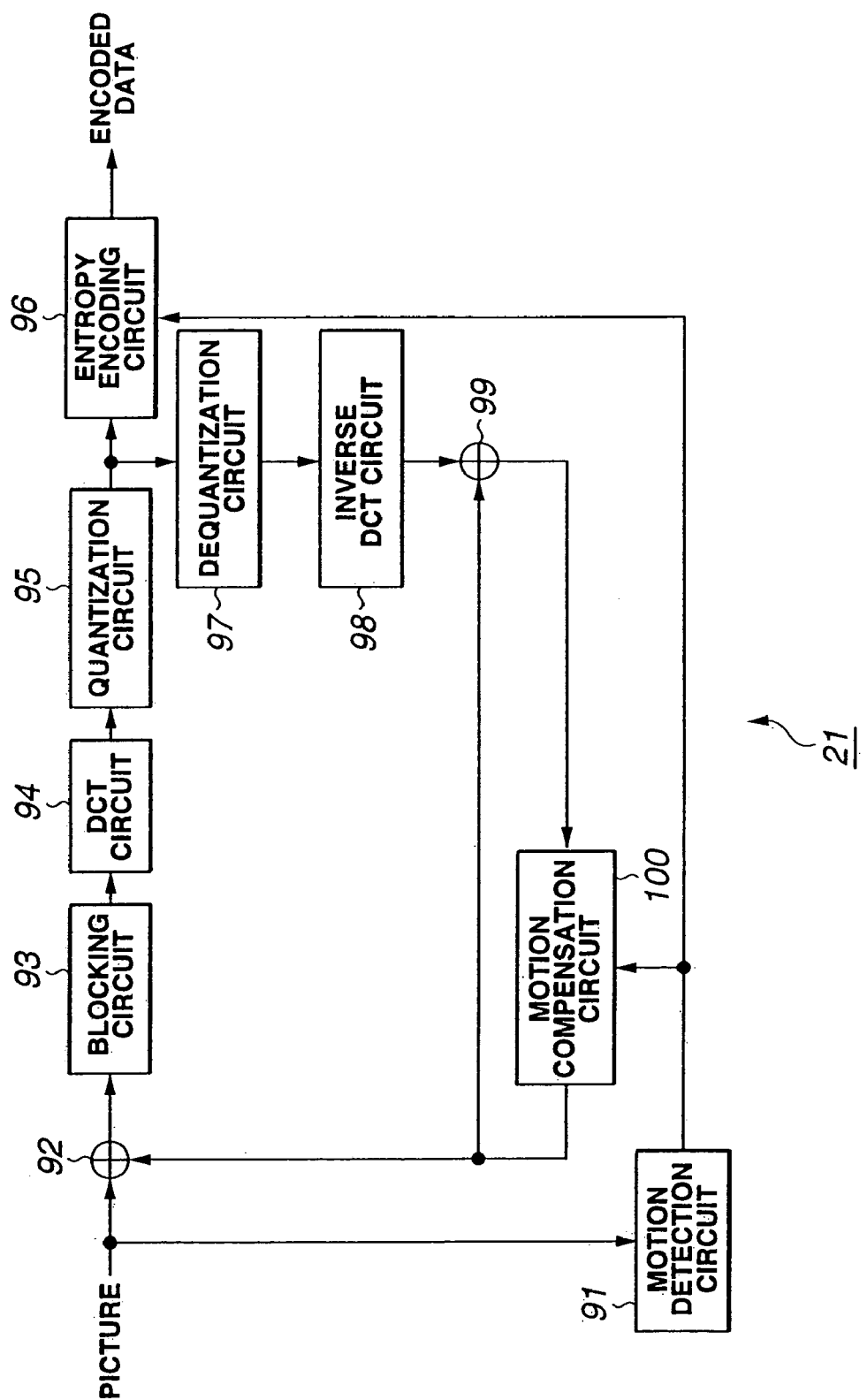
FIG. 19 is a block diagram showing an illustrative structure of an encoder in the picture transmission system.

That is, FIG. 19 shows an illustrative structure of the encoder 21 when MPEG encoding is performed.

In the encoder 21, shown in FIG. 19, the frames or the fields, making up a moving picture to be encoded by MPEG, are sequentially sent to a motion detection circuit 91 and to a calculating unit 92.

The motion detection circuit 91 detects the motion vector for the frame supplied thereto, on the macro-block basis, to send the so detected motion vector to an entropy decoding circuit 96 and to a motion compensation circuit 100.

If the picture supplied to the calculating unit 92 is an I-picture (intra-picture), the calculating unit 92 directly routes it on the macro-block basis to the blocking circuit 93. If the picture supplied to the calculating unit 92 is a P-picture (predictive coded picture) or a B-picture (bidirectionally predicted picture), the calculating unit 92 calculates a difference from the reference picture supplied from the motion compensation circuit 100 to route the difference value to the blocking circuit 93.

The blocking circuit 93 blocks an output of the calculating unit 92 into a block of 8×8 pixels, which is supplied to a DCT circuit 94. The DCT circuit 94 applies DCT processing to the pixel block from the blocking circuit 93 to route the resulting DCT coefficients to a quantization circuit 95. The quantization circuit 95 quantizes the resulting block-based DCT coefficients in a preset quantization step to route the resulting quantized DCT coefficients to the entropy decoding circuit 96. The entropy decoding circuit 96 entropy-encodes the quantized DCT coefficients from the quantization circuit 95 to add the motion vector from the motion detection circuit 91 and other similar needed information to output the resulting encoded data as MPEG encoded data.

Of the quantized DCT coefficients, output by the quantization circuit 95, the I- and P-pictures need to be locally decoded for use as reference picture for subsequently encoded P- and B-Pictures. So, these pictures are routed not only to the entropy decoding circuit 96 but also to the dequantization circuit 97.

The dequantization circuit 97 dequantizes the quantized DCT coefficients from the quantization circuit 95 into DCT coefficients which are routed to an inverse DCT circuit 98. The inverse DCT circuit 98 applies inverse DCT to the DCT coefficients from the dequantization circuit 97 to output the result to a calculating unit 99. This calculating unit 99 is fed not only with the output of the inverse DCT circuit 98 but also with a reference picture output by the motion compensation circuit 100. If the output of the inverse DCT circuit 98 is a P-picture, the calculating unit 99 adds the output to an output of the motion compensation circuit 100 to decode the original picture which is supplied to the motion compensation circuit 100. If the output of the inverse DCT circuit 98 is an I-picture, the output is the decoded I-picture, it is directly supplied to the motion compensation circuit 100.

The motion compensation circuit 100 motion-compensates a locally decoded picture, supplied from the calculating unit 99, in accordance with the motion vector from the motion detection circuit 91, to route the motion-compensated picture as reference picture to the calculating unit 92 and to the calculating unit 99.

Figure 20:
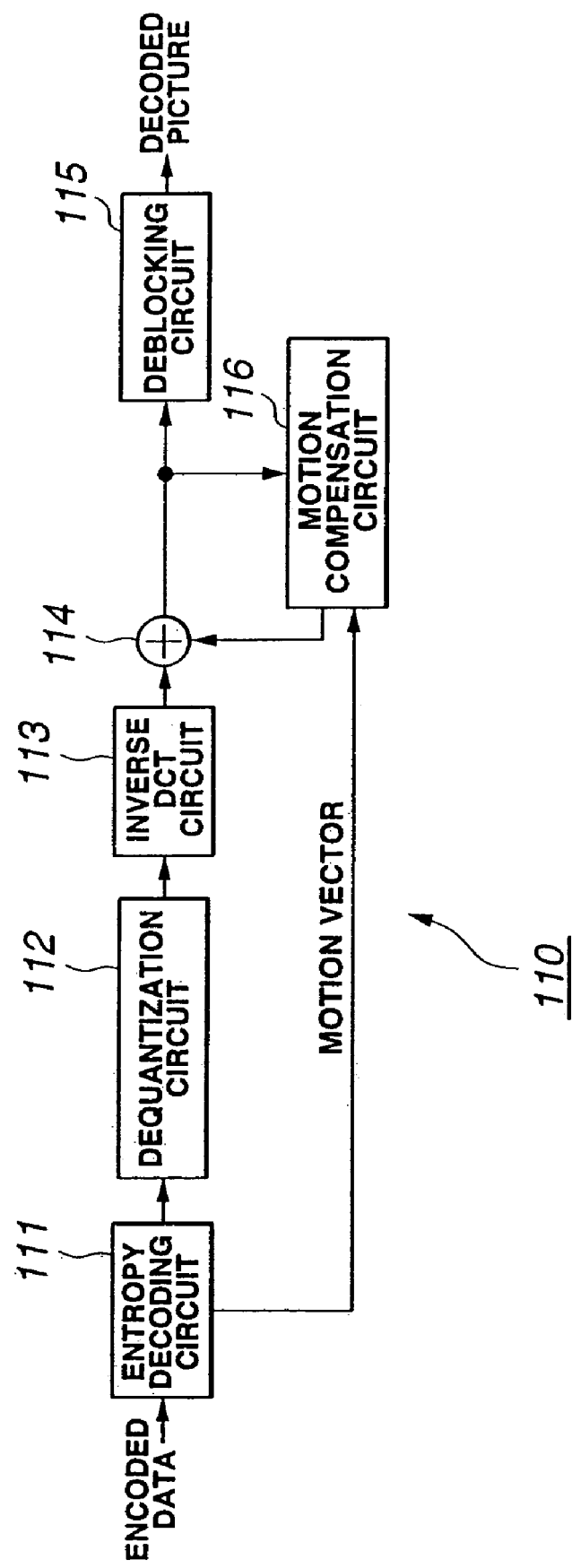
FIG. 20 is a block diagram showing an illustrative structure of an MPEG decoder.

FIG. 20 shows an illustrative structure of an MPEG decoder 110 for decoding encoded data obtained by the above-described MPEG encoding.

In this MPEG decoder 110, the encoded data are sent to an entropy decoding circuit 111. This entropy decoding circuit 111 entropy-decodes the encoded data to produce quantized DCT coefficients, motion vector and other information. The quantized DCT coefficients are sent to a dequantization circuit 112, whilst the motion vector is routed to a motion compensation circuit 116.

The dequantization circuit 112 dequantizes the quantized DCT coefficients from the entropy decoding circuit 111 to form DCT coefficients which are supplied to an inverse DCT circuit 113.

The inverse DCT circuit 113 applies inverse DCT to the quantized DCT coefficients from the dequantization circuit 112 which are routed to a calculating unit 114. The calculating unit 114 is fed with both the output of the inverse DCT circuit 113 and with an output of the motion compensation circuit 116, as a reference picture, which is an already decoded I- or P-picture motion-compensated with a motion vector from the entropy decoding circuit 111. If the output of the inverse DCT circuit 113 is a P- or B-picture, the calculating unit 114 sums this output to an output of the motion compensation circuit 100 to decode an original picture which is routed to a deblocking circuit 115. If the output of the inverse DCT circuit 113 is an I-picture, the output is a decoded I-picture, so that it directly sends the output to the deblocking circuit 115.

The deblocking circuit 115 deblocks the decoded picture supplied thereto on the pixel block basis to produce and output a decoded picture.

On the other hand, the motion compensation circuit 116 receives an I-picture and a P-picture, among the decoded pictures output from the calculating unit 114, to process these pictures with motion compensation in accordance with the motion vector from the entropy decoding circuit 111. The motion compensation circuit 116 sends the motion compensated picture as reference picture to the calculating unit 114.

The decoder 22 of FIG. 3 is able to decode the MPEG-encoded data efficiently into a picture of high picture quality.

That is, encoded data is sent to the entropy decoding circuit 31 which then entropy decodes the encoded data. The quantized DCT coefficients, motion vector and other information, obtained on this entropy decoding, are sent from the entropy decoding circuit 31 to the coefficient conversion circuit 32.

Using the quantized DCT coefficients Q from the entropy decoding circuit 31 and tap coefficients as found on learning, the coefficient conversion circuit 32 executes preset predictive calculations, at the same time as it performs motion compensation in accordance with the motion vector from the entropy decoding circuit 31, to decode the quantized DCT coefficients into original pixel values, which are routed to the deblocking circuit 33.

The deblocking circuit 33 deblocks the pixel block of decoded pixels from the coefficient conversion circuit 32 to produce and output a decoded picture.

Figure 21:
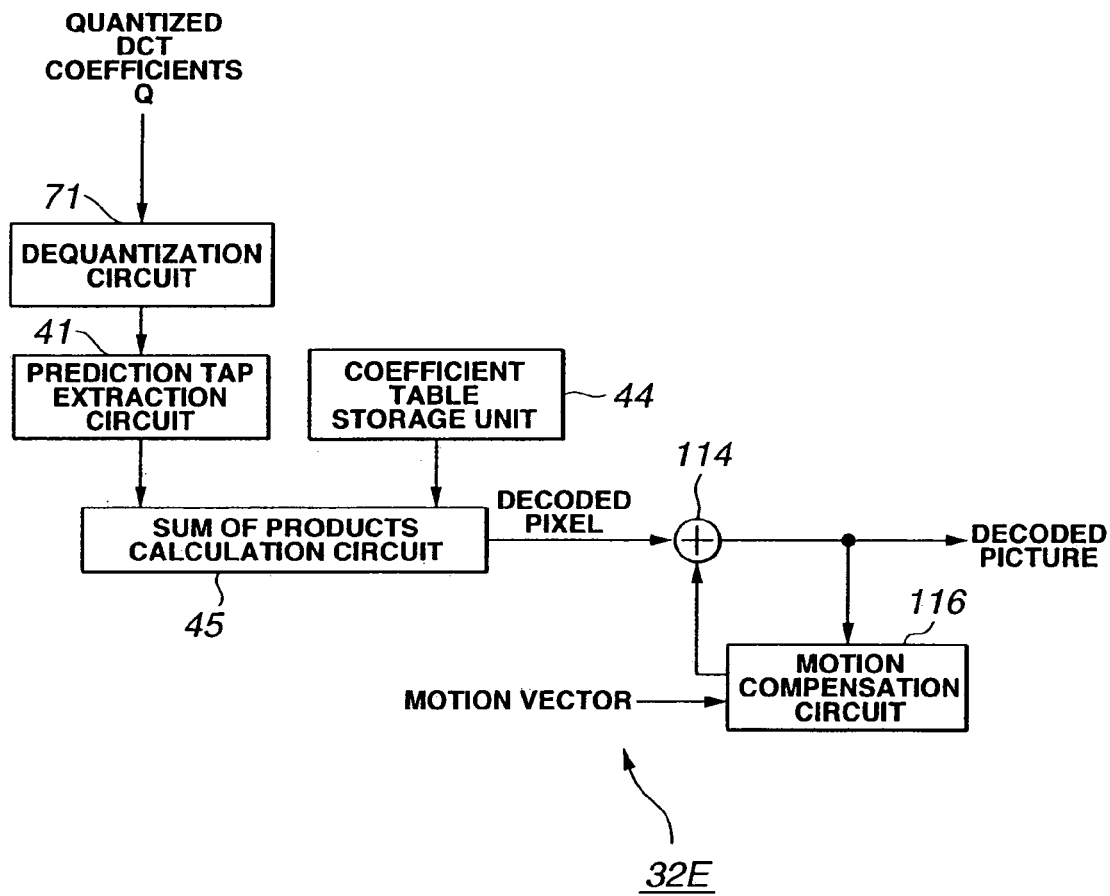
FIG. 21 is a block diagram showing still another illustrative structure of the coefficient conversion circuit.

FIG. 21 shows an illustrative structure of the coefficient conversion circuit 32 in case of decoding MPEG encoded data by the decoder 22. Meanwhile, parts or components corresponding to those shown in FIG. 17 or 20 are depicted by the same reference numerals and are not explained specifically. That is, a coefficient conversion circuit 32E, shown in FIG. 21, is configured similarly to FIG. 17 except there are provided the calculating unit 114 and the motion compensation circuit 116 downstream of the sum of products circuit 45 as shown in FIG. 20.

Thus, in the coefficient conversion circuit 32E, shown in FIG. 21, predictive calculations employing tap coefficients are carried out in place of the inverse DCT processing by the inverse DCT circuit 113 shown in FIG. 20. Subsequently, a decoded picture is obtained in the same way as in FIG. 20.

Figure 22:
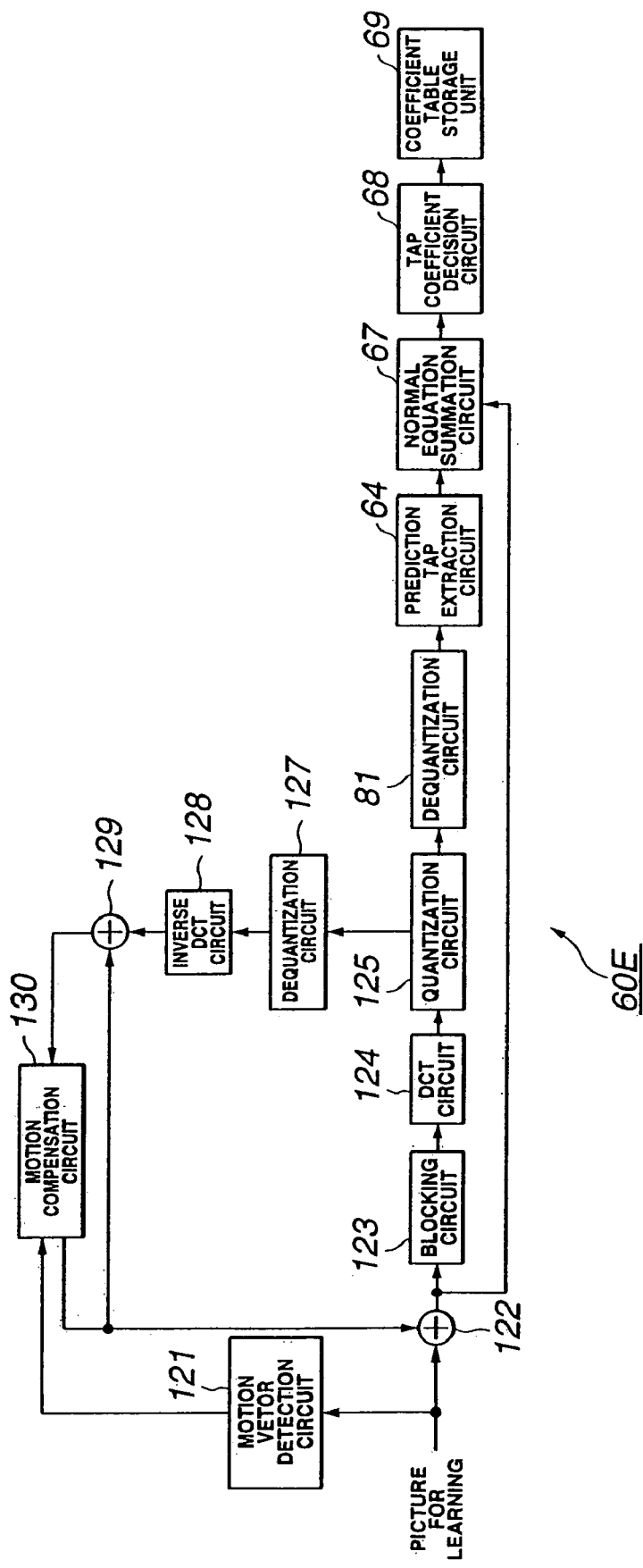
FIG. 22 is a block diagram showing still another illustrative structure of the learning device.

FIG. 22 shows an illustrative structure of the learning device 60E adapted for learning tap coefficients to be stored in the coefficient table storage unit 44 of FIG. 21. Meanwhile, parts or components corresponding to those shown in FIG. 18 are depicted by the same reference numerals and are not explained specifically.

In the learning device 60E, shown in FIG. 22, a motion vector detection circuit 121 and a calculating unit 122 are fed with a picture for learning as teacher data. The motion vector detection circuit 121, calculating unit 122, a blocking circuit 123, a DCT circuit 124, a quantization circuit 125, a dequantization circuit 127, an inverse DCT circuit 128, a calculating unit 129 or a motion compensation circuit 130 perform the processing similar to that performed by the vector detection circuit 91, calculating unit 92, a blocking circuit 93, a DCT circuit 94, a quantization circuit 95, a dequantization circuit 97, an inverse DCT circuit 98, a calculating unit 99 or a motion compensation circuit 100 of FIG. 19, respectively, whereby quantized DCT coefficients similar to those output by the quantization circuit 95 of FIG. 19 are output from the quantization circuit 125.

The quantized DCT coefficients, output by the quantization circuit 125, are routed to the dequantization circuit 81, which then dequantizes the quantized DCT coefficients from the quantization circuit 125 into DCT coefficients which are supplied to the prediction tap extraction circuit 64. This prediction tap extraction circuit 64 forms prediction taps from the DCT coefficients from the dequantization circuit 81 to send the resulting prediction taps to the normal equation summation circuit 67.

The normal equation summation circuit 67 executes the aforementioned summation on an output of the calculating unit 122 as teacher data and on the prediction taps from the dequantization circuit 81 as pupil data to generate the normal equations.

The tap coefficient decision circuit 68 solves the normal equations, generated by the normal equation summation circuit 67, to find tap coefficients, which then are sent to and stored in the coefficient table storage unit 69.

Since the MPEG encoded data are decoded using the tap coefficients thus found, in the sum-of-products circuit 45, the decoding of the MPEG encoded picture and the processing for improving the picture quality may be performed simultaneously, whereby a decoded picture of high picture quality may be obtained from the MPEG encoded picture.

Meanwhile, the coefficient conversion circuit 32E may be formed without employing the dequantization circuit 71. In such case, the learning device 60E may be formed without providing the dequantization circuit 81.

The coefficient conversion circuit 32E of FIG. 21 may also be designed using the class tap extraction circuit 42 and the classification circuit 43, as in the case shown in FIG. 5. In such case, the learning device 60E may be designed with the class tap extraction circuit 65 and the classification circuit 66, as in the case of FIG. 11.

According to the present invention, as described above, in which the tap coefficients as found on learning are acquired and used along with converted data to execute preset calculations to decode the converted data into original data, the converted data can be decoded efficiently.

Moreover, according to the present invention, in which teacher data as a teacher is at least transformed orthogonally or into a frequency domain to generate pupil data as pupils, and in which learning is executed to statistically minimize the prediction errors of the prediction values of the teacher data obtained on predictive calculations using the tap coefficients and the pupil data, in order to find tap coefficients, the orthogonal or frequency transformed data can be decoded efficiency using these tap coefficients.

A modified embodiment of the present invention is hereinafter explained.

Figure 23:
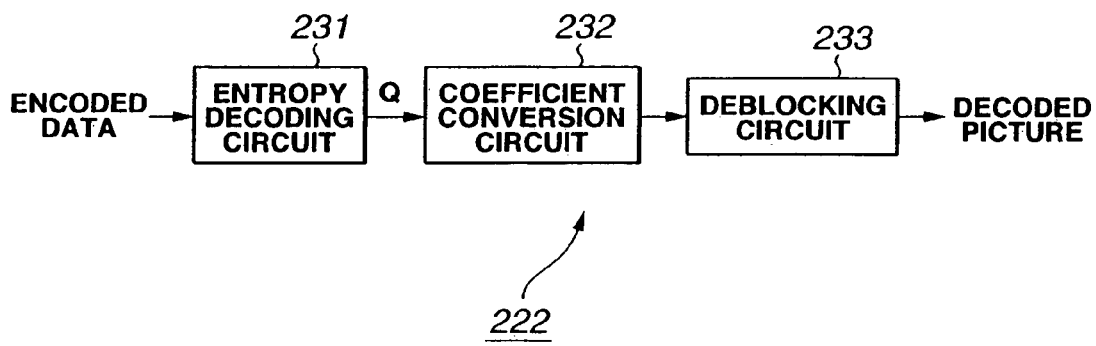
FIG. 23 is a block diagram showing an illustrative structure of a decoder in another embodiment in which the present invention is applied to the picture transmission system.
Figure 24:
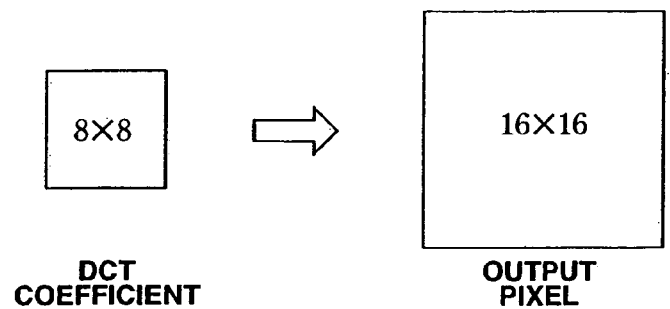
FIG. 24 shows how 8×8 DCT coefficients in the decoder are decoded to 16×16 pixels.

In the modification, now explained, a decoder 222 composed of an entropy decoding circuit 231, a coefficient decoding circuit 232 and a deblocking circuit 233, as shown in FIG. 23, is used as the decoder 22 shown in FIG. 2 to decode the encoded data.

The encoded data is fed to the entropy decoding circuit 231, which then entropy decodes the encoded data to send the block-based quantized DCT coefficients Q to the coefficient decoding circuit 232. Meanwhile, although not only the entropy-encoded quantized DCT coefficients but also the quantization table is included in the encoded data, this quantization table may be used as necessary for decoding the quantized DCT coefficients.

Using the quantized DCT coefficients Q from the entropy decoding circuit 231 and tap coefficients as found by learning, the coefficient decoding circuit 232 executes preset predictive calculations to obtain data which correspond to block-based quantized DCT coefficients decoded into an original 8×8 pixel block and which has been processed in a manner of improving the improving the picture quality of the original block. That is, while the original block is made up of 8×8 pixels, the coefficient decoding circuit 232 yields a block composed of 16×16 pixels, having double the horizontal and vertical spatial resolution of the 8×8 pixels, as a result of the predictive calculations employing the tap coefficients. Here, the coefficient decoding circuit 232 decodes the block composed of 8×8 quantized DCT coefficients into a block composed of 16×16 pixels, and outputs the latter block.

The deblocking circuit 233 deblocks the 16×16 pixel block, obtained in the coefficient decoding circuit 232, to improve the spatial resolution, to output the resulting decoded picture.

Figure 25:
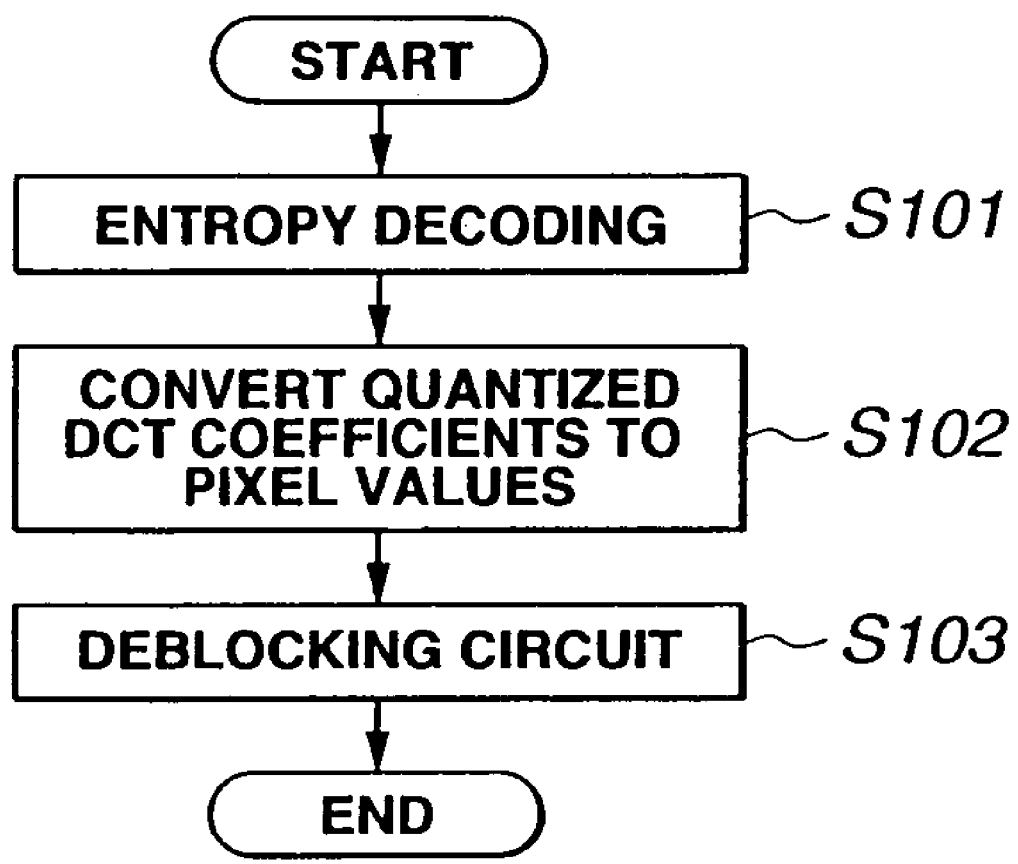
FIG. 25 is a flowchart for illustrating the processing in the decoder.

Referring to the flowchart of FIG. 25, the processing of the decoder 222 of FIG. 23 is explained.

The encoded data is sequentially supplied to the entropy decoding circuit 231. At step S101, the entropy decoding circuit 231 entropy-decodes the encoded data, and sends block-based quantized DCT coefficients Q to the coefficient decoding circuit 232, which coefficient decoding circuit executes predictive calculations, employing tap coefficients, at step S102, to generate a high-resolution block, which is on decoding the block-based quantized DCT coefficients Q from the entropy decoding circuit 231 into block-based pixels values, and which is improved in the block spatial resolution. The high-resolution bloc, thus produced, is sent to the deblocking circuit 233. The deblocking circuit 233 at step S103 executes deblocking of the block of the improved spatial resolution from the coefficient decoding circuit 232 to output the resulting high-resolution decoded picture to terminate the processing.

The coefficient decoding circuit 232 of FIG. 23 exploits the above-described classification adaptive processing to decode the quantized DCT coefficients into pixel values to yield a picture improved in spatial resolution.

Figure 26:
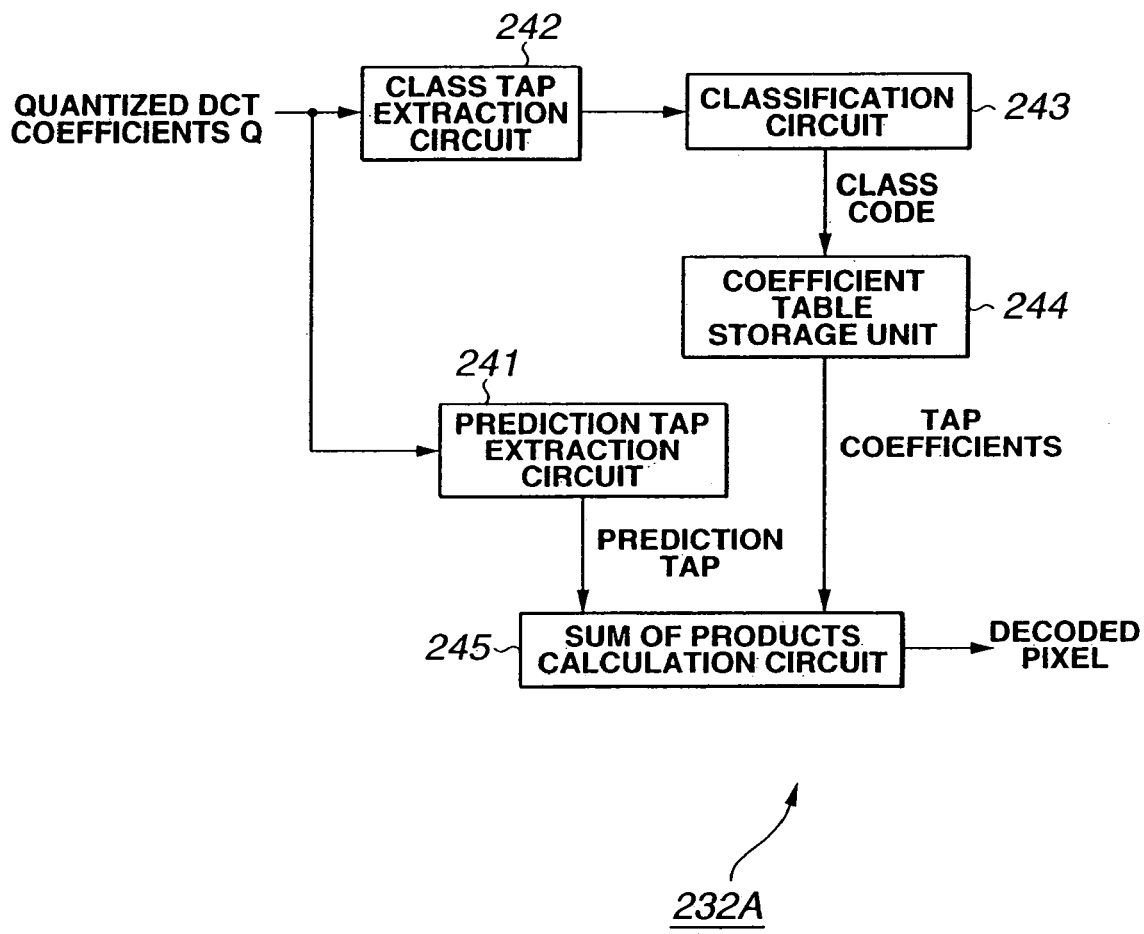
FIG. 26 is a block diagram showing an illustrative structure of a coefficient conversion circuit in the decoder.

FIG. 26 shows an illustrative structure of the coefficient decoding circuit 232 of FIG. 23 adapted for decoding the quantized DCT coefficients into pixel values.

In a coefficient decoding circuit 232A, shown in FIG. 26, the block-based quantized DCT coefficients, output by the entropy decoding circuit 231 (FIG. 23), are routed to a block-based prediction tap extraction circuit 241 and to a class tap extraction circuit 242.

The prediction tap extraction circuit 241 sets the blocks of pixel values of high picture quality corresponding to the blocks of 8×8 quantized DCT coefficients supplied thereto, incidentally referred to below as DCT blocks, sequentially as high picture quality blocks of interest. These blocks of pixel values of high picture quality are not present in the present stage but virtually presupposed, and are incidentally referred to below as high picture quality blocks. Moreover, the pixels that make up the high picture quality block of interest are sequentially made into pixels of interest in the raster scanning sequence. In summation, the prediction tap extraction circuit 241 extracts the quantized DCT coefficients, used for predicting the pixel values of the pixels of interest, for use as prediction taps.

That is, the prediction tap extraction circuit 241 extracts, as prediction taps, the totality of the quantized DCT coefficients, that is 8×8=64 quantized DCT coefficients, of the DCT block corresponding to the high picture quality block to which belongs the pixel of interest, as shown in FIG. 6. Thus, in the present embodiment, the same prediction tap is formed for all pixels of a certain high picture quality block. Alternatively, the prediction tap may be formed by different quantized DCT coefficients from one pixel of interest to another.

The prediction taps of the respective pixels making up a high picture quality block, that is 256 sets of the prediction taps for each of the set of 16×6=256 pixels, obtained in the prediction tap extraction circuit 241, are sent to a sum-of-products circuit 245. However, since the same prediction taps are formed for all pixels of a high picture quality block, it is in effect sufficient if a set of the predication taps is provided to the sum-of-products circuit 245 for one high picture quality block.

The class tap extraction circuit 242 extracts quantized DCT coefficients used for classifying the pixels of interest into one of a plural number of classes, for use as class taps.

In JPEG encoding, a picture is encoded, that is DCTed and quantized, from one 8×8 pixel block to another. This 8×8 pixel block is incidentally referred to below as pixel block. Thus, the pixels belonging to a high picture quality block corresponding to a pixel block, improved to high picture quality, are classified e.g., into the same class. That is, similarly to the prediction tap extraction circuit 241, the class tap extraction circuit 242 extracts the totality of 8×8 quantized DCT coefficients of a DCT block corresponding to the high picture quality block to which belongs the pixel of interest, shown in FIG. 6, as class taps.

It is noted that assigning the respective pixels belonging to a high picture quality pixel block to the same class is equivalent to classifying the pixel block. Thus, it is sufficient if the class tap extraction circuit 242 forms not 256 sets of the class taps for classifying each of 16×16=256 pixels making up the high picture quality pixel block of interest, but one set of the class taps for classifying the high picture quality pixel block of interest. To this end, the class tap extraction circuit 242 extracts 64 quantized DCT coefficients of the DCT block associated with the high picture quality pixel block, in order to classify the high picture quality pixel blocks, from one high picture quality pixel block to another, for use as class taps.

Meanwhile, the quantized DCT coefficients, forming prediction taps or class taps, are not limited to those of the above-mentioned patterns.

The class taps of the high quality pixel block of interest, obtained in the class tap extraction circuit 242, are supplied to the classification circuit 243. The classification circuit classifies the high picture quality block of interest, based on the class tap from the class tap extraction circuit 242, to output a class code corresponding to the so obtained class.

As a classification method, ADRC, for example, may be used. With the method employing ADRC, the quantized DCT coefficients, forming the class taps, are processed with ADRC. The class of the pixel block of interest is determined based on the resultant ADRC code.

Meanwhile, in the present embodiment, the classification circuit 243 extracts characteristic values of high cruciality from the quantized DCT coefficients forming the class taps and undertakes classification based on these characteristic values to diminish the number of the classes.

Figure 27:
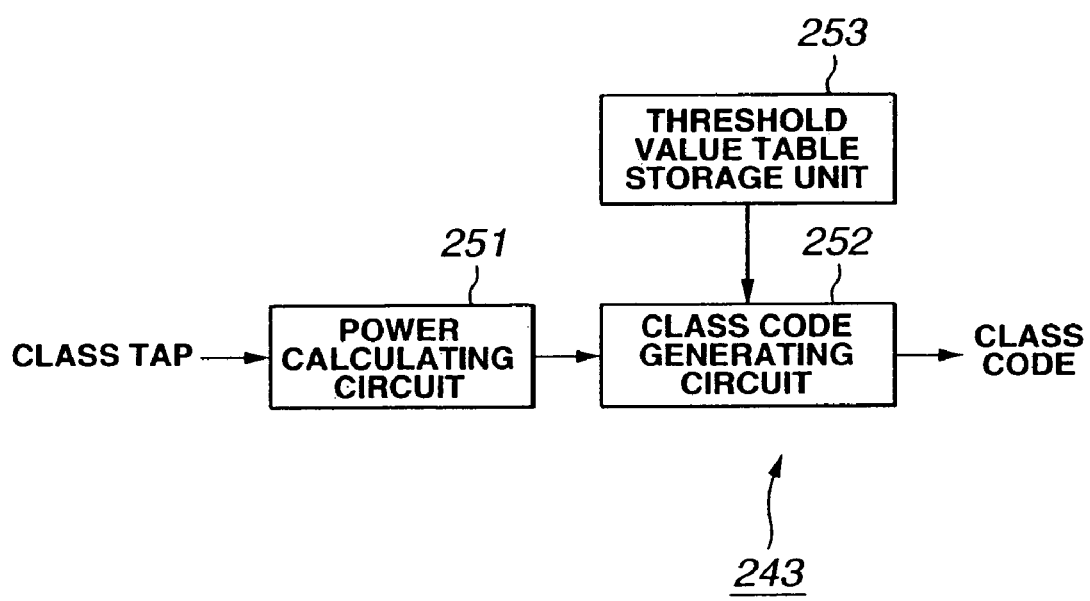
FIG. 27 is a block diagram showing an illustrative structure of a classification circuit in the coefficient conversion circuit.

FIG. 27 shows an illustrative structure of the classification circuit 243 of FIG. 26.

The class taps are adapted to be supplied to a power calculating circuit 251. The power calculating circuit 251 splits the quantized DCT coefficients forming the class taps into a plural number of spatial frequency bands and calculates the power values of the respective frequency bands.

That is, the power calculating circuit 51 splits the 8×8 quantized DCT coefficients, forming the class tap, into four spatial frequency bands $S_0$, $S_1$, $S_2$ and $S_3$, shown for example in FIG. 6. The spatial frequency band $S_0$ is made up of four quantized DCT coefficients $x_0$, $x_1$, $x_8$, $x_9$, the spatial frequency band $S_1$ is made up of 12 quantized DCT coefficients $x_2$, $x_3$, $x_4$, $x_5$, $x_6$, $x_7$, $x_{10}$, $x_{11}$, $x_{12}$, $x_{13}$, $x_{14}$, $x_{15}$, the spatial frequency band $S_2$ is made up of 12 quantized DCT coefficients $x_{16}$, $x_{17}$, $x_{24}$, $x_{25}$, $x_{32}$, $x_{33}$, $x_{40}$, $x_{41}$, $x_{48}$, $x_{49}$, $x_{56}$, $x_{57}$ and the spatial frequency band $S_3$ is made up of 36 quantized DCT coefficients $x_{18}$, $x_{19}$, $x_{20}$, $x_{21}$, $x_{22}$, $x_{23}$, $x_{26}$, $x_{27}$, $x_{28}$, $x_{29}$, $x_{30}$, $x_{31}$, $x_{34}$, $x_{35}$, $x_{36}$, $x_{37}$, $x_{38}$, $x_{39}$, $x_{42}$, $x_{43}$, $x_{44}$, $x_{45}$, $x_{46}$, $x_{47}$, $x_{50}$, $x_{51}$, $x_{52}$, $x_{53}$, $x_{54}$, $x_{55}$, $x_{58}$, $x_{59}$, $x_{60}$, $x_{61}$, $x_{62}$, $x_{63}$.

Moreover, the power calculating circuit 251 calculates power values $P_0$, $P_1$, $P_2$ and $P_3$ of the AC components of the quantized DCT coefficients, for each of the spatial frequency bands $S_0$, $S_1$, $S_2$ and $S_3$, to output the so calculated power values $P_0$, $P_1$, $P_2$ and $P_3$ to a class code generating circuit 252.

That is, the power calculating circuit 251 finds a square sum value $x_1^2+x_8^2+x_9^2$ of the AC components $x_1$, $x_8$, $x_9$ of the four quantized DCT coefficients $x_0$, $x_1$, $x_8$, $x_9$ to output the resulting square sum to the class code generating circuit 52 as power $P_0$. The power calculating circuit 251 also finds a square sum of the AC components of the 12 quantized DCT coefficients for the spatial frequency band $S_1$, that is the totality of the 12 quantized DCT coefficients, to output the resulting square sum to the class code generating circuit 252 as power $P_1$. The power calculating circuit 251 also finds the power values $P_2$ and $P_3$ for the spatial frequency bands $S_2$ and $S_3$, respectively, as in the case of the spatial frequency band $S_1$, described above, to output the resulting power values to the class code generating circuit 252.

The class code generating circuit 252 compares the power values $P_0$, $P_1$, $P_2$ and $P_3$ from the power calculating circuit 251 to corresponding threshold values $TH_0$, $TH_1$, $TH_2$ and $TH_3$ stored in a threshold value storage unit 253 to output class codes based on the magnitude relationships thereof. That is, the class code generating circuit 252 compares the power $P_0$ to the threshold value $TH_0$ to produce a one-bit code representing the magnitude relationships. In similar manner, the class code generating circuit 252 compares the power $P_0$ to the threshold value $TH_0$ to produce a one-bit code representing the magnitude relationships thereof. Likewise, the class code generating circuit 252 compares the power $P_1$ to the threshold value $TH_1$, the power $P_2$ to the threshold value $TH_2$ and the power $P_3$ to the threshold value $TH_3$ to produce a one-bit code for each of the power-threshold value combinations. The class code generating circuit 252 outputs the four one-bit codes (thus any of values from 0 to 15), obtained as described above, in e.g., a preset sequence, as class codes representing the classes of the pixel block of interest. Thus, in the present embodiment, the pixel blocks of interest are classified into $2^4=16$ classes.

The threshold value storage unit 253 memorizes the threshold values $TH_0$ to $TH_3$ to be compared to the power values $P_0$ to $P_3$ of the spatial frequency bands $S_0$ to $S_3$.

Reverting to FIG. 26, the class codes, output by the classification circuit 243, as described above, are afforded as addresses to a coefficient table storage unit 244.

The coefficient table storage unit 244 memorizes a coefficient table, having registered therein tap coefficients obtained by learning processing as will be explained subsequently, and outputs tap coefficients stored in an address associated with the class code, output by the classification circuit 243, to the sum-of-products circuit 245.

In the present embodiment, one class code is obtained for the pixel block of interest. On the other hand, since the high picture quality pixel block in the present embodiment is made up of 16×16=256 pixels, 256 sets of tap coefficients are required for decoding 256 pixels making up a pixel block of interest. Thus, the coefficient table storage unit 244 memorizes 256 sets of tap coefficients for an address corresponding to one class code.

The sum-of-products circuit 245 acquires the prediction tap output by the prediction tap extraction circuit 241 and the tap coefficients output by the coefficient table storage unit 244 and, using the prediction taps and the tap coefficients, executes linear predictive processing (sum of products processing) shown in the equation (1), to output the prediction values of the pixel values of the 16×16 pixels of the pixel block of interest as decoded results of the corresponding DCT block to the deblocking circuit 233 (FIG. 23).

In the prediction tap extraction circuit 241, each pixel of the pixel block of interest sequentially becomes a pixel of interest. The sum-of-products circuit 245 then performs processing in an operating mode associated with the position of a pixel which is the current pixel of interest of the pixel block of interest. This operating mode is referred to below as pixel position mode.

That is, if a number i pixel of the pixels of the pixel block of interest, in the raster scanning sequence, is denoted $p_i$, with the pixel $p_i$ being the pixel of interest, the sum-of-products circuit 245 performs the processing of the pixel position mode #1.

Specifically, the coefficient table storage unit 44 outputs 256 sets of tap coefficients for decoding each of the 256 pixels making up a pixel block of interest. If the set of tap coefficients for decoding the pixel $p_i$ is denoted $W_i$, and the operating mode is the pixel mode #1, the sum-of-products circuit 425 performs the sum of product processing of the equation (1), using the prediction taps and the set $W_i$, among the tap coefficients of the 64 sets, and renders the results of the sum of product processing the results of the decoding of the pixel $p_i$.

Figure 28:
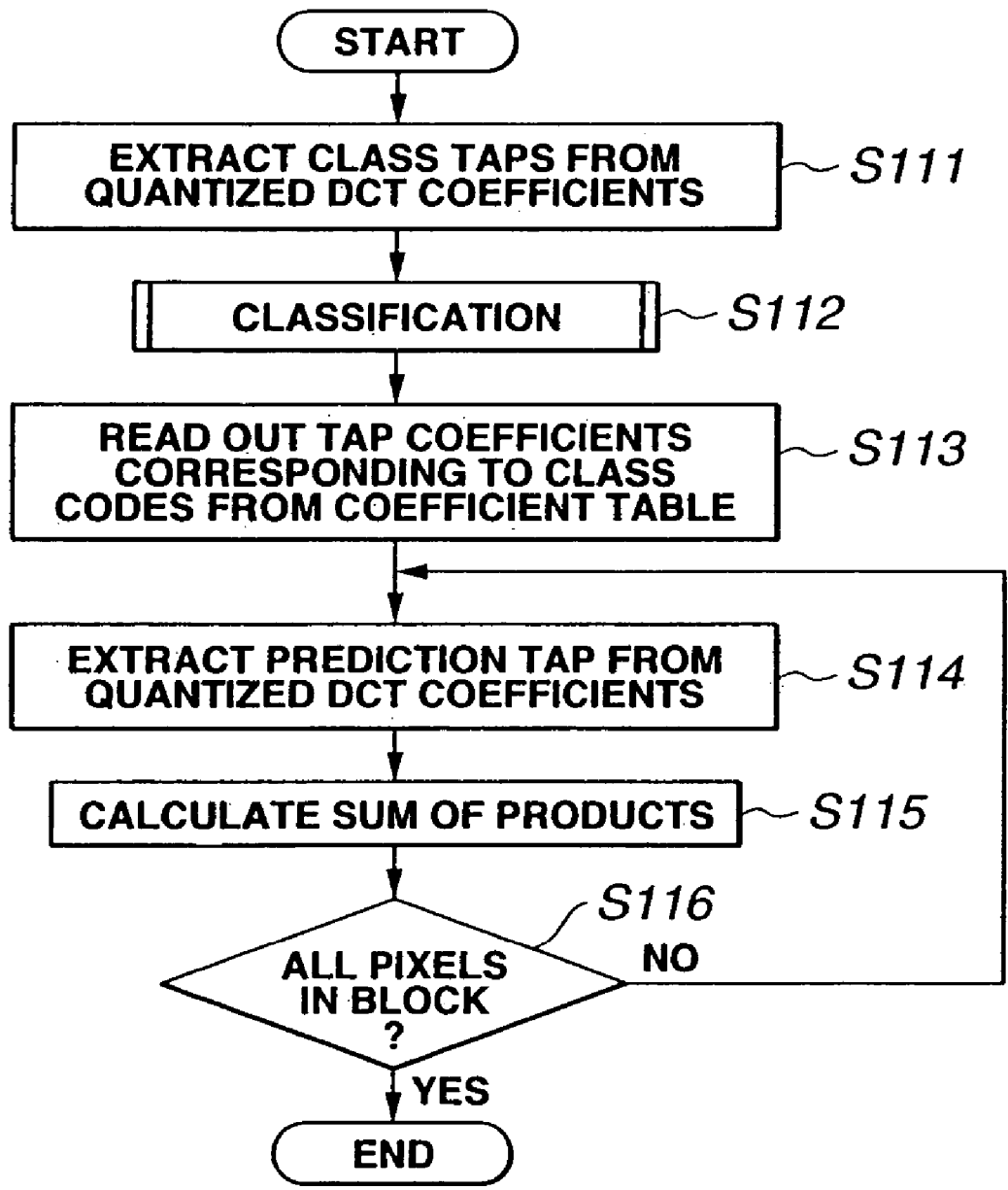
FIG. 28 is a flowchart for illustrating the processing in the coefficient conversion circuit.

Referring to the flowchart of FIG. 28, the processing of the coefficient conversion circuit 232A of FIG. 28 is explained.

The block-based DCT coefficients, output by the entropy decoding circuit 231 (FIG. 23), are sequentially received by the prediction tap extraction circuit 241 and by the class tap extraction circuit 242. The prediction tap extraction circuit 241 sequentially renders the pixel block corresponding to the block of the quantized DCT coefficients supplied thereto (DCT block) a pixel block of interest.

At step S111, the class tap extraction circuit 242 extracts the quantized DCT coefficients received and used for classifying the pixel block of interest, to form a class tap, which then is output to the classification circuit 243.

At step S112, the classification circuit 243 classifies the high quality pixel block of interest, using the class taps from the class tap extraction circuit 242, to output the resulting class codes to the coefficient table storage unit 244.

Figure 29:
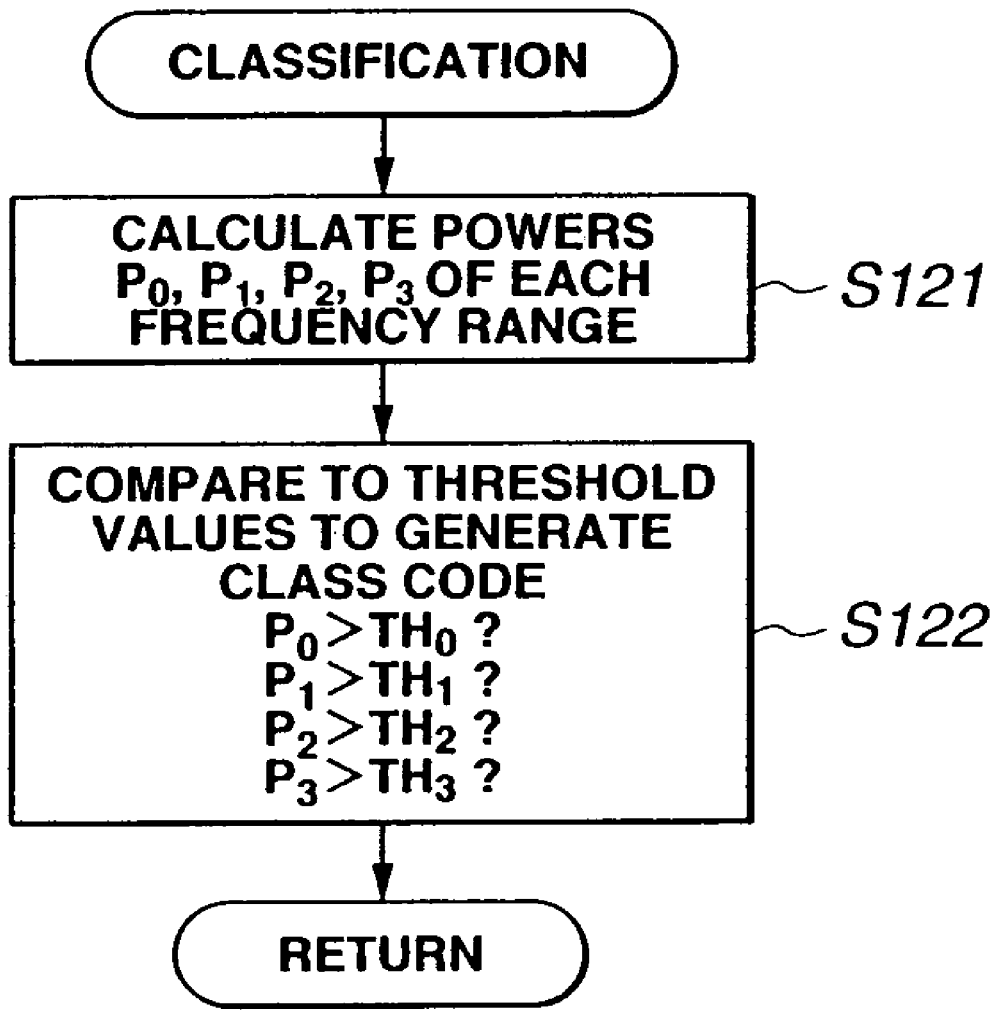
FIG. 29 is a flowchart for illustrating the processing in the coefficient conversion circuit in more detail.

That is, st step S112 in the flowchart of FIG. 29, the power calculating circuit 251 of the classification circuit 243 (FIG. 27) splits, first at step S121, the 8×8 quantized DCT coefficients making up the class taps into four spatial frequency bands $S_0$ to $S_3$ to calculate the respective power values $P_0$ to $P_3$. These power values $P_0$ to $P_3$ are output from the power calculating circuit 251 to the class code generating circuit 252.

The class code generating circuit 252 at step S122 reads out the threshold values $TH_0$ to $TH_3$ from the power calculating circuit 51 to compare the power values $P_0$ to $P_3$ from the power calculating circuit 251 to the threshold values $TH_0$ to $TH_3$ to generate the class codes based on the respective magnitude relationships. The program return then is performed.

Reverting to FIG. 28, the class codes, obtained at step S112 as described above, are given from the classification circuit 243 to the coefficient table storage unit 244 as addresses.

On receipt of the class codes form the classification circuit 243 as addresses, the coefficient table storage unit 244 at step S113 reads out the 256 sets of the tap coefficients stored in the addresses (256 sets of tap coefficients corresponding to the classes of the class codes) to output the tap coefficients so read out to the sum-of-products circuit 245.

The program then moves to step S114 where the prediction tap extraction circuit 241 extracts quantized DCT coefficients used for predicting the pixel values of the pixels of interest, with the pixels of the pixel block of interest not as yet rendered the pixels of interest in the raster scanning sequence as the pixels of interest, to form prediction taps. The prediction taps are sent from the prediction tap extraction circuit 41 to the sum-of-products circuit 245.

In the present embodiment, since the same prediction taps are formed for the totality of the pixels of the high quality pixel blocks, from one high quality pixel block to another, it is sufficient if the processing of step S114 is performed only for the pixel initially made into a pixel of interest, while it is unnecessary to perform the processing for the remaining 255 pixels.

At step S115, the sum-of-products circuit 245 acquires a set of tap coefficients corresponding to the pixel position mode for the pixel of interest, from among the 256 set tap coefficients output at step S113 from the coefficient table storage unit 244 and, using the set of the tap coefficients and the prediction taps supplied from the prediction tap extraction circuit 241, the sum-of-products circuit 245 executes the sum of product processing, shown in the equation (1), to acquire a value of the decoded pixel of interest.

The program then moves to step S116 where the prediction tap extraction circuit 241 verifies whether or not the processing has been executed with the totality of the pixels of the high quality pixel block of interest as the pixels of interest. If it is verified at step S116 that the processed has not been executed with the totality of the pixels of the high quality pixel block of interest as the pixels of interest, the program reverts to step S114 where the prediction tap extraction circuit 241 repeats similar processing with the pixel value of the pixel of interest of the pixels of the high quality pixel block of interest, not as yet rendered the pixels of interest in the raster scanning sequence, as the pixels of interest.

If it is verified at step S116 that the processing has been done with the totality of the pixels of the high quality pixel block of interest as the pixels of interest, that is if the decoded values of the totality of the pixels of the high quality pixel block of interest, that is 8×8 quantized DCT coefficients decoded into 8×8 pixels and further made into 16×16 pixels by way of improving the pixel quality, have been acquired, the sum-of-products circuit 245 outputs the high quality block made up of the decoded values to the deblocking circuit 233 (FIG. 23) to finish the processing.

Meanwhile, the processing conforming to the flowchart of FIG. 28 is executed repeatedly each time the prediction tap extraction circuit 241 sets a new high quality pixel block of interest.

Figure 30:
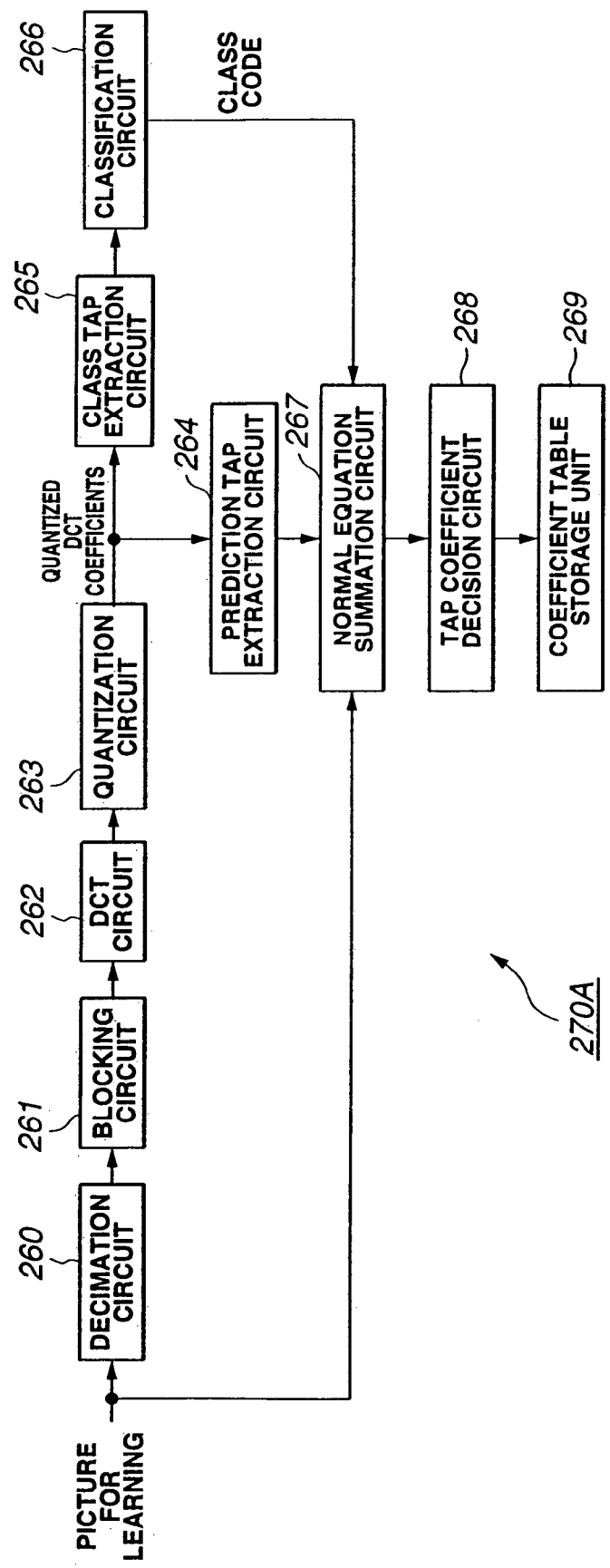
FIG. 30 is a block diagram showing an illustrative structure of a learning device responsible for learning processing of the tap coefficients of the coefficient conversion circuit.
Figure 31:
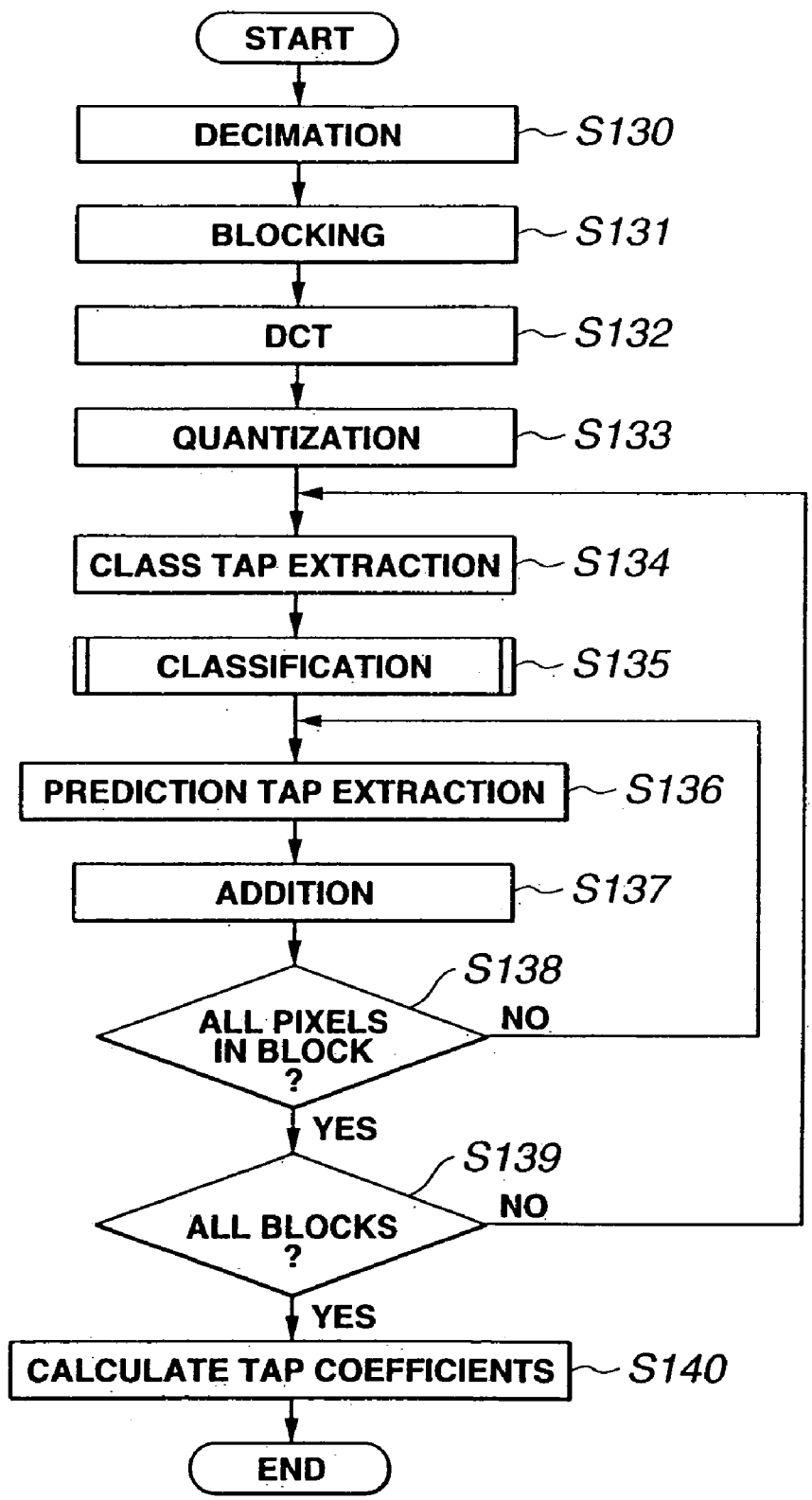
FIG. 31 is a flowchart for illustrating the processing in the learning device.

FIG. 30 shows an illustrative structure of a learning device 270A executing the learning processing for tap coefficients stored in the coefficient table storage unit 244 of FIG. 26.

In the learning device 270A, a decimation circuit 260 is fed with one or more pictures of picture data for learning, as teacher data which becomes a teacher in learning. The decimation circuit 260 processes the picture, as teacher data, for improving the picture quality of the picture as teacher data by sum of products processing performed by the sum-of-products circuit 245 in the coefficient decoding circuit 232A of FIG. 26. Since this processing converts the 8×8 pixels into 16×16 pixels of the spatial resolution, along the horizontal and vertical directions, twice that of the 8×8 pixels, the decimation circuit 260 decimates the pixels of the picture data as teacher data to generate picture data, having the numbers of the horizontal and vertical pixels reduced to one half. This picture data is incidentally referred to below as quasi-teacher data.

The picture data as quasi-teacher data is of the same picture quality (resolution) as the picture data to be encoded by JPEG encoding in the encoder 21 (FIG. 2). For example, if the picture to be JPEG-encoded is an SD (standard resolution) picture, it is necessary to use a high density (HD) picture, having the number of the horizontal and vertical pixels twice those of the SD picture, as the picture used as teacher data.

A blocking circuit 261 blocks an SD picture, as one or more pictures of quasi-teacher data, generated by a decimation circuit 260, into an 8×8 pixel block, as in the case of JPEG encoding.

A DCT circuit 262 sequentially reads out a pixel block, blocked by the blocking circuit 261, and applies DCT to the pixel block to form a block of DCT coefficients. This block of DCT coefficients is routed to a quantization circuit 263.

The quantization circuit 263 quantizes the block of DCT coefficients from the DCT circuit 262 in accordance with the same quantization table as that used for JPEG encoding in the encoder 21 (FIG. 2), and sequentially sends the resulting block of the quantized DCT coefficients (DCT block) to a prediction tap extraction circuit 264 and to a class tap extraction circuit 265.

The prediction tap extraction circuit 264 forms the same prediction taps as those formed by the prediction tap extraction circuit 241 of FIG. 26, for the pixels as current pixels of interest, among the 16×16 pixels making up the high picture quality block, which a normal equation summation circuit 267 retains to be the high picture quality block of interest, by extracting the needed quantized DCT coefficients from the output of the quantization circuit 263. These prediction taps are routed as pupil data, which become pupils in learning, from the prediction tap extraction circuit 264 to the normal equation summation circuit 267.

The class tap extraction circuit 265 forms the same class taps as those formed by the class tap extraction circuit 242 of FIG. 26, for the high picture quality block of interest, by extracting the needed quantized DCT coefficients from the output of the quantization circuit 263. These class taps are supplied from the class tap extraction circuit 265 to the classification circuit 266.

The classification circuit 266 performs the same processing as that by the classification circuit 243, using the class taps from the class tap extraction circuit 265, to classify the high picture quality blocks of interest, to send the resulting class code to the normal equation summation circuit 267.

The normal equation summation circuit 267 is fed with the same HD picture as that supplied as teacher data to the decimation circuit 260. The normal equation summation circuit 267 blocks the HD picture into 16×16 pixel high picture quality blocks which are sequentially made into high picture quality blocks of interest. The normal equation summation circuit 267 sequentially sets pixels, among the 16×16 pixels forming the high picture quality block of interest, which have as yet not been made into the pixels of interest, as pixels of interest, and executes summation on the pixel values of the pixels of interest and the quantized DCT coefficients forming the prediction tap from the prediction tap forming circuit 264.

That is, the normal equation summation circuit 267 executes calculations corresponding to multiplication ($x_{in}$, $x_{im}$) and summation $\Sigma$ of pupil data, as respective elements of the matrix A of the equation 8, using prediction taps (pupil data) from one class corresponding to the class code supplied from the classification circuit 266 to another.

The normal equation summation circuit 267 also executes calculations corresponding to multiplication ($x_{in}y_i$) and summation $\Sigma$ of prediction taps (pupil data), and the pixel of interest (teacher data), as components of the vector v of equation (8), using the prediction taps (pupil data) and the pixel of interest (teacher data), from one class corresponding to the class code supplied from the classification circuit 266 to another.

The aforementioned summation in the normal equation summation circuit 267 is performed for each class from one pixel position mode for the pixel of interest to another.

The normal equation summation circuit 267 executes the above-described summation, with the totality of the pixels making up the teacher picture supplied thereto as pixels of interest, whereby a normal equation shown in the equation (8) is established for each pixel position mode for each class.

A tap coefficient decision circuit 268 solves the normal equation, generated for each class, from one pixel position mode to another, in the normal equation summation circuit 67, to find 256 sets of the tap coefficients, from class to class, to send the tap coefficients thus found to the addresses corresponding to the respective classes of a coefficient table storage unit 269.

Depending on the number of pictures provided as pictures for learning, or on the picture contents, it may be an occurrence that a class is produced in which the number of the normal equations necessary to find the tap coefficients cannot be realized. For such class, the tap coefficient decision circuit 68 outputs e.g., default tap coefficients.

The coefficient table storage unit 269 memorizes 256 sets of the tap coefficients for each class supplied thereto from the tap coefficient decision circuit 268.

Referring now to the flowchart of FIG. 12, the processing (learning processing) of a learning device 270A of FIG. 30 is explained.

The decimation circuit 260 of the learning device 270A is fed as teacher data with an HD picture, as picture data for learning. The decimation circuit 260 at step S130 decimates pixels of the HD picture, as teacher data, to generate an SD picture, the number of pixels in the horizontal direction and in the vertical direction of which are both halved.

The blocking circuit 261 at step S131 blocks an SD picture, as quasi-teacher data, obtained at the decimation circuit 260, into a pixel block of 8×8 pixels, as in the case of the JPEG encoding by the encoder 21 (FIG. 2). The program then moves to step S132. At step S132, the DCT circuit 262 sequentially reads out the pixel blocks, formed by the blocking circuit 261, and quantizes the so read-out blocks in accordance with the same quantization table as that used for JPEG encoding in the encoder 21, to form blocks each formed by the quantized DCT coefficients (DCT blocks).

On the other hand, the normal equation summation circuit 267 is fed with an HD picture, as teacher data. The normal equation summation circuit 267 blocks the HD picture into high picture quality blocks of 16×16 pixels. At step S134, those of the high picture quality blocks that have not as yet been made into the high picture quality blocks of interest are now made into the high picture quality blocks of interest. At step S134, the class tap extraction circuit 265 extracts those quantized DCT coefficients used in classifying the high picture quality block of interest, among the pixel blocks formed by the blocking circuit 261, from the DCT blocks obtained in the quantization circuit 263, to form class taps, which are then routed to the classification circuit 266. The classification circuit 266 at step S135 classifies the high picture quality blocks of interest, using the class taps from the class tap extraction circuit 265, as explained with reference to the flowchart of FIG. 29, to send the resulting class code to the normal equation summation circuit 267. The program then moves to step S136.

At step S136, the normal equation summation circuit 267 sets the pixels among the pixels of the high quality block of interest, that are as yet not rendered pixels of interest in the raster scanning sequence, as pixels of interest. For these pixels of interest, the prediction tap extraction circuit 264 forms the same prediction taps as those formed by the prediction tap extraction circuit 241 of FIG. 26, by extracting necessary quantized DCT coefficients from the output of the quantization circuit 263. The prediction tap extraction circuit 264 sends the prediction taps for the pixels of interest as pupil data to the normal equation summation circuit 267. The program then moves to step S137.

At step S137, the normal equation summation circuit 267 effects summation on the matrix A and the vector v of the above-mentioned equation (8), on the pixels of interest as teacher data and prediction taps (or the DCT coefficients forming the prediction taps) as pupil data. Meanwhile, this summation is executed from one class corresponding to the class code from the classification circuit 266 to another and from one pixel position mode for the pixel of interest to another.

The program then moves to step S138 where the normal equation summation circuit 267 checks whether or not the summation has been made for all pixels of the high picture quality block of interest as the pixels of interest. If it is verified at step S138 that the summation has not been made for all pixels of the high picture quality block of interest as the pixels of interest, the program reverts to step S136 where the normal equation summation circuit 267 sets the pixels of the high picture quality block of interest which are not as yet made into the pixels of interest, as pixels of interest. Subsequently, a similar sequence of operations is repeated.

If it is verified at step S138 that the summation has been made for all pixels of the high picture quality block of interest as the pixels of interest, the program moves to step S139, where the normal equation summation circuit 267 verifies whether or not the totality of the high picture quality blocks obtained from the picture as teacher data have been processed as the high picture quality blocks of interest. If it is verified at step S139 that the processing has not been performed with the totality of the high picture quality blocks obtained from the picture as teacher as the high picture quality blocks of interest, the program reverts to step S134 where a high picture quality block not as yet rendered a high picture quality block of interest is newly rendered a high picture quality block. Subsequently, a similar sequence of processing operations is repeated.

If it is verified at step S139 that processing has been made with the totality of the high picture quality blocks, obtained from the picture as teacher data, as the high picture quality blocks of interest, that is if a normal equation has been acquired from one pixel position mode to another for each class, the program moves to step S140 where the tap coefficient decision circuit 268 solves the normal equation generated from one pixel position mode for each class to another to find 256 sets of tap coefficients corresponding to the 256 pixel position modes of the class in question to send the tap coefficients thus found to the addresses corresponding to the respective classes of the tap coefficient storage unit 269 for storage therein. The processing then comes to a close.

The class-based tap coefficients, stored in the tap coefficient storage unit 269, are stored in a coefficient table storage unit 244 of FIG. 26.

So, the tap coefficients stored in the coefficient table storage unit 44 have been found by learning so that the prediction errors (herein the square errors) of the predicted values of the original pixel values, obtained on linear prediction calculations, will be statistically minimum. The result is that, with the coefficient conversion circuit 232A of FIG. 26, a JPEG encoded picture can be decoded to a picture limitlessly proximate to the HD picture which uses the JPEG encoded picture as teacher data.

Moreover, with the coefficient conversion circuit 232A, since the processing of decoding the JPEG encoded picture and the processing for improving the picture quality are carried out simultaneously, a decoded picture of high picture quality can be efficiently produced from the JPEG encoded picture.

Figure 32:
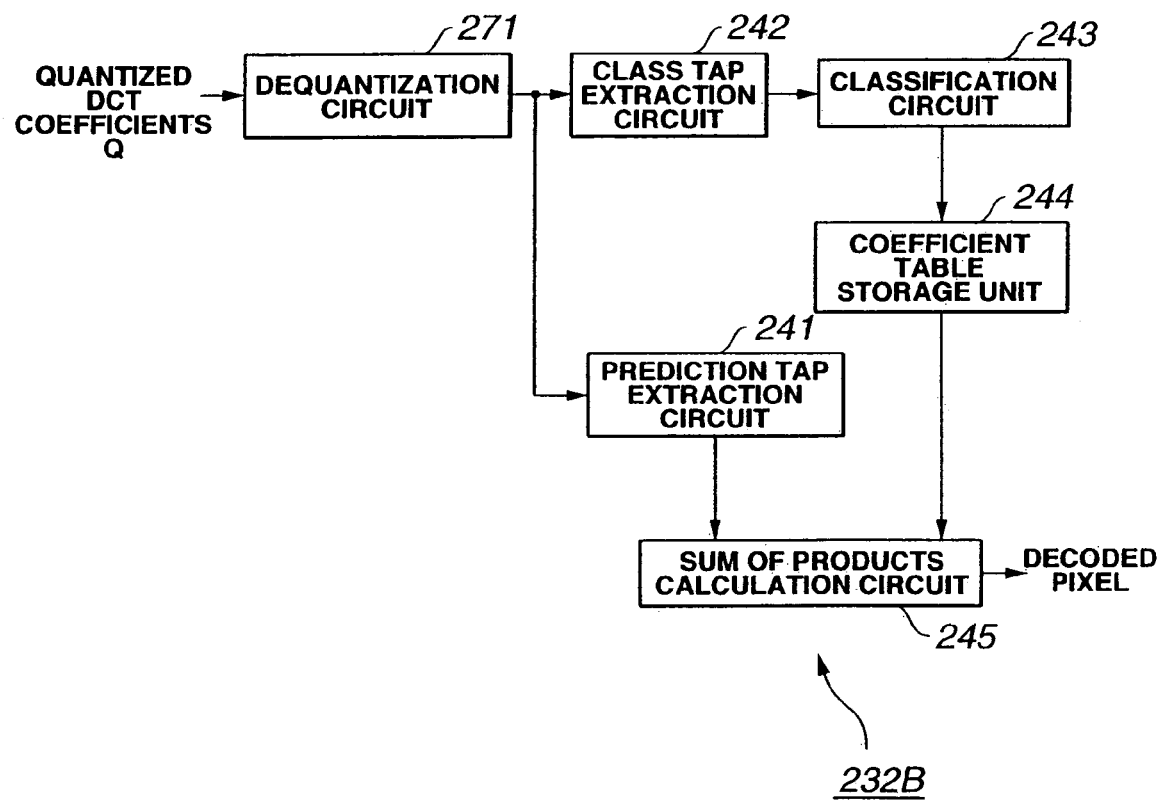
FIG. 32 is a block diagram showing another illustrative structure of the coefficient conversion circuit.

FIG. 32 shows another illustrative structure of the coefficient conversion circuit 232 of FIG. 23. Meanwhile, parts or components similar to those shown in FIG. 26 are depicted by the same reference numerals That is, a coefficient conversion circuit 232B shown in FIG. 13 is basically constructed similarly to the circuit shown in FIG. 26, except that a dequantization circuit 271 is provided newly.

In the coefficient conversion circuit 232B, shown in FIG. 32, the dequantization circuit 271 is fed with block-based quantized DCT coefficients, obtained on entropy decoding the encoded data in the entropy decoding circuit 231 (FIG. 23).

Meanwhile, in the entropy decoding circuit 231, not only the quantized DCT coefficients but also the quantization table are obtained form the encoded data. In the coefficient conversion circuit 232B of FIG. 32, this quantization table is supplied from the entropy decoding circuit 231 to the dequantization circuit 271.

The dequantization circuit 271 dequantizes the quantized DCT coefficients from the entropy decoding circuit 231 in accordance with the quantization table from the entropy decoding circuit 231 to send the resulting DCT coefficients to the prediction tap extraction circuit 241 and to the class tap extraction circuit 242.

Thus, in the prediction tap extraction circuit 241 and in the class tap extraction circuit 242, the prediction taps and the class taps are formed for the DCT coefficients instead of for the quantized DCT coefficients. The processing similar to that shown in FIG. 5 is subsequently performed on the DCT coefficients.

Thus, since the coefficient conversion circuit 232B of FIG. 32 performs processing not on the quantized DCT coefficients but on the DCT coefficients, it is necessary for the tap coefficients stored in the coefficient table storage unit 244 to be different from those shown in FIG. 26.

Figure 33:
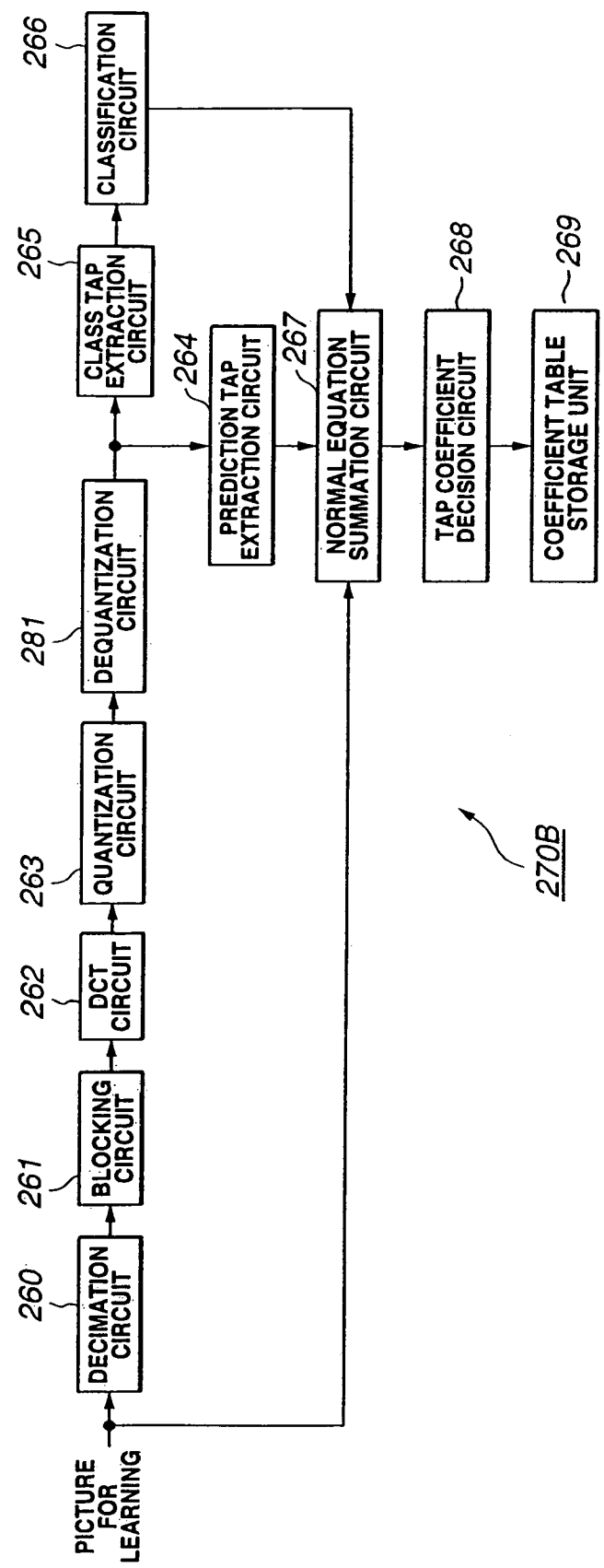
FIG. 33 is a block diagram showing still another illustrative structure of the learning device.

FIG. 33 shows another illustrative structure of a learning device 270B adapted for learning the tap coefficients stored in the coefficient table storage unit 244 of FIG. 32. The parts or components of FIG. 30 corresponding to those shown in FIG. 30 are indicated by the same reference numerals and the corresponding explanation is sometimes omitted for clarity. That is, the learning device 270B shown in FIG. 14 is basically configured similarly to the circuit shown in FIG. 30 except that a dequantization circuit 281 is newly provided at back of the quantization circuit 263.

In the learning device 270B of FIG. 33, the dequantization circuit 281 dequantizes the quantized DCT coefficients, output by the dequantization circuit 263, similarly to the dequantization circuit 271 of FIG. 32. The resulting DCT coefficients are routed to the prediction tap extraction circuit 264 and to the class tap extraction circuit 265.

Thus, in the prediction tap extraction circuit 264 and in the class tap extraction circuit 265, the prediction and class taps are formed for the DCT coefficients instead of for the quantized DCT coefficients. Subsequently, processing similar to that shown in FIG. 11 is performed on the DCT coefficients.

The result is that there are produced tap coefficients that diminish the effect of the quantization error resulting from quantization and dequantization of the DCT coefficients.

Figure 34:
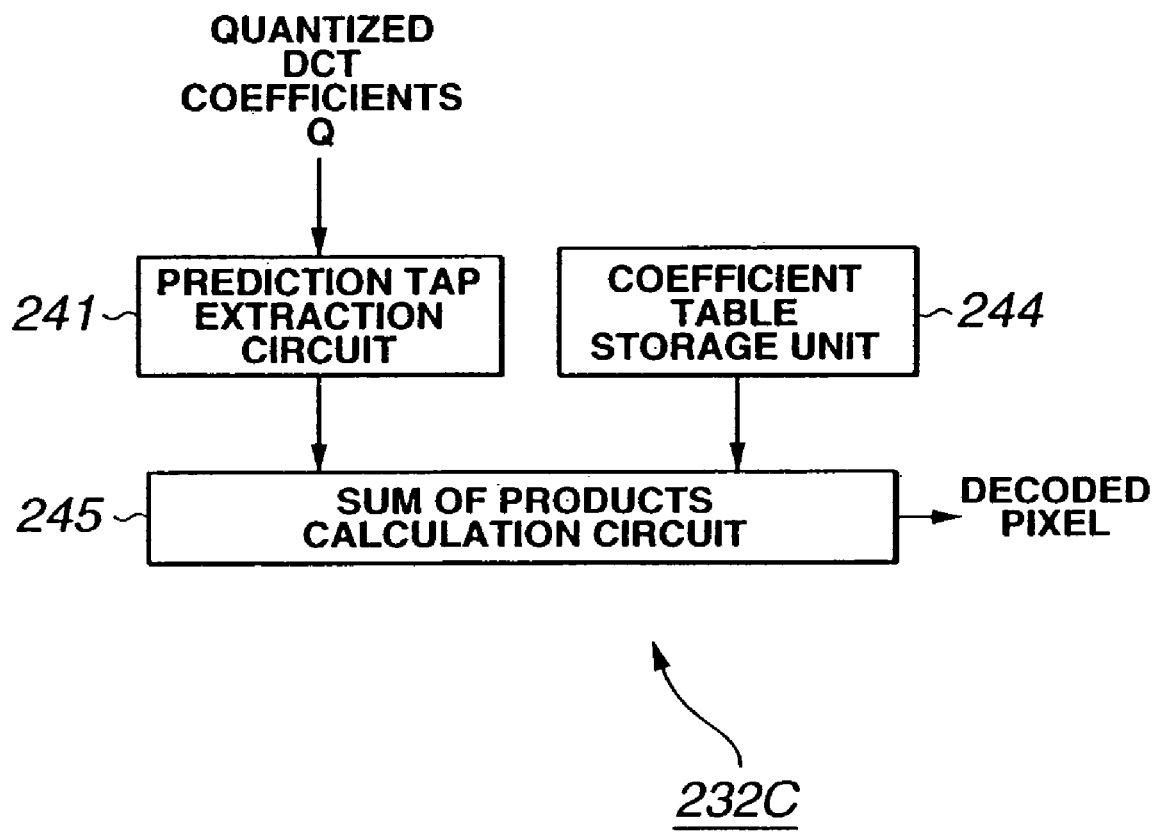
FIG. 34 is a block diagram showing still another illustrative structure of the coefficient conversion circuit.

FIG. 34 shows a modified illustrative structure of the coefficient conversion circuit 232 of FIG. 23. The parts or components of FIG. 34 corresponding to those shown in FIG. 26 are indicated by the same reference numerals and the corresponding explanation is sometimes omitted for clarity. That is, the coefficient conversion circuit 232C shown in FIG. 34 is basically configured similarly to the circuit shown in FIG. 26 except that it is destitute of the class tap extraction circuit 242 and the classification circuit 243.

So, the coefficient conversion circuit 232C shown in FIG. 34 lacks in the concept of the class, which may be said to be equivalent to the number of the classes being one. Thus, only one class of the tap coefficients is stored in the coefficient table storage unit 244 such that processing is executed using this one class of the tap coefficients.

That is, in the coefficient conversion circuit 232C of FIG. 34, the tap coefficients memorized in the coefficient-table storage unit 244 differ from those shown in FIG. 26.

Figure 35:
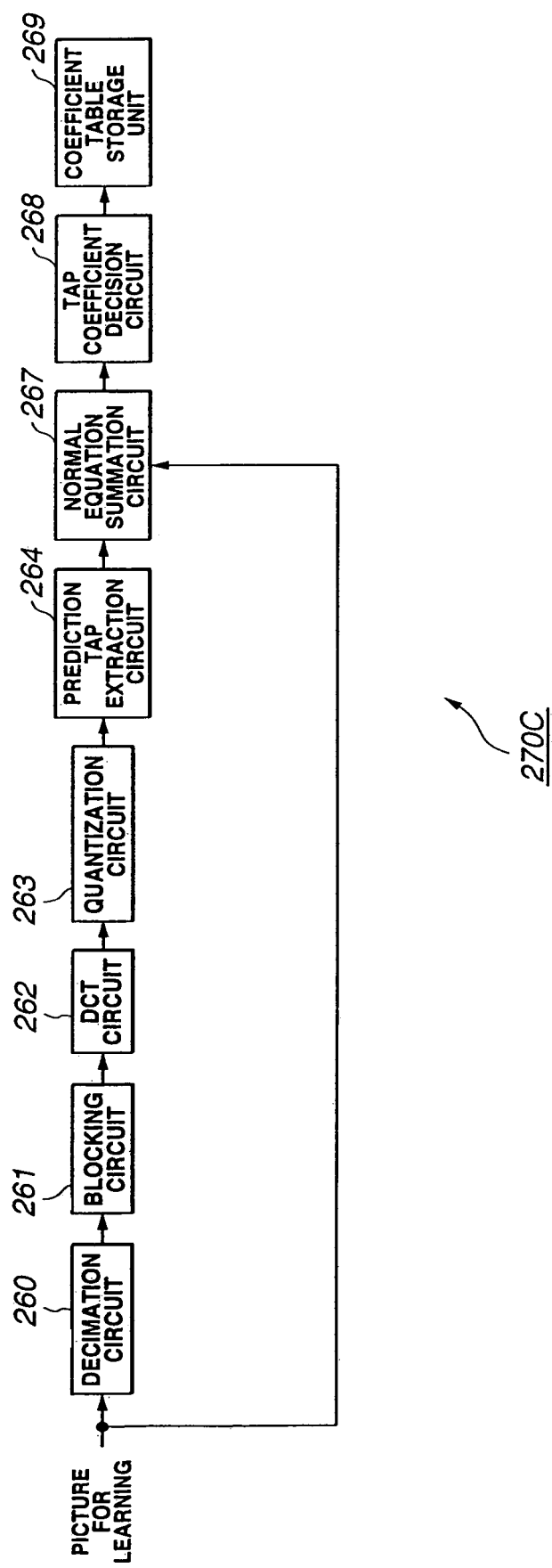
FIG. 35 is a block diagram showing still another illustrative structure of the learning device.

FIG. 35 shows an illustrative structure of the learning device 270C for executing the processing of learning the tap coefficients to be stored in the coefficient table storage unit 244 of FIG. 34. Meanwhile, the parts or components of FIG. 35 corresponding to those shown in FIG. 30 are indicated by the same reference numerals and the corresponding explanation is sometimes omitted for clarity. That is, the coefficient conversion circuit 270C shown in FIG. 35 is basically configured similarly to the circuit shown in FIG. 30 except that it is destitute of the class tap extraction circuit 265 or the classification circuit 266.

Thus, in the learning device 270C of FIG. 35, the above-described summation is carried out without dependency on the class in the normal equation summation circuit 267. The tap coefficient decision circuit 268 solves the normal equations generated from one pixel position mode to another to find the tap coefficients.

Figure 36:
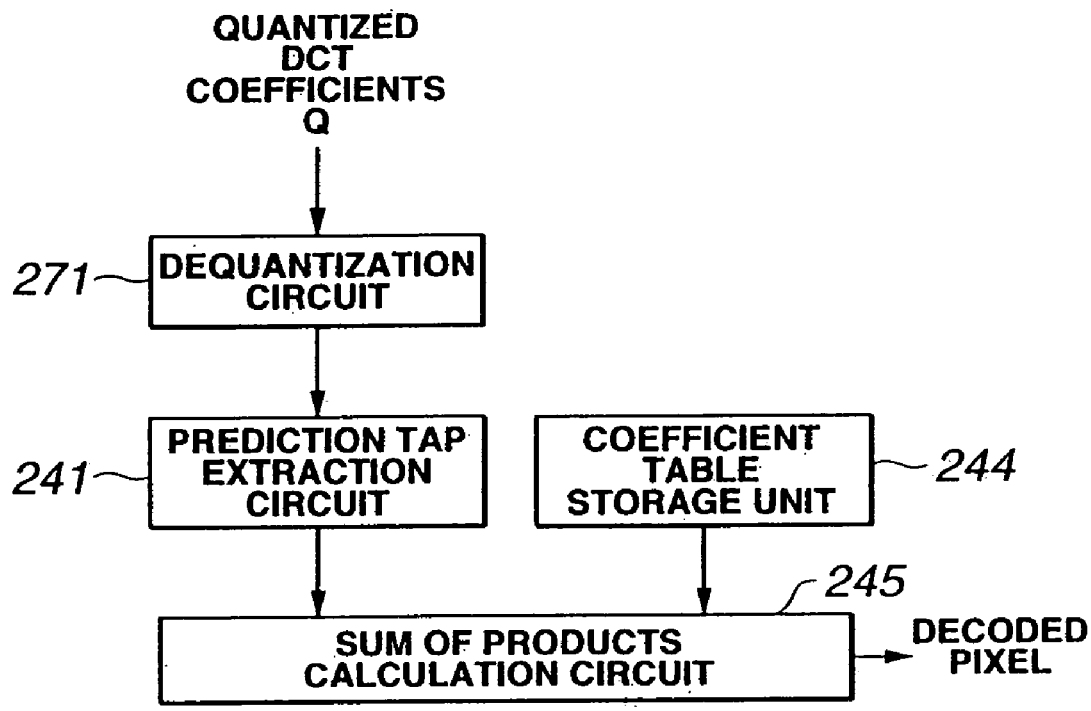
FIG. 36 is a block diagram showing still another illustrative structure of the coefficient conversion circuit.

FIG. 36 shows another illustrative structure of the coefficient conversion circuit 232 of FIG. 23. Meanwhile, the parts or components of FIG. 36 corresponding to those shown in FIG. 26 or 32 are indicated by the same reference numerals and the corresponding explanation is sometimes omitted for clarity. That is, the coefficient conversion circuit 232D shown in FIG. 36 is basically configured similarly to the circuit shown in FIG. 26 except that it is destitute of the class tap extraction circuit 242 or the classification circuit 243 and that there is newly provided the dequantization circuit 271.

Thus, similarly to the coefficient conversion circuit 232C of FIG. 34, the coefficient conversion circuit 232D of FIG. 36 memorizes only the class coefficients of one class and processing is carried out using these one-class tap coefficients.

Moreover, in the coefficient conversion circuit 232D of FIG. 36, prediction taps are formed not on the quantized DCT coefficients, but on the DCT coefficients, output by the dequantization circuit 271, as in the coefficient conversion circuit 232C of FIG. 32. Subsequently, processing is further performed on the DCT coefficients.

Thus, in the coefficient conversion circuit 232D, shown in FIG. 36, the tap coefficients stored in the coefficient table storage unit 244 differ from those shown in FIG. 26.

Figure 37:
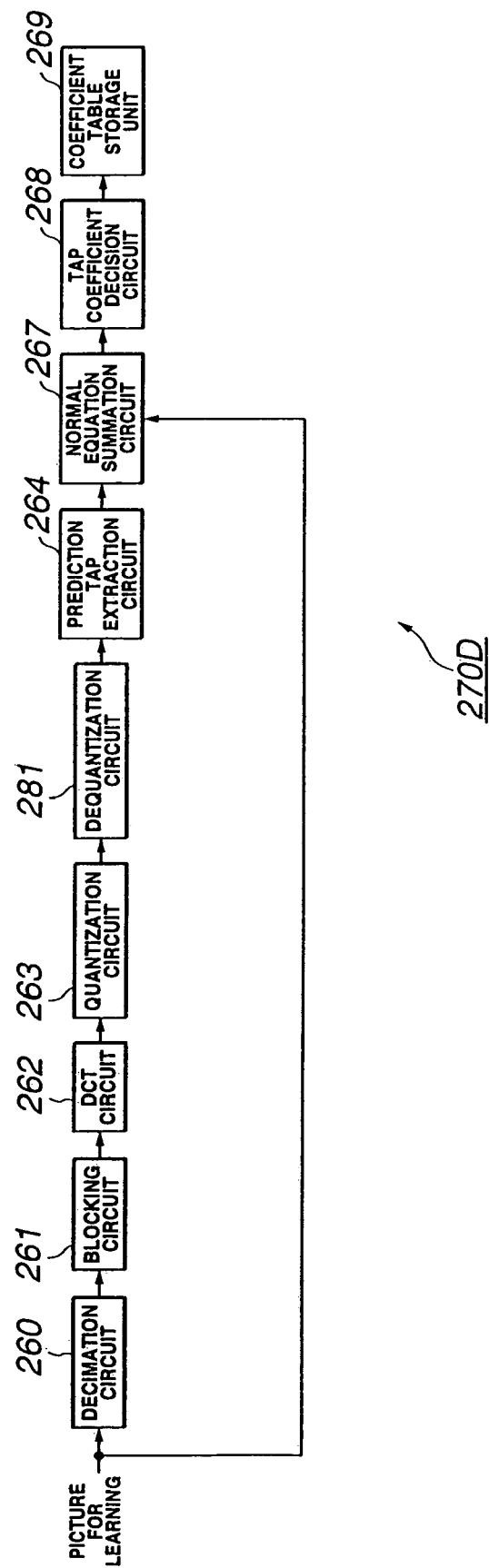
FIG. 37 is a block diagram showing still another illustrative structure of the learning device.

Thus, FIG. 37 shows an illustrative structure of a learning device 270D executing the learning processing of tap coefficients to be stored in the coefficient table storage unit 244 of FIG. 36. Meanwhile, the parts or components of FIG. 37 corresponding to those shown in FIG. 30 or 33 are indicated by the same reference numerals and the corresponding explanation is sometimes omitted for clarity. That is, the learning device 270D shown in FIG. 37 is basically configured similarly to the learning device shown in FIG. 37, except that it is destitute of the class tap extraction circuit 265 or the classification circuit 266 and that there is newly provided the dequantization circuit 281.

Thus, in the learning device 270D, shown in FIG. 37, prediction taps are formed in the prediction tap extraction circuit 264 for the DCT coefficients instead of for the quantized DCT coefficients. Subsequently, processing is further performed on the DCT coefficients. Moreover, the normal equation summation circuit 267 executes the aforementioned summation without dependency on the class, such that the tap coefficient decision circuit 268 solves the normal equations generated without dependency on the class to find the tap coefficients.

Although the image produced on JPEG encoding for compression encoding a still image is targeted in the foregoing, it is also possible to target e.g., a picture obtained on MPEG encoding.

Figure 38:
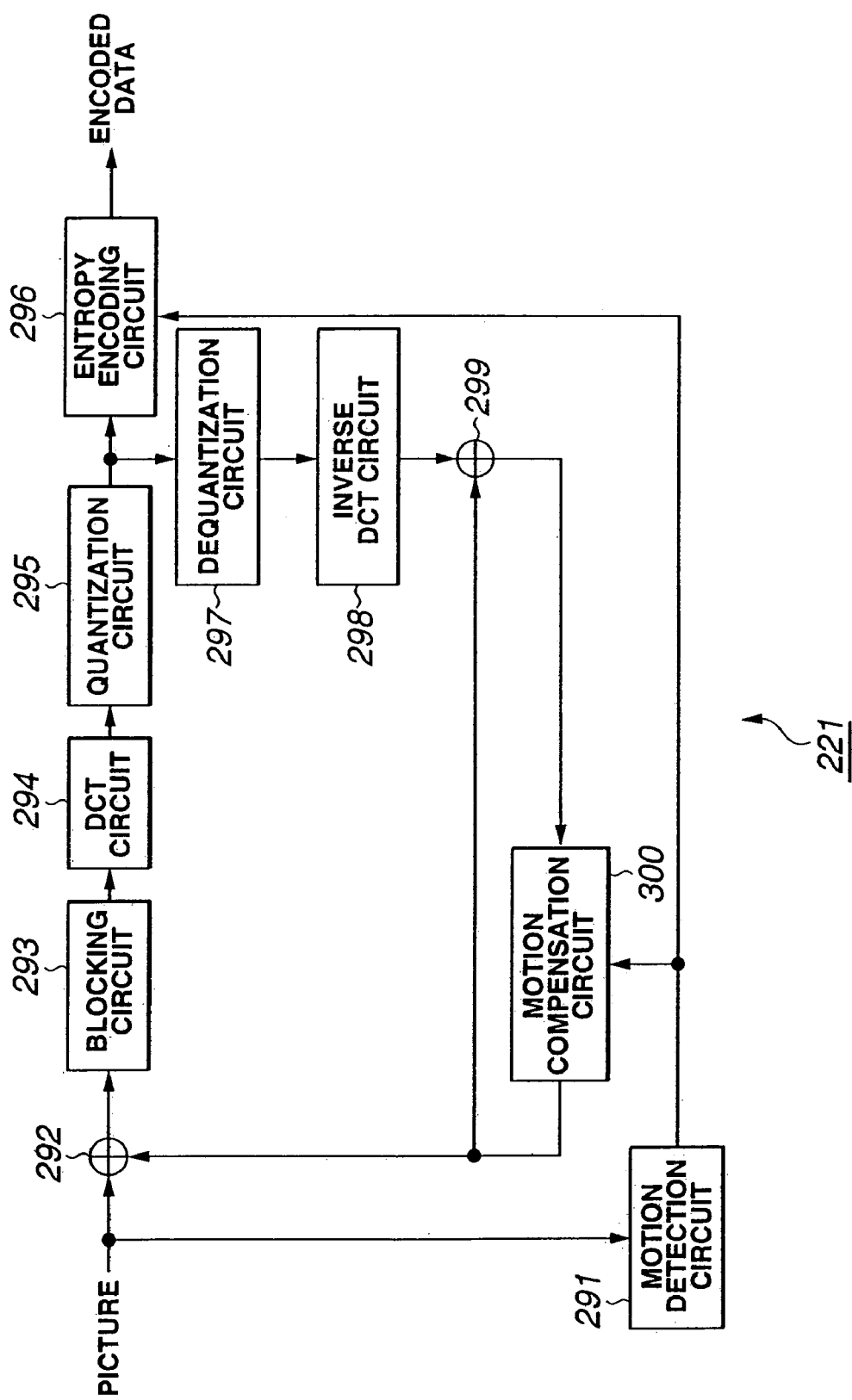
FIG. 38 is a block diagram showing an illustrative structure of the encoder.

That is, FIG. 38 shows an illustrative structure of the encoder 221 when MPEG encoding is performed.

In the encoder 221, shown in FIG. 38, the frames or the fields, making up a moving picture to be encoded by MPEG, are sequentially sent to a motion detection circuit 291 and to a calculating unit 292.

The motion detection circuit 291 detects the motion vector for a frame supplied thereto, on the macro-block basis, to send the so detected motion vector to an entropy decoding circuit 296 and to a motion compensation circuit 300.

If the picture supplied to the calculating unit 292 is an I-picture (intra-picture), the calculating unit 292 directly routes it on the macro-block basis to the blocking circuit 293. If the picture supplied to the calculating unit 292 is a P-picture (predictive coded picture) or a B-picture (bidirectionally predicted picture), the calculating unit 292 calculates a difference from the reference picture supplied from the motion compensation circuit 300 to route the difference values to the blocking circuit 293.

The blocking circuit 293 blocks an output of the calculating unit 292 into pixel blocks of 8×8 pixels which are supplied to a DCT circuit 294. The DCT circuit 294 applies DCT processing to the pixel blocks from the blocking circuit 293 to route the resulting DCT coefficients to a quantization circuit 295. The quantization circuit 295 quantizes the resulting block-based DCT coefficients in a preset quantization step to route the resulting quantized DCT coefficients to the entropy decoding circuit 296. The entropy decoding circuit 296 entropy-encodes the quantized DCT coefficients from the quantization circuit 295 to add the motion vector from the motion detection circuit 291 and other similar needed information to output the resulting encoded data as MPEG encoding results.

Of the quantized DCT coefficients, output by the quantization circuit 295, the I- and P-pictures need to be locally decoded for use as reference pictures for subsequently encoded P- and B-Pictures. Thus, these pictures are routed not only to the entropy decoding circuit 296 but also to the dequantization circuit 297.

The dequantization circuit 297 dequantizes the quantized DCT coefficients from the quantization circuit 295 into DCT coefficients which are routed to an inverse DCT circuit 298. The inverse DCT circuit 298 applies inverse DCT to the DCT coefficients from the dequantization circuit 297 to output the result to a calculating unit 299. This calculating unit 299 is fed not only with the output of the inverse DCT circuit 298 but also with a reference picture output by the motion compensation circuit 300. If the output of the inverse DCT circuit 298 is a P-picture, the calculating unit 299 adds the output to an output of the motion compensation circuit 300 to decode the original picture which is supplied to the motion compensation circuit 300. If the output of the inverse DCT circuit 298 is an I-picture, the output is the decoded I-picture, so the calculating unit 299 directly routes the picture to the motion compensation circuit 300.

The motion compensation circuit 300 motion-compensates a locally decoded picture, supplied from the calculating unit 299, in accordance with the motion vector from the motion detection circuit 291, to route the motion-compensated picture as reference picture to the calculating unit 292 and to the calculating unit 299.

In the decoder 222 of FIG. 23, even MPEG encoded data can be efficiently decoded to a picture of a high quality.

That is, the encoded data is sent to the entropy decoding circuit 231 which then entropy-decodes the encoded data. The quantized DCT coefficients, resulting from this entropy decoding, motion vector and other information are routed from the entropy decoding circuit 231 to the coefficient decoding circuit 232D.

The coefficient decoding circuit 232D uses the quantized DCT coefficients Q from the entropy decoding circuit 231 and the tap coefficients as found by learning to effect preset predictive calculations and motion compensation in accordance with the motion vector from the entropy decoding circuit 231 as necessary to decode the quantized DCT coefficients into pixel values of high picture quality to route the high picture quality block comprised of the high picture quality pixel values to the deblocking circuit 233.

The deblocking circuit 233 deblocks the high picture quality block obtained in the coefficient decoding circuit 232D to acquire and output a high picture quality decoded picture having the numbers of horizontal and vertical pixels e.g., twice those of the MPEG encoded picture.

Figure 39:
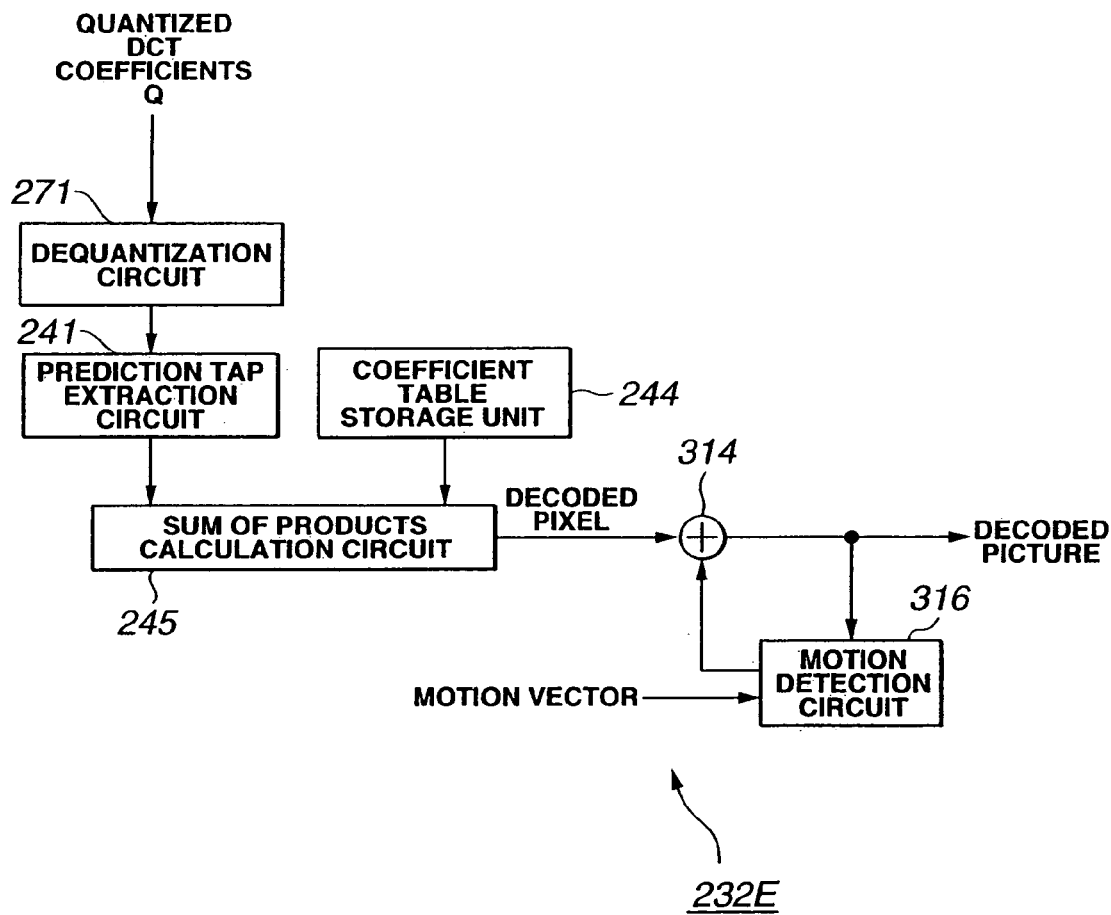
FIG. 39 is a block diagram showing still another illustrative structure of the learning device.

FIG. 39 shows an illustrative structure of the coefficient decoding circuit 232 of FIG. 23 in case of decoding the MPEG encoded data by the decoder 222. Meanwhile, the parts or components corresponding to those of FIG. 36 are depicted by the same reference numerals and are not explained specifically. That is, the coefficient decoding circuit 232E, shown in FIG. 39, is basically formed similarly to that shown in FIG. 36, except that the coefficient decoding circuit 232E is provided with a calculating unit 314 and a motion compensation circuit 316 in rear of the sum-of-products circuit 245.

Thus, in the coefficient decoding circuit 232E, shown in FIG. 39, the quantized DCT coefficients are dequantized by the dequantization circuit 271 and, using the resulting DCT coefficients, prediction taps are formed by the class tap extraction circuit 241. The sum-of-products circuit 245 executes predictive calculations, using the tap coefficients employing the prediction taps and the tap coefficients stored in the coefficient table storage unit 244 to output high picture quality data having the number of the horizontal and vertical pixels e.g., twice those of the original picture.

The calculating unit 314 sums an output of the sum-of-products circuit 245 to an output of the motion compensation unit 316 as necessary to decode a picture of high picture quality having the number of the horizontal and vertical pixels e.g., twice those of the original picture to output the resulting high quality picture to the deblocking circuit 233 (FIG. 23).

That is, for an I-picture, an output of the sum-of-products circuit 245 is a high quality picture having the number of the horizontal and vertical pixels e.g., twice those of the original picture, so that the calculating unit 314 directly routes an output of the sum-of-products circuit 245 to the deblocking circuit 233.

For a P- or B-picture, the output of the sum-of-products circuit 245 is a difference between the high picture quality picture having the number of the horizontal and vertical pixels e.g., twice those of the original picture and the high quality reference picture. So, the calculating unit 314 sums the output of the sum-of-products circuit 245 to the reference picture of high picture quality supplied from the motion compensation circuit 316 to provide a decoded picture of high picture quality having the numbers of the horizontal and vertical pixels e.g., twice those of the original picture to output the decoded picture to the deblocking circuit 233.

On the other hand, the motion compensation circuit 316 receives I- and P-pictures, among the high quality decoded pictures, output by the calculating unit 314, and applies motion compensation employing the motion vector from the entropy decoding circuit 231 (FIG. 23) to the high-quality decoded I- or P-picture to produce a high quality reference picture which is routed to the calculating unit 314.

Since the numbers of the horizontal and vertical pixels are e.g., twice those of the original picture, the motion compensation circuit 316 effects motion compensation in accordance with the motion vector having the sizes in the horizontal and vertical directions twice those of the motion vector from the entropy decoding circuit 231.

Figure 40:
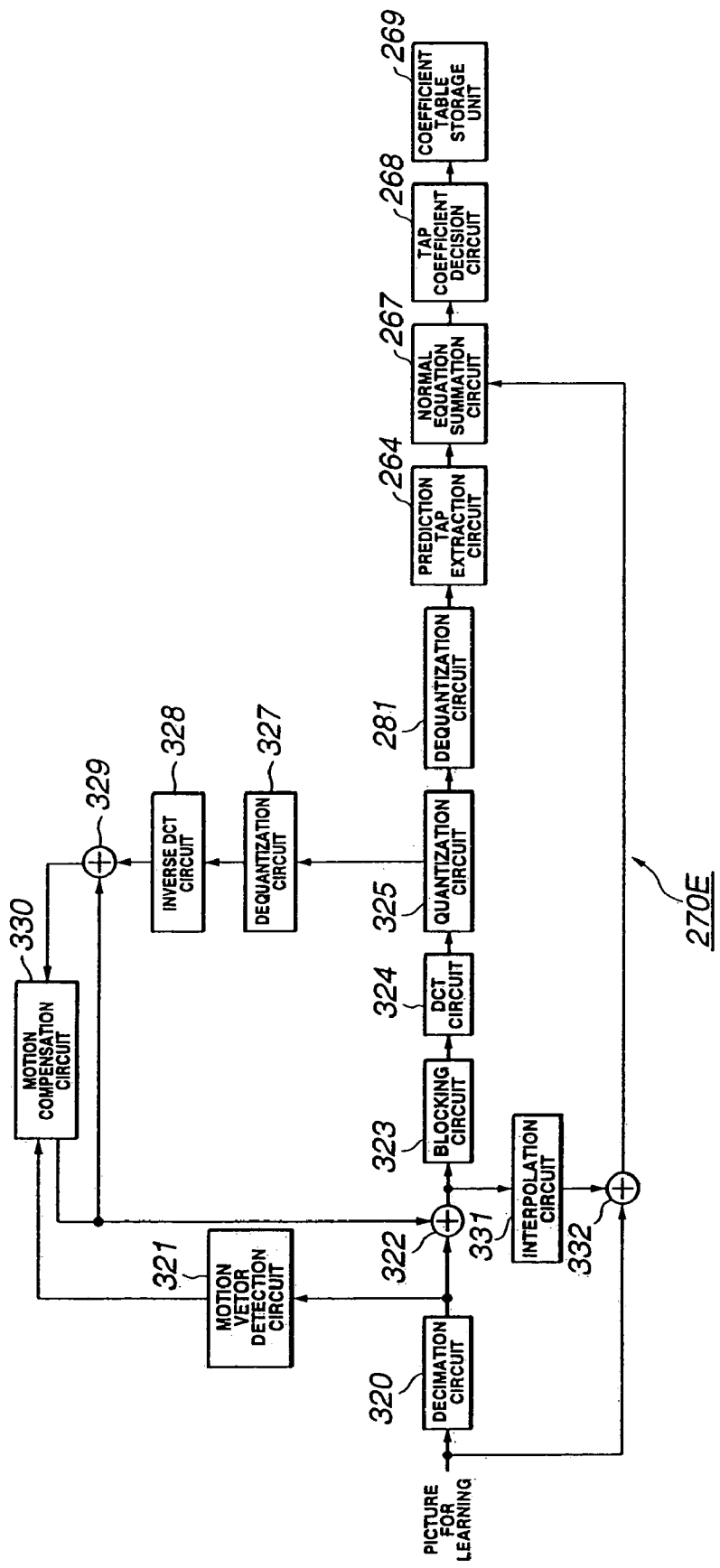
FIG. 40 is a block diagram showing still another illustrative structure of the learning device.

FIG. 40 shows an illustrative structure of a learning device 270E responsible for performing the learning processing of the tap coefficients to be stored in the coefficient table storage unit 244. In the drawing, the parts or components corresponding to those shown in FIG. 37 are depicted by the same reference numerals and detailed description is omitted for simplicity.

In the learning device 270A, shown in FIG. 40, a decimation circuit 320 is fed with an HD picture for learning, as teacher data. Similarly to the decimation circuit 260, the decimation circuit 320 decimates the pixels of the HD picture as teacher data to generate quasi-teacher data which as an SD picture has the numbers of the horizontal and vertical pixels halved. The SD picture, as quasi-teacher data, is sent to a motion vector detection circuit 321 and to a calculating unit 322.

The motion vector detection circuit 321, calculating unit 322, blocking circuit 323, DCT circuit 324, quantization circuit 325, dequantization circuit 327, inverse DCT circuit 328, calculating unit 329 or the motion compensation circuit 330 performs the processing similar to that of the motion vector detection circuit 291, calculating unit 292, blocking circuit 293, DCT circuit 294, quantization circuit 295, dequantization circuit 297, inverse DCT circuit 298, calculating unit 299 or the motion compensation circuit 300 of FIG. 38, whereby the quantization circuit 125 outputs quantized DCT coefficients similar to those output by the quantization circuit 295 of FIG. 38.

The quantized DCT coefficients output by the quantization circuit 325 are sent to the dequantization circuit 281, which then dequantizes the quantized DCT coefficients to DCT coefficients from the quantization circuit 325 into DCT coefficients. These DCT coefficients then are supplied to the prediction tap extraction circuit 264. This prediction tap extraction circuit forms prediction taps from the DCT coefficients of the dequantization circuit 281 to send the so-formed tap coefficients as pupil data to the normal equation summation circuit 267.

On the other hand, the HD picture as teacher data is sent not only to the decimation circuit 320 but also to the calculating unit 332. This calculating unit subtracts an output of an interpolation circuit 331 from the HD picture as teacher data as necessary to send the resulting difference to the normal equation summation circuit 267.

That is, the interpolation circuit 331 generates a high picture quality reference picture having the numbers of pixels in the horizontal and vertical directions twice those of the reference picture of the SD picture output by the motion compensation circuit 330.

If the HD picture sent to the calculating unit 332 is an I-picture, the calculating unit sends the HD picture of the I-picture directly as teacher data to the normal equation summation circuit 267. If the HD picture sent to the calculating unit 332 is a P- or B-picture, the calculating unit calculates the difference between the HD picture of the P- or B-picture and the high picture quality reference picture output by the interpolation circuit 131 to yield a high quality version of the difference with respect to the SD picture output by the calculating unit 322 (quasi-teacher data). This high quality version of the difference is sent as teacher data to the normal equation summation circuit 267.

Meanwhile, the interpolation circuit 331 is able to increase the number of pixels by, for example, simple interpolation. The interpolation circuit 331 is also able to increase the number of pixels by, for example, classification adaptive processing. Moreover, the calculating unit 332 is able to MPEG-encode, locally decode and motion-compensate the HD picture as teacher data for use as a reference picture.

The normal equation summation circuit 267 executes the aforementioned summation of the output of the calculating unit 332 as teacher data and the prediction taps from the dequantization circuit 281 as pupil data to generate a normal equation.

The tap coefficient decision circuit 268 solves the normal equation generated by the normal equation summation circuit 267 to find tap coefficients which are then sent to and stored in the tap coefficient storage unit 269.

In the sum-of-products circuit 245, shown in FIG. 39, the tap coefficients, found as described above, are used to decode the MPEG-encoded data. Thus, the processing of decoding the MPEG-encoded data and the processing of raising the picture quality of the decoded data again can be executed simultaneously. The result is that, in the present embodiment, a decoded picture as an HD picture of a high picture quality, having double the numbers of the horizontal and vertical pixels, may be obtained efficiently.

Meanwhile, the coefficient conversion circuit 232E of FIG. 39 may also be designed without providing the dequantization circuit 271. In such case, it suffices to design the learning device 270E of FIG. 40 without providing the dequantization circuit 281.

The coefficient conversion circuit 232E of FIG. 39 may also be provided with a class tap extraction circuit 242 and a classification circuit 243, as in the case of FIG. 26. In such case, the learning device 270E of FIG. 40 may be provided with the class tap extraction circuit 265 and a classification circuit 266, as in the case of FIG. 30.

In the above-described case, the decoder 222 is adapted for producing a decoded picture having the spatial resolution improved to twice that of the original picture. It is however possible for the decoder 222 to produce a decoded picture having a spatial resolution raised by a factor of an optional multiple number relative to that of the original picture or a decoded picture having a temporal resolution improved with respect to that of the original picture.

Figure 41A:
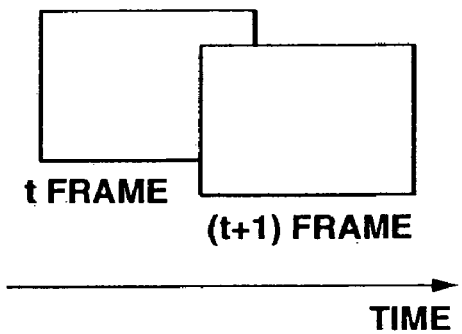
FIGS. 41A and 41B show a picture in which time resolution has been improved.
Figure 41B:
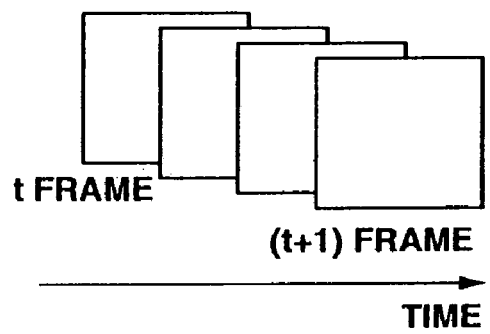
Figure 42A:
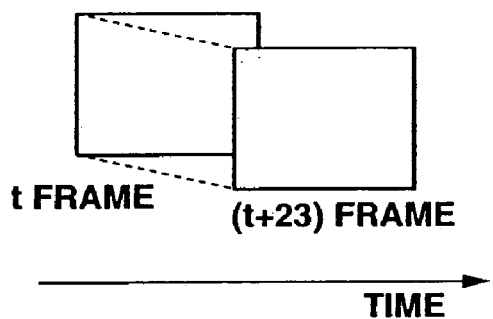
FIGS. 42A and 42B show a picture in which time resolution has been improved.
Figure 42B:
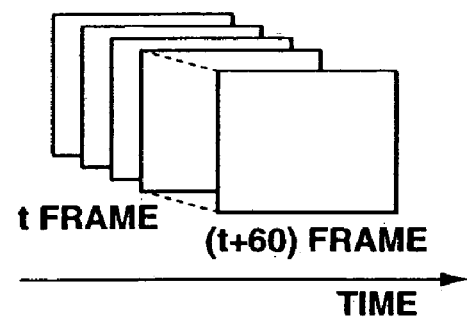

That is, if the picture to be MPEG encoded is of a low temporal resolution, as shown in FIG. 41A, it is possible for the decoder 222 to decode the original picture with a temporal resolution twice that of the original picture as shown in FIG. 41B. Moreover, if the picture of an object to be MPEG encoded is a picture of 24-frame-per-second rate as used in a motion picture, as shown in FIG. 42A, it is possible for the decoder 222 to decode the encoded data, obtained on MPEG encoding the picture, into a picture of 60-frame-per-second rate in which the temporal resolution is 60/24 times that of the original picture, as shown in FIG. 42B. In this case, the so-called 2-3 pull-down may be achieved readily.

Figure 43:
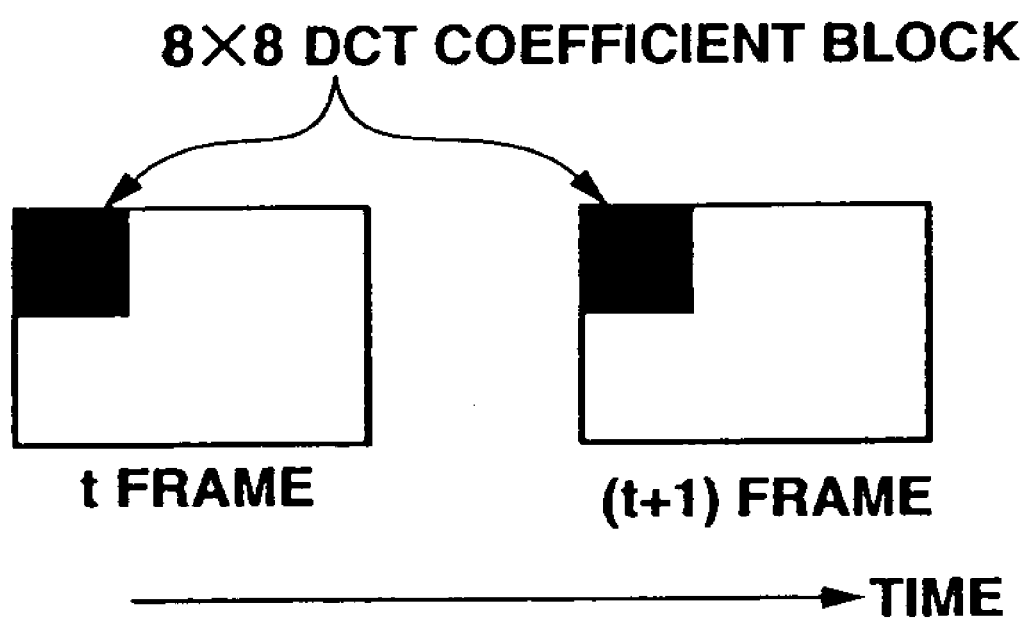
FIG. 43 shows that shows that a class tap and a prediction tap are constructed from the DCT coefficients of two or more frames.

If the temporal resolution is to be improved in the decoder 222, the prediction tap or the class tap may be formed by two or more DCT coefficients, as shown for example in FIG. 43.

The decoder 222 is also able to produce a decoded picture in which not only one but also both of the spatial resolution and temporal resolution are improved.

According to the present invention, described above, it is possible to produce the tap coefficients found by learning, to use the tap coefficients and the transformed data to effect preset predictive calculations to decode the transformed data into original data, and to produce processed data corresponding to the original data processed in a preset fashion.

Thus, it becomes possible to decode the transformed data efficiently to process the decoded data in a preset fashion.

Moreover, according to the present invention, teacher data, as teacher, are processed in a preset fashion, the resulting quasi-teacher data are at least orthogonal or frequency transformed to generate pupil data as pupils, and learning is executed such as to statistically minimize the prediction errors of predicted values of teacher data obtained on predictive calculations employing tap coefficients and pupil data to find tap coefficients. Using the tap coefficients, thus found, the data orthogonal or frequency transformed may be decoded efficiently, while the decoded data may also be processed in a preset fashion.

A further modification of the present invention is now explained.

Figure 44:
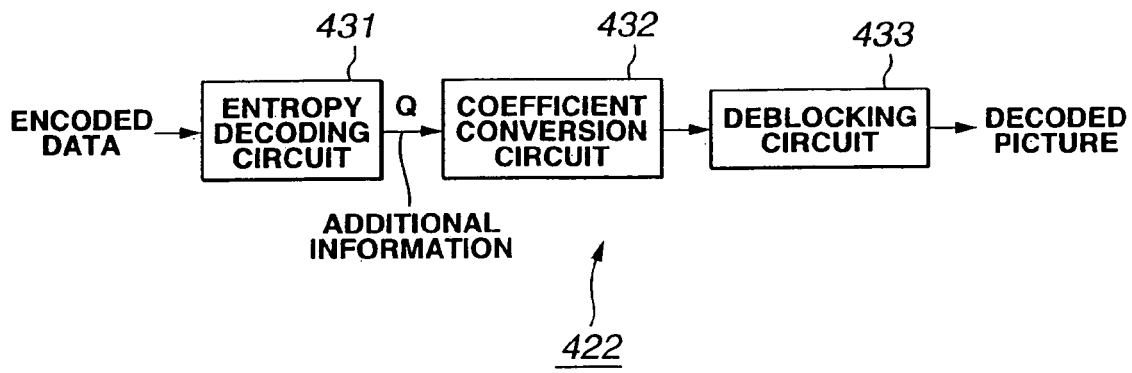
FIG. 44 is a block diagram showing an illustrative structure of a decoder in a embodiment in which the present invention is applied to the picture transmission system.

In the embodiment, now explained, a decoder 422, shown in FIG. 44, comprised of an entropy decoding circuit 431, a coefficient conversion circuit 432 and a deblocking circuit 433, as decoder 22 shown in FIG. 2, is used to decode the encoded data.

The encoded data is sent to the entropy decoding circuit 431, which entropy decoding circuit separates the encoded data into entropy encoded quantized DCT coefficients and a quantization table as the summational information annexed thereto. The entropy decoding circuit 431 entropy decodes the entropy encoded quantized DCT coefficients to send the resulting block-based quantized DCT coefficients Q along with the quantization table as the annexed information to the coefficient conversion circuit 432.

Using the quantization table as the annexed information, as, so to speak, an auxiliary tool, and also using tap coefficients, as found by learning with the quantized DCT coefficients Q, the coefficient conversion circuit 432 executes preset predictive calculations to decode the block-based quantized DCT coefficients into the original block of 8×8 pixels.

The deblocking circuit 433 deblocks the decoded block obtained in the coefficient conversion circuit 432 to produce and output the decoded picture.

Figure 45:
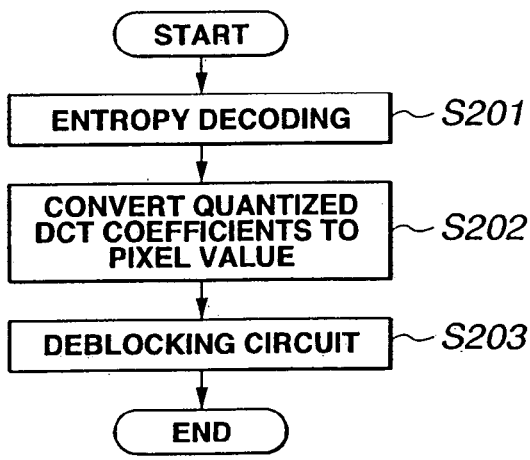
FIG. 45 is a flowchart for illustrating the processing by the decoder.

This decoder 422 performs decoding in accordance with the sequence shown in the flowchart of FIG. 45 (steps S201 to S203).

That is, the encoded data is sequentially supplied to the entropy decoding circuit 431. At step S201, the entropy decoding circuit 431 entropy decodes the encoded data and sends the block-based quantized DCT coefficients Q to the coefficient conversion circuit 432. The entropy decoding circuit 431 also separates the quantization table as the summational information contained in the encoded data to send the table to the coefficient conversion circuit 432. The coefficient conversion circuit at step S202 executes the prediction calculations employing the quantization table and the tap coefficients to decode the block-based quantized DCT coefficients Q from the entropy decoding circuit 431 into block-based pixel values which are then routed to the deblocking circuit 433. The deblocking circuit 433 at step S203 deblocks the pixel values from the coefficient conversion circuit 432 (decoded block) to output the resulting decoded picture to terminate the processing.

Figure 46:
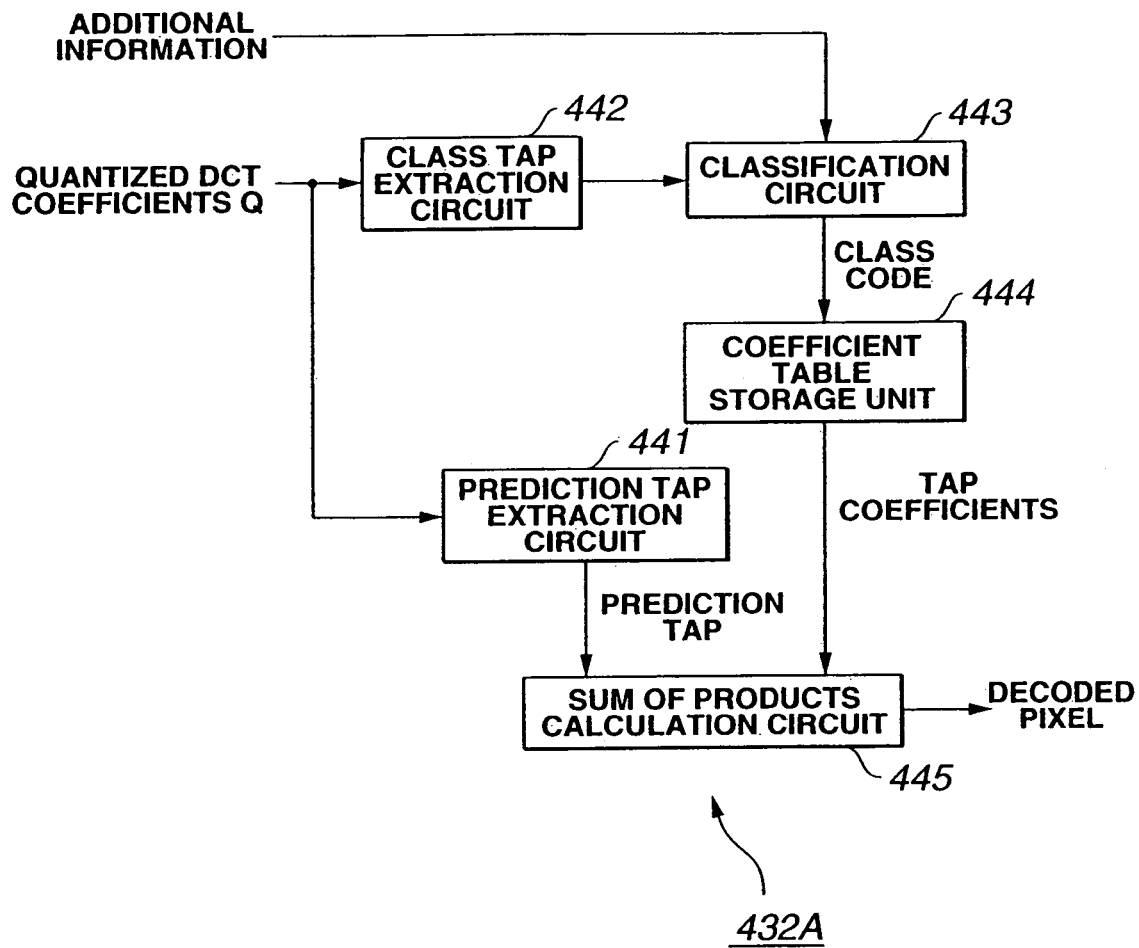
FIG. 46 is a block diagram showing an illustrative structure of a coefficient conversion circuit in the decoder.

FIG. 46 shows an illustrative structure of the coefficient decoding circuit 432 of FIG. 23 for decoding the quantized DCT coefficients into pixel values.

In a coefficient decoding circuit 432A, shown in FIG. 46, the block-based quantized DCT coefficients, output by the entropy decoding circuit 431 (FIG. 44), are routed to a block-based prediction tap extraction circuit 441 and to a class tap extraction circuit 442. The quantization table, as subsidiary information, is routed to the classification circuit 443.

The prediction tap extraction circuit 441 sets the block pixel values corresponding to the block of quantized DCT coefficients supplied thereto, incidentally referred to below as DCT blocks, sequentially as high picture quality blocks of interest. These blocks of pixel values, not present in the present stage but virtually presupposed, are incidentally referred to below as pixel blocks. Moreover, the pixels that make up the high picture quality block of interest are sequentially made into pixels of interest in the raster scanning sequence. In summation, the prediction tap extraction circuit 441 extracts the quantized DCT coefficients, used for predicting the pixel values of the pixels of interest, for use as prediction taps.

That is, the prediction tap extraction circuit 441 extracts, as prediction taps, the totality of the quantized DCT coefficients, that is 8×8=64 quantized DCT coefficients, of the DCT block corresponding to the pixel block to which belongs the pixel of interest, as shown in FIG. 6. Thus, in the present embodiment, the same prediction tap is formed for all pixels of a certain high picture quality block. Alternatively, the prediction tap may be formed by different quantized DCT coefficients from one pixel of interest to another.

The prediction taps of the respective pixels making up the pixel block, that is 64 sets of the prediction taps for each of the 64 pixels, obtained in the prediction tap extraction circuit 441, are sent to a sum-of-products circuit 445. However, since the same prediction tap is formed for all pixels of a pixel block, it is in effect sufficient if a set of the predication taps is provided to the sum-of-products circuit 245 for one pixel block.

The class tap extraction circuit 442 extracts quantized DCT coefficients used for classifying the pixels of interest into one of a plural number of classes, for use as class taps. Similarly to the prediction tap extraction circuit 441, the class tap extraction circuit 442 extracts the totality of the 8×8 quantized DCT coefficients of the DCT block, corresponding to the pixel block to which belongs the pixel of interest, shown in FIG. 6, as class taps.

It is noted that the class tap extraction circuit 442 extracts 64 quantized DCT coefficients of a DCT block associated with a pixel block in question, in order to classify the pixel blocks, from one pixel block to another, for use as class taps.

Meanwhile, the quantized DCT coefficients, forming prediction taps or class taps, are not limited to those of the above-mentioned patterns.

The class taps of the pixel block of interest, obtained in the class tap extraction circuit 442, are supplied to the classification circuit 443. The classification circuit classifies the high picture quality block of interest, based on the class tap from the class tap extraction circuit 442, to output a class code corresponding to the so obtained class.

As a classification method, ADRC, for example, may be used. With the method employing ADRC, the quantized DCT coefficients, forming a class tap, are processed with ADRC. The class of the pixel block of interest is determined based on the resultant ADRC code.

Meanwhile, in the present embodiment, the classification circuit 443 extracts characteristic values of high cruciality from the quantized DCT coefficients forming the class tap, and undertakes classification based on these characteristic values to diminish the number of the classes.

Figure 47:
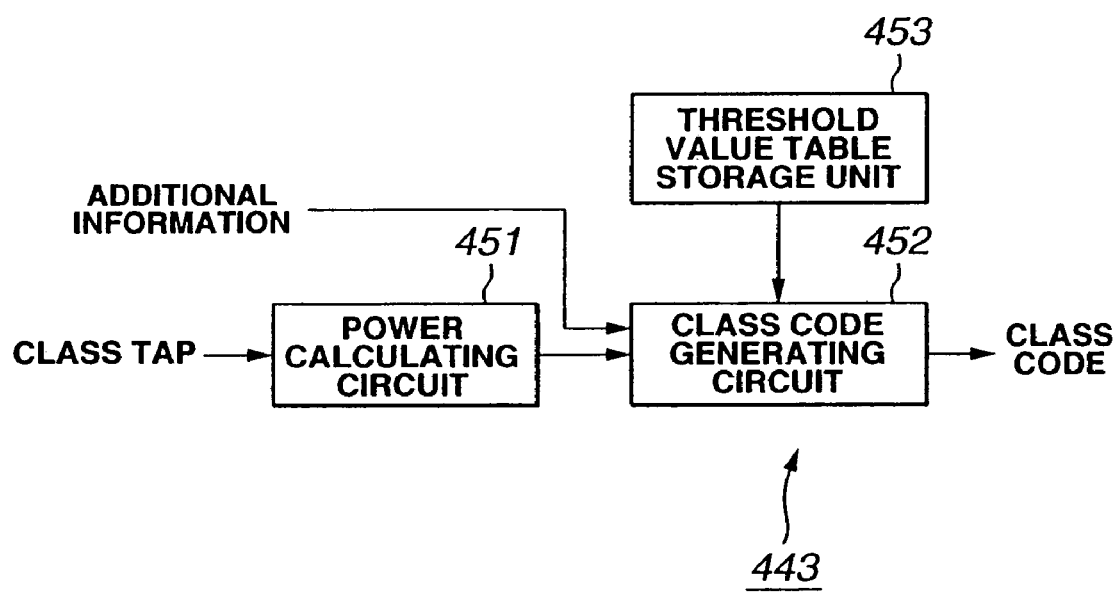
FIG. 47 is a block diagram showing an illustrative structure of a classification circuit in the coefficient conversion circuit.

FIG. 47 shows an illustrative structure of the classification circuit 443 of FIG. 46.

In the classification circuit 443, shown in FIG. 47, the class tap is adapted to be supplied to a power calculating circuit 451. The power calculating circuit 451 splits the quantized DCT coefficients forming the class tap into a plural number of spatial frequency bands, and calculates the power values of the respective frequency bands.

The power calculating circuit 451 splits the 8×8 quantized DCT coefficients forming the class tap into four spatial frequency bands $S_0$, $S_1$, $S_2$ and $S_3$ shown in FIG. 6.

The power calculating circuit 451 also finds the power values $P_0$ to P4 of the AC components of the quantized DCT coefficients for each of the spatial frequency bands $S_0$ to $S_3$ to output the calculated values of the power values to the class code generating circuit 452.

The class code generating circuit 452 compares the power values $P_0$, $P_1$, $P_2$ and $P_3$ from the power calculating circuit 451 to corresponding threshold values $TH_0$, $TH_1$, $TH_2$ and $TH_3$ stored in a threshold value storage unit 453 to output class codes based on the magnitude relationships thereof. That is, the class code generating circuit 452 compares the power $P_0$ to the threshold value $TH_0$ to produce a one-bit code representing the magnitude relationship. In similar manner, the class code generating circuit 252 compares the power $P_1$ to the threshold value $TH_1$ to produce a one-bit code representing the magnitude relationship thereof. Likewise, the class code generating circuit 252 compares the power $P_2$ to the threshold value $TH_2$ and the power $P_3$ to the threshold value $TH_3$ to produce a one-bit code for each of the power-threshold value combinations. The class code generating circuit 452 arrays the four one-bit codes (thus any of values from 0 to 15), obtained as described above, in e.g., a preset sequence, as class code representing the first class of the pixel block of interest. This first class is incidentally referred to below as power class code.

Figure 1B:
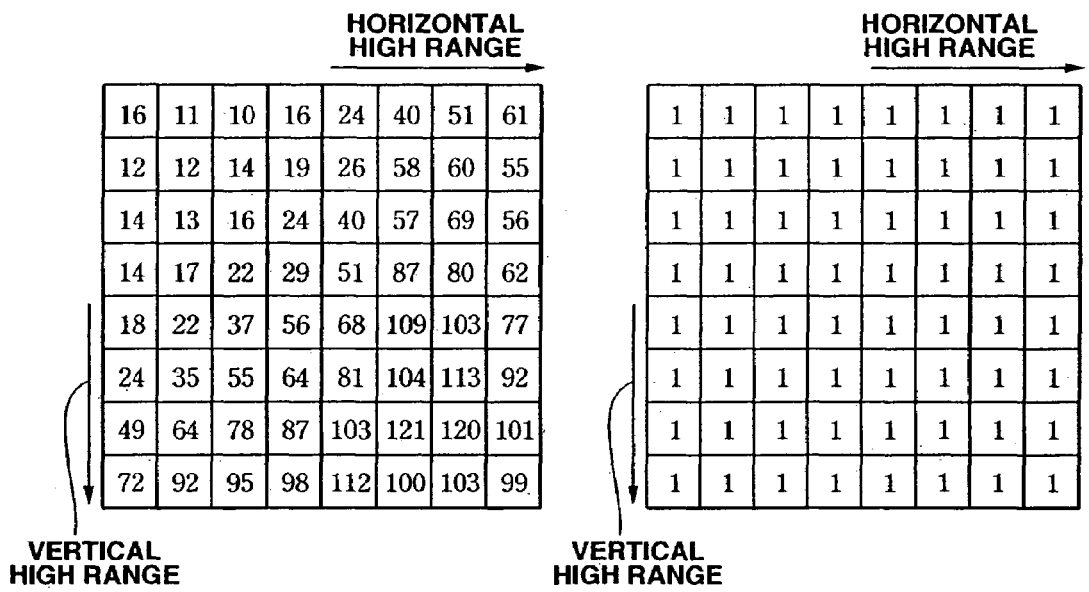
Figure 1C:
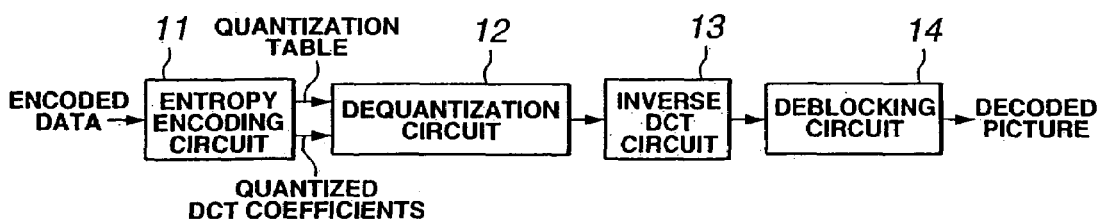

The class code generating circuit 452 is fed with a quantization table as the subsidiary information. The class code generating circuit 452 executes classification based on this subsidiary information to obtain a class code indicating the second class of the pixel block of interest. That is, if, in JPEG encoding, any of the two sorts of the quantization tables shown in FIG. 1B is used to carry out quantization, the class code generating circuit 452 verifies which one of these two sorts of the quantization tables is the quantization table as the subsidiary information, and renders a one-bit code representing the verified results the class code indicating the second class of the pixel block of interest. This one-bit code is incidentally referred to below as the class code of the subsidiary information.

The class code generating circuit 452 appends the one-bit subsidiary information class code, representing the second class, to the 4-bit power class code indicating the first class, to generate and output the ultimate class code for the pixel block of interest. Thus, in the present embodiment, the ultimate class code is of five bits, so that the pixel block of interest is classified in one of $2^5$ (=32) classes, for example, in a class represented by one of values of 0 to 31.

Meanwhile, the method of classification based on the quantization table is not limited to the method described above. That is, in the class code generating circuit 452, a plural number of quantization tables as reference patterns for comparison to the quantization table supplied as the subsidiary information (the quantization table actually used in the JPEG encoding) may be provided, and such a quantization table, as a reference pattern, most proximate to the quantization table as the subsidiary information, then may be detected to output a code corresponding to the detected results as the subsidiary information class code.

The threshold value storage unit 453 has stored therein threshold values $TH_0$ to $TH_3$ for comparison to the power values $P_0$ to $P_3$ of the spatial frequency bands $S_0$ to $S_3$.

In the above-described case, the DC component $x_0$ of the quantized DCT coefficients is not used for classification. It is however possible to use this DC component $x_0$ to execute the classification.

Reverting to FIG. 46, the class codes, output by the classification circuit 243, as described above, are afforded as addresses to a coefficient table storage unit 444.

The coefficient table storage unit 444 memorizes a coefficient table, having registered therein tap coefficients obtained by learning processing as will be explained subsequently, and outputs tap coefficients stored in an address associated with the class code, output by the classification circuit 443, to the sum-of-products circuit 245.

In the present embodiment, in which the pixel blocks are classified, one class code is obtained for the pixel block of interest. On the other hand, since the pixel block in the present embodiment is made up of 8×8=64 pixels, 64 sets of tap coefficients are required for decoding 64 pixels making up a pixel block of interest. Thus, the coefficient table storage unit 444 memorizes 64 sets of tap coefficients for an address corresponding to one class code.

The sum-of-products circuit 445 acquires the prediction tap output by the prediction tap extraction circuit 441 and the tap coefficients output by the coefficient table storage unit 444 and, using the prediction taps and the tap coefficients, executes linear predictive processing (sum of products processing) shown in the equation (1), to output the pixel values of the 8×8 pixels of the pixel block of interest as decoded results of the corresponding DCT block to the deblocking circuit 433 (FIG. 44).

In the prediction tap extraction circuit 441, each pixel of the pixel block of interest sequentially becomes a pixel of interest. The sum-of-products circuit 445 then performs processing in an operating mode associated with the position of a pixel which is the prevailing pixel of interest of the pixel block of interest. This operating mode is referred to as pixel position mode.

That is, if a number i pixel of the pixels of the pixel block of interest, in the raster scanning sequence, is denoted $p_i$, with the pixel $p_i$ being the prevailing pixel of interest, the sum-of-products circuit 445 performs the processing of the pixel mode #1.

Specifically, the coefficient table storage unit 444 outputs 64 sets of tap coefficients for decoding each of the 64 pixels making up a pixel block of interest. If the set of tap coefficients for decoding the pixel $p_i$ is denoted $W_i$, and the operating mode is the pixel mode #1, the sum-of-products circuit 445 performs the sum of product processing of the equation (1), using the prediction taps and the set $W_i$, among the tap coefficients of the 64 sets, and renders the results of the sum of product processing the results of the decoding of the pixel $p_i$.

Figure 48:
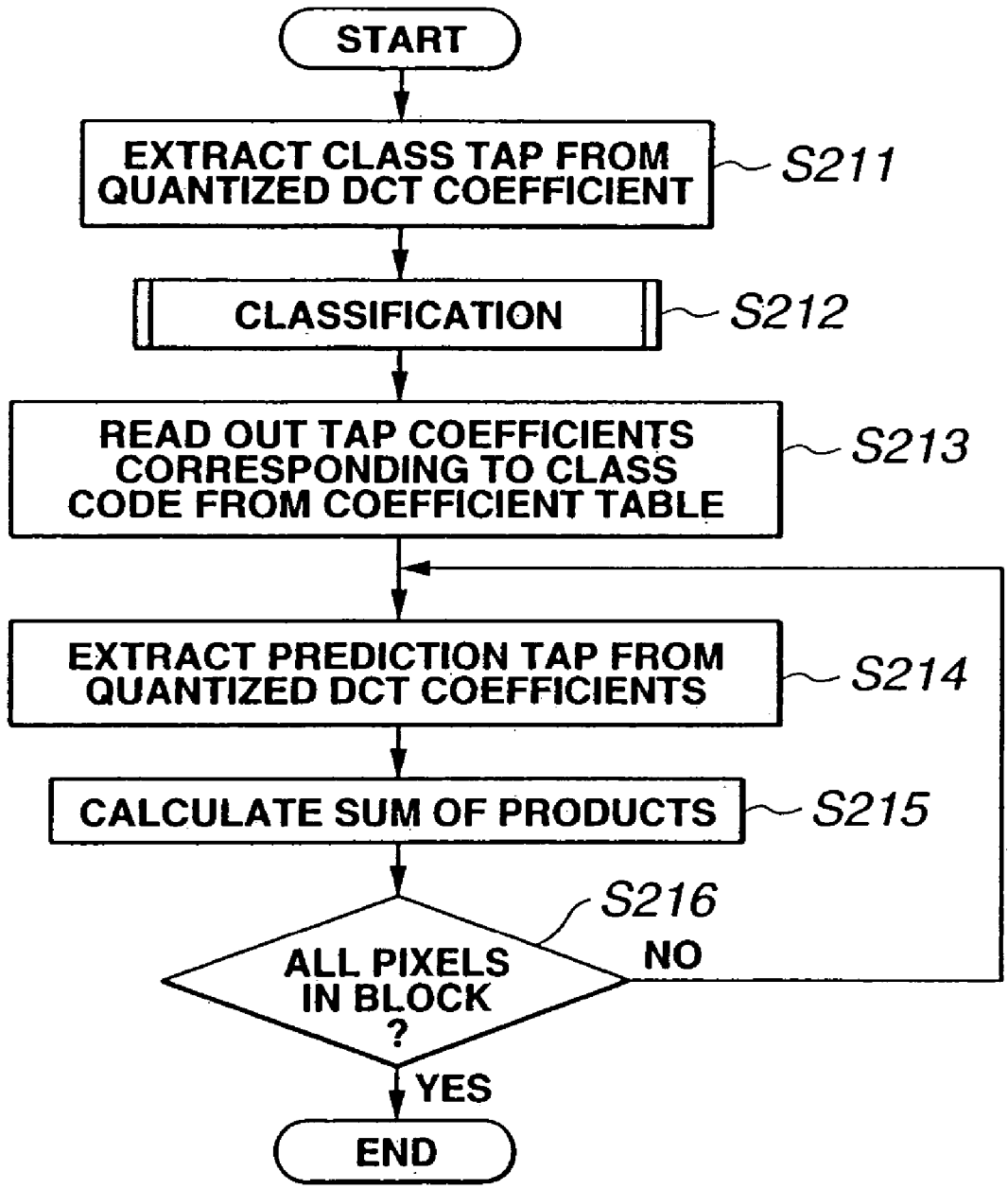
FIG. 48 is a flowchart for illustrating the processing by the coefficient conversion circuit.

Referring to the flowchart of FIG. 48, the processing of the coefficient conversion circuit 432A of FIG. 46 is explained.

The block-based quantized DCT coefficients, output by the entropy decoding circuit 431, are sequentially received by the prediction tap extraction circuit 441 and by the class tap extraction circuit 442. The prediction tap extraction circuit 441 sequentially renders the pixel block corresponding to the block of the quantized DCT coefficients (DCT block) a pixel block of interest.

At step S211, the class tap extraction circuit 442 extracts the quantized DCT coefficients received and used for classifying the pixel block of interest, to form a class tap, which then is output to the classification circuit 443.

The classification circuit 443 is fed with the class tap from the class tap extraction circuit 442, while being also fed with a quantization table, as the subsidiary information, output by the entropy decoding circuit 431. The classification circuit 443 classifies the pixel blocks of interest, using the class tap from the class tap extraction circuit 442 and the quantization table from the entropy decoding circuit 431, to output the resulting class code to the coefficient table storage unit 444.

Figure 49:
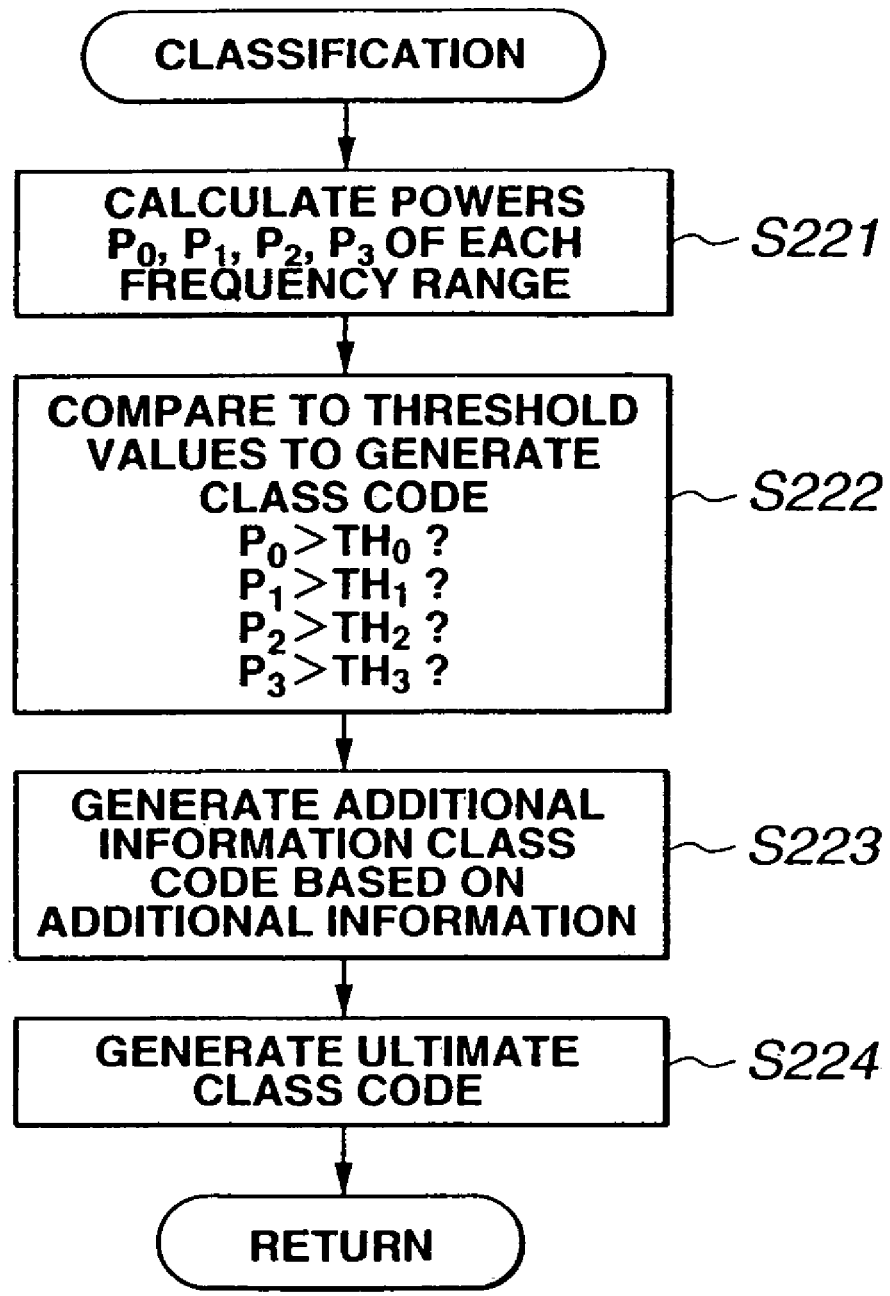
FIG. 49 is a flowchart for illustrating the processing by the coefficient conversion circuit in more detail.

That is, st step S212 in the flowchart of FIG. 49, the power calculating circuit 451 of the classification circuit 443 (FIG. 47) splits, first at step S221, the 8×8 quantized DCT coefficients making up the class tap into four spatial frequency bands $S_0$ to $S_3$, shown in FIG. 8, to calculate the respective power values $P_0$ to $P_3$. These power values $P_0$ to $P_3$ are output from the power calculating circuit 451 to the class code generating circuit 452.

The class code generating circuit 452 at step S222 reads out the threshold values $TH_0$ to $TH_3$ from the threshold value table storage unit 453 to compare the power values $P_0$ to $P_3$ from the power calculating circuit 451 to the threshold values $TH_0$ to $TH_3$ to generate the power class codes based on the respective magnitude relationships.

The class code generating circuit 452 at step S223 generates the subsidiary information class code, using the quantization table, as the subsidiary information. The class code generating circuit 452 then proceeds to step S224 to generate an ultimate class code, from the power class code and the subsidiary information class code. The program return then is performed.

Reverting to FIG. 48, the class code, obtained at step S212 as described above, is given from the classification circuit 443 to the coefficient table storage unit 444 as address.

On receipt of the class code from the classification circuit 443 as address, the coefficient table storage unit 444 at step S213 reads out the 64 sets of the tap coefficients stored in the address to output the tap coefficients so read out to the sum-of-products circuit 445.

The program then moves to step S214 where the prediction tap extraction circuit 441 extracts quantized DCT coefficient used for predicting the pixel values of the pixel of interest of the pixels of the pixel block of interest not as yet rendered the pixel of interest in the raster scanning sequence to form a prediction tap. This prediction tap is sent from the prediction tap extraction circuit 441 to the sum-of-products circuit 445.

In the present embodiment, since the same prediction taps are formed for the totality of the pixels of the pixel block, from one pixel block to another, it is sufficient if the processing of step S214 is performed only for the pixel initially made into a pixel of interest, while it is unnecessary to perform the processing for the remaining 255 pixels.

At step S215, the sum-of-products circuit 445 acquires a set of tap coefficients corresponding to the pixel position mode for the pixel of interest, from among the 64 set tap coefficients output at step S213 from the coefficient table storage unit 444 and, using the set of the tap coefficients and the prediction tap supplied from the prediction tap extraction circuit 441 at step S214, the sum-of-products circuit 445 executes the sum of product processing, shown in the equation (1), to acquire a value of the decoded pixel of interest.

The program then moves to step S216 where the prediction tap extraction circuit 441 verifies whether or not the processing has been executed with the totality of the pixels of the pixel block of interest as the pixels of interest. If it is verified at step S116 that the processed has not been executed with the totality of the pixels of the pixel block of interest as the pixels of interest, the program reverts to step S214 where the prediction tap extraction circuit 441 repeats similar processing, using a pixel of the pixel block of interest, not as yet rendered the pixel of interest in the raster scanning sequence, as pixel of interest.

If it is verified at step S216 that the processing has been done with the totality of the pixels of the pixel block of interest as the pixels of interest, that if the decoded values of the totality of the pixels of the pixel block of interest, have been acquired, the sum-of-products circuit 445 outputs the pixel block (decoded block) made up of the decoded values to the deblocking circuit 433 (FIG. 44) to finish the processing.

Meanwhile, the processing conforming to the flowchart of FIG. 48 is executed repeatedly each time the prediction tap extraction circuit 441 sets a new pixel block of interest.

Figure 50:
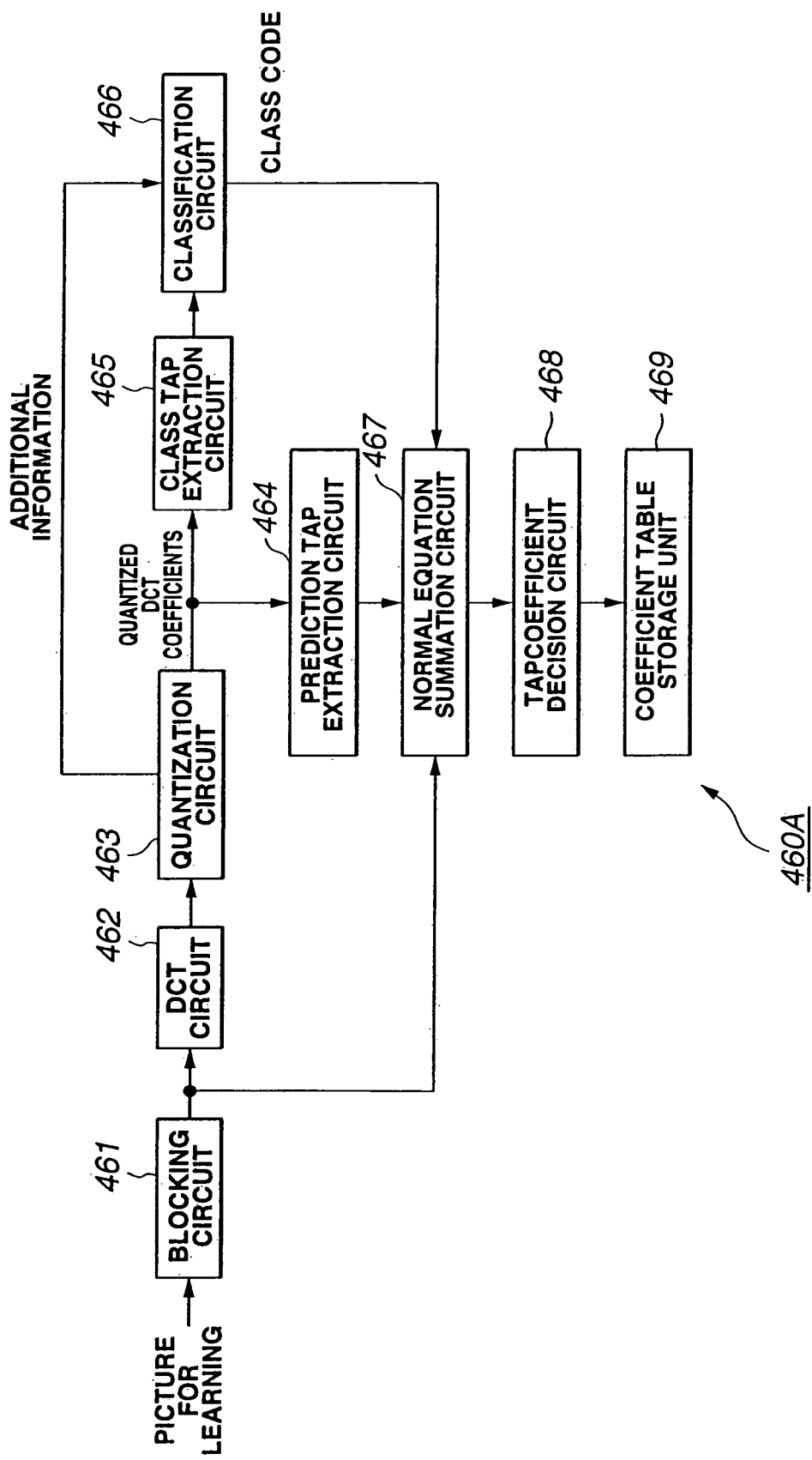
FIG. 50 is a block diagram showing an illustrative structure of a learning device learning tap coefficients of the coefficient conversion circuit.

FIG. 50 shows an illustrative structure of a learning device 460A executing the learning processing for tap coefficients stored in the coefficient table storage unit 444 of FIG. 46.

In the learning device 460A, shown in FIG. 50, the blocking circuit 461 is fed with one or more pictures of picture data for learning as teacher data operating as teacher in learning. As in the case of JPEG encoding, the blocking circuit 461 blocks the picture, as teacher data, into a pixel block composed of 8×8 pixels.

A DCT circuit 462 sequentially reads out the pixel blocks, formed by the blocking circuit 461, as pixel blocks of interest, and applies DCT to the pixel blocks of interest to form blocks of DCT coefficients. These blocks of DCT coefficients are sent to the quantization circuit 463.

The quantization circuit 463 quantizes the block of the DCT coefficients from the DCT circuit 462 in accordance with the same quantization table as used for JPEG encoding, and sequentially sends the resulting blocks of the quantized DCT coefficients (DCT blocks) to the prediction tap extraction circuit 464 and to the class tap extraction circuit 465.

That is, the quantization circuit 463 sets a few of routine compression ratios used in JPEG encoding and quantizes DCT coefficients in accordance with the quantization table associated with each compression ratio to send the quantized DCT coefficients to the prediction tap extraction circuit 464 and to the class tap extraction circuit 465. The quantization circuit 463 also sends the quantization table used for quantization as the subsidiary information to the classification circuit 466. Meanwhile, the same quantization table as used by the quantization circuit 463 is stored as a reference pattern in the class code generating circuit 452 of FIG. 47.

The prediction tap extraction circuit 464 uses a pixel of the pixels of the pixel block of interest, which has not been rendered a pixel of interest, as a pixel of interest, and extracts the needed quantized DCT coefficient from the output of the quantization circuit 463 to form the same prediction tap as that formed by the prediction tap extraction circuit 441. This prediction tap is sent from the prediction tap extraction circuit 464 to the normal equation summation circuit 467 as pupil data corresponding to pupils in learning.

The class tap extraction circuit 465 extracts the needed quantized DCT coefficients from the output of the quantization circuit 463, for the pixel block of interest, to form the same class tap as that formed by the class tap extraction circuit 442 of FIG. 46. This class tap is sent from the class tap extraction circuit 465 to the classification circuit 466.

Using the class tap from the class tap extraction circuit 465 and the quantization table as the subsidiary information from the quantization circuit 463, the classification circuit 466 classifies the pixel blocks of interest, to send the resulting class code to the normal equation summation circuit 467.

The normal equation summation circuit 467 reads out pixel values of the pixel of interest, as teacher data, from the blocking circuit 461, and executes summation on the quantized DCT coefficients forming the prediction taps as pupil data from the prediction tap extraction circuit 464 and the pixel of interest.

The normal equation summation circuit 467 performs calculations, corresponding to the multiplication of pupil data ($x_{in}x_{im}$) and summation ($\Sigma$) as respective elements in the matrix A in the above equation (8), with the use of the prediction taps (pupil data), for each class corresponding to the class code supplied from the classification circuit 466.

The normal equation summation circuit 467 also executes calculations corresponding to multiplication ($x_{in}y_i$) and summation $\Sigma$ of pupil data and teacher data, as components of the vector v of equation (8), using the prediction taps (pupil data) and the pixel of interest (teacher data), from one class corresponding to the class code supplied from the classification circuit 466 to another.

The aforementioned summation in the normal equation summation circuit 467 is performed for each class from one pixel position mode for the pixel of interest to another.

The normal equation summation circuit 467 executes the above-described summation, using the totality of the pixels making up the teacher picture supplied thereto as pixels of interest, whereby a normal equation shown in the equation (8) is established for each pixel position mode for each class.

A tap coefficient decision circuit 468 solves the normal equation, generated for each class, from one pixel position mode to another, in the normal equation summation circuit 467, to find 64 sets of the tap coefficients, from class to class, to send the tap coefficients thus found to the addresses corresponding to the respective classes of a coefficient table storage unit 469.

Depending on the number of pictures provided as pictures for learning, or on the picture contents, it may be an occurrence that a class is produced in which the number of the normal equations necessary to find the tap coefficients cannot be produced. For such class, the tap coefficient decision circuit 468 outputs e.g., default tap coefficients.

The coefficient table storage unit 469 memorizes 64 sets of the tap coefficients for each class supplied thereto from the tap coefficient decision circuit 468.

Figure 51:
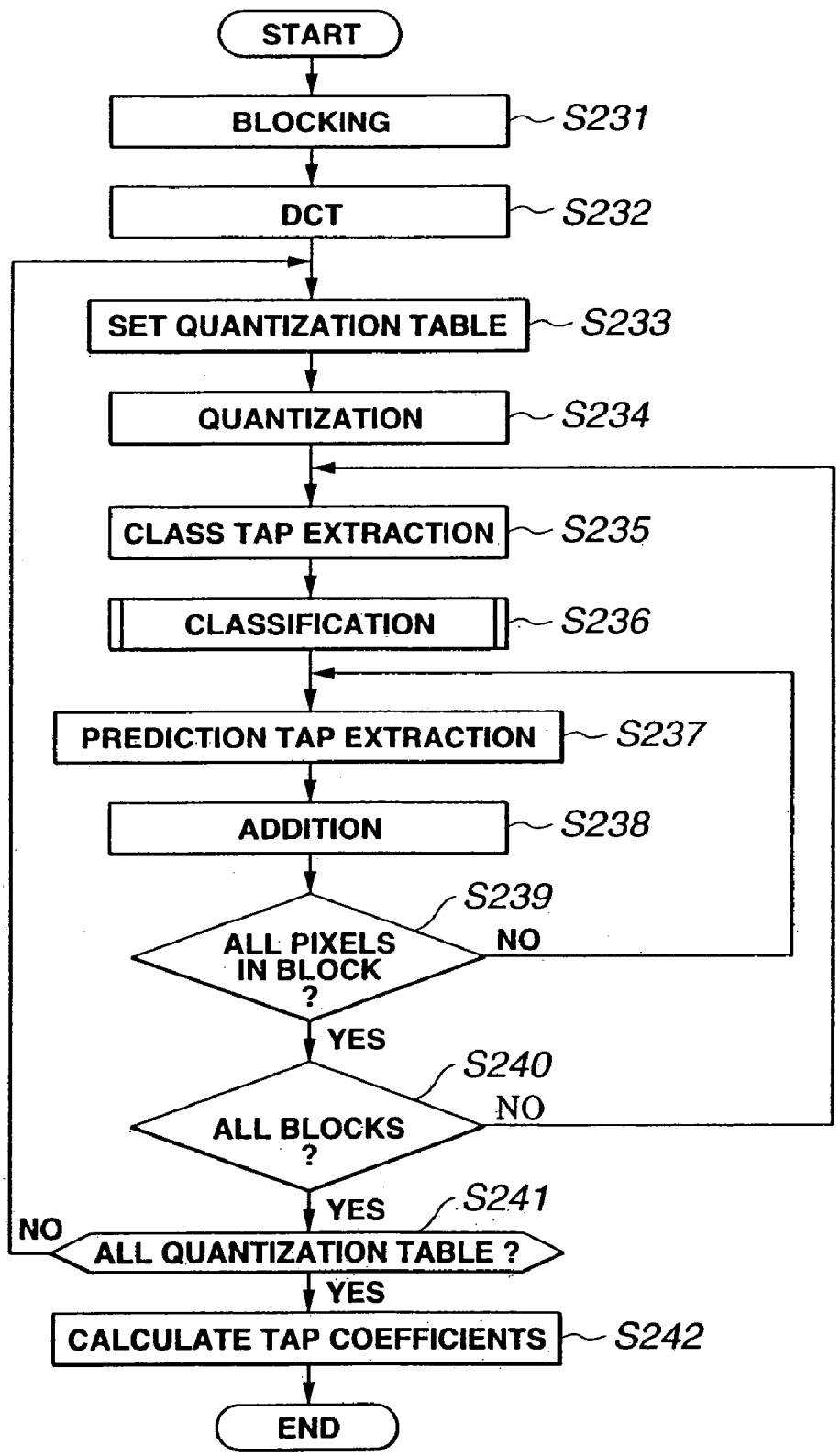
FIG. 51 is a flowchart for illustrating the processing by the learning device.

Referring now to the flowchart of FIG. 51, the processing (learning processing) of a learning device 460A of FIG. 50 is explained.

The blocking circuit 461 is fed with picture data for learning, as teacher data. The blocking circuit 461 at step S231 forms the picture data as teacher data into a pixel block of 8×8 pixels as in the case the JPEG encoding. The program then moves to step S232, where the DCT circuit 462 sequentially reads out the pixel blocks formed by the blocking circuit 461 and applies DCT to a pixel block of interest to form a block of DCT coefficients. The program then moves to step S233.

At step S233, the quantization circuit 463 sets one of the pre-set quantization tables not as yet rendered a quantization table of interest and routes the so set quantization table to the classification circuit 466. Then, program then moves to step S234, where the quantization circuit 463 sequentially reads out the blocks of the DCT coefficients obtained at the DCT circuit 462 to quantize the blocks in accordance with the quantization table to form blocks formed by quantized DCT coefficients.

The program then moves to step S235 where the class tap extraction circuit 465 sets the pixel block, formed by the blocking circuit 461 but which has not been set as the pixel block of interest, as the pixel block of interest. Moreover, the class tap extraction circuit 465 extracts the quantized DCT coefficients, used for classifying the pixel block of interest, from the DCT block obtained by the quantization circuit 463, to form a class tap, which then is sent to the classification circuit 466. As explained with reference to the flowchart of FIG. 49, the classification circuit 466 at step S236 classifies the pixel blocks of interest, using the class tap from the class tap extraction circuit 465 and the quantization table of interest from the quantization circuit 463, and sends the resulting class code to the normal equation summation circuit 467. The program then moves to step S237.

At step S237, the prediction tap extraction circuit 464 sets the pixel of the pixel block of interest which has not been set as the pixel of interest in the raster scanning sequence, as pixel of interest, and extracts the needed quantized DCT coefficients from the output of the quantization circuit 463 for the pixel of interest to form the same prediction taps as that formed by the prediction tap extraction circuit 441. The prediction tap extraction circuit 464 sends the prediction taps for the pixel of interest as pupil data to the normal equation summation circuit 467. The program then moves to step S237.

At step S238, the normal equation summation circuit 467 reads out the pixel of interest as teacher data from the blocking circuit 461 and executes the summation of the matrix A and the vector v of the equation (8) for the quantized DCT coefficients forming the prediction taps as pupil data and the pixel of interest as teacher data. Meanwhile, this summation is executed from one class corresponding to the class code from the classification circuit 466 to another and from one pixel position mode for the pixel of interest to another.

The program then moves to step S239 where the prediction tap extraction circuit 464 checks whether or not the summation has been made for all pixels of the pixel block of interest as the pixels of interest. If it is verified at step S239 that the summation has not been made for all pixels of the pixel block of interest as the pixels of interest, the program reverts to step S237 where the prediction tap extraction circuit 464 sets the pixels of the pixel block of interest, which are not as yet made into the pixels of interest, as pixels of interest. Subsequently, a similar sequence of operations is repeated.

If it is verified at step S239 that the summation has been made for all pixels of the pixel block of interest as the pixels of interest, the program moves to step S240, where the blocking circuit 461 verifies whether or not the totality of the pixel blocks obtained from the picture as teacher data have been processed as the pixel blocks of interest. If it is verified at step S240 that the processing has not been performed with the totality of the pixel blocks obtained from a picture as teacher as the pixel blocks of interest, the program reverts to step S235 where a pixel block not as yet rendered a pixel block of interest is newly rendered a pixel block. Subsequently, a similar sequence of processing operations is repeated.

If it is verified at step S240 that processing has been made with the totality of the pixel blocks, obtained from the picture as teacher data, as the pixel blocks of interest, the program moves to step S241 where the quantization circuit 463 checks whether or not processing has been made with the totality of the preset quantization tables as the quantization table of interest. If it is verified at step S241 that the processing has not been made with the totality of the preset quantization tables as the quantization table of interest, the program reverts to step S233 to repeat the processing as from step S233 on the totality of the picture data for learning.

If it is verified at step S241 that the processing has been made with the totality of the preset quantization tables as the quantization table of interest, the program moves to step S242 where the tap coefficient decision circuit 468 solves the normal equation generated from one pixel position mode of each class to another in the normal equation summation circuit 467 to find the 64 sets of the tap coefficients corresponding to the 64 pixel position modes of the class in question. The tap coefficients thus found are sent to and stored in the addresses corresponding to the respective classes of the coefficient table storage unit 469 to finish the processing.

The class-based tap coefficients, stored in the tap coefficient storage unit 269, are stored in a coefficient table storage unit 244 of FIG. 26.

So, the tap coefficients stored in the coefficient table storage unit 444 have been found by learning so that the prediction error (herein the square error) of the predicted values of the original pixel values, obtained on linear prediction calculations, will be statistically minimum. The result is that, with the coefficient conversion circuit 432A of FIG. 46, a JPEG encoded picture can be decoded to a picture limitlessly proximate to the HD picture which uses the JPEG encoded picture as teacher data.

Moreover, since the processing of decoding the JPEG encoded picture and the processing for improving the picture quality are carried out simultaneously, a decoded picture of high picture quality can be efficiently produced from the JPEG encoded picture.

In the present embodiment, the classification in the classification circuits 443, 466 is performed using not only the class tap but also the quantization table as the subsidiary information. Alternatively, the classification may also be performed using only the class tap. However, if the classification is performed using the quantization table as the subsidiary information, as described above, what may be called a fine classification may be achieved to improve the picture quality of the decoded picture appreciably.

Figure 52:
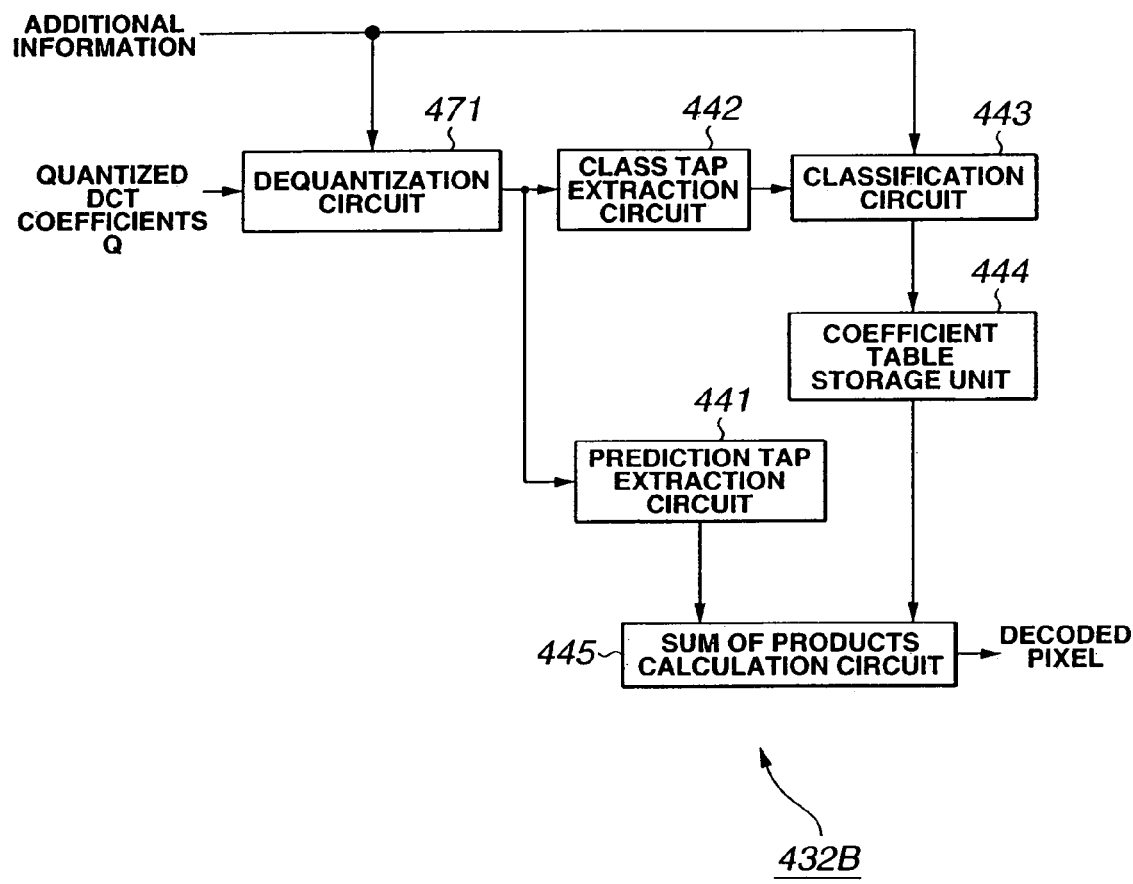
FIG. 52 is a block diagram showing another illustrative structure of the coefficient conversion circuit.

FIG. 52 shows another illustrative structure of the coefficient conversion circuit 432 of FIG. 44. Meanwhile, parts or components similar to those shown in FIG. 46 are depicted by the same reference numerals That is, a coefficient conversion circuit 432B shown in FIG. 52 is basically constructed similarly to the circuit shown in FIG. 46, except that a dequantization circuit 471 is provided newly.

In the coefficient conversion circuit 432B, shown in FIG. 52, the dequantization circuit 471 is fed with block-based quantized DCT coefficients, obtained on entropy decoding the encoded data in the entropy decoding circuit 431 (FIG. 44). Moreover, the dequantization circuit 471 is fed with a quantization table, as the subsidiary information, output from the entropy decoding circuit 431.

The dequantization circuit 471 dequantizes the quantized DCT coefficients from the entropy decoding circuit 431 in accordance with the quantization table from the entropy decoding circuit 431, and routes the resulting DCT coefficients to the prediction tap extraction circuit 441 and to the class tap extraction circuit 442.

Thus, in the prediction tap extraction circuit 441 and in the class tap extraction circuit 442, prediction and class taps are formed not only for the quantized DCT coefficients but also for the DCT coefficients. Subsequently, the processing similar to that shown in FIG. 46 is carried out for the DCT coefficients.

Thus, in the coefficient conversion circuit 432B of FIG. 52, in which processing is carried out not only for the quantized DCT coefficients but also for the DCT coefficients, the tap coefficients stored in the coefficient table storage unit 444 need to be different from those in FIG. 46.

Figure 53:
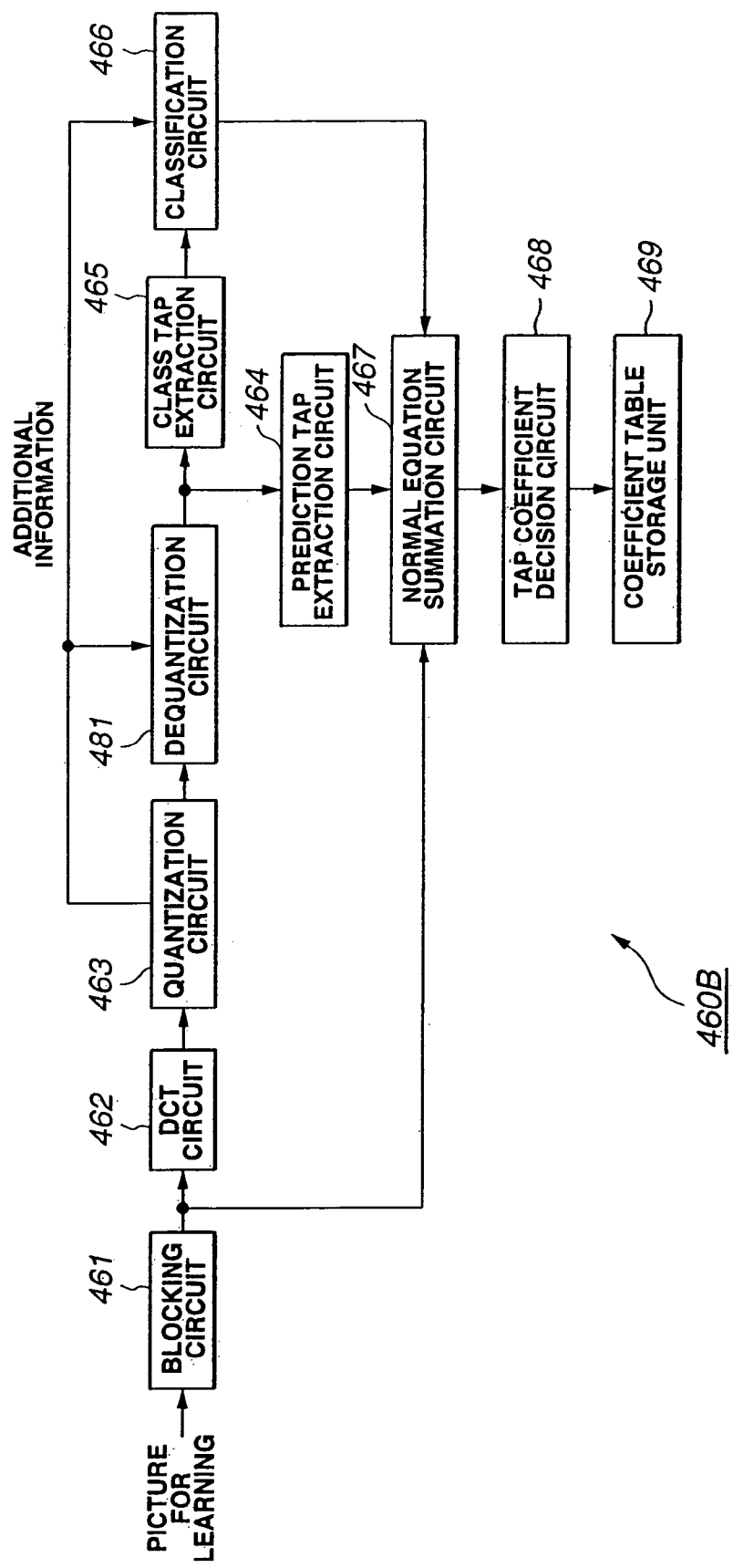
FIG. 53 is a block diagram showing an illustrative structure of a learning device.

FIG. 53 shows an illustrative structure of a learning device 460B for performing the learning processing for tap coefficients stored in the coefficient table storage unit 444. In FIG. 53, the parts or components similar to those shown in FIG. 50 are depicted by the same reference numerals That is, a learning device 460B, shown in FIG. 53, is basically constructed similarly to the circuit shown in FIG. 50, except that a dequantization circuit 481 is newly provided on the downstream side of the quantization circuit 463.

In the learning device 460B, shown in FIG. 53, the dequantization circuit 481 is fed with the quantized DCT coefficients output by the quantization circuit 463 and with the quantization table as the subsidiary information. The dequantization circuit 481 dequantizes the quantized DCT coefficients from the quantization circuit 463 in accordance with quantization table from similarly the quantization circuit 463 to send the resulting DCT coefficients to the prediction tap extraction circuit 464 and to the class tap extraction circuit 465.

Thus, in the prediction tap extraction circuit 464 and in the class tap extraction circuit 465, the prediction tap and the class tap are formed not only from the quantized DCT coefficients but also from the DCT coefficients. Subsequently, the processing similar to that in the case of FIG. 50 is performed on the DCT coefficients.

The result is that the tap coefficients obtained suffer from the effect of the quantization error produced from quantization and subsequent dequantization of the DCT coefficients.

Figure 54:
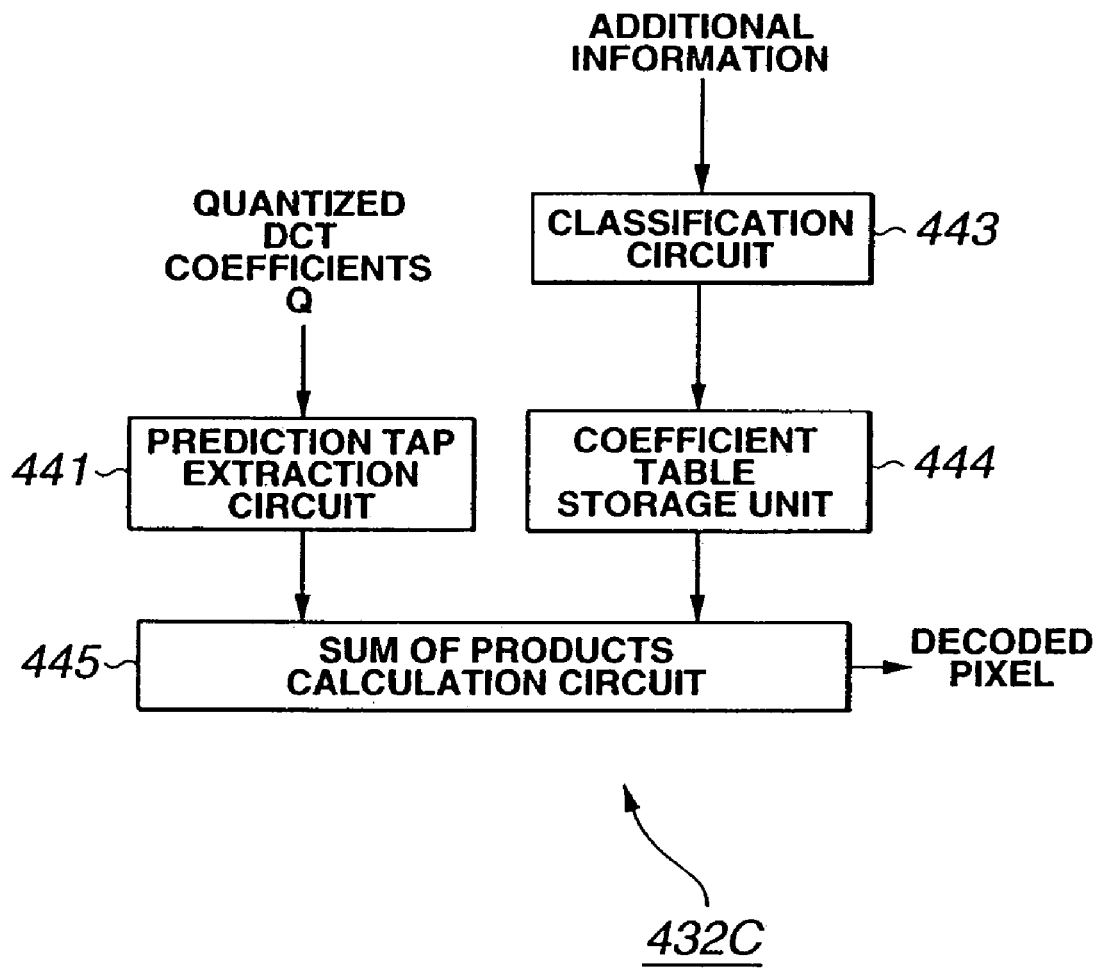
FIG. 54 is a block diagram showing another illustrative structure of the coefficient conversion circuit.

FIG. 54 shows an illustrative structure of the coefficient conversion circuit 432 shown in FIG. 44. In FIG. 54, the parts or components similar to those shown in FIG. 46 are depicted by the same reference numerals and corresponding description is omitted for simplicity. That is, the coefficient conversion circuit 432C, shown in FIG. 52, is basically constructed similarly to the circuit shown in FIG. 46, except that the coefficient conversion circuit 432 lacks in the class tap extraction circuit 442.

Thus, in a coefficient conversion circuit 432C, shown in FIG. 54, the classification circuit 443 executes classification based solely on the quantization table as the subsidiary information supplied thereto, and sends the resulting subsidiary information class code directly to the coefficient table storage unit 444 as the ultimate class code.

In the present embodiment, the subsidiary information class code is one bit, as described above, so that only tap coefficients of 2 ($=2^1$) classes of the tap coefficients are stored in the coefficient table storage unit 444, and processing is carried out using these tap coefficients.

Thus, in the coefficient conversion circuit 432C, shown in FIG. 54, the tap coefficients stored in the coefficient table storage unit differ from those in FIG. 46.

Figure 55:
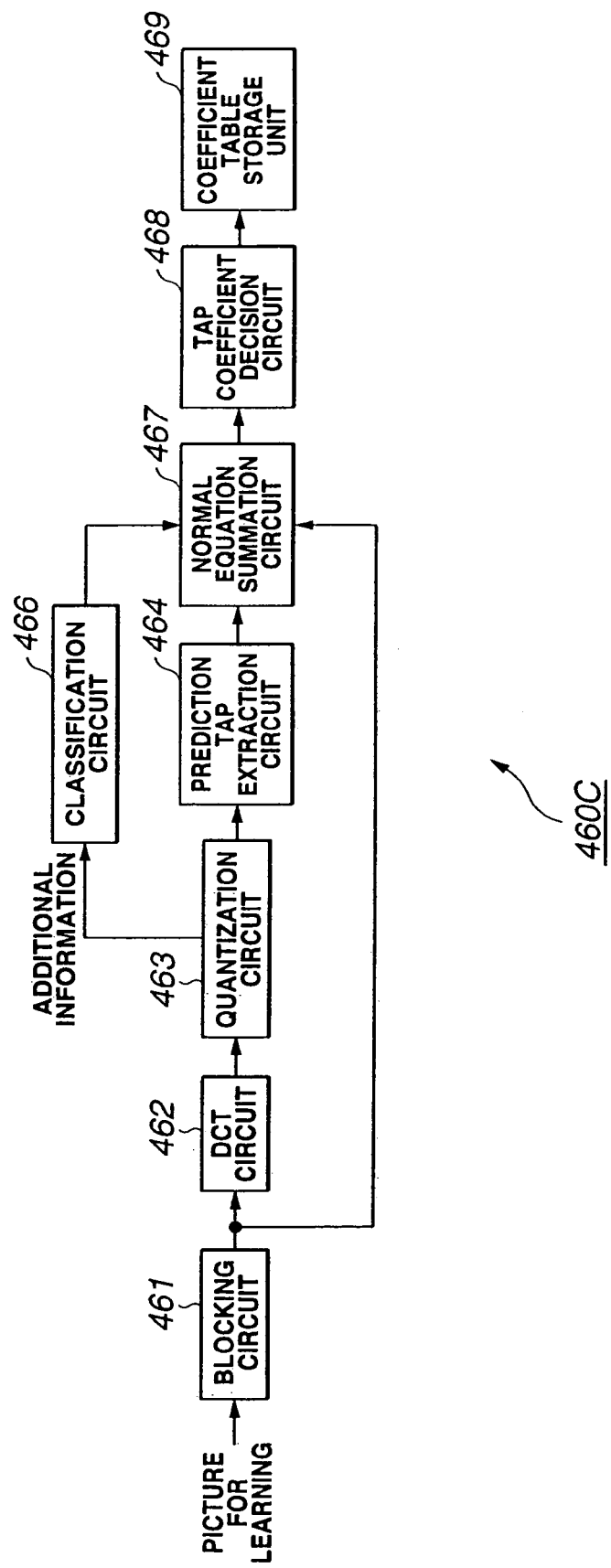
FIG. 55 is a block diagram showing an illustrative structure of the learning device embodying the present invention.

FIG. 55 shows an illustrative structure of a learning device 460C responsible for learning processing of the tap coefficients stored in the coefficient table storage unit 444 of FIG. 54. In FIG. 55, the parts or components similar to those shown in FIG. 50 are depicted by the same reference numerals and the corresponding description is omitted for simplicity. That is, the learning device 460C, shown in FIG. 55, is basically constructed similarly to the circuit shown in FIG. 50, except that the learning device 460C lacks in the class tap extraction circuit 465.

Thus, in the learning device 460C, shown in FIG. 55, the aforementioned summation is executed in the normal equation summation circuit 467 from one class obtained based only on the subsidiary information to another. In the tap coefficient decision circuit 468, the normal equation generated by such summation is solved to find the tap coefficient.

Figure 56:
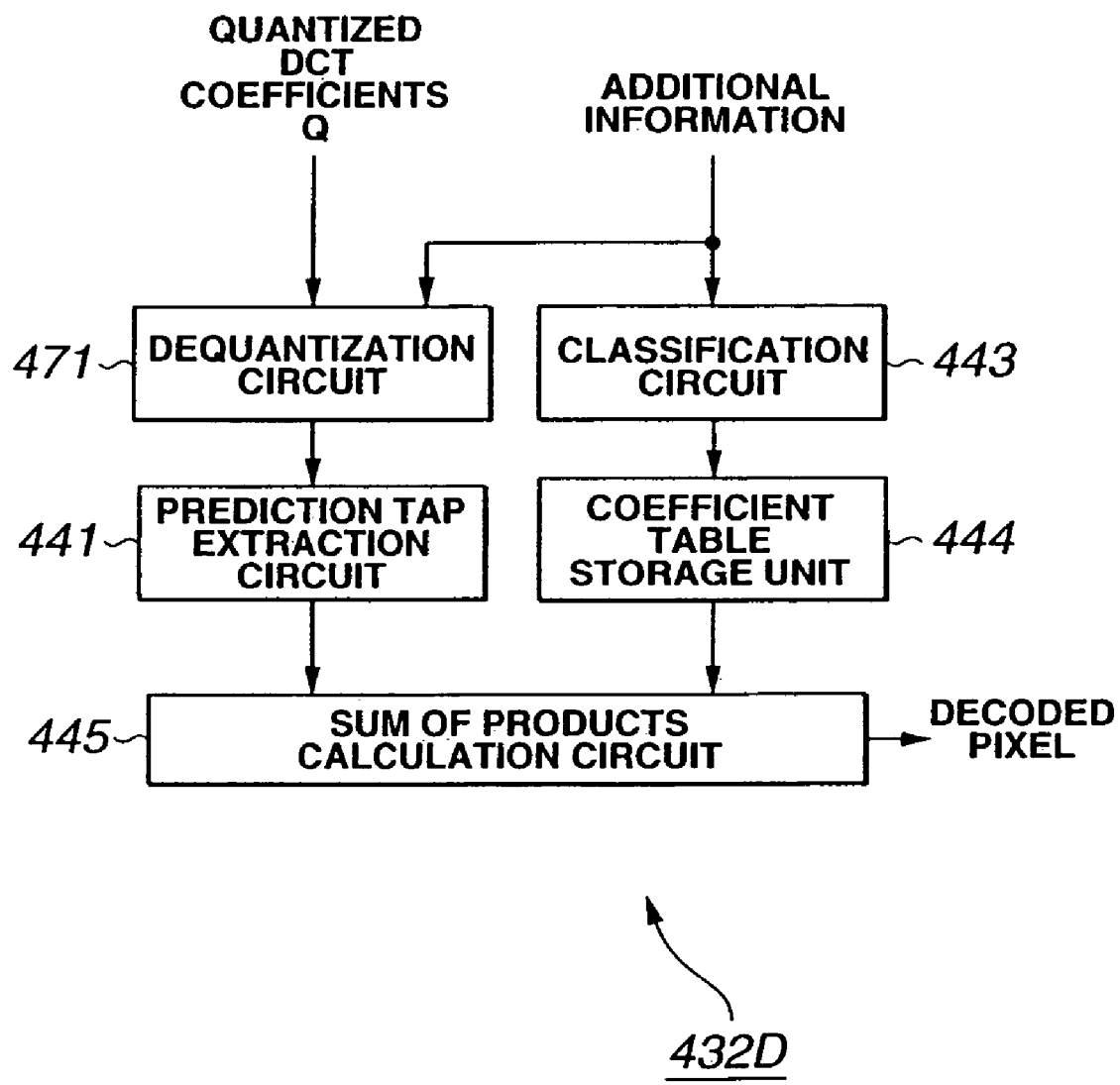
FIG. 56 is a block diagram showing another illustrative structure of the coefficient conversion circuit.

FIG. 56 shows an illustrative structure of the coefficient conversion circuit 432 of FIG. 44. In FIG. 56, the parts or components similar to those shown in FIG. 46 or 52 are depicted by the same reference numerals and the corresponding description is omitted for simplicity. That is, a coefficient conversion circuit 432D, shown in FIG. 56, is basically constructed similarly to the circuit shown in FIG. 46, except that the coefficient conversion circuit 432D lacks in the class tap extraction circuit 442 and that a dequantization circuit 471 is provided anew.

Thus, in the coefficient conversion circuit 432D, shown in FIG. 56, as in the coefficient conversion circuit 432C of FIG. 54, only the tap coefficients of the class obtained by classification performed based solely on the quantization table as the subsidiary information are stored and processing is carried out using these tap coefficients.

Moreover, in the coefficient conversion circuit 432D of FIG. 56, as in the coefficient conversion circuit 432C of FIG. 52, the prediction taps are formed in the prediction tap extraction circuit 41 on the DCT coefficients output by the dequantization circuit 471. Subsequently, the processing is carried out for the DCT coefficients.

Thus, in the coefficient conversion circuit 432D of FIG. 56, the tap coefficients stored in the coefficient table storage unit 444 differ from those shown in FIG. 46.

Figure 57:
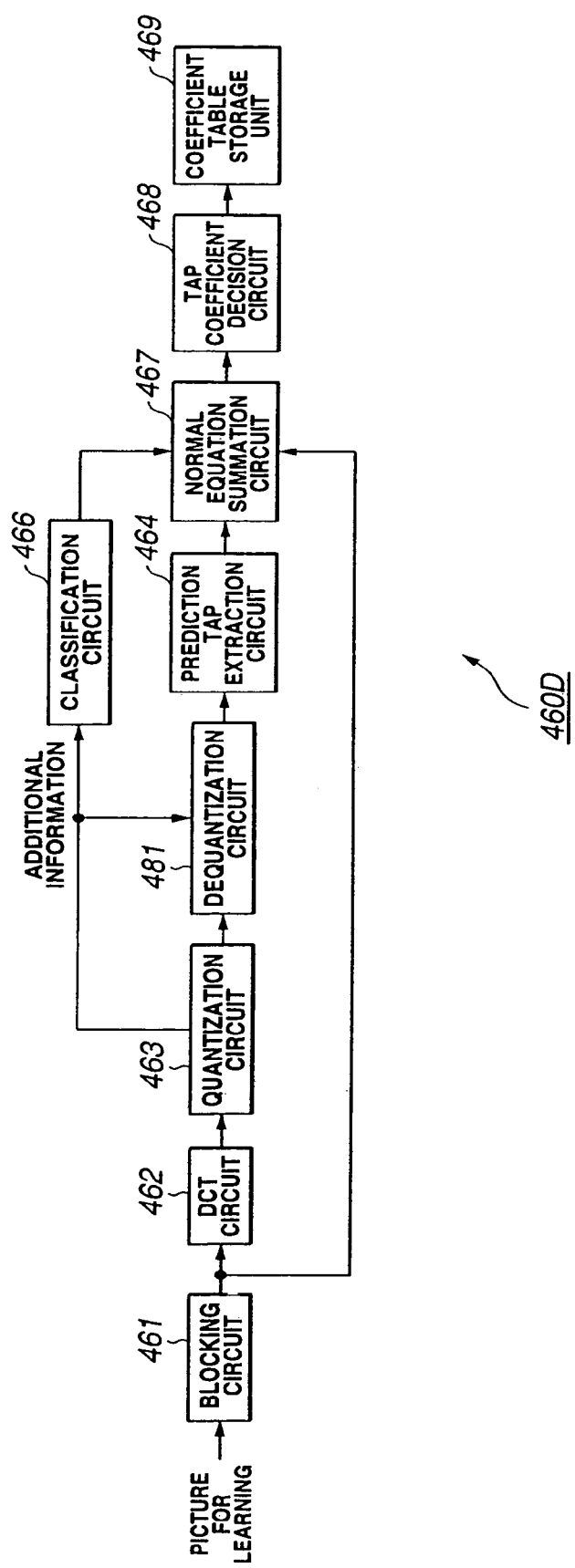
FIG. 57 is a block diagram showing an illustrative structure of the learning device.

FIG. 57 shows an illustrative structure of a learning device 460D for performing learning processing of tap coefficients memorized in the coefficient table storage unit 444. Meanwhile, the parts corresponding to the case of FIG. 50 or 53 are denoted by the same reference numerals and the corresponding explanation is omitted for simplicity. That is, the learning device 460D shown in FIG. 57 is configured basically identically as the corresponding device shown in FIG. 50 except that the class tap extraction circuit 465 is omitted and the dequantization circuit 481 is provided anew.

Thus, with the learning device 460D, shown in FIG. 57, prediction taps are formed not on the quantized DCT coefficients, but on the DCT coefficients, in the prediction tap extraction circuit 464. Subsequently, processing is carried out on the DCT coefficients. In the normal equation summation circuit 467, the processing is performed for each class obtained on classification of the aforementioned summation based solely on the quantization table as the subsidiary information. The normal equation is solved for the class-based normal equation in the tap coefficient decision circuit 468 to find the tap coefficients.

The foregoing description is made on a picture encoded in JPEG designed for compression encoding of a still picture. The present invention is, however, applicable to an MPEG encoded picture designed for compression encoding a moving picture.

Figure 58:
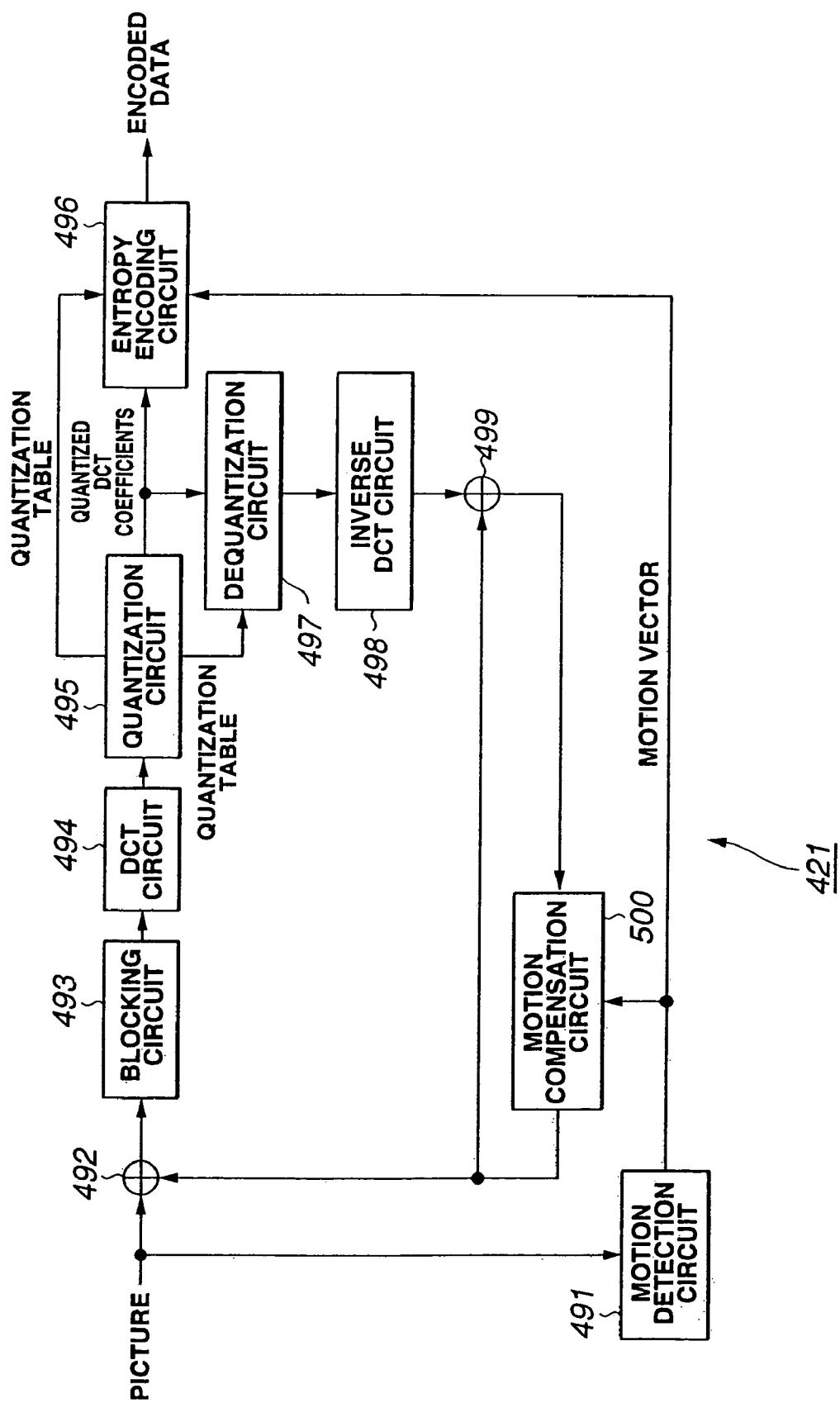
FIG. 58 is a block diagram showing an illustrative structure of an encoder in the picture transmission system.

FIG. 58 shows an illustrative structure of an encoder 42 of FIG. 2 in case of performing MPEG encoding.

In the encoder 421, shown in FIG. 58, the frames or fields, forming a moving picture to be encoded in MPEG, are sequentially supplied to a motion detection circuit 491 and to a calculating unit 492.

The motion detection circuit 491 detects the motion vector for the frames supplied thereto, on the macro-block basis, to send the detected motion vector to an entropy encoding circuit 496 and to a motion compensation circuit 500.

If the picture sent to the motion detection circuit 491 is an I-picture, it directly routes the picture to the blocking circuit 463. If the picture sent to the motion detection circuit 491 is a P- or B-picture, it calculates the difference between the picture and a reference picture supplied from the motion compensation circuit 500 to route the difference to the blocking circuit 493.

The blocking circuit 493 blocks an output of the calculating unit 492 into a pixel block of 8×8 pixels, which is routed to a DCT circuit 494. The DCT circuit 494 applies DCT to the pixel block from the blocking circuit 493 to send the resulting DCT coefficients to the quantization circuit 495. The quantization circuit 495 quantizes the block-based DCT coefficients from the DCT circuit 493, in accordance with a preset quantization table, to send the resulting quantized DCT coefficients and the quantization table used to the entropy encoding circuit 496. The entropy encoding circuit 496 entropy-encodes the quantized DCT coefficients from the quantization circuit 495 and appends the motion vector from the motion detection circuit 491, the quantization table from the quantization circuit 495 and other needed information to output the resulting encoded data as the MPEG encoding results.

Of the quantized DCT coefficients, output by the quantization circuit 495, the I- and P-pictures need to be locally decoded for use as a reference picture for P- or B-picture encoded subsequently. So, the I- and P-pictures are sent to both the entropy encoding circuit 496 and the dequantization circuit 497. This dequantization circuit is also fed with a quantization table used in the quantization circuit 495.

The dequantization circuit 497 dequantizes the quantized DCT coefficients from the quantization circuit 495 in accordance with the quantization table from the quantization circuit 495 into DCT coefficients which are sent to an inverse DCT circuit 498. This inverse DCT circuit applies inverse DCT to the DCT coefficients from the dequantization circuit 497 to output the result to a calculating unit 499. The calculating unit 499 is also fed not only with an output of the inverse DCT circuit 498 but with the reference picture output from the motion compensation circuit 500. If the output from the inverse DCT circuit 498 is a P-picture, the output is summed to an output of the motion compensation circuit 500 to form the decoded original picture If the output from the inverse DCT circuit 498 is an I-picture, the output is a decoded I-picture, so the calculating unit 499 directly sends the picture to the motion compensation circuit 500.

The motion compensation circuit 500 applies motion compensation, in accordance with the motion vector from the motion detection circuit 491, to the locally decoded picture from the calculating unit 499, to send the motion compensated picture as a reference picture to the calculating units 492 and 499.

Figure 59:
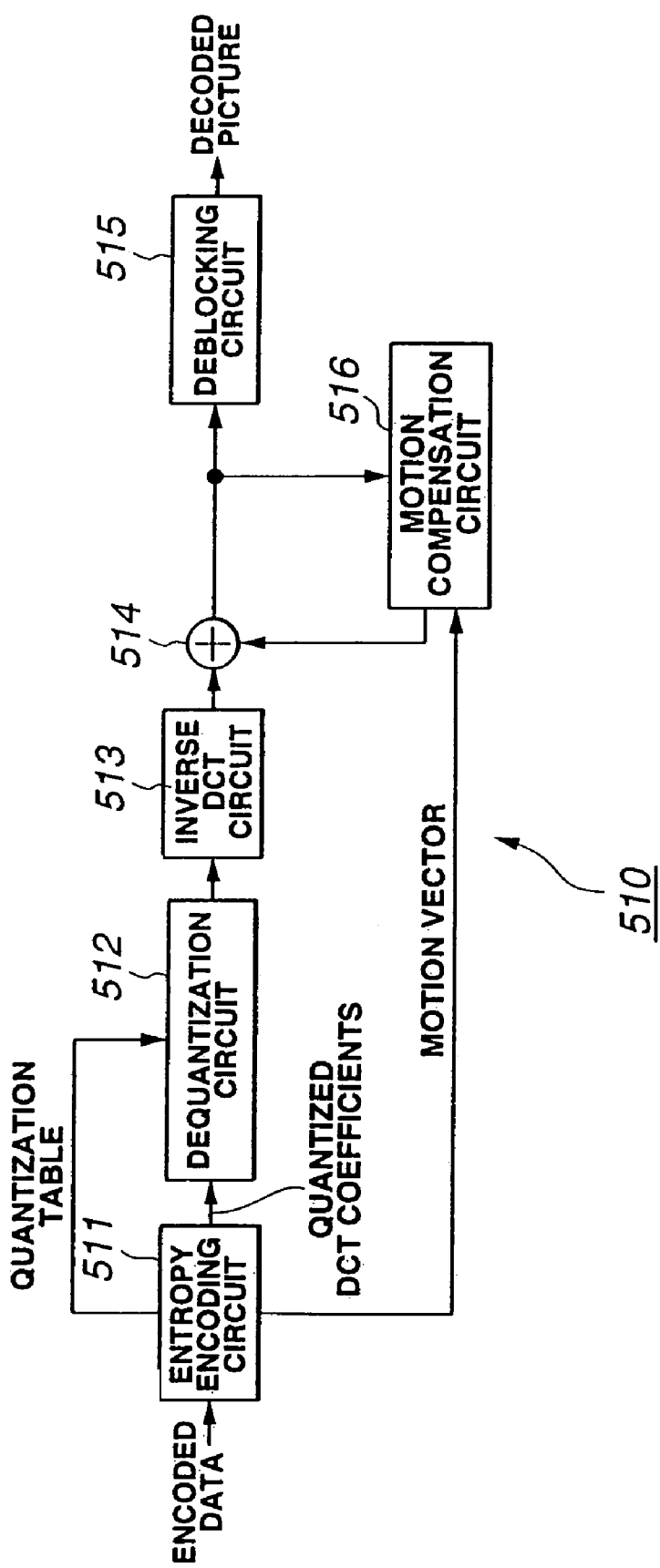
FIG. 59 is a block diagram showing an illustrative structure of an MPEG decoder in the picture transmission system.

The encoded data, obtained on MPEG encoding, described above, can be decoded by an MPEG decoder 510, designed as shown in FIG. 59.

In the MPEG decoder 510, shown in FIG. 59, the encoded data is sent to an entropy decoding circuit 511, which then entropy decodes the encoded data to produce quantized DCT coefficients as well as to separate the motion vector, quantization table and the other needed information contained in the encoded data. The quantized DCT coefficients and the quantization table are routed to a dequantization circuit 512, while the motion vector is sent to a motion compensation circuit 516.

The dequantization circuit 112 dequantizes the quantized DCT coefficients from the entropy decoding circuit 511 in accordance with the quantization table supplied from the entropy decoding circuit 511 to form DCT coefficients which are sent to the inverse DCT circuit 513. This inverse DCT circuit 513 applies inverse DCT to the DCT coefficients from the dequantization circuit 512 to output the result to a calculating unit 514. This calculating unit is fed not only with the output of the inverse DCT circuit 513 but also with the already decoded I- or P-pictures output from the motion compensation circuit 516 and which have been motion compensated in accordance with the motion vector from the entropy decoding circuit 511. If the output of the inverse DCT circuit 513 is a P- or B-picture, the calculating unit 514 sums the output and an output of the motion compensation circuit 516 together to form the decoded original picture which is then routed to a deblocking circuit 515. If the output of the inverse DCT circuit 513 is an I-picture, the output is a decoded I-picture, so it is directly routed to the deblocking circuit 515.

The deblocking circuit 515 deblocks the decoded picture, supplied thereto on the pixel block basis from the calculating unit 514, to produce and output a decoded picture.

The motion compensation circuit 516 receives the I- and P-pictures, from among the decoded pictures output from the calculating unit 514, to apply motion compensation thereto in accordance with the motion vector from the entropy decoding circuit 511. The motion compensation circuit 516 sends the motion compensated picture as reference picture to the calculating unit 514.

With the decoder 422 of FIG. 44, the MPEG encoded data can be decoded efficiently to a high quality picture, as described above.

That is, the encoded data is routed to the entropy decoding circuit 431, which entropy decoding circuit then entropy decodes the encoded data to produce quantized DCT coefficients as well as to separate the motion vector, quantization table or the other needed information contained in the encoded data. The quantized DCT coefficients are routed from the entropy decoding circuit 431 to the coefficient conversion circuit 432D, whilst the quantization table and the motion vector etc are also routed as subsidiary information from the entropy decoding circuit 431 to the coefficient conversion circuit 432D.

Using the quantized DCT coefficients Q from the entropy decoding circuit 431, subsidiary information, and the tap coefficients, as found by learning, the coefficient conversion circuit 432D performs preset predictive calculations, while also performing motion compensation in accordance with the motion vector from the entropy decoding circuit 431, as necessary, to decode the quantized DCT coefficients to the original pixel values, which are routed to the deblocking circuit 433.

The deblocking circuit 433 deblocks the pixel block, obtained by the coefficient conversion circuit 432D, and which are made up of decoded pixels, to produce and output a decoded picture.

Figure 60:
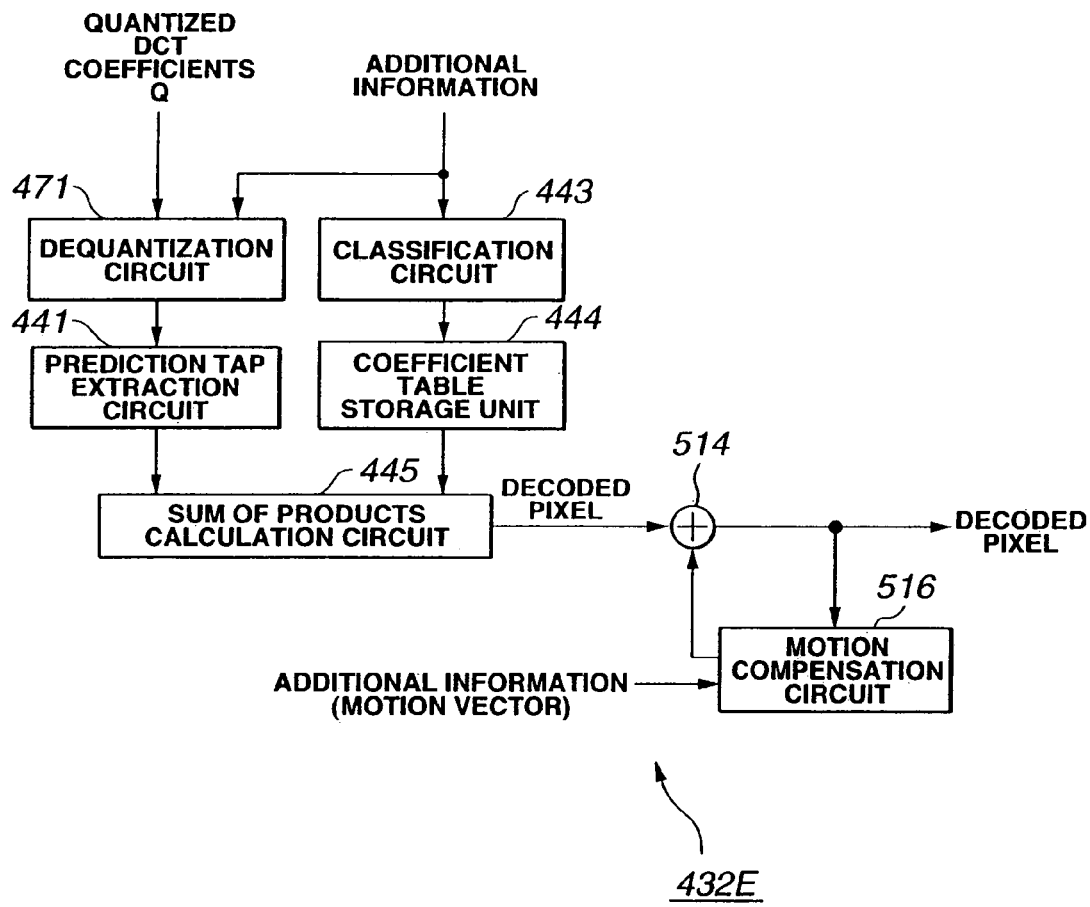
FIG. 60 is a block diagram showing another illustrative structure of the coefficient conversion circuit.

FIG. 60 shows an illustrative structure of the coefficient conversion circuit 432 of FIG. 44 in case of decoding the MPEG encoded data from the decoder 22. In FIG. 60, the parts corresponding to the case of FIG. 56 or 59 are denoted by the same reference numerals and the corresponding explanation is omitted for simplicity. That is, the coefficient conversion circuit 432E shown in FIG. 60 is configured basically identically as the corresponding device shown in FIG. 56 except that the calculating unit 514 and the motion compensation circuit 516 shown in FIG. 59 are provided downstream of the sum-of-products circuit 45.

Thus, in the coefficient conversion circuit 432E, shown in FIG. 60, the processing similar to that shown in FIG. 56 is carried out in place of the inverse DCT processing in the inverse DCT circuit 513 of the MPEG decoder of FIG. 59. Subsequently, the processing similar to that in FIG. 59 is carried out to produce a decoded picture.

Meanwhile, in the coefficient conversion circuit 432E shown in FIG. 60, not only the quantization table but also the motion vector is contained in the subsidiary information sent to the classification circuit 443. Thus, the classification circuit 443 is able to perform classification based not only on the quantization table but also on the motion vector. In the classification based on the motion vector, it is possible to use codes representing the magnitude relationships of the motion vector and preset threshold values or codes representing the magnitude relationships of x and y components of the motion vector and preset threshold values, as the class codes.

Figure 61:
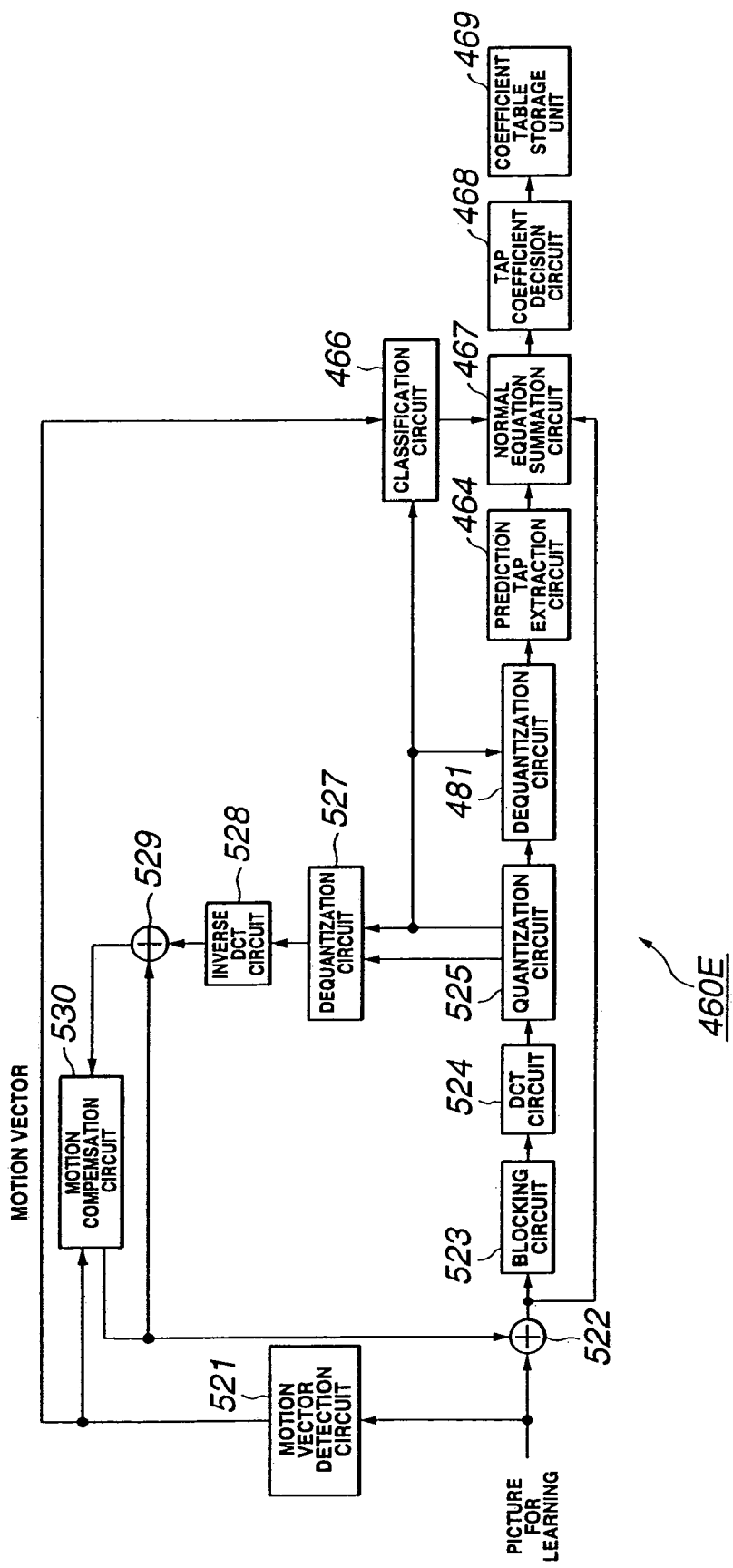
FIG. 61 is a block diagram showing another illustrative structure of the learning device.

FIG. 61 shows an illustrative structure of a learning device 460E responsible for learning processing of tap coefficients memorized in the coefficient table storage unit 444 of FIG. 60. In FIG. 61, the parts or components similar to those shown in FIG. 57 are depicted by the same reference numerals and the corresponding description is oimtted for simplicity.

That is, in the learning device 460E, shown in FIG. 61, a motion vector detection circuit 521 and a calculating unit 522 are fed with a picture for learning as teacher data. The motion vector detection circuit 521, calculating unit 522, blocking circuit 523, DCT circuit 524, quantization circuit 525, dequantization circuit 527, inverse DCT circuit 528, calculating unit 529 or the motion compensation circuit 530 perform processing similar to that of the motion vector detection circuit 491, calculating unit 492, blocking circuit 493, DCT circuit 494, quantization circuit 495, dequantization circuit 497, inverse DCT circuit 498, calculating unit 499 or the motion compensation circuit 500 of FIG. 58, whereby the quantization circuit 525 outputs the quantized DCT coefficients and the quantization table similar to those output by the quantization circuit 495 of FIG. 58.

The quantized DCT coefficients and the quantization table, output by the quantization circuit 525, are sent to the dequantization circuit 481, which then dequantizes the quantized DCT coefficients from the quantization circuit 525 in accordance with the quantization step from the quantization circuit 525 for conversion to DCT coefficients which then are supplied to the prediction tap extraction circuit 464. The prediction tap extraction circuit 464 forms prediction taps from the DCT coefficients from the dequantization circuit 481 to send the so formed prediction taps to the normal equation summation circuit 467.

The classification circuit 466 performs classification based on the quantization table output from the quantization circuit 525. If the classification circuit 433 of FIG. 60 performs classification based on the quantization table and the motion vector, the classification circuit 466 performs classification based on the quantization table output by the quantization circuit 525 and on the motion vector output from the motion vector detection circuit 521.

The class codes, resulting from the classification by the classification circuit 466, are sent to the normal equation summation circuit 467, where the aforementioned summation is executed from class to class, with an output of the calculating unit 522 as teacher data and with the prediction taps from the dequantization circuit 481 as pupil data, to generate normal equations.

The tap coefficient decision circuit 468 solves the class-based normal equations, generated by the normal equation summation circuit 467, to find the class-based tap coefficients, which are sent to and stored in the coefficient table storage unit 469.

Using the class-based tap coefficients, thus found, the sum-of-products circuit 445 of FIG. 60 decodes the MPEG encoded data. So, the processing of decoding the MPEG encoded pictures and the processing of improving the picture quality can be executed simultaneously with the result that a decoded picture of high picture quality may be produced efficiently from the MPEG encoded picture.

Meanwhile, the coefficient conversion circuit 432E of FIG. 60 can be formed without providing the dequantization circuit 471. In such case, the learning device 460E of FIG. 61 nay be formed without providing the dequantization circuit 481.

It is noted that the coefficient conversion circuit 432D may be designed with the class tap extraction circuit 442. In such case, it is sufficient if the learning device 460E of FIG. 61 is designed with the class tap extraction circuit 465.

In the above case, the quantization table or the motion vector is used as the subsidiary information. However, as the subsidiary information, a variety of the information not mandatory to restore the DCT coefficients may also be used. For example, in MPEG encoded data, picture types, macroblock types and so forth may be used, besides the quantization table or the motion vector, as the subsidiary information.

According to the present invention, as described above, the data of interest, among the original data, is assigned to one of a plural number of classes, and a tap coefficient, among the class-based tap coefficients as found by learning, is acquired which corresponds to the class of the data of interest. Using the tap coefficient corresponding to the class of the data of interest, and the converted data, preset predictive calculations are executed to decode the converted data to original data efficiently.

Moreover, according to the present invention, teacher data, as teacher, are processed by at least orthogonal or frequency transform, to generate pupil data as pupils, and learning is executed such as to statistically minimize the prediction error of predicted values of teacher data obtained on predictive calculations employing tap coefficients corresponding to the class of the teacher data of interest and pupil data to find tap coefficients. Using the tap coefficients, thus found, the data orthogonal or frequency transformed may be decoded efficiently.

A further modification of the present invention is now explained.

Figure 62:
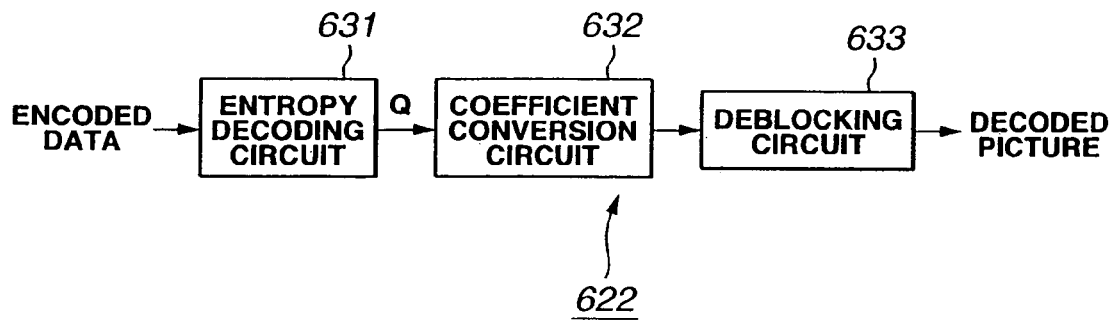
FIG. 62 is a block diagram showing an illustrative structure of a decoder in a embodiment in which the present invention is applied to the picture transmiission system.

In the embodiment, now explained, a decoder 622, shown in FIG. 62, comprised of an entropy decoding circuit 631, a coefficient conversion circuit 632 and a deblocking circuit 633, as decoder 22 shown in FIG. 2, is used to decode the encoded data. The encoded data includes not only the entropy encoded quantized DCT coefficients, but also quantization tables.

Using the quantized DCT coefficients Q from the entropy decoding circuit 631, and also using tap coefficients, as found by learning, as later explained, the coefficient conversion circuit 632 executes preset predictive calculations to decode the block-based quantized DCT coefficients into the original block of 8×8 pixels.

The deblocking circuit 633 deblocks the decoded block obtained in the coefficient conversion circuit 632 to produce and output the decoded picture.

Figure 63:
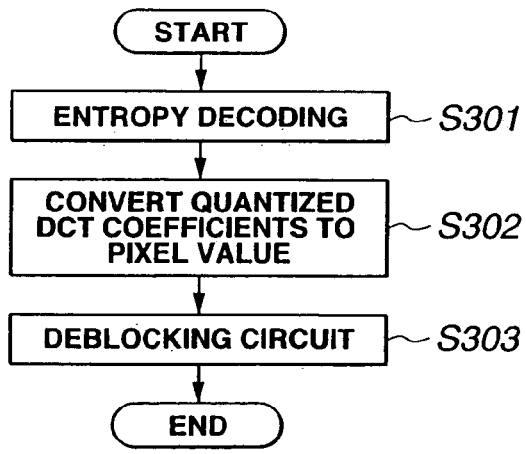
FIG. 63 is a flowchart for illustrating the processing of the decoder.

Referring to the flowchart of FIG. 63, processing by the decoder 22 of FIG. 62 is explained.

The encoded data is sequentially supplied to the entropy decoding circuit 631. At step S301, the entropy decoding circuit 631 entropy decodes the encoded data to send the block-based quantized DCT coefficients Q to the coefficient conversion circuit 632. The coefficient conversion circuit 632 at step S302 performs predictive calculations, employing tap coefficients, to decode the block-based quantized DCT coefficients Q to form block-based pixel values, which are then supplied to the deblocking circuit 633. The deblocking circuit at step S303 deblocks the block of the pixel values from the coefficient conversion circuit 632 (decoded block) to output the resulting decoded picture to terminate the processing.

The coefficient conversion circuit 632 of FIG. 62 uses e.g., classification adaptive processing to decode the quantized DCT coefficients into pixel values.

Figure 64:
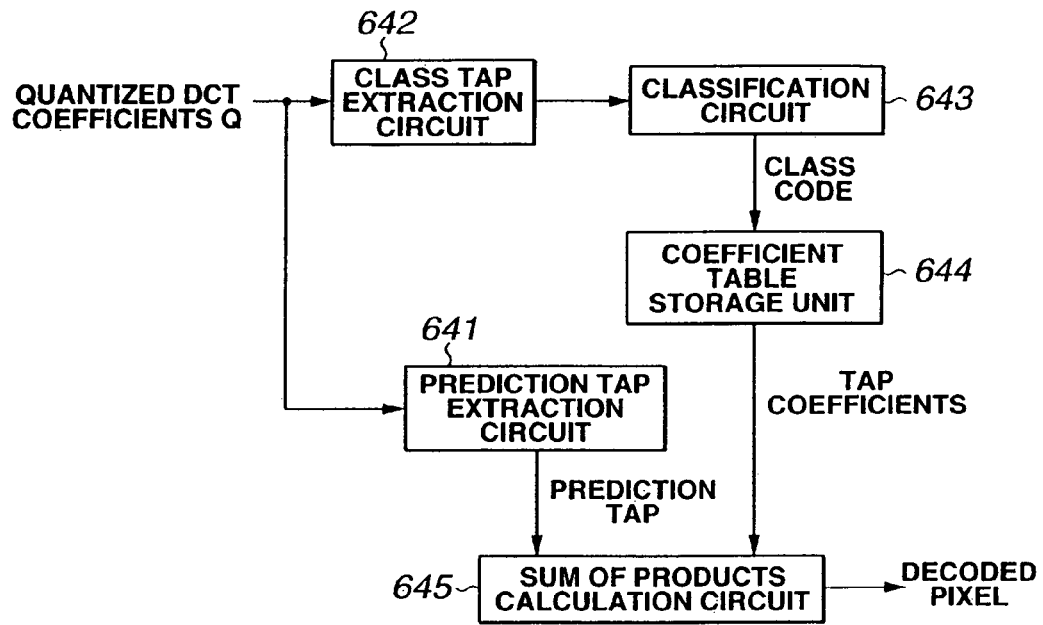
FIG. 64 is a block diagram showing an illustrative structure of the coefficient conversion circuit in the decoder.

FIG. 64 shows an illustrative structure of the coefficient conversion circuit 632 of FIG. 62 adapted for decoding the quantized DCT coefficients into pixel values.

In a coefficient conversion circuit 632A, shown in FIG. 64, the block-based quantized DCT coefficients, output by the entropy decoding circuit 631 (FIG. 62), are sent to a prediction tap extraction circuit 641 and to a class tap extraction circuit 642.

The prediction tap extraction circuit 641 sequentially sets the block pixel values corresponding to the block of quantized DCT, coefficients supplied thereto, incidentally referred to below as DCT blocks, as pixel blocks of interest. These blocks of pixel values, not present in the present stage but virtually presupposed, are incidentally referred to below as pixel blocks. Moreover, the pixels that make up the pixel block of interest are sequentially made into pixels of interest in the raster scanning sequence. In summation, the prediction tap extraction circuit 641 extracts the quantized DCT coefficients, used for predicting the pixel values of the pixels of interest, for use as prediction taps.

That is, the prediction tap extraction circuit 642 of the present embodiment extracts, as prediction taps, the totality of the quantized DCT coefficients, that is 8×8=64 quantized DCT coefficients, of the DCT block corresponding to the pixel block to which belongs the pixel of interest, as shown in FIG. 65A. Thus, in the present embodiment, the same prediction tap is formed for all pixels of a given pixel block. Alternatively, the prediction tap may be formed by different quantized DCT coefficients from one pixel of interest to another.

Meanwhile, the quantized DCT coefficients, making up a prediction tap, are not limited to the aforementioned pattern.

The prediction taps of the respective pixels making up the pixel block, that is 64 prediction taps for each of the 64 pixels, obtained in the prediction tap extraction circuit 641, are sent to a sum-of-products circuit 645. However, since the same prediction tap is formed for all pixels of a pixel block, it is in effect sufficient if a set of the predication taps is provided to the sum-of-products circuit 645 for one pixel block.

The class tap extraction circuit 642 extracts quantized DCT coefficients used for classifying the pixels of interest into one of a plural number of classes, for use as class taps.

Meanwhile, in JPEG encoding, a picture is encoded (DCTed and quantized) from one pixel block to another, so that pixels belonging to a given pixel block are assigned to the same class by way of classification. So, the class tap extraction circuit 642 forms the same class tap for the respective pixels of a given pixel block.

That is, in the present embodiment, the class tap extraction circuit 642 extracts, as class taps, the quantized DCT coefficients of a DCT block corresponding to the pixel block to which belongs the pixel of interest and four DCT blocks lying adjacent to the upper, lower, left and right sides of the block, totaling five DCT blocks, with the number of the quantized DCT coefficients being 8×8×5=320.

It is noted that assigning the respective pixels belonging to a high picture quality pixel block to the same class is equivalent to classifying the pixel block. Thus, it is sufficient if the class tap extraction circuit 242 forms not 64 sets of the class taps for classifying each of 64 pixels making up the pixel block of interest, but one set of the class taps for classifying the pixel block of interest. To this end, the class tap extraction circuit 642 extracts quantized DCT coefficients of the DCT block associated with the pixel block in question and quantized DCT coefficients lying adjacent to the upper, lower, left and right sides thereof, in order to classify the pixel block in question, from one pixel block to another, for use as class taps.

Meanwhile, the quantized DCT coefficients, forming prediction taps or class taps, are not limited to those of the above-mentioned patterns.

That is, in JPEG encoding, DCT and quantization are executed in terms of a pixel block, made up of 8×8 pixels, as a unit, to form a DCT block made up of 8×8 quantized DCT coefficients. It may, therefore, be contemplated that, in decoding pixels of a given pixel block by classification adaptive processing, only the quantized DCT coefficients of the DCT block associated with the pixel block be used as class taps.

However, if attention is directed to a given pixel block in a given picture, it is customary that certain non-negligible correlation exists between the pixels of the pixel block in question and the pixels of the neighboring pixel blocks. Thus, by extracting quantized DCT coefficients not only from the DCT block corresponding to a certain pixel block but also from the other DCT blocks and by employing them as class taps, the pixel of interest can be classified more appropriately, with the result that the decoded picture can be higher in picture quality than if solely the quantized DCT coefficients of the DCT block corresponding to the pixel block are used as the class tap.

In the foregoing explanation, the quantized DCT coefficients from the DCT block corresponding to a certain pixel block and from the four DCT blocks neighboring to the upper, lower, left and right sides thereof are used as class taps. Alternatively, the quantized DCT coefficients, as class taps, may also be extracted from the DCT blocks lying obliquely with respect to the DCT block corresponding to the pixel block in question and from the DCT blocks not lying adjacent to but lying in the vicinity of the DCT block corresponding to the pixel block in question. That is, there is no particular limitation to the range of the DCT blocks from which to extract the quantized DCT coefficients serving as class taps.

The class taps of the pixel block of interest, obtained in the class tap extraction circuit 642, are sent to a classification circuit 643. Based on the class taps from the class tap extraction circuit 642, obtained from the class tap extraction circuit 642, the classification circuit 643 classifies the pixel block of interest, and outputs the class code corresponding to the so produced class.

As the classification method, ADRC, for example, may be used.

In the method employing ADRC, the quantized DCT coefficients, forming the class tap, are ADRC processed, and the class of the pixel block of interest is determined based on the so produced ADRC code.

In the classification circuit 643, the information volume of the class tap is compressed by ADRC processing or vector quantization followed by classification.

Meanwhile, in the present embodiment, the class tap is formed by 320 quantized DCT coefficients. Thus, if classification is performed by 1-bit ADRC processing, the number of class code cases is an exorbitant figure of $2^{320}$.

Thus, in the present embodiment, the classification circuit 643 extracts characteristic values of high cruciality from the quantized DCT coefficients forming the class tap, and undertakes classification based on these characteristic values to diminish the number of the classes.

That is, FIG. 66 shows an illustrative structure of the classification circuit 643 of FIG. 64.

In the classification circuit 643, shown in FIG. 64, the class taps are adapted to be supplied to a power calculating circuit 651. The power calculating circuit 651 splits the quantized DCT coefficients forming the class taps into a plural number of spatial frequency bands and calculates the power values of the respective frequency bands.

That is, the power calculating circuit 451 splits the 8×8 quantized DCT coefficients forming the class taps into four spatial frequency bands $S_0$, $S_1$, $S_2$ and $S_3$ shown for example in FIG. 8.

If now the 8×8 quantized DCT coefficients of a DCT block are represented with sequential integers from 0 in the raster scanning sequence, as subscripts to a letter x, as shown in FIG. 6, the spatial frequency band $S_0$ is made up of four quantized DCT coefficients $x_0$, $x_1$, $x_8$, $x_9$, the spatial frequency band $S_1$ is made up of 12 quantized DCT coefficients $x_2$, $x_3$, $x_4$, $x_5$, $x_6$, $x_7$, $x_{10}$, $x_{11}$, $x_{12}$, $x_{13}$, $x_{14}$, $x_{15}$, the spatial frequency band $S_2$ is made up of 12 quantized DCT coefficients $x_{16}$, $x_{17}$, $x_{24}$, $x_{25}$, $x_{32}$, $x_{33}$, $x_{40}$, $x_{41}$, $x_{48}$, $x_{49}$, $x_{56}$, $x_{57}$ and the spatial frequency band $S_3$ is made up of 36 quantized DCT coefficients $x_{18}$, $x_{19}$, $x_{20}$, $x_{21}$, $x_{22}$, $x_{23}$, $x_{26}$, $x_{27}$, $x_{28}$, $x_{29}$, $x_{30}$, $x_{31}$, $x_{34}$, $x_{35}$, $x_{36}$, $x_{37}$, $x_{38}$, $x_{39}$, $x_{42}$, $x_{43}$, $x_{44}$, $x_{45}$, $x_{46}$, $x_{47}$, $x_{50}$, $x_{51}$, $x_{52}$, $x_{53}$, $x_{54}$, $x_{55}$, $x_{58}$, $x_{59}$, $x_{60}$, $x_{61}$, $x_{62}$, $x_{63}$.

Moreover, the power calculating circuit 51 calculates power values $P_0$, $P_1$, $P_2$ and $P_3$ of the AC components of the quantized DCT coefficients to output the so calculated power values $P_0$, $P_1$, $P_2$ and $P_3$ to a class code generating circuit 652.

That is, the power calculating circuit 651 finds a square sum value $x_1^2 + x_8^2 + x_9^2$ of the AC components $x_1$, $x_8$, $x_9$ of the four quantized DCT coefficients $x_0$, $x_1$, $x_8$, $x_9$ to output the resulting square sum to the class code generating circuit 652 as power $P_0$. The power calculating circuit 651 also finds a square sum of the AC components of the 12 quantized DCT coefficients for the spatial frequency band $S_1$, that is the totality of the 12 quantized DCT coefficients, to output the resulting square sum to the class code generating circuit 652 as power $P_1$. The power calculating circuit 651 also finds the power values $P_2$ and $P_3$ for the spatial frequency bands $S_2$ and $S_3$, as in the case of the spatial frequency band $S_1$, described above, to output the resulting power values to the class code generating circuit 652.

The class code generating circuit 652 compares the power values $P_0$, $P_1$, $P_2$ and $P_3$ from the power calculating circuit 651 to corresponding threshold values $TH_0$, $TH_1$, $TH_1$ and $TH_3$ stored in a threshold value storage unit 653 to output class codes based on the magnitude relationships thereof. That is, the class code generating circuit 652 compares the power $P_0$ to the threshold value $TH_0$ to produce a one-bit code representing the magnitude relationship. In similar manner, the class code generating circuit 52 compares the power $P_1$ to the threshold value $TH_1$, the power $P_2$ to the threshold value $TH_1$ and the power $P_3$ to the threshold value $TH_3$ to produce one-bit code for each of the power-threshold value combinations.

The class code generating circuit 652 thus acquires four one-bit codes for each of five DCT blocks, forming the class taps, that is one 20-bit code. The class code generating circuit 652 outputs this 20-bit code as a class code representing the class of the pixel block of interest. In this case, the pixel block of interest is assigned to one of $2^{20}$ classes by way of classification.

The threshold value storage unit 653 memorizes the threshold values $TH_0$ to $TH_3$ to be compared to the power values $P_0$ to $P_3$ of the spatial frequency bands $S_0$ to $S_3$.

In the above case, the DC component $x_0$ of the quantized DCT coefficients is not used for classification. However, the DC component $x_0$ may also be used for classification.

Reverting to FIG. 64, the class codes, output by the classification circuit 643, as described above, are afforded as addresses to a coefficient table storage unit 644.

The coefficient table storage unit 644 memorizes a coefficient table, having registered therein tap coefficients obtained by learning processing, and outputs tap coefficients stored in an address associated with the class code, output by the classification circuit 643, to the sum-of-products circuit 645.

In the present embodiment, since the pixel blocks are classified, one class code is obtained for each pixel block of interest. On the other hand, since the pixel block in the present embodiment is made up of 8×8=64 pixels, 64 sets of tap coefficients are required for decoding 64 pixels making up the pixel block of interest. Thus, the coefficient table storage unit 644 memorizes 64 sets of tap coefficients for an address corresponding to one class code.

The sum-of-products circuit 645 acquires the prediction tap output by the prediction tap extraction circuit 641 and the tap coefficients output by the coefficient table storage unit 644 and, using the prediction taps and the tap coefficients, executes linear predictive processing (sum of products processing) shown in the equation (1), to output the pixel values of the 8×8 pixels of the pixel block of interest, as a decoded result of the corresponding DCT block, to the deblocking circuit 633 (FIG. 62).

In the prediction tap extraction circuit 641, each pixel of the pixel block of interest sequentially proves a pixel of interest. The sum-of-products circuit 645 then performs processing in an operating mode associated with the position of a pixel which is the current pixel of interest of the pixel block of interest. This operating mode is incidentally referred to below as the pixel position mode.

That is, if a number i pixel of the pixels of the pixel block of interest, in the raster scanning sequence, is denoted $p_i$, with the pixel $p_i$ being the pixel of interest, the sum-of-products circuit 645 performs the processing of the pixel mode #1.

Specifically, the coefficient table storage unit 644 outputs 64 sets of tap coefficients for decoding each of the 64 pixels making up a pixel block of interest. If the set of tap coefficients for decoding the pixel $p_i$ is denoted $W_i$, and the operating mode is the pixel mode #1, the sum-of-products circuit 645 performs the sum of product processing of the equation (1), using the prediction taps and the set $W_i$, among the tap coefficients of the 64 sets, and renders the results of the sum of product processing the results of the decoding of the pixel $p_i$.

Figure 67:
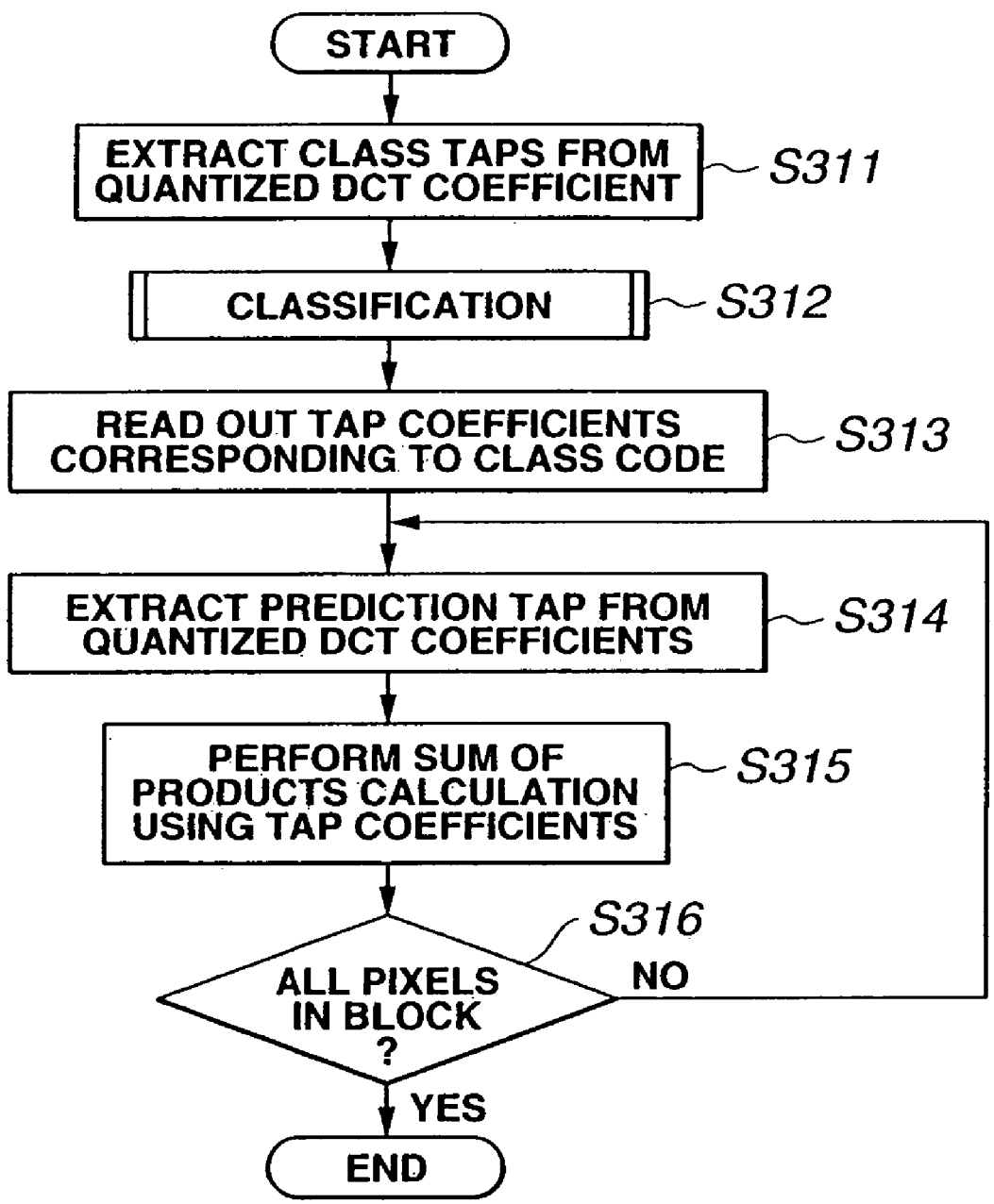
FIG. 67 is a flowchart for illustrating the processing of the coefficient conversion circuit.

Referring to the flowchart of FIG. 67, the processing of the coefficient conversion circuit 632A of FIG. 64 is explained.

The block-based DCT coefficients, output by the entropy decoding circuit 631, are sequentially received by the prediction tap extraction circuit 641 and by the class tap extraction circuit 642. The prediction tap extraction circuit 641 sequentially renders the supplied pixel block corresponding to the block of the quantized DCT coefficients (DCT block), a pixel block of interest.

At step S311, the class tap extraction circuit 642 extracts the quantized DCT coefficients received and used for classifying the pixel block of interest, that is the quantized DCT coefficients of a DCT block corresponding to the pixel block of interest and four DCT blocks adjacent to upper, lower; left and right sides thereof, totaling at five DCT blocks, to form a class tap, which then is output to the classification circuit 643.

At step S312, the classification circuit 643 classifies the pixel block of interest, using the class tap from the class tap extraction circuit 642, to output the resulting class code to the coefficient table storage unit 644.

Figure 68:
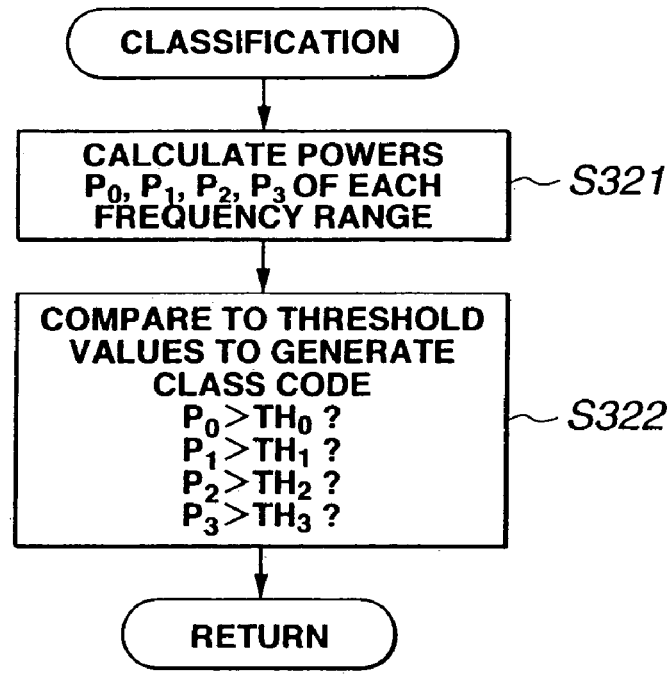
FIG. 68 is a flowchart for illustrating the processing of the coefficient conversion circuit in more detail.

That is, st step S312 in the flowchart of FIG. 68, the power calculating circuit 651 of the classification circuit 643 (FIG. 66) calculates, first at step S321, the respective power values $P_0$ to $P_3$ of the four spatial frequency bands $S_0$ to $S_3$, shown in FIG. 8, for each of the five DCT blocks forming the class taps. These power values $P_0$ to $P_3$ are output from the power calculating circuit 651 to the class code generating circuit 652.

The class code generating circuit 652 at step S322 reads out the threshold values $TH_0$ to $TH_3$ from the threshold value storage unit 653 to compare the power values $P_0$ to $P_3$ of the five DCT blocks forming the class tap from the power calculating circuit 651 to the threshold values $TH_0$ to $TH_3$ to generate the class codes based on the respective magnitude relationships before program return.

Reverting to FIG. 67, the class code, obtained at step S312 as described above, is given from the classification circuit 643 to the coefficient table storage unit 644 as address.

On receipt of the class code form the classification circuit 643 as address, the coefficient table storage unit 644 at step S313 reads out the 64 sets of the tap coefficients stored in the address to output the tap coefficients so read out to the sum-of-products circuit 645.

The program then moves to step S314 where the prediction tap extraction circuit 641 extracts quantized DCT coefficients used for predicting the pixel values of the pixel of interest of the pixel block of interest not as yet rendered the pixel of interest in the raster scanning sequence to form a prediction tap. This prediction tap is sent from the prediction tap extraction circuit 641 to the sum-of-products circuit 645.

In the present embodiment, since the same prediction tap is formed for the totality of the pixels of the pixel block, from one pixel block to another, it is sufficient if the processing of step S314 is performed only for the pixel initially rendered a pixel of interest, while it is unnecessary to perform the processing for the remaining 63 pixels.

At step S315, the sum-of-products circuit 645 acquires a set of tap coefficients corresponding to the pixel position mode for the pixel of interest, from among the 64 set tap coefficients output at step S13 from the coefficient table storage unit 644 and, using the set of the tap coefficients and the prediction tap supplied from the prediction tap extraction circuit 641, the sum-of-products circuit 645 executes the sum of product processing, shown in the equation (1), to acquire a value of the decoded pixel of interest.

The program then moves to step S316 where the prediction tap extraction circuit 641 verifies whether or not the processing has been executed with the totality of the pixels of the pixel block of interest as the pixel of interest. If it is verified at step S316 that the processing has not been executed with the totality of the pixels of the pixel block of interest as the pixels of interest, the program reverts to step. S314 where the prediction tap extraction circuit 641 repeats similar processing with the pixel values of the pixel of interest of the pixel block of interest not as yet rendered the pixel of interest in the raster scanning sequence as the pixel of interest.

If it is verified at step S316 that the processing has been done with the totality of the pixels of the pixel block of interest as the pixels of interest, that is if the decoded values of the totality of the pixels of the pixel block of interest have been acquired, the sum-of-products circuit 645 outputs the pixel block (decoded block) made up of the decoded values to the deblocking circuit 633 (FIG. 62) to finish the processing.

It should be noted that the processing conforming to the flowchart of FIG. 67 is carried out repeatedly each time the prediction tap extraction circuit 641 sets a new pixel block of interest.

In the above-described embodiment, the power values $P_0$ to $P_3$ of the same spatial frequency bands $S_0$ to $S_3$ are calculated for each of five DCT blocks making up the class tap, and classification is performed based on the power values. Alternatively, the classification may be performed based on the power values of different spatial frequency bands calculated for each of the five DCT blocks making up the class tap.

Figure 69:
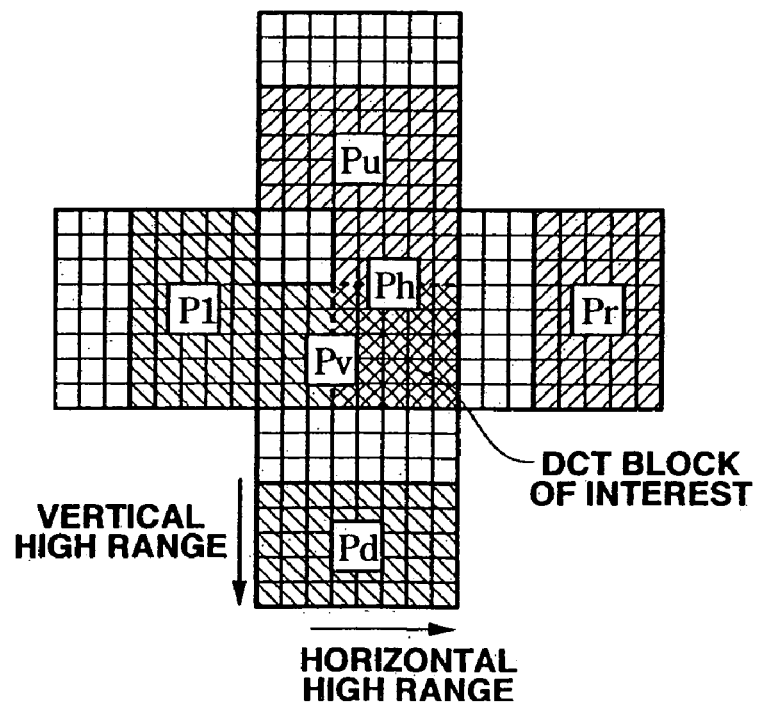
FIG. 69 illustrates a classification method.

That is, for the DCT block corresponding to the pixel block of interest, incidentally referred to below as DCT block of interest, for the DCT block adjacent to the upper side of the DCT block of interest, for the DCT block adjacent to the lower side of the DCT block of interest, for the DCT block adjacent to the left side of the DCT block of interest and for the DCT block adjacent to the right side of the DCT block of interest, among the five DCT blocks forming the class tap, as shown shaded in FIG. 69, the power Pv and Ph in the high frequency band in the vertical and horizontal directions, respectively, the power Pu in the high frequency band in the vertical direction, the power Pd in the high frequency band in the vertical direction, the power Pl in the high frequency band in the horizontal direction and the power Pr in the high frequency band in the horizontal direction, respectively, are calculated. Based on these power values Pv, Ph, Pu, Pd, Pl and Pr, classification may be performed in the same way as explained with reference to FIGS. 66 and 68.

Figure 70:
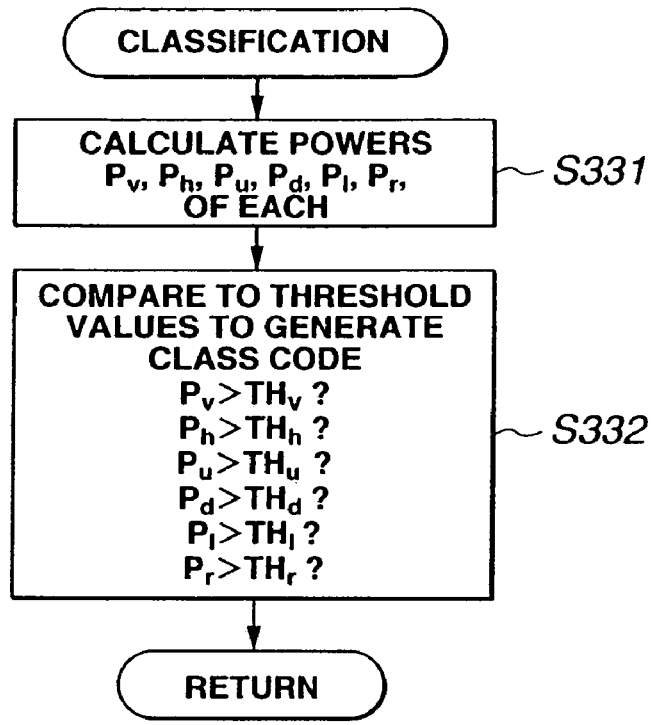
FIG. 70 is a flowchart for illustrating the processing of the classification circuit.

In this case, the processing shown in FIG. 70 is carried out in the classification circuit 643 at step S312 of FIG. 67.

That is, at step S331, the power calculating circuit 651 of the classification circuit 643 (FIG. 66) calculates the power values Pv, Ph, Pu, Pd, Pl and Pr of the respective frequency bands, as explained with reference to FIG. 69, to output the result to the class code generating circuit 652.

The class code generating circuit 652 at step S332 reads out a threshold value from the threshold value storage unit 653. It is assumed that threshold values THv, THh, THu, THd, THl and THr, for comparison with the power values Pv, Ph, Pu, Pd, Pl and Pr, respectively, are stored in the threshold value storage unit 653.

On reading out the threshold values THv, THh, THu, THd, THl and Thr, from the threshold value storage unit 653, the class code generating circuit 652 compares these to the power values Pv, Ph, Pu, Pd, Pl and Pr from the power calculating circuit 651, respectively, to acquire six bits corresponding to the magnitude relationships thereof. The class code generating circuit 652 outputs a 6-bit code composed of six one-bit codes. The program then is caused to return. Thus, in this case, the pixel of interest (pixel block of interest) is classified in any one of 64 ($=2^8$) classes.

In the foregoing, AC components of the quantized DCT coefficients, as the class taps, are used for classification. Alternatively, the classification may be performed using the DC component of the quantized DCT coefficients.

Figure 71:
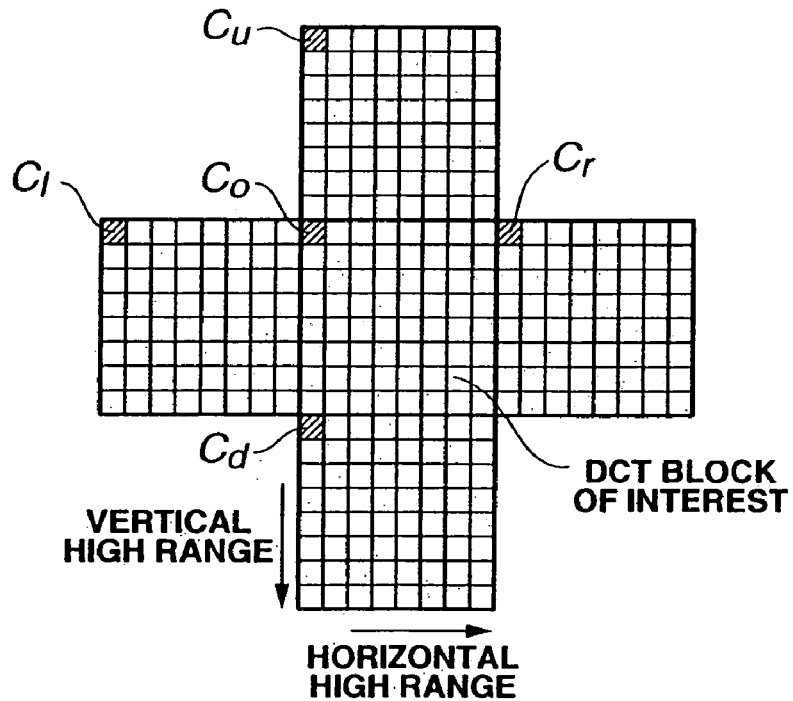
FIG. 71 shows another method for classification.

That is, the classification may be performed using the DC component $C_0$ of the DCT block of interest, and DC components of the DCT blocks adjacent to the upper, lower, left and right sides thereof, as shown in FIG. 71.

Figure 72:
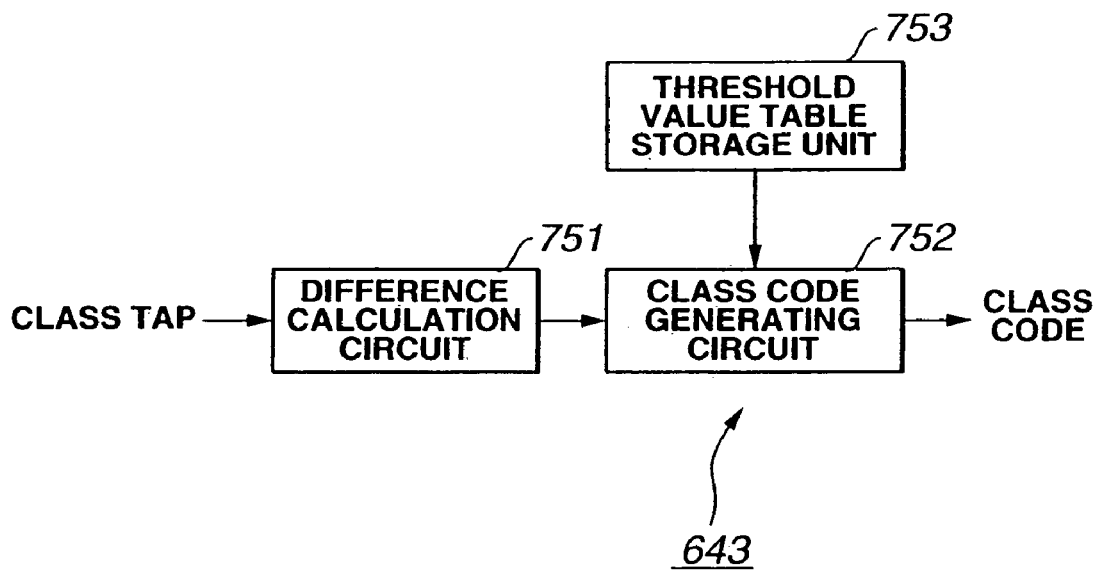
FIG. 72 is a block diagram showing another illustrative structure of the classification circuit.

In this case, the classification circuit 643 is configured as shown for example in FIG. 72.

The class tap is supplied to a difference calculating circuit 751. This difference calculating circuit 751 calculates absolute values Du, Dv, Cl and Dr of the differences between the DC components Cu, Cv, Cl and Cr of DCT blocks lying adjacent to the upper, lower, left and right sides of the DCT block of interest, forming the five DCT blocks of the class tap, and the DC component $C_0$ of the DCT block of interest, and sends the result to a class code generating circuit 752. That is, the difference calculating circuit 751 calculates the following equations (9):

$$D_u = |C_u - C_0|$$

$$D_d = |C_d - C_0|$$

$$D_l = |C_l - C_0|$$

$$D_r = |C_r - C_0| \quad (9)$$

to send the calculated results to the class code generating circuit 752.

The class code generating circuit 752 compares the results of calculations (absolute values of the differences) $D_u$, $D_d$, $D_l$, and $D_r$, as calculated by the difference calculating circuit 751, to the corresponding threshold values $TH_v$, $TH_h$, $TH_u$, $TH_d$, $TH_l$, and $TH_r$, stored in a threshold value storage unit 753, to output class codes based on the respective magnitude relationships. That is, the class code generating circuit 752 compares the absolute value of the difference Du to the threshold value $TH_u$ to generate a one-bit code representing its magnitude relationship. Similarly, the class code generating circuit 752 compares the absolute values of the differences $D_d$, $D_l$ and $D_h$ to the threshold values $TH_d$, $TH_l$ and $TH_r$, respectively, to produce respective one-bit codes.

The class code generating circuit 752 outputs 4-bit codes, obtained on arraying the four one-bit codes, obtained as described above, in a preset sequence, that is any values from 0 to 15, as class code representing the class of the pixel block of interest. Therefore, the pixel block of interest is assigned to one of $2^4$ ($=16$) classes.

The threshold value storage unit 753 memorizes the threshold values $TH_u$, $TH_d$, $TH_l$ and $TH_r$, for comparison to the absolute values of the difference values $D_u$, $D_d$, $D_l$ and $D_r$, respectively.

Figure 73:
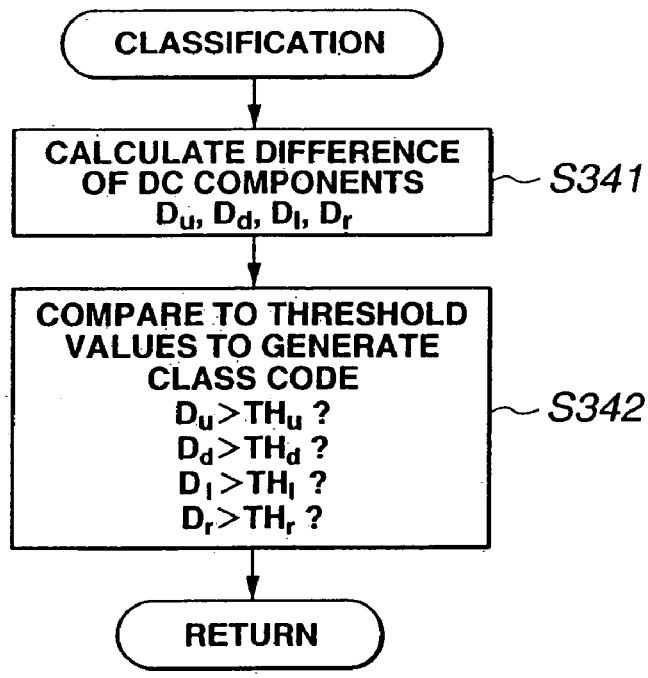
FIG. 73 is a flowchart for illustrating the processing of the classification circuit.

If the classification circuit 643 is designed as shown in FIG. 72, the processing shown in FIG. 73 is carried out at step S312 in FIG. 67.

That is, in the present case, the difference calculating circuit 751 at step S341 calculates the absolute values of the difference values $D_u$, $D_d$, $D_l$ and $D_r$, using the DC components $C_0$, $C_u$, $C_d$, $C_l$ and $C_r$ of the five DCT blocks forming the class taps, to route the absolute values of the difference values $D_u$, $D_d$, $D_l$ and $D_r$ to the class code generating circuit 752.

The class code generating circuit 752 at step S342 compares the threshold values THu, THd, THl and THr, stored in the threshold value storage unit 753, to the absolute values of the difference values $D_u$, $D_d$, $D_l$ and $D_r$ from the difference calculating circuit 751, to produce four one-bit codes representing the magnitude relationships. The class code generating circuit 752 outputs the 4-bit code, made up of the four one-bit codes. The program is then caused to return.

Meanwhile, the classification may also be performed not only using only the AC or DC component of the quantized DCT coefficients, but also using both the AC and DC components. That is, the method for classification is not limited to the above-described technique.

It should be noted that the learning processing for learning the tap coefficients memorized in the coefficient table storage unit 644 of FIG. 64 may be executed by the learning devices 60C and 60D shown in FIG. 16 or 18.

The coefficient conversion circuit 632 of FIG. 62 may be formed as shown in FIG. 13.

Figure 74:
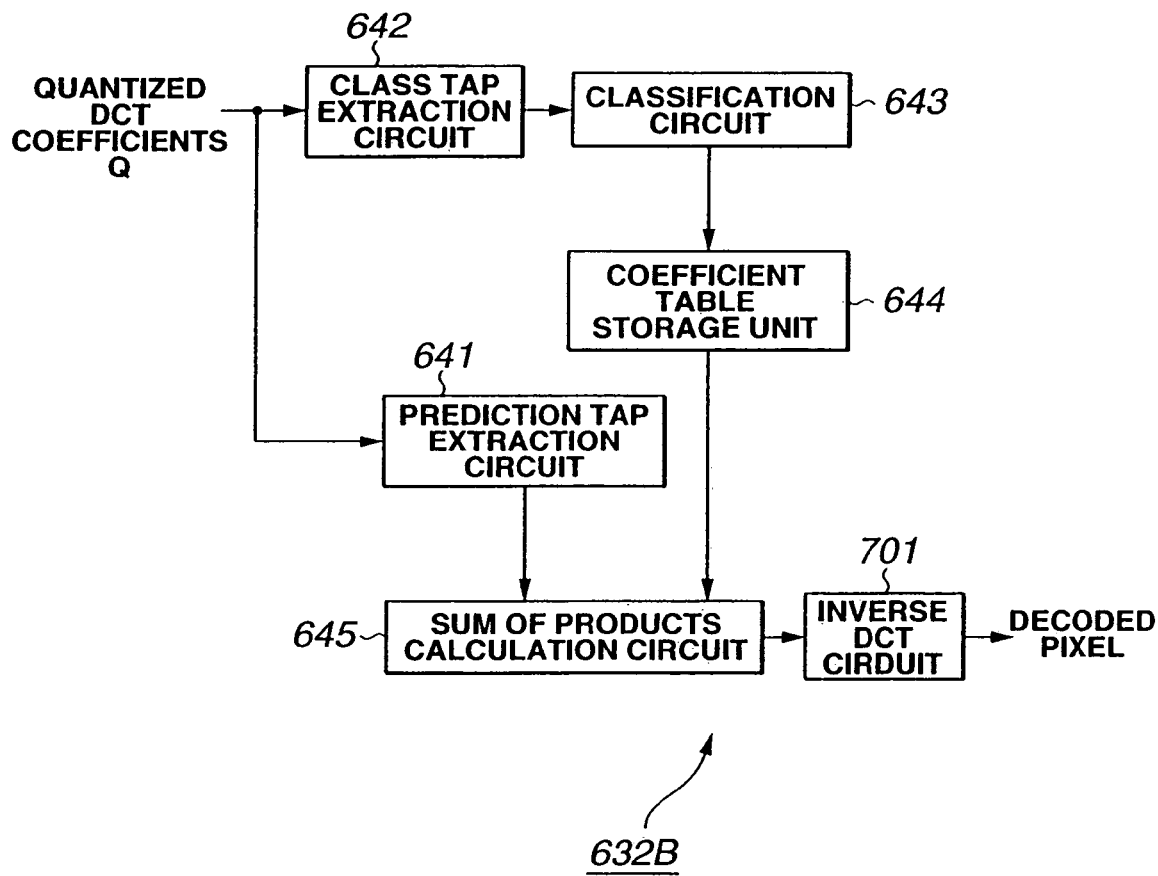
FIG. 74 is a block diagram showing another illustrative structure of the coefficient conversion circuit.

FIG. 74 shows an illustrative structure of the coefficient conversion circuit 632. In FIG. 74, the parts corresponding to the case of FIG. 64 are denoted by the same reference numerals and the corresponding explanation is omitted for simplicity. That is, the coefficient conversion circuit 632B shown in FIG. 74 is configured basically identically as the corresponding device shown in FIG. 64 except that an inverse DCT circuit 701 is provided anew on the downstream side of the sum-of-products circuit 645.

The inverse DCT circuit 701 applies inverse DCT to an output of the sum-of-products circuit 645 to decode the output into a picture, which is output. Thus, the coefficient conversion circuit 632B of FIG. 74 executes product of sum calculations of the quantized DCT coefficients forming the prediction taps output by the prediction tap extraction circuit 641 and tap coefficients stored in the coefficient table storage unit 644 to output DCT coefficients.

Thus, in the coefficient conversion circuit 632B of FIG. 74, the sum of product processing of the quantized DCT coefficients with the tap coefficients decodes the quantized DCT coefficients not into pixel values but into DCT coefficients, which DCT coefficients are inverse DCTed in the inverse DCT circuit 701 and thereby decoded into pixel values. So, the tap coefficients stored in the coefficient table storage unit 644 need to be different from those in FIG. 64.

Figure 75:
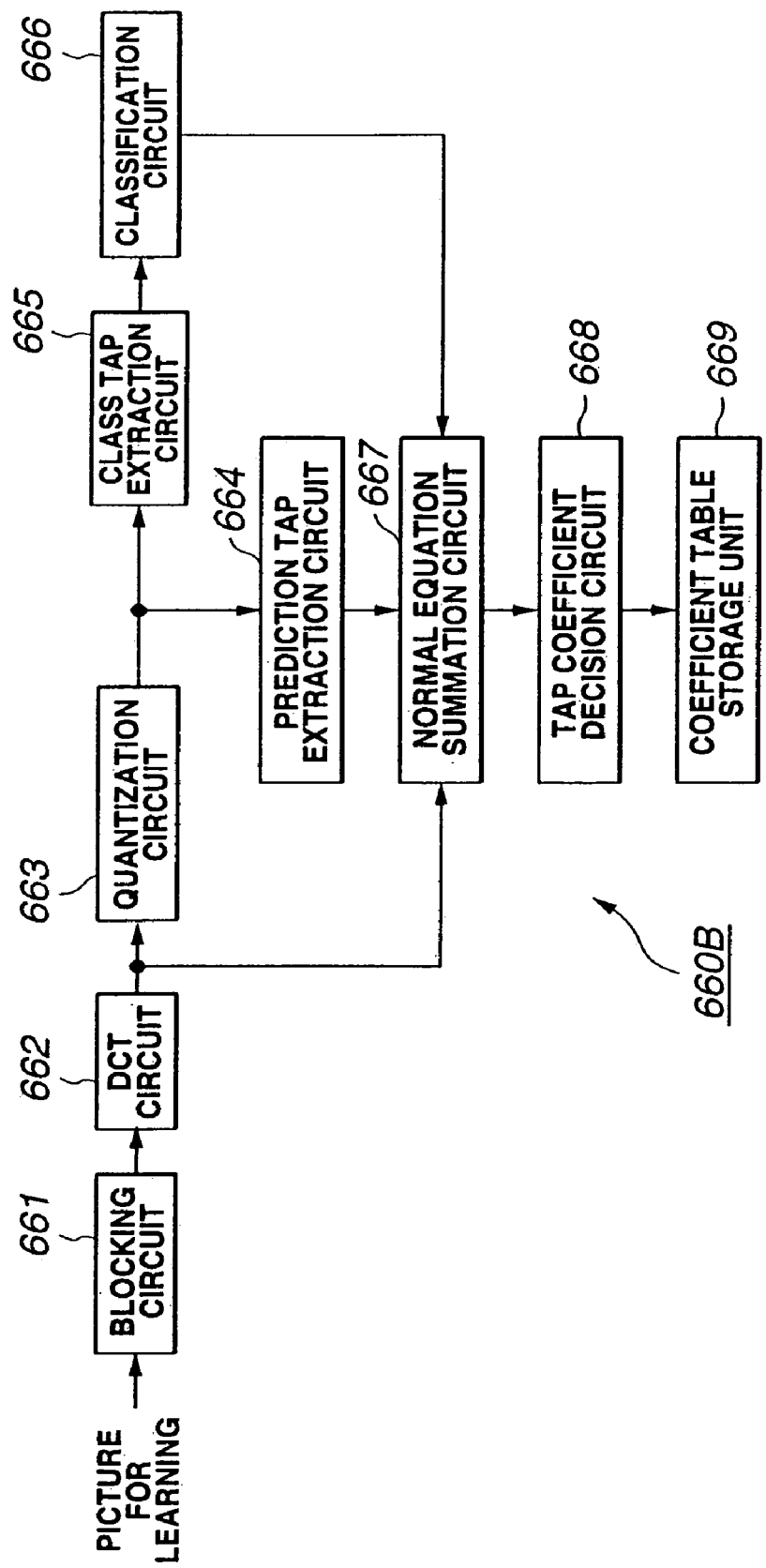
FIG. 75 is a block diagram showing an illustrative structure of a learning device responsible for learning processing of tap coefficients of the coefficient conversion circuit.

Thus, FIG. 75 shows an illustrative structure of a learning device 660B responsible for performing the learning processing of the tap coefficients stored in the coefficient table storage unit 644 of FIG. 74. Meanwhile, the parts or components corresponding to those shown in FIG. 16 are depicted by the same reference numerals each with 6 to the left of the MSB and the corresponding explanation is omitted for clarity. That is, the learning device 660B shown in FIG. 75 is configured similarly to the device shown in FIG. 16 except that not the pixel values of the picture for learning but the DCT coefficients DCTed from the picture for learning, output by the DCT circuit 662, are sent as teacher data to the normal equation summation circuit 667.

Thus, the normal equation summation circuit 667 in the learning device 660B, shown in FIG. 75, executes the above summation for the DCT coefficients output by the DCT circuit 662 as teacher data and for the quantized DCT coefficients forming the prediction taps output by the coefficient table storage unit 644. The tap coefficient decision circuit 668 solves the normal equation obtained by such summation to find tap coefficients. The result is that, in the learning device 660B of FIG. 75, such tap coefficients for converting the quantized DCT coefficients into DCT coefficients, in which the quantization error ascribable to quantization by the quantization circuit 663 is reduced or suppressed, may be found.

In the coefficient conversion circuit 632B of FIG. 74, in which the sum-of-products circuit 645 executes the sum of product processing, using the aforementioned tap coefficients, an output is the quantized DCT coefficients from the prediction tap extraction circuit 641 converted into DCT coefficients having the quantization error reduced. These DCT coefficients are inverse DCTed by the inverse DCT circuit 701 to produce a decoded picture in which the picture quality deterioration due to the quantization error is suppressed to a lower value.

Figure 76:
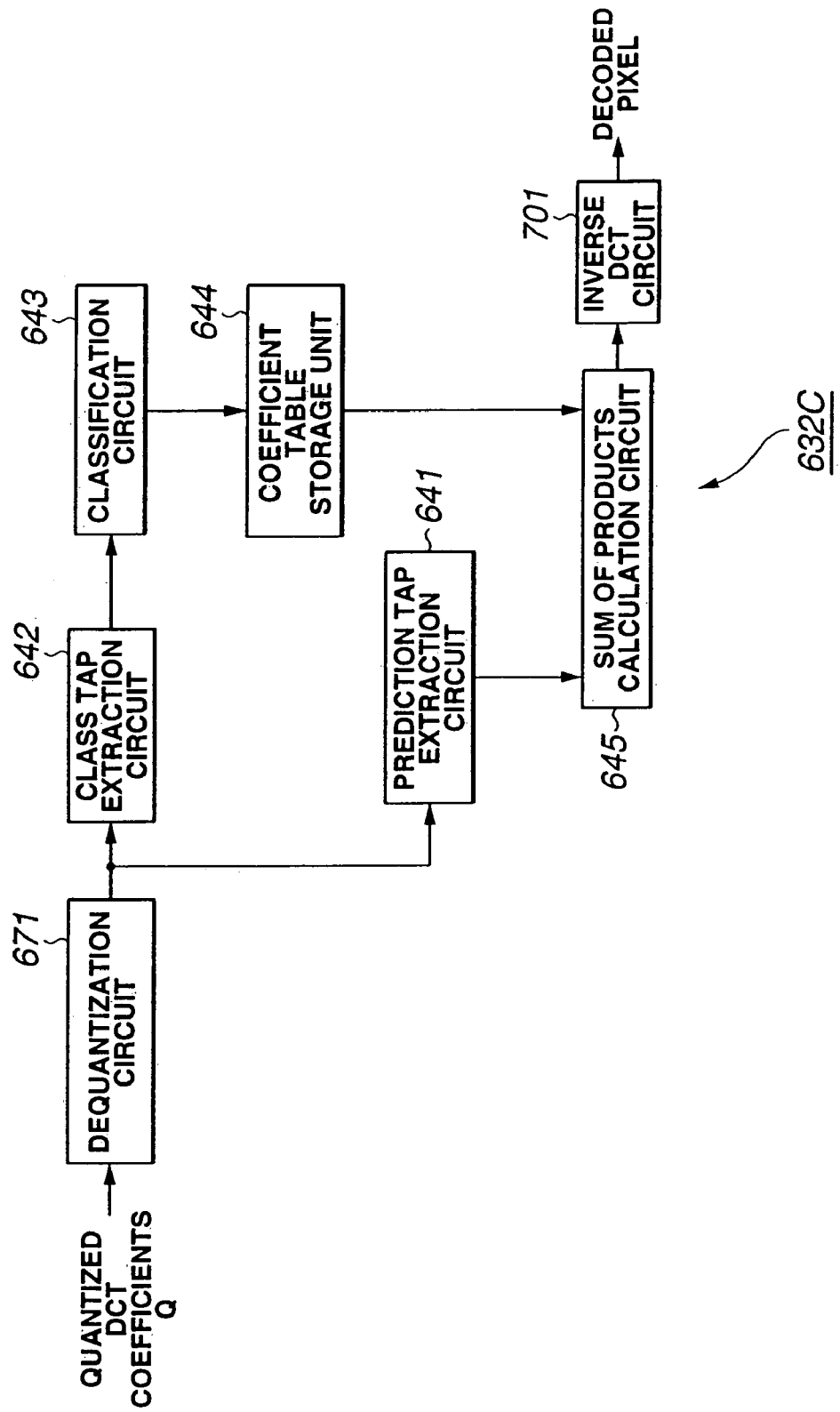
FIG. 76 is a block diagram showing an illustrative structure of the coefficient conversion circuit.

FIG. 76 shows a modified structure of the coefficient conversion circuit 632 shown in FIG. 62. In FIG. 76, the parts corresponding to the case of FIG. 64 or 74 are denoted by the same reference numerals and the corresponding explanation is omitted for simplicity. The coefficient conversion circuit 632C shown in FIG. 76 is configured basically identically as the corresponding device shown in FIG. 64 except that a dequantization circuit 671 is provided anew as in FIG. 18 and that the inverse DCT circuit 701 is also provided anew as in FIG. 74.

Therefore, in the prediction tap extraction circuit 641 and in the class tap extraction circuit 642 in the coefficient conversion circuit 632C of FIG. 76, the prediction and class taps are formed for the DCT coefficients, instead of for the quantized DCT coefficients. Additionally, the sum-of-products circuit 645 in the coefficient conversion circuit 632C of FIG. 76 executes sum of products processing, using the DCT coefficients forming the prediction taps output by the prediction tap extraction circuit 641 and the tap coefficients stored in the coefficient table storage unit 644 to produce DCT coefficients having the quantization error reduced. The so produced DCT coefficients are output to the inverse DCT circuit 701.

Figure 77:
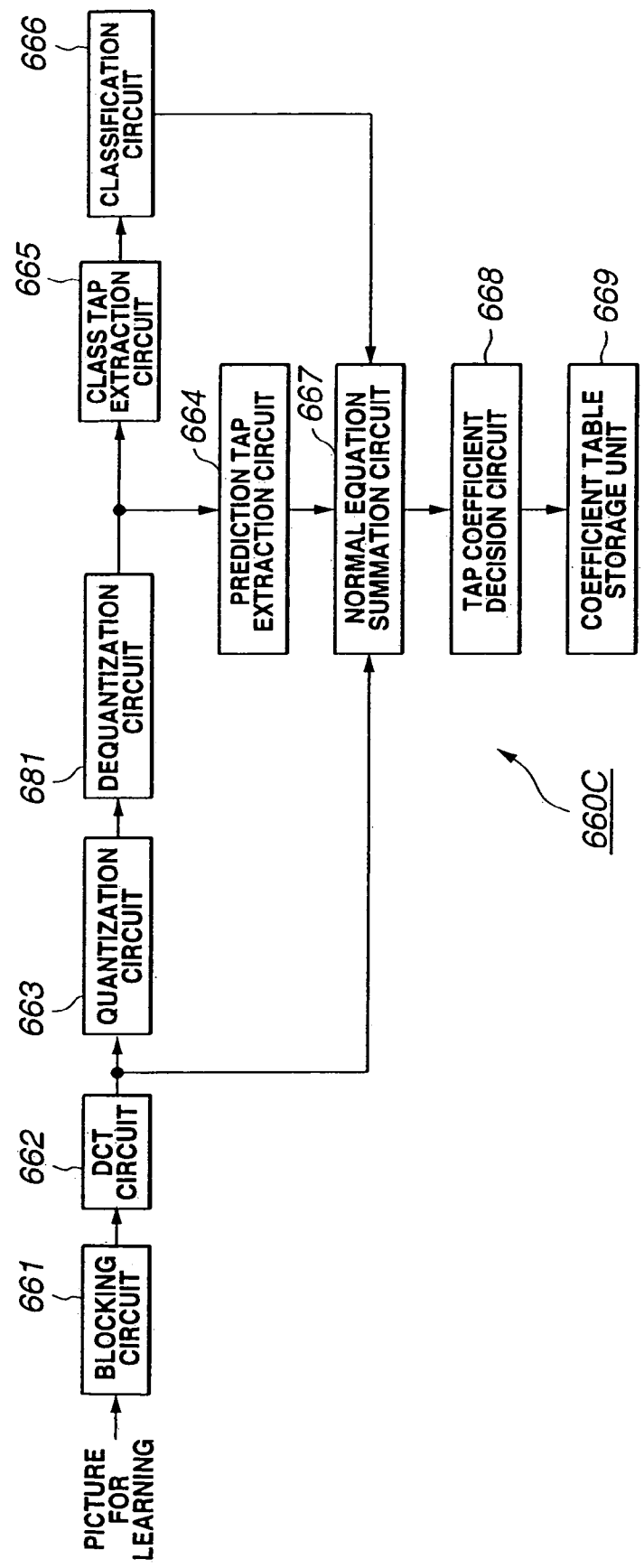
FIG. 77 is a block diagram showing another illustrative structure of the learning device.

FIG. 77 shows an illustrative structure of the learning device 660C responsible for performing the learning processing of tap coefficients stored in the coefficient table storage unit 644 of FIG. 76. In FIG. 77, the parts or components similar to those shown in FIG. 75 are depicted by the same reference numerals and the corresponding description is omitted for simplicity. That is, the learning device 660C, shown in FIG. 77, is basically constructed similarly to the circuit shown in FIG. 19, except that the dequantization circuit 681 is provided anew as in FIG. 19 and that not the pixel values of a picture for learning but DCT coefficients from the DCT circuit 662, obtained on DCTing the picture for learning, are afforded as teacher data to the normal equation summation circuit 667, as in FIG. 75.

Thus, the learning device 660C of FIG. 77 executes the aforementioned summation, using the DCT coefficients output by the DCT circuit 662, that is DCT coefficients free of quantization errors, as teacher data, and also using the DCT coefficients forming the prediction taps output by a prediction tap forming circuit 664, that is quantized and dequantized DCT coefficients, as pupil data. The result is that tap coefficients for converting the quantized and dequantized DCT coefficients into DCT coefficients, having reduced quantization error from quantization and dequantization, may be found in the learning device 660C.

According to the present invention, as described above, the converted data used for assigning the processing data of interest to one of a plural number of classes is extracted at least from the block other than the blocks corresponding to the processing data of interest, for use as class tap, classification is then executed to find the class of the processing data of interest, based on the class tap, and preset predictive calculations are executed, using the tap coefficients of the class of the processing data of interest and the converted data, to find the prediction value for processing data of interest, so that desired data for processing may be found efficiently from the converted data.

Moreover, according to the present invention, the pupil data used for assigning the teacher data of interest to one of a plural number of classes is extracted from the block other than the block corresponding to at least the teacher data of interest, for use as a class tap, based on which class tap the classification for finding the class of the teacher data of interest is performed. The learning is executed such as to statistically minimize the prediction errors of prediction values of teacher data, obtained on predictive calculations for the class-based tap coefficients and the pupil data, to find tap coefficients from class to class. Using the so found tap coefficients, desired data can be found efficiently from the data from orthogonal or frequency transform.

A further modification of the present invention is explained.

In the modification, now explained, encoded data is decoded using a decoder 822, comprised of an entropy decoding circuit 831, a coefficient conversion circuit 832 and a deblocking circuit 833, as the decoder 22 shown in FIG. 2.

The encoded data is supplied to the entropy decoding circuit 831. The entropy decoding circuit 831 entropy-decodes the encoded data and sends the resulting block-based quantized DCT coefficients Q to the coefficient conversion circuit 832. Meanwhile, the encoded data includes not only the entropy-encoded quantized DCT coefficients but also a quantization table, while the quantization table may be used as necessary for decoding the quantized DCT coefficients.

Using the quantized DCT coefficients Q from the entropy decoding circuit 831 and the tap coefficients as found by learning, the coefficient conversion circuit 832 performs preset predictive calculations to decode the block-based quantized DCT coefficients into an original block of 8×8 pixels.

The deblocking circuit 833 deblocks the decoded block obtained by the coefficient conversion circuit 832 to produce and output a decoded picture.

Figure 78:
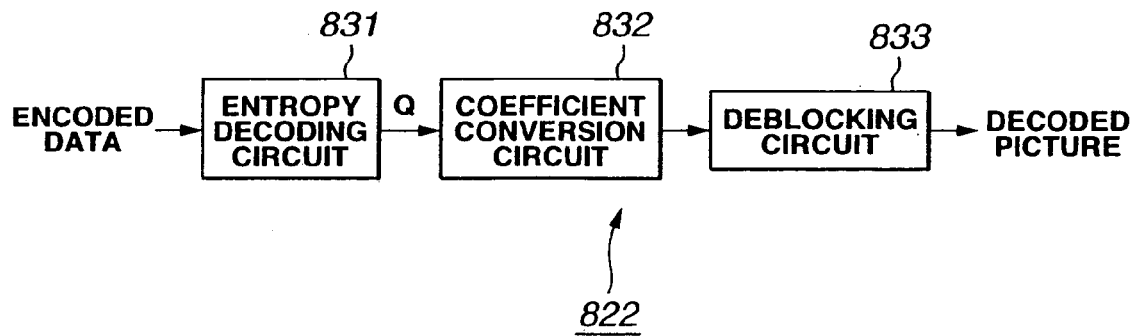
FIG. 78 is a block diagram showing an illustrative structure of a embodiment of a decoder in which the present invention is applied to the picture transmission system.
Figure 79:
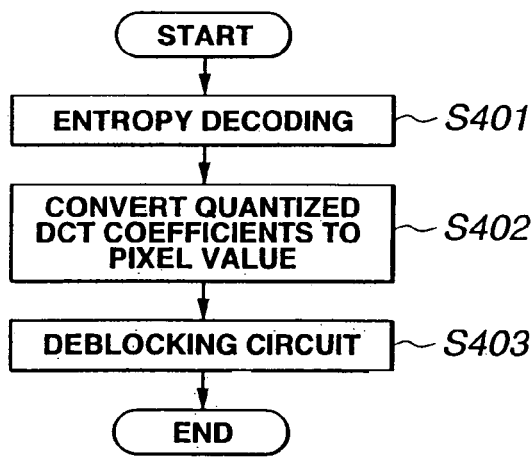
FIG. 79 is a flowchart for illustrating the processing by the decoder.

Referring to the flowchart of FIG. 79, the processing by the decoder 822 of FIG. 78 is explained.

The encoded data is sequentially fed to the entropy decoding circuit 831. At step S401, the entropy decoding circuit 831 entropy decodes the encoded data to send the block-based quantized DCT coefficients to the coefficient conversion circuit 832. The coefficient conversion circuit 832 at step S402 executes predictive calculations employing tap coefficients to decode the block-based quantized DCT coefficients Q into block-based pixel values which are then routed to the deblocking circuit 833. The deblocking circuit 833 deblocks the block of the pixel values from the coefficient conversion circuit 832 (decoded block) to output the resulting decoded picture to terminate the processing.

This coefficient conversion circuit 832 of FIG. 78 exploits the classification adaptive processing to decode the quantized DCT coefficients into pixel values.

Figure 80:
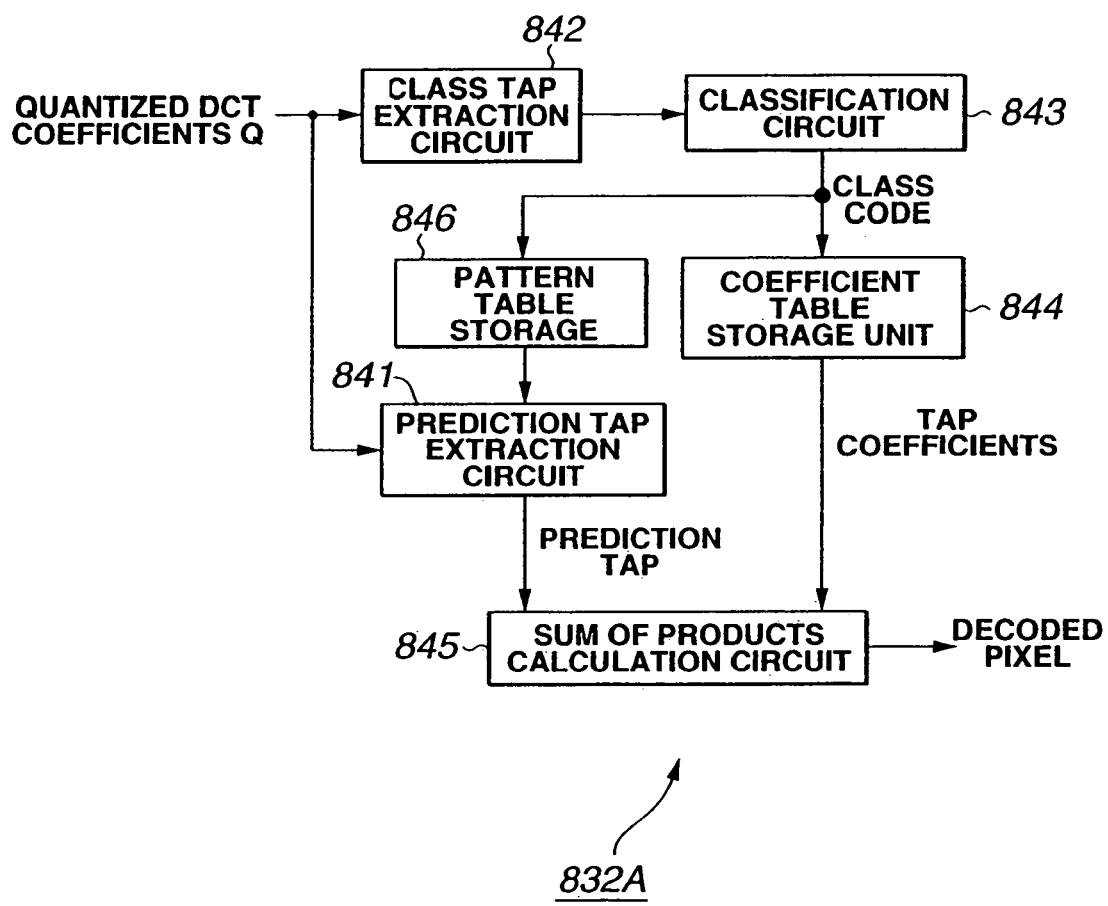
FIG. 80 is a block diagram showing an illustrative structure of a coefficient conversion circuit in the decoder.

FIG. 80 shows an illustrative structure of the coefficient conversion circuit 832 of FIG. 78 used for decoding the quantized DCT coefficients into pixel values.

In this coefficient conversion circuit 832A, shown in FIG. 80, the block-based quantized DCT coefficients, output from the entropy decoding circuit 831 (FIG. 78), are sent to a prediction tap extraction circuit 841 and to a class tap extraction circuit 842.

The prediction tap extraction circuit 841 sets the block of pixel values corresponding to the block of quantized DCT coefficients, supplied thereto, incidentally referred to below as DCT blocks, sequentially as pixel blocks of interest. These blocks of pixel values, are not present in the present stage but virtually presupposed, and are incidentally referred to below as pixel blocks. Moreover, the pixels that make up the pixel block of interest are sequentially made into pixels of interest in the raster scanning sequence. In summation, the prediction tap extraction circuit 841 references the pattern table of a pattern table storage unit 846, for use as prediction taps.

That is, the pattern table storage unit 846 memorizes a pattern table, having registered therein the pattern information indicating the position relationships of the quantized DCT coefficients, extracted as prediction tap for the pixel of interest, with respect to the pixels of interest. Based on the pattern information, the prediction tap extraction circuit 841 extracts the quantized DCT coefficients to form a prediction tap for the pixel of interest.

The prediction tap extraction circuit 841 forms prediction taps for respective pixels, forming a pixel block of 8×8=64 pixels, that is 64 sets of prediction taps for each of the 64 pixels, as described above, to send the prediction taps thus formed to the sum-of-products circuit 845.

The class tap extraction circuit 842 extracts quantized DCT coefficients used for assigning the pixel of interest to any of a plural number of classes, for use as class taps. In JPEG encoding, in which a picture is encoded (DCTed and quantized) from one pixel block to another, all of the pixels belonging to a given pixel block are assigned to the same class by way of classification. So, the class tap extraction circuit 842 forms the same class tap for respective pixels of a given pixel block. That is, the class tap extraction circuit 842 extracts all of the quantized DCT coefficients, that is 8×8=64 quantized DCT coefficients, of a DCT block corresponding to the pixel block to which belongs the pixel of interest, as class taps, as shown in FIG. 6. It is however possible to form the class taps from quantized DCT coefficients that are different from one pixel of interest to another.

It is noted that assigning the respective pixels belonging to a given pixel block to the same class is equivalent to classifying the pixel block. Thus, it is sufficient if the class tap extraction circuit 842 forms not 64 sets of the class taps for classifying each of 64 pixels making up the pixel block of interest, but one set of the class taps for classifying the pixel block of interest. To this end, the class tap extraction circuit 842 extracts 64 quantized DCT coefficients of the DCT block associated with the pixel block in question, for use as class taps, in order to classify the pixel block in question, from one pixel block to another.

Meanwhile, the quantized DCT coefficients, forming prediction taps or class taps, are not limited to those of the above-mentioned patterns.

The class tap of the pixel block of interest, obtained in the class tap extraction circuit 842, is sent to the classification circuit 843. The classification circuit 843 classifies the pixel blocks of interest, based on the class tap from the class tap extraction circuit 842, to output the class code corresponding to the resulting class.

As the classification method, ADRC, for example, may be used.

In the method employing ADRC, the quantized DCT coefficients, forming the class tap, are ADRC processed, and the class of the pixel block of interest is determined based on the so produced ADRC code.

In the classification circuit 843, preferably the information volume of the class tap is compressed by ADRC processing or vector quantization followed by classification.

Thus, in the present embodiment, the classification circuit 843 extracts characteristic values of high cruciality, from the quantized DCT coefficients, forming the class tap, and undertakes the classification based on the characteristic values to diminish the number of the classes.

Figure 81:
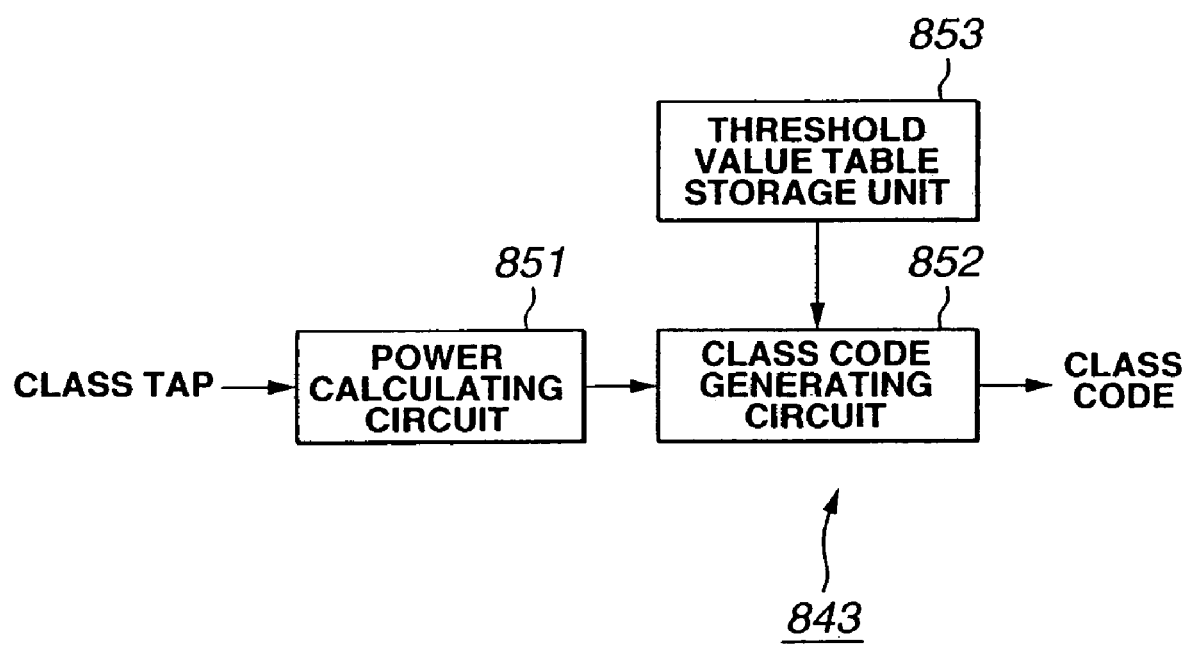
FIG. 81 is a block diagram showing an illustrative structure of a classification circuit in the coefficient conversion circuit.

FIG. 81 shows an illustrative structure of the classification circuit 843 shown in FIG. 80.

The class tap is sent to the power calculation circuit 851, which then splits the quantized DCT coefficients, forming the class tap, into a plural number of spatial frequency bands, to calculate the power from one frequency band to another.

That is, the power calculating circuit 851 splits the 8×8 quantized DCT coefficients, forming the class tap, into four spatial frequency bands $S_0$, $S_1$, $S_2$ and $S_3$, shown for example in FIG. 6. The spatial frequency band $S_0$, is made up of four quantized DCT coefficients $x_0$, $x_1$, $x_8$, $x_9$, the spatial frequency band $S_1$ is made up of 12 quantized DCT coefficients $x_2$, $x_3$, $x_4$, $x_5$, $x_6$, $x_7$, $x_{10}$, $x_{11}$, $x_{12}$, $x_{13}$, $x_{14}$, $x_{15}$, the spatial frequency band $S_2$ is made up of 12 quantized DCT coefficients $x_{16}$, $x_{17}$, $x_{24}$, $x_{25}$, $x_{32}$, $x_{33}$, $x_{40}$, $x_{41}$, $x_{48}$, $x_{49}$, $x_{56}$, $x_{57}$ and the spatial frequency band $S_3$ is made up of 36 quantized DCT coefficients $x_{18}$, $x_{19}$, $x_{20}$, $x_{21}$, $x_{22}$, $x_{23}$, $x_{26}$, $x_{27}$, $x_{28}$, $x_{29}$, $x_{30}$, $x_{31}$, $x_{34}$, $x_{35}$, $x_{36}$, $x_{37}$, $x_{38}$, $x_{39}$, $x_{42}$, $x_{43}$, $x_{44}$, $x_{45}$, $x_{46}$, $x_{47}$, $x_{50}$, $x_{51}$, $x_{52}$, $x_{53}$, $x_{54}$, $x_{55}$, $x_{58}$, $x_{59}$, $x_{60}$, $x_{61}$, $x_{62}$, $x_{63}$.

Moreover, the power calculating circuit 851 calculates power values $P_0$, $P_1$, $P_2$ and $P_3$ of the AC components of the quantized DCT coefficients, for each of the spatial frequency bands $S_0$, $S_1$, $S_2$ and $S_3$, to output the so calculated power values $P_0$, $P_1$, $P_2$ and $P_3$ to a class code generating circuit 852.

That is, the power calculating circuit 851 finds a square sum value $x_1^2+x_8^2+x_9^2$ of the AC components $x_1$, $x_8$, $x_9$ of the four quantized DCT coefficients $x_0$, $x_1$, $x_8$, $x_9$ to output the resulting square sum to the class code generating circuit 852 as power $P_0$. The power calculating circuit 851 also finds a square sum of the AC components of the 12 quantized DCT coefficients for the spatial frequency band $S_1$, that is the totality of the 12 quantized DCT coefficients, to output the resulting square sum to the class code generating circuit 852 as power $P_1$. The power calculating circuit 851 also finds the power values $P_2$ and $P_3$ for the spatial frequency bands $S_2$ and $S_3$, respectively, as in the case of the spatial frequency band $S_1$, described above, to output the resulting power values to the class code generating circuit 52.

The class code generating circuit 852 compares the power values $P_0$, $P_1$, $P_2$ and $P_3$ from the power calculating circuit 851 to corresponding threshold values $TH_0$, $TH_1$, $TH_1$ and $TH_3$ stored in a threshold value storage unit 853 to output class codes based on the magnitude relationships thereof. That is, the class code generating circuit 852 compares the power $P_0$ to the threshold value $TH_0$ to produce a one-bit code representing the magnitude relationship. In similar manner, the class code generating circuit 852 compares the power $P_1$ to the threshold value $TH_1$ to produce a one-bit code representing the magnitude relationship thereof. Likewise, the class code generating circuit 852 compares the power $P_2$ to the threshold value $TH_2$ and the power $P_3$ to the threshold value $TH_3$, respectively, to produce a one-bit code for each of the power-threshold value combinations. The class code generating circuit 852 outputs the four one-bit codes (thus any of values from 0 to 15), obtained as described above, in e.g., a preset sequence, as class codes representing the classes of the pixel block of interest. Thus, in the present embodiment, the pixel blocks of interest is classified into $2^4=16$ classes.

The threshold value storage unit 853 memorizes the threshold values $TH_0$ to $TH_3$ to be compared to the power values $P_0$ to $P_3$ of the spatial frequency bands $S_0$ to $S_3$, respectively.

In the above-described case, the DC component $x_0$ of the quantized DCT coefficients is not used for the classification processing. Alternatively, this DC component $x_0$ may also be used for classification.

Reverting to FIG. 80, the class codes, output by the classification circuit 843, as described above, are afforded as addresses to a coefficient table storage unit 844 and to a pattern table storage unit 846.

The coefficient table storage unit 844 memorizes a coefficient table, having registered therein tap coefficients, obtained by learning processing, as will be explained subsequently, and outputs tap coefficients stored in an address associated with the class code, output by the classification circuit 843, to the sum-of-products circuit 845.

In the present embodiment, in which the pixel blocks are classified, one class code is obtained for the pixel block of interest. On the other hand, since the pixel block in the present embodiment is made up of 8×8=64 pixels, 64 sets of tap coefficients are required for decoding 64 pixels making up a given pixel block of interest. Thus, the coefficient table storage unit 844 memorizes 64 sets of tap coefficients for an address corresponding to one class code.

The sum-of-products circuit 845 acquires the prediction tap output by the prediction tap extraction circuit 841 and the tap coefficients output by the coefficient table storage unit 844 and, using the prediction taps and the tap coefficients, executes linear predictive processing (sum of products processing) shown in the equation (1), to output the pixel values of the 8×8 pixels of the pixel block of interest, as decoded results of the corresponding DCT block, to the deblocking circuit 833 (FIG. 78).

In the prediction tap extraction circuit 841, each pixel of the pixel block of interest sequentially becomes a pixel of interest. The sum-of-products circuit 845 then performs processing in an operating mode associated with the position of a pixel which is the pixel of interest of the pixel block of interest. This operating mode is incidentally referred to below as pixel position mode.

That is, if a number i pixel of the pixels of the pixel block of interest, in the raster scanning sequence, is denoted $p_i$, with the pixel $p_i$ being the pixel of interest, the sum-of-products circuit 845 performs the processing of the pixel position mode #1.

Specifically, the coefficient table storage unit 844 outputs 64 sets of tap coefficients for decoding each of the 64 pixels making up a pixel block of interest. If the set of tap coefficients for decoding the pixel $p_i$ is denoted $W_i$, and the operating mode is the pixel mode #1, the sum-of-products circuit 845 performs the sum of product processing of the equation (1), using the prediction taps and the set $W_i$, among the tap coefficients of the 64 sets, and renders the results of the sum of product processing the results of the decoding of the pixel $p_i$.

The pattern table storage unit 846 has stored therein a pattern table, in which there is registered the pattern information obtained on learning the pattern information representing an extraction pattern of the quantized DCT information, as later explained. The pattern table storage unit 846 outputs the pattern information stored in an address associated with the class code output by the classification circuit 843 to the prediction tap extraction circuit 841.

In the pattern table storage unit 846, there are stored 64 sets of the pattern information (the pattern information for each pixel position mode) for an address associated with one class code.

Figure 82:
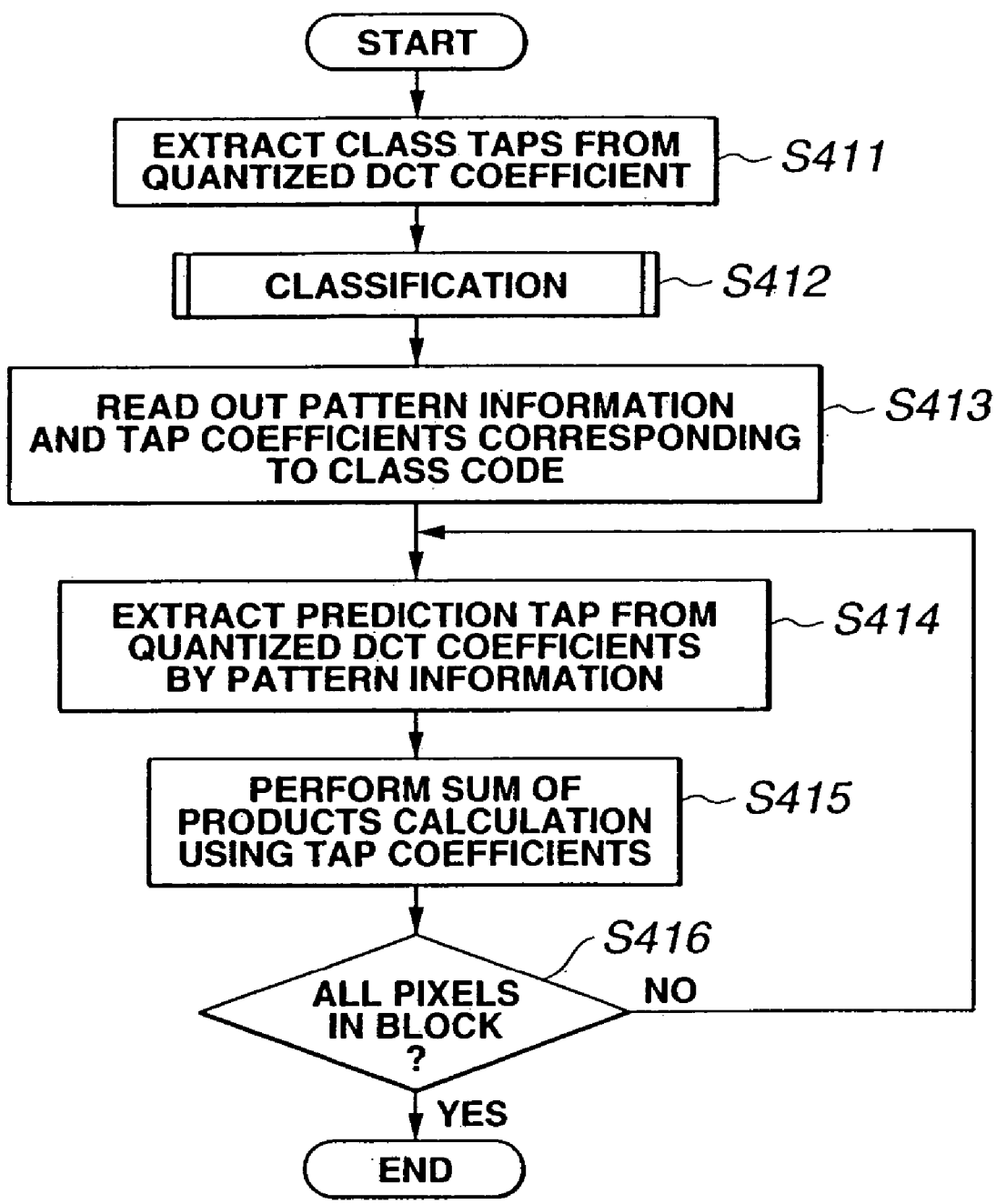
FIG. 82 is a flowchart for illustrating the processing by the coefficient conversion circuit.

Referring to the flowchart of FIG. 82, the processing of the coefficient conversion circuit 832A of FIG. 80 is explained.

The block-based DCT coefficients, output by the entropy decoding circuit 831, are sequentially received by the prediction tap extraction circuit 841 and by the class tap extraction circuit 842. The prediction tap extraction circuit 841 sequentially renders the pixel block corresponding to the block of the quantized DCT coefficients (DCT block) a pixel block of interest.

At step S411, the class tap extraction circuit 842 extracts the quantized DCT coefficients received and usable for classifying the pixel block of interest, to form class taps, which are then output to the classification circuit 243.

At step S412, the classification circuit 843 classifies the pixel block of interest, using the class taps from the class tap extraction circuit 842, to output the resulting class codes to the coefficient table storage unit 844 and to the pattern table storage unit 846.

Figure 83:
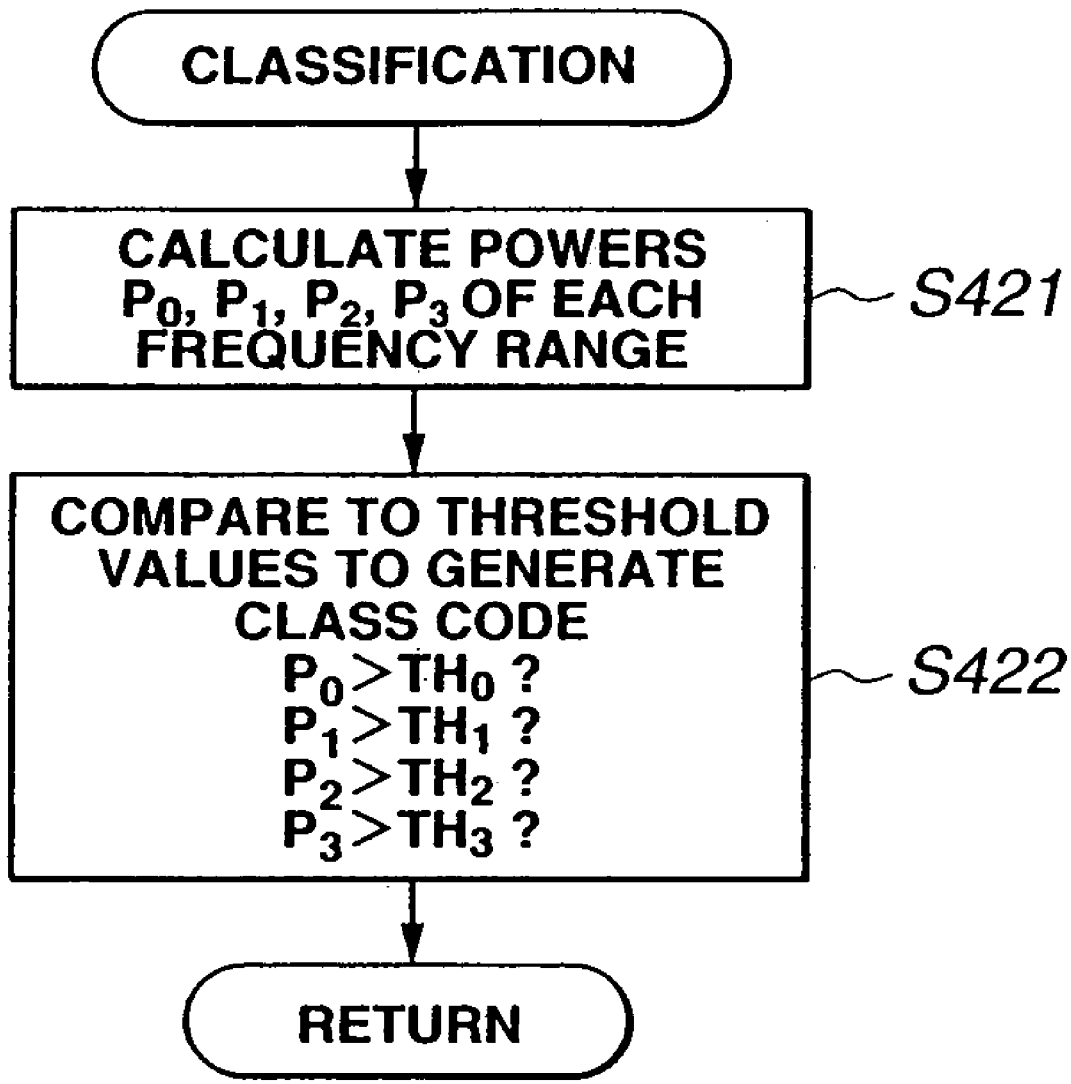
FIG. 83 is a flowchart for illustrating the processing by the coefficient conversion circuit in more detail.

That is, st step S412, in the flowchart of FIG. 83, the power calculating circuit 843 of the classification circuit 843 (FIG. 81) splits, first at step S421, the 8×8 quantized DCT coefficients making up the class tap into four spatial frequency bands $S_0$ to $S_3$ to calculate the respective power values $P_0$ to $P_3$. These power values $P_0$ to $P_3$ are output from the power calculating circuit 851 to the class code generating circuit 852.

The class code generating circuit 852 at step S422 reads out the threshold values $TH_0$ to $TH_3$ to compare the power values $P_0$ to $P_3$ from the power calculating circuit 851 to the threshold values $TH_0$ to $TH_3$ to generate the class codes based on the respective magnitude relationships. The program then is caused to return.

Reverting to FIG. 82, the class codes, obtained at step S412 as described above, are given from the classification circuit 843 to the coefficient table storage unit 844 and to the pattern table storage unit 846 as addresses.

On receipt of the class codes from the classification circuit 843 as addresses, the coefficient table storage unit 844 at step S413 reads out the 64 sets of the tap coefficients stored as the addresses to output the so read out tap coefficients to the sum-of-products circuit 845.

The program then moves to step S414 where the prediction tap extraction circuit 841 extracts quantized DCT coefficients used for predicting the pixel values of the pixels of interest of the pixel block of interest not as yet rendered the pixels of interest in the raster scanning sequence, thereby forming prediction taps. These prediction taps are sent from the prediction tap extraction circuit 841 to the sum-of-products circuit 845.

At step S415, the sum-of-products circuit 845 acquires a set of tap coefficients corresponding to the pixel position mode for the pixels of interest, from among the 64 set tap coefficients output at step S413 from the coefficient table storage unit 844. Then, using the set of the tap coefficients and the prediction taps supplied from the prediction tap extraction circuit 841, the sum-of-products circuit 845 executes the sum of product processing, shown in the equation (1), to acquire the values of the decoded pixels of interest.

The program then moves to step S416 where the prediction tap extraction circuit 841 verifies whether or not the processing has been executed with the totality of the pixels of the pixel block of interest as the pixels of interest. If it is verified at step S416 that the processing has not been executed with the totality of the pixels of the pixel block of interest as the pixels of interest, the program reverts to step S414 where the prediction tap extraction circuit 841 repeats similar processing with the pixel values of the pixels of interest of the pixel block of interest, not as yet rendered the pixels of interest in the raster scanning sequence, as the pixels of interest.

If it is verified at step S416 that the processing has been done with the totality of the pixels of the pixel block of interest as the pixels of interest, that is if the decoded values of the totality of the pixels of the pixel block of interest, have been acquired, the sum-of-products circuit 845 outputs the pixel block (decoded block), made up of the decoded values, to the deblocking circuit 833 (FIG. 78) to finish the processing.

Meanwhile, the processing conforming to the flowchart of FIG. 82 is executed repeatedly each time the prediction tap extraction circuit 841 sets a new pixel block of interest.

Figure 84:
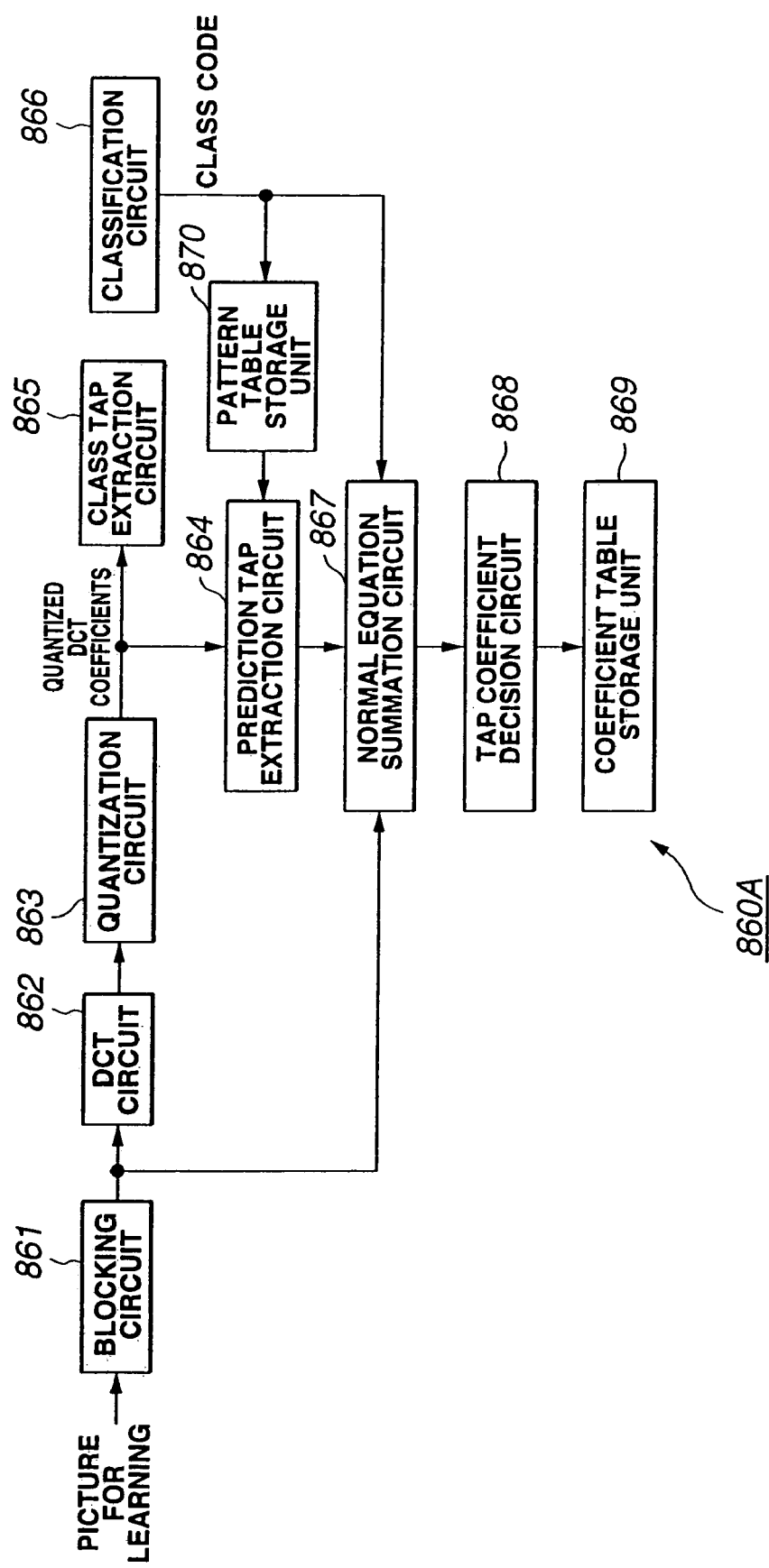
FIG. 84 is a block diagram showing an illustrative structure of a tap coefficient learning device responsible for learning processing of the pattern information.

FIG. 84 shows an illustrative structure of a learning device 860A executing the learning processing for tap coefficients stored in the coefficient table storage unit 844 of FIG. 80.

The blocking circuit 861 is fed with one or more pictures of the picture data as teacher data operating as a teacher in learning. The blocking circuit 861 blocks the picture as teacher data into pixel blocks each comprised of 8×8 pixels, as in the case of JPEG encoding.

The DCT circuit 862 sequentially reads out the pixel blocks, formed by the blocking circuit 861, and applies DCT processing to the pixel block of interest to form blocks of DCT coefficients. These blocks of DCT coefficients are sent to the quantization circuit 863.

The quantization circuit 863 quantizes the blocks of the DCT coefficients from the DCT circuit 862, using the same quantization table as that used for JPEG encoding, and sequentially sends the resulting blocks of the quantized DCT coefficients (DCT blocks) to the prediction tap extracting circuit 864 and to the class tap extraction circuit 865.

With the pixels of the pixel block of interest, not as yet rendered the pixels of interest in the raster scanning sequence, as the pixels of interest, the prediction tap extracting circuit 864 references the pattern information, read out from the pattern table storage unit 870, for the pixels of interest, by extracting the needed quantized DCT coefficients from the output of the quantization circuit 863, to form the same prediction taps as those formed by the prediction tap extraction circuit 841 of FIG. 80. This class taps are sent from the prediction tap extracting circuit 864 to the normal equation summation circuit 867.

The class tap extraction circuit 865 extracts quantized DCT coefficients as needed from the output of the quantization circuit 863, for the pixel block of interest, to form the same class taps as those formed by the class tap extraction circuit 842 of FIG. 80. This class taps are sent from the class tap extraction circuit 865 to the classification circuit 866.

Using the class taps from the class tap extraction circuit 865, the classification circuit 866 executes the same processing as that performed by the classification circuit 843 of FIG. 80 to classify the pixel blocks of interest to send the resulting class codes to the normal equation summation circuit 867 and to the pattern table storage unit 870.

The normal equation summation circuit 867 reads out pixel values of the pixels of interest as teacher data from the blocking circuit 861 to execute the summation on the quantized DCT coefficients forming the prediction taps as pupil data from the prediction tap extracting circuit 864 and on the pixels of interest.

That is, the normal equation summation circuit 867 executes calculations corresponding to multiplication ($x_{in}x_{im}$) and summation $\Sigma$ of pupil data, as respective elements of the matrix A of the equation (8), using prediction taps (pupil data) from one class corresponding to the class code supplied from the classification circuit 866 to another.

The normal equation summation circuit 867 also executes calculations corresponding to multiplication ($x_{in}y_i$) and summation $\Sigma$ of prediction taps (pupil data), and the pixel of interest (teacher data), as components of the vector v of equation (8), using the pupil data and the teacher data, from one class corresponding to the class code supplied from the classification circuit 266 to another.

The aforementioned summation in the normal equation summation circuit 867 is performed for each class from one pixel position mode for the pixel of interest to another.

The normal equation summation circuit 867 executes the above-described summation, with the totality of the pixels making up the teacher picture supplied thereto as pixels of interest, whereby a normal equation shown in the equation (8) is established for each pixel position mode for each class.

A tap coefficient decision circuit 868 solves the normal equation, generated for each class, from one pixel position mode to another, in the normal equation summation circuit 867, to find 64 sets of the tap coefficients, from class to class, to send the tap coefficients thus found to the addresses corresponding to the respective classes of a coefficient table storage unit 869.

Depending on the number of pictures provided as pictures for learning, or on the picture contents, it may be an occurrence that a class is produced in which the number of the normal equations necessary to find the tap coefficients cannot be produced. For such class, the tap coefficient decision circuit 868 outputs e.g., default tap coefficients.

The coefficient table storage unit 869 memorizes 64 sets of the tap coefficients for each class supplied thereto from the tap coefficient decision circuit 868.

The pattern table storage unit 870 memorizes the same pattern table as that memorized by the pattern table storage unit 870. The 64 sets of the pattern information, stored in the address associated with the class codes from the classification circuit 866, are read out and sent to the prediction tap extracting circuit 864.

Figure 85:
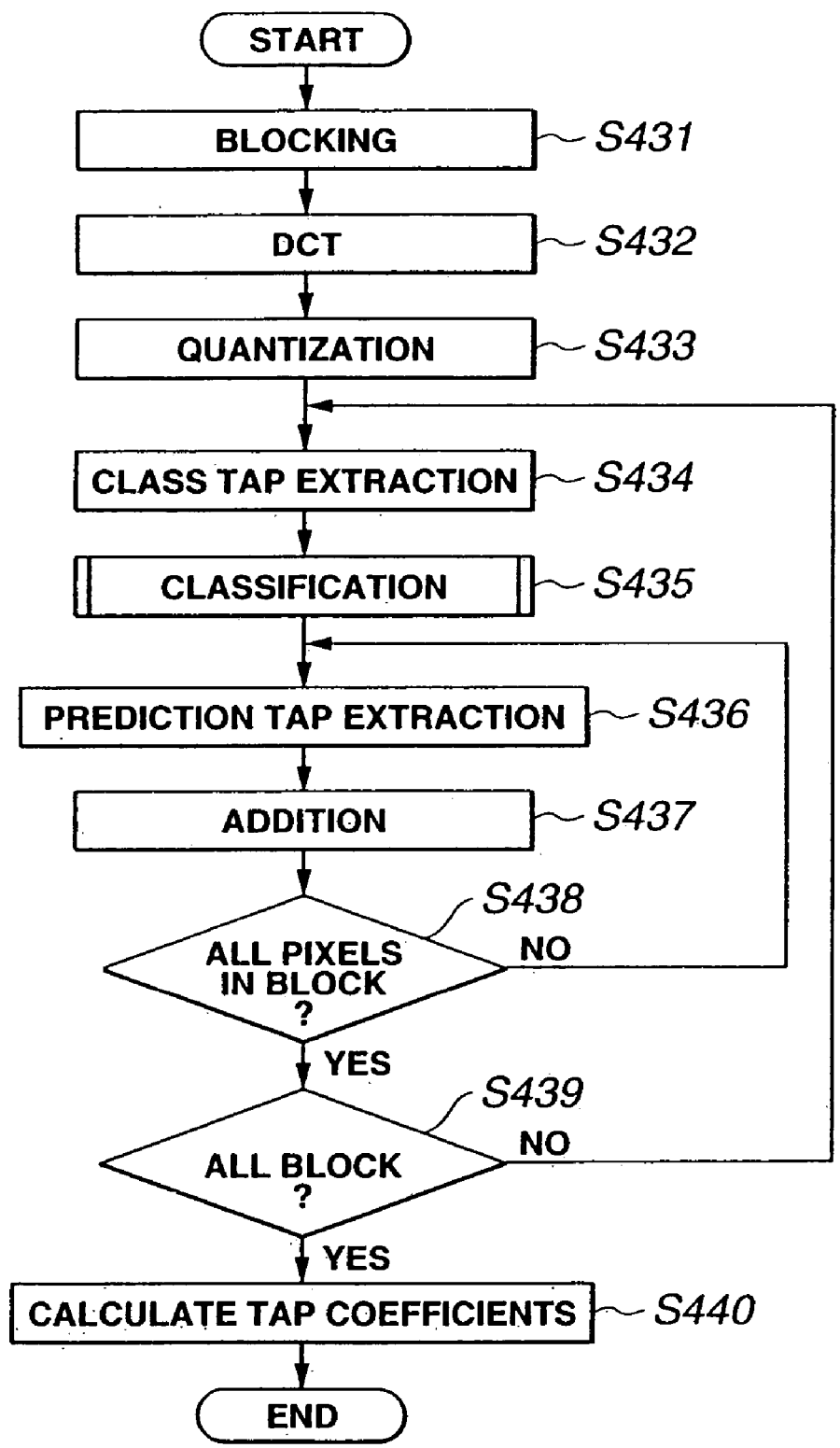
FIG. 85 is a flowchart for illustrating the processing by the tap coefficient learning device.

Referring now to the flowchart of FIG. 85, the processing (learning processing) of a learning device 860A of FIG. 84 is explained.

The blocking circuit 861, fed with picture data for learning as teacher data, blocks the picture data as teacher data, at step S431, as in the case of JPEG encoding, into a pixel block of 8×8 pixels. The program then moves to step S432 where the DCT circuit 862 sequentially reads out the pixel blocks formed by the blocking circuit 861 and applies DCT to the pixel block of interest to form a block of DCT coefficients. The program then moves to step S433 where the quantization circuit 863 sequentially reads out the blocks of the DCT coefficients obtained in the DCT circuit 862, and quantizes the so read out blocks, using the same quantization table as that used in JPEG encoding to form blocks each made up of the quantized DCT coefficients (DCT blocks).

The program then moves to step S434 where the class tap extraction circuit 865 renders the pixel block, among the pixel blocks formed into one block by the blocking circuit 861, not as yet made into the pixel block of interest, a pixel block of interest. Moreover, the class tap extraction circuit 865 extracts the quantized DCT coefficients used for classifying the pixel block of interest, from the DCT blocks obtained at the quantization circuit 863, to form class taps, which are then routed to the classification circuit 866. As explained in connection with the flowchart of FIG. 83, the classification circuit 866 at step S435 classifies the pixel blocks of interest, using the class taps from the class tap extraction circuit 865, to route the resulting class codes to the normal equation summation circuit 867 and to the pattern table storage unit 870. The program then moves to step S436.

Thus, the pattern table storage unit 870 reads out the 64 sets of the pattern information stored in an address associated with the class code from the classification circuit 866 to send the so read out pattern information to the prediction tap extracting circuit 864.

With the pixel of the pixel block of interest not as yet rendered the pixel of interest in the raster scanning sequence as the pixel of interest, the prediction tap extracting circuit 864 forms the same prediction taps as those formed by the prediction tap extraction circuit 841 of FIG. 80, using the pattern information of the 64 sets of the pattern information from the pattern table storage unit 870, corresponding to the pixel position mode of the pixels of interest, by extracting the quantized DCT coefficients as needed from the output of the quantization circuit 863. With the prediction taps for the pixels of interest as pupil data, the prediction tap extracting circuit 864 sends the pupil data to the normal equation summation circuit 867. The program then moves to step S437.

At step S437, the normal equation summation circuit 867 reads out the pixels of interest as teacher data from the blocking circuit 861, and executes the aforementioned summation on the quantized DCT coefficients forming the prediction taps as pupil data and the pixels of interest as teacher data, in the matrix A of the equation (8) and the vector v. It should be noted that this summation is executed from one class corresponding to the class code from the classification circuit 866 to another and from one pixel position mode for the pixel of interest to another.

The program then moves to step S438 where the prediction tap extracting circuit 864 verifies whether or not the summation has been done on the totality of the pixels of the pixel block of interest as the pixels of interest. If it is found at step S438 that summation has not been done on the totality of the pixels of the pixel block of interest as the pixels of interest, the program reverts to step S436 where the prediction tap extracting circuit 864 renders the pixel of the pixel block of interest not as yet made into the pixel of interest in the raster scanning sequence a pixel of interest anew. Subsequently, a similar sequence of operations is repeated.

If it is found at step S438 that summation has been done on the totality of the pixels of the pixel block of interest as the pixels of interest, the program moves to step S439 where the blocking circuit 861 verifies whether or not the processing has been made with all of the pixel blocks obtained from the picture as teacher data as the pixel blocks of interest. If it is found at step S439 that processing has not been made with all of the pixel blocks obtained from the picture as teacher data as the pixel blocks of interest, the program reverts to step S434 where the pixel block of the pixel blocks formed by the blocking circuit 861 and which has as yet not been rendered the pixel block of interest is newly rendered a pixel block of interest. Subsequently, a similar sequence of operations is repeated.

If conversely it is found at step S439 that processing has been made with all of the pixel blocks obtained from the picture as teacher data as the pixel blocks of interest, that is if the normal equation is obtained for each pixel position mode for each class, the program then moves to step S440 where the tap coefficient decision circuit 868 solves the normal equation generated from one pixel position mode of each class to another to find the 64 sets of the tap coefficients associated with the 64 pixel position modes of each class to cause the tap coefficients thus found to be routed to and stored in the addresses associated with the respective classes of the coefficient table storage unit 869. The processing is then terminated.

Thus, the tap coefficients of the respective classes stored in the coefficient table storage unit 869 are stored in the coefficient table storage unit 844 of FIG. 80.

Thus, the tap coefficients stored in the coefficient table storage unit 844 have been found by learning so that the prediction errors (herein the square errors) of the predicted values of the original pixel values, obtained on linear prediction calculations, will be statistically minimum. The result is that, with the coefficient conversion circuit 832A of FIG. 80, a JPEG encoded picture can be decoded to a picture limitlessly proximate to the original picture.

Moreover, since the processing of decoding the JPEG encoded picture and the processing for improving the picture quality are carried out simultaneously, a decoded picture of high picture quality can be efficiently produced from the JPEG encoded picture.

Figure 86:
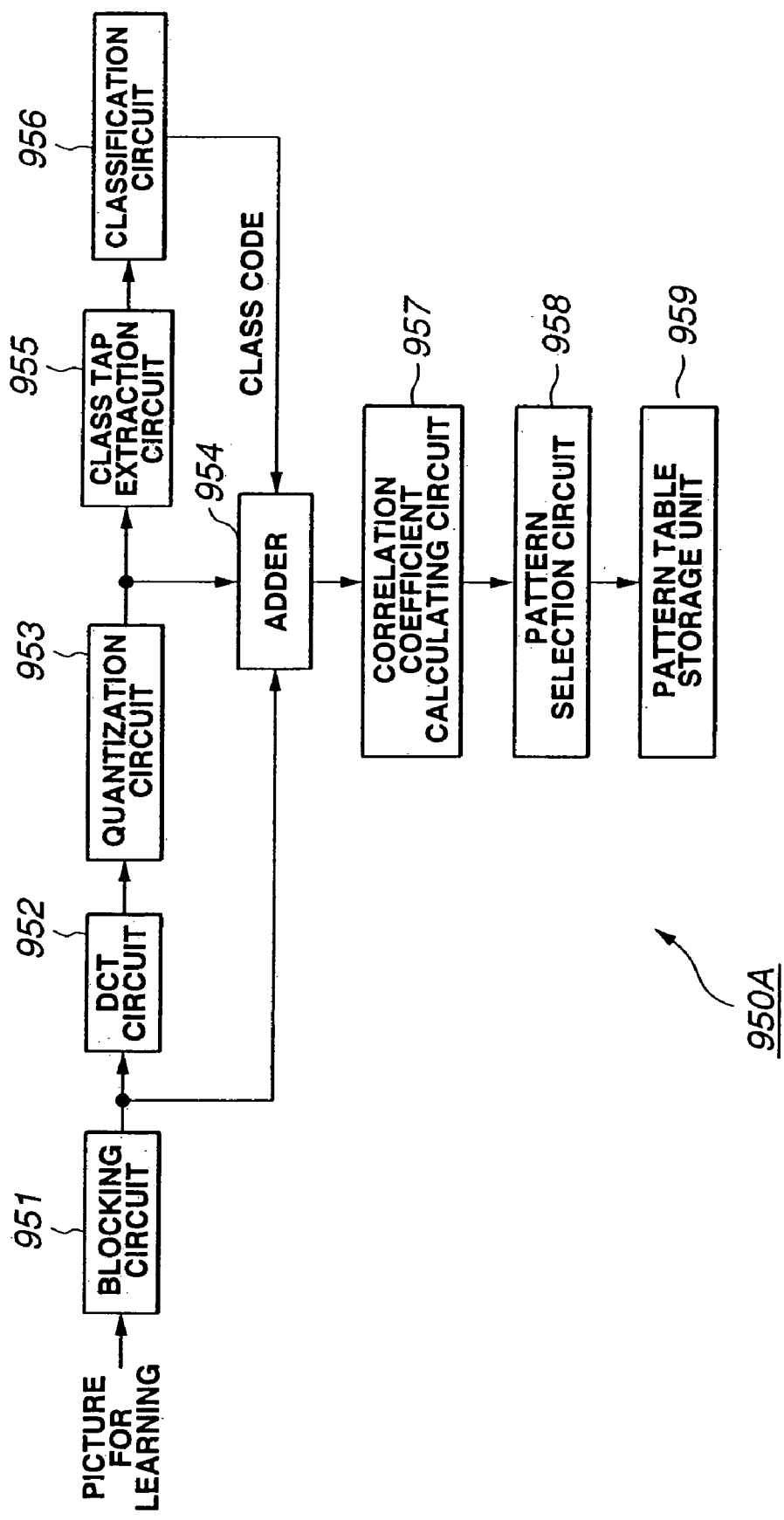
FIG. 86 is a block diagram showing an illustrative structure of a pattern learning device responsible for learning processing of the pattern information.

FIG. 86 shows an illustrative structure of a pattern learning device 950A responsible for the learning processing of the pattern information to be stored in the pattern table storage unit 846 of FIG. 80 and in the pattern table storage unit 870 of FIG. 84.

A blocking circuit 951 is fed with one or more picture of picture data for learning. As in the JPEG encoding, the blocking circuit 951 forms the picture for learning into a pixel block of 8×8 pixels, as in JPEG encoding. Meanwhile, the picture data for learning, supplied to the blocking circuit 951, may be the same as or different from the picture data for learning supplied to the blocking circuit 861 of the tap coefficient learning device 860A of FIG. 84.

The blocking circuit 951 of a DCT circuit 952 sequentially reads out pixel blocks formed by the blocking circuit 951 to apply DCT to the pixel blocks to form blocks of DCT coefficients. These blocks of DCT coefficients are sent to a quantization circuit 953.

The quantization circuit 953 quantizes the blocks of the DCT coefficients from the DCT circuit 952 in accordance with the same quantization table as that used in JPEG encoding. The blocks of the quantized DCT coefficients thus produced (DCT blocks) are sequentially sent to an summation circuit 954 and to a class tap extraction circuit 955.

With the pixel blocks, obtained in the blocking circuit 951, sequentially as the pixel blocks of interest, and with the pixels of the pixel blocks of interest not as yet rendered the pixels of interest in the raster scanning sequence, as the pixels of interest, the summation circuit 954 executes summation processing for finding correlation values (cross-correlation values) between the pixels of interest and the quantized DCT coefficients output by the quantization circuit 953.

Figure 87A:
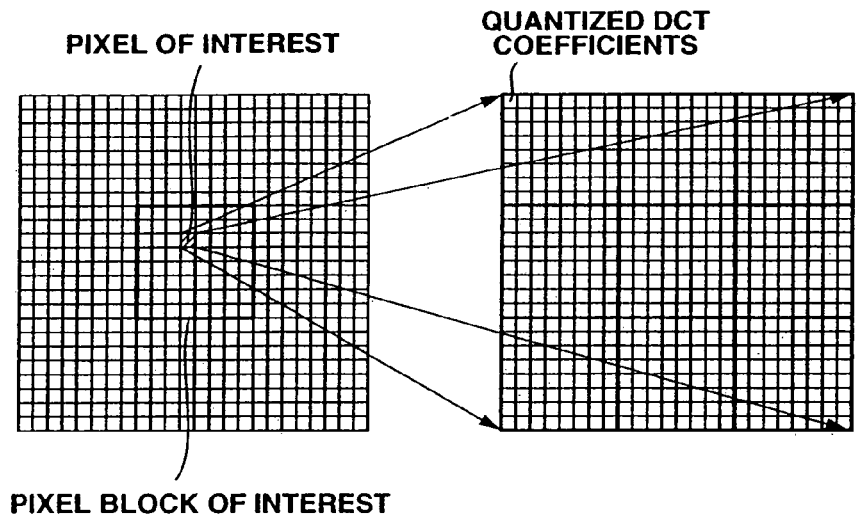
FIGS. 87A, 87B and 87C illustrate the processing by an adder circuit in the pattern learning device.
Figure 87B:
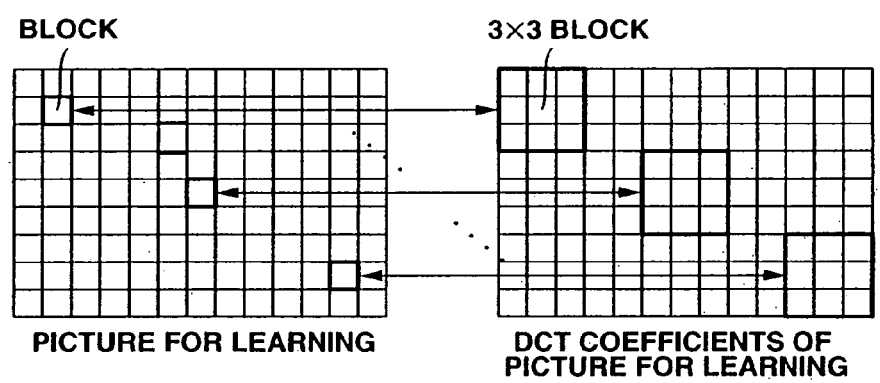
Figure 87C:
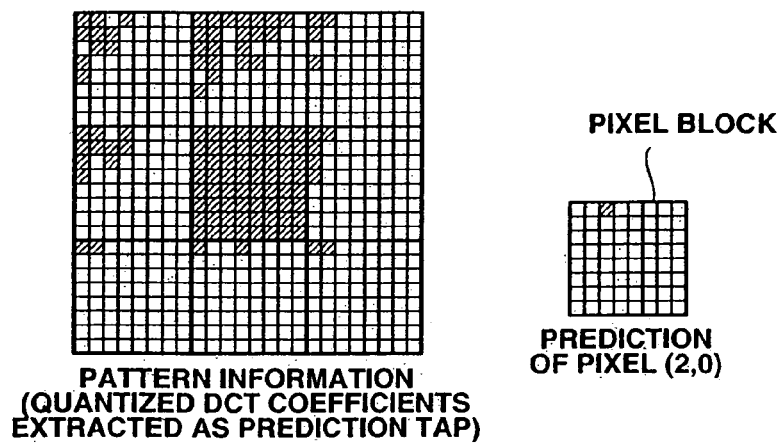

That is, in the learning processing for the pattern information, all of the quantized DCT coefficients of 3×3 DCT blocks, centered about a DCT block corresponding to a given pixel block of interest to which belongs a given pixel of interest, are associated with the pixel of interest, as shown in FIG. 87A. This operation is carried out for all of the pixel blocks obtained from the picture for learning, as shown in FIG. 87B, to calculate correlation values between respective pixels of a given pixel block and respective quantized DCT coefficients of 3×3 DCT blocks centered about a DCT block corresponding to the pixel block. Then, for each pixel of the pixel block, a position pattern of the quantized DCT coefficients exhibiting larger correlation values with respect to the pixel, as indicated by ■, is rendered the pattern information. That is, in FIG. 87C, a position pattern of the quantized DCT coefficients exhibiting larger correlation values with a pixel of the pixel block in a third column from left and in a first row from above, is represented by ■, this position pattern being the pattern information.

If a pixel in a number (x+1) column from left and in a number (y+1) row from above is represented by A(x,y) (in the present embodiment, x, y are integers of 0 to 7 (=8−1), and the quantized DCT coefficients of 3×3 DCT blocks, which are centered about the DCT block corresponding to the pixel block including the pixel, and which lie in the number (s+1) column from left in the number t+1 row from above, are denoted by B(s,t) (s and t in the present embodiment being integers of 0 to 23 (=8×3−1)), the cross-correlation values $R_{A(x,y)B(s,t)}$ of the pixel A(x,y) with respect to the quantized DCT coefficients B(s,t) in a preset position relationship with respect to the pixel A(x,y), is expressed by the following equation (10):

$$R_{A(x,y)B(s,t)} = \sum (A(x, y) - A'(x, y))(B(s, t) - B'(s, t))/ \quad (10)$$
$$\left(\sqrt{\left(\sum (A(x, y) - A'(x, y))^2\right)}\sqrt{\left(\sum (B(s, t) - B'(s, t))^2\right)}\right).$$

In the equation (10), as in the following equations (11) to (13), the summation (Σ) denotes the summation for all pixel blocks obtained from a picture for learning, A'(x,y) denotes an average value of pixel values at the position s(x,y) of the pixel block obtained from the picture in learning and B'(s,t) denotes an average value of the quantized DCT coefficients lying at the position (s,t) of 3×3 DCT blocks corresponding to a pixel block obtained from a picture for learning.

Thus, if the total number of the pixel blocks obtained from a picture for learning is denoted N, an average value A' (x,y) and an average value B'(s,t) may be represented by the following equation (11):

$$A'(x,y)=(\Sigma A(x,y))/N$$
$$B'(s,t)=(\Sigma B(s,t))/N \quad (11).$$

Substituting the equation (11) into the equation (10), the following equation $$R_{A(x,y)B(s,t)} = N\sum (A(x, y) - B(s, t)) - \quad (12)$$

-continued $$(\sum A(x, y))(\sum B(s, t))/(\sqrt{(N \sum A(x, y)^2 - (\sum A(x, y))^2)}$$
$$\sqrt{(N \sum B(s, t)^2 - (\sum B(s, t))^2)})$$

is derived.

For finding the correlation value $R_{A(x,y)B(s,t)}$ from the equation (12), the summation calculations of the following five terms:

$\Sigma A(x,y)$ summation calculations of the following five terms:

$\Sigma A(x,y)$ $\Sigma B(s,t)$ $\Sigma A(x,y)^2$ $\Sigma B(s,t)^2$ $\Sigma (A(x,y)B(s,t))$ (13)

need to be performed. So, the summation circuit 954 sums these five terms together.

Here, the class is not taken into consideration, for simplifying the explanation. In a pattern learning device 950A of FIG. 86, the summation circuit 954 undertakes the summation calculations for each of the class codes supplied from a classification circuit 956. Thus, in the above case, summation ($\Sigma$) denotes summation for all of the pixel blocks obtained from the picture for learning. However, if the class is taken into consideration, the summation ($\Sigma$) of the equation (13) denotes the summation of the pixel blocks obtained from the picture for learning and which belong to a given one of the classes.

Reverting to FIG. 86, when the result of the summation calculations of the equation (13) for calculating the correlation values of pixels at respective positions of a pixel block and the quantized DCT coefficients at respective positions of 3×3 DCT blocks centered about the DCT block corresponding to the pixel block is obtained for each class, the summation circuit 954 outputs the result of the summation calculations to a correlation coefficient calculating circuit 957.

The class tap extraction circuit 955 forms the same class taps as those formed by the class tap extraction circuit 842 of FIG. 80 by extracting the needed quantized DCT coefficients from the output of the quantization circuit 953. These class taps are supplied from the class tap extraction circuit 955 to the classification circuit 956.

The classification circuit 956 performs the same processing as that of the classification circuit 843 of FIG. 80, using the class taps from the class tap extraction circuit 955, to classify the pixel blocks of interest to send the resulting class codes to the summation circuit 954.

Using the output of the summation circuit 954, the correlation coefficient calculating circuit 957 calculates the correlation values between the pixels at the respective positions of the pixel block and the quantized DCT coefficients at the respective positions of 3×3 DCT blocks centered about the DCT block corresponding to the pixel block, from class to class, in accordance with the equation (12), and sends the resulting correlation value to a pattern selection circuit 958.

Based on the correlation values from the correlation coefficient calculating circuit 957, the pattern selection circuit 958 recognizes, from class to class, the positions of the DCT coefficients showing larger correlation values with respect to the respective 8×8 pixels at the respective positions of the pixel block. That is, the pattern selection circuit 958 recognizes, from class to class, the positions of the DCT coefficients having absolute correlative values with respect to the 8×8 pixels at the respective positions of the pixel blocks larger than a preset threshold value. Alternatively, the pattern selection circuit 958 recognizes, from class to class, the positions of the DCT coefficients having absolute correlative values with respect to the 8×8 pixels at the respective positions of the pixel blocks higher than a preset rank value. The pattern selection circuit 958 sends position patterns of 64 sets of the DCT coefficients, for each pixel position mode with respect to each of the 8×8 pixels, recognized from class to class, to a pattern table storage unit 959, as the pattern information.

If the pattern selection circuit 958 is designed to recognize the positions of the DCT coefficients having absolute correlative values with respect to pixels at the respective positions of the pixel block higher than a preset rank value, the number of the positions of the DCT coefficients thus recognized is of a fixed value corresponding to the preset rank value. On the other hand, if the positions of the DCT coefficients having absolute correlative values with respect to pixels at the respective positions of the pixel block not lower than a preset threshold value, the number of the positions of the DCT coefficients is of a variable value.

The pattern table storage unit 959 memorizes the pattern information output by the pattern selection circuit 958.

Figure 88:
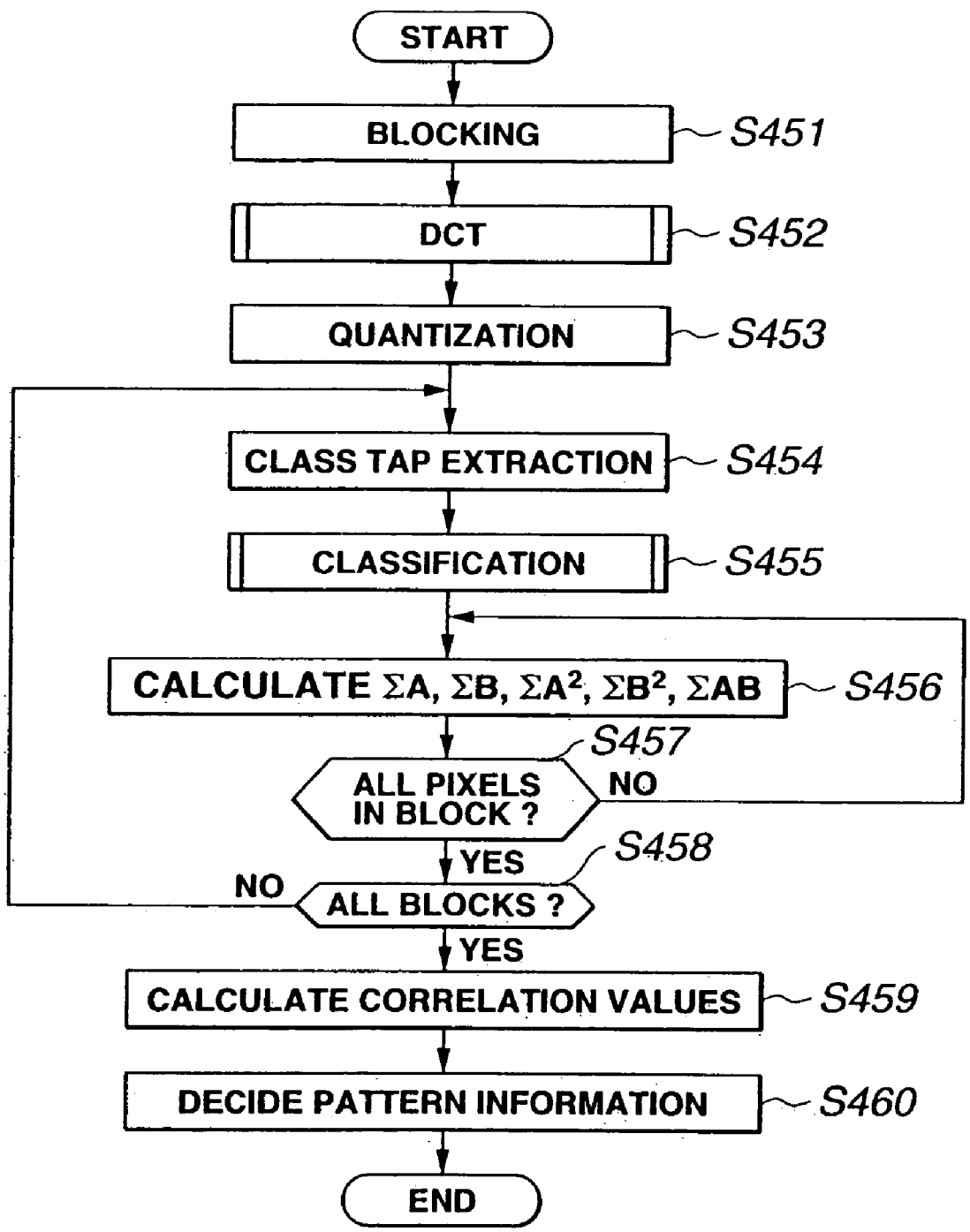
FIG. 88 is a flowchart for illustrating the processing by the pattern learning device.

Referring to the flowchart of FIG. 88, the processing by the pattern learning device 950A of FIG. 86 (learning processing) is explained.

The blocking circuit 951 is fed with picture data for learning. At step S451, the blocking circuit 861 forms the picture data for learning into a pixel block of 8×8 pixels, as in the case of the JPEG encoding. The program then moves to step S452, where the DCT circuit 952 sequentially reads out the pixel block formed by the blocking circuit 951 and applies DCT to the pixel block to form a block of DCT coefficients. The program then moves to step S453, where the quantization circuit 953 sequentially reads out the blocks of DCT coefficients acquired at the DCT circuit 952 and quantizes the DCT coefficients in accordance with the same quantization table as that used in JPEG encoding to form a block of the quantized DCT coefficients (DCT block).

The program then moves to step S454 where the summation circuit 954 renders the pixel block not as yet made into the pixel block of interest a pixel block of interest. At step S454, the class tap extraction circuit 955 extracts the quantized DCT coefficients, used for classifying the pixel blocks of interest, from the DCT block obtained at the quantization circuit 863 to form a class tap which is supplied to the classification circuit 956. In a manner explained with reference to the flowchart of FIG. 83, the classification circuit 956 classifies the pixel blocks of interest, using the class tap from the class tap extraction circuit 955, to send the resulting class codes to the summation circuit 954. The program then moves to step S456.

At step S456, the summation circuit 954 performs summation processing of the equation (13), using the picture for learning blocked by the blocking circuit 951 and the quantized DCT coefficients output by the quantization circuit 953, with the pixels of the pixel block of interest not as yet made into the pixel of interest, as pixels of interest, form one position of such pixel of interest (one pixel position mode) to another, and from one class code supplied from the classification circuit 956 to another. The program then moves to step S457.

At step S457, the summation circuit 954 verifies whether or not the summation calculations have been executed with all of pixels of the pixel blocks of interest as pixels of interest. If it is found at step S457 that summation has not been done on the totality of the pixels of the pixel blocks of interest as the pixels of interest, the program moves to step S456 where the summation circuit 954 renders the pixels of the pixel block of interest not as yet rendered the pixel of interest in the raster sequence a new pixel of interest. Subsequently, a similar sequence of operations is repeated.

If conversely it is found at step S457 that processing has been made with all of the pixel blocks obtained from the picture as teacher data as the pixel blocks of interest, the program moves to step S458 where the summation circuit 954 verifies whether or not processing has been done with all pixels of the pixel blocks of interest obtained from the picture for learning as the pixel blocks of interest. If it is found at step S458 that processing has not been done with all pixels of the pixel block of interest obtained from the picture for learning as the pixel blocks of interest, the program reverts to step S454 where a pixel block formed by the blocking circuit 951 and which has not been made into the pixel block of interest is made into a new pixel block of interest. Subsequently, a similar sequence of operations is repeated.

If conversely it is found at step S458 that processing has been made with all of the pixel blocks obtained from the picture for learning as pixel blocks of interest, the program moves to step S459 where the correlation coefficient calculating circuit 957 calculates the correlation values between the pixels at the respective positions of a given pixel block and quantized DCT coefficients at respective positions of 3×3 DCT blocks centered about the DCT block corresponding to the pixel block to send the calculated results to the pattern selection circuit 958.

Based on the correlation values from the correlation coefficient calculating circuit 957, the pattern selection circuit 958 at step S460 recognizes, from class to class, the positions of the DCT coefficients showing position relationships of larger correlation values with respect to the 8×8 pixels at the respective positions of the pixel block. The pattern selection circuit 958 routes position patterns of 64 sets of DCT coefficients for the respective ones of the 8×8 pixels at the respective positions of the pixel block, as recognized from class to class, as pattern information, to the pattern table storage unit 959, for storage therein. The processing then comes to a close.

As described above, the 64 sets of the class-based pattern information, stored in the pattern table storage unit 959, are stored in the pattern table storage unit 846 of FIG. 80 and in the pattern table storage unit 870 of FIG. 84.

Thus, in the coefficient conversion circuit 832A, shown in FIG. 80, the quantized DCT coefficients showing larger correlation values with respect to the pixels of interest are extracted as prediction taps, and the quantized DCT coefficients are decoded to the original pixel values, with the use of these prediction taps. Thus, the decoded picture may be improved in picture quality as compared to the case of random extraction of the quantized DCT coefficients used as prediction taps.

In JPEG encoding, DCT and quantization are executed in terms of a pixel block of 8×8 pixels as a unit, so that a DCT block is formed which is comprised of 8×8 quantized DCT coefficients. It may, therefore, be contemplated that, in decoding pixels of a given pixel block by classification adaptive processing, only the quantized DCT coefficients of the DCT block associated with the pixel block be used as class taps.

However, if attention is directed to a given pixel block in a given picture, it is customary that certain non-negligible correlation exists between the pixels of the pixel block in question and the pixels of the neighboring pixel blocks. Thus, by extracting quantized DCT coefficients, showing position relationships of higher correlation with respect to the pixels of interest, not only from the 3×3 DCT blocks centered about the DCT block associated with the given pixel block, that is DCT blocks associated with the DCT block in question, but also from the other DCT blocks, and by employing them as prediction taps, the decoded picture may be higher in picture quality than if only the quantized DCT coefficients of the DCT block corresponding to the pixel block are used as the class taps.

In view of the non-negligible correlation between the pixel of a given pixel block and the pixels of the neighboring pixel blocks, it is possible to improve the picture quality of a decoded picture by employing all of the quantized DCT coefficients of 3×3 DCT blocks centered about the DCT block corresponding to a given pixel block as prediction taps as compared to the case of employing only the quantized DCT coefficients of the DCT block corresponding to the pixel block.

However, if all of the quantized DCT coefficients of the 3×3 DCT blocks centered about the DCT block corresponding to a given pixel block are to be used as prediction taps, the number of the quantized DCT coefficients forming the prediction taps is 576 (=8×8×3×3), with the result that the number of times of the sum-of-products processing to be performed by the sum-of-products circuit 845 is increased.

Thus, if quantized DCT coefficients of the 576 quantized DCT coefficients showing position relationships of larger correlation with respect to the pixel of interest are extracted and used as prediction taps, it is possible to suppress the processing volume in the sum-of-products circuit 845 of FIG. 80 and yet to improve the picture quality of the decoded picture.

In the above case, the quantized DCT coefficients showing position relationships of larger correlation with respect to the pixel of interest are extracted as prediction taps. However, the quantized DCT coefficients used as prediction taps may also be extracted from the quantized DCT coefficients of e.g., 5×5 DCT blocks centered about the DCT block corresponding to the given pixel block. That is, there is no particular limitation to which range of the DCT blocks are to be extracted the quantized DCT coefficients used as prediction taps.

The quantized DCT coefficients of a given DCT block are obtained from the pixels of the corresponding pixel block, so that, in forming prediction taps for a pixel of interest, it may be thought to be desirable to use all quantized DCT coefficients of the DCT block associated with the pixel block of the pixel of interest.

So, the pattern selection circuit 958 may be designed to generate the pattern information in which the quantized DCT coefficients of the DCT block associated with the pixel block in question will necessarily be extracted as prediction taps. In this case, the pattern selection circuit 958 selects quantized DCT coefficients of higher correlation values from the eight DCT blocks neighboring to the DCT block associated with the pixel block in question, such that a pattern of the positions of these quantized DCT coefficients and a pattern of the positions of all quantized DCT coefficients of all of the DCT blocks associated with the pixel block, combined together, become the ultimate pattern information.

Figure 89:
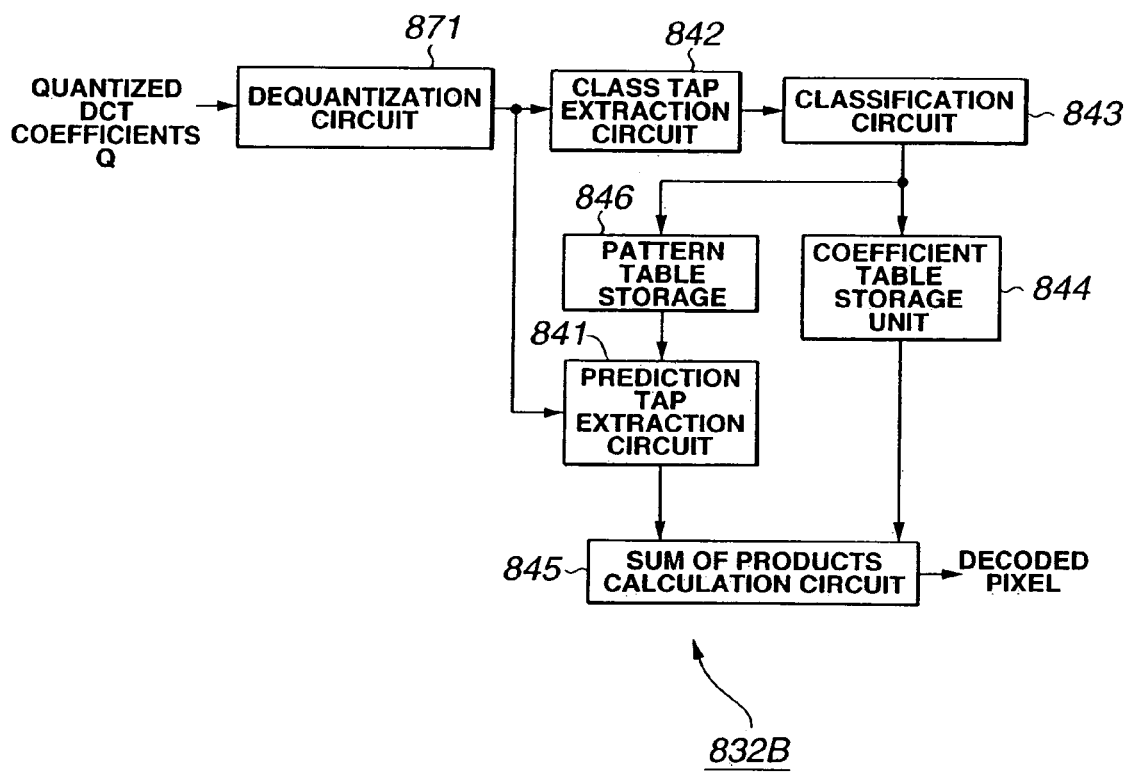
FIG. 89 is a block diagram showing an illustrative structure of the coefficient conversion circuit.

FIG. 89 shows a modification of the coefficient conversion circuit 832 shown in FIG. 78. In FIG. 89, the parts corresponding to the case of FIG. 80 are denoted by the same reference numerals and the corresponding explanation is omitted for simplicity. That is, the coefficient conversion circuit 832B shown in FIG. 89 is configured basically identically as the corresponding device shown in FIG. 80 except that there is newly provided a dequantization circuit 871.

In the coefficient conversion circuit 832B, shown in FIG. 89, the dequantization circuit 871 is fed with block-based quantized DCT coefficients obtained on entropy decoding the encoded data from the entropy decoding circuit 831 (FIG. 78).

Meanwhile, in the entropy decoding circuit 831, not only the quantized DCT coefficients but also the quantization table are obtained, as described above. In the coefficient conversion circuit 832B of FIG. 89, this quantization table is also fed from the entropy decoding circuit 831 to the dequantization circuit 871.

The dequantization circuit 871 dequantizes the quantized DCT coefficients from the entropy decoding circuit 831 in accordance with a quantization table from the entropy decoding circuit 831 to send the resulting DCT coefficients to the prediction tap extraction circuit 841 and to the class tap extraction circuit 842.

Thus, the prediction tap extraction circuit 841 and the class tap extraction circuit 842 form prediction and class taps, not only for the DCT coefficients but also for the DCT coefficients. Subsequently, the processing similar to that of FIG. 80 is performed for the DCT coefficients.

Since the coefficient conversion circuit 832B of FIG. 89 performs processing not only for the quantized DCT coefficients, but also for the DCT coefficients, the tap coefficients stored in the coefficient table storage unit 844 need to be different from those in FIG. 80.

Figure 90:
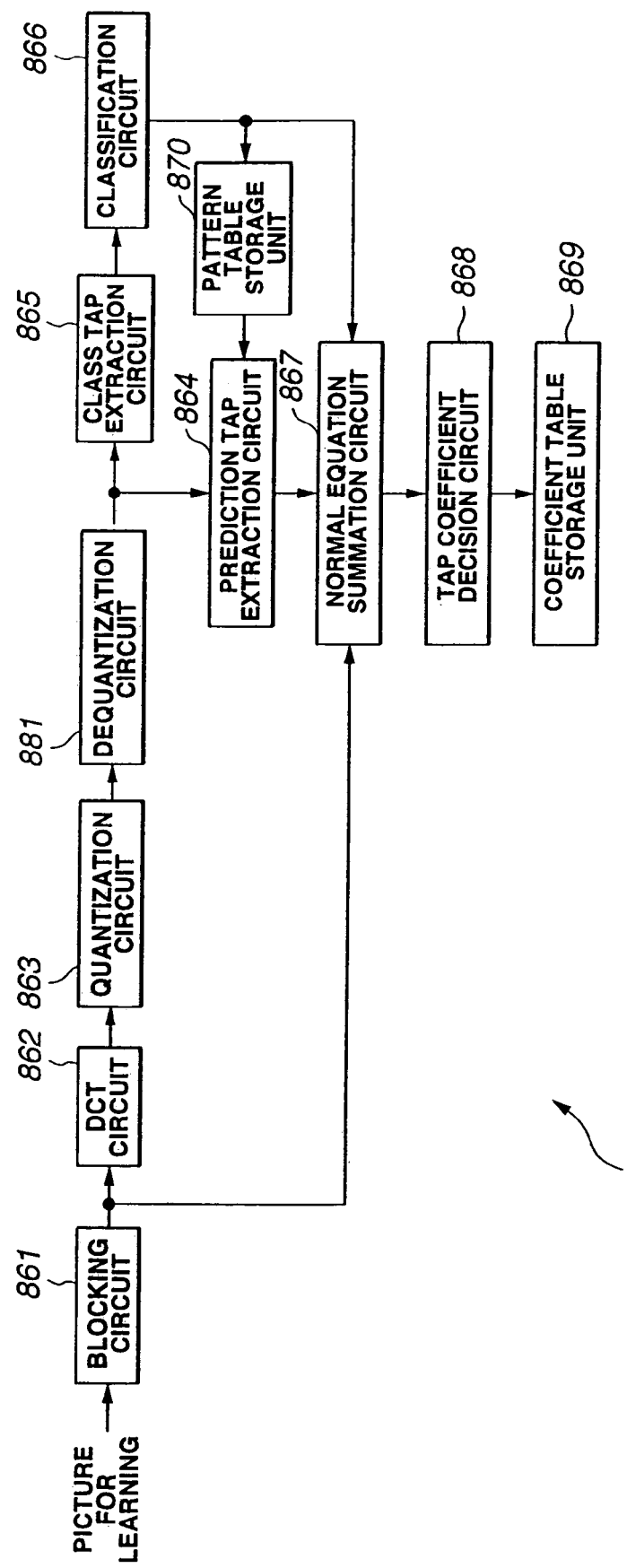
FIG. 90 is a block diagram showing another illustrative structure of the tap coefficient learning device.

Thus, FIG. 90 shows an illustrative structure of a tap coefficient learning device 860B responsible for the learning processing of the tap coefficients, stored in the coefficient table storage unit 844 of FIG. 89. Meanwhile, the parts or components corresponding to those shown in FIG. 90 are depicted by the same reference as those used in FIG. 84, and the corresponding explanation is omitted for clarity. That is, the tap coefficient learning device 860B shown in FIG. 90 is configured similarly to the device shown in FIG. 84 except that a dequantization circuit 881 is newly provided downstream of the quantization circuit 863.

The dequantization circuit 881 in the tap coefficient learning device 860B, shown in FIG. 90, dequantizes the quantized DCT coefficients, output by the quantization circuit 863, in the same way as the dequantization circuit 871 of FIG. 89, and sends the resulting DCT coefficients to the prediction tap extracting circuit 864 and to the class tap extraction circuit 865.

Thus, in the prediction tap extracting circuit 864 and in the class tap extraction circuit 865, the prediction and tap coefficients are formed not on the quantized DCT coefficients but on the DCT coefficients. Subsequently, processing is performed in the same way as in FIG. 84.

The result is that tap coefficients are produced in which the effect of the quantization error resulting from quantization and dequantization of DCT coefficients is diminished.

Figure 91:
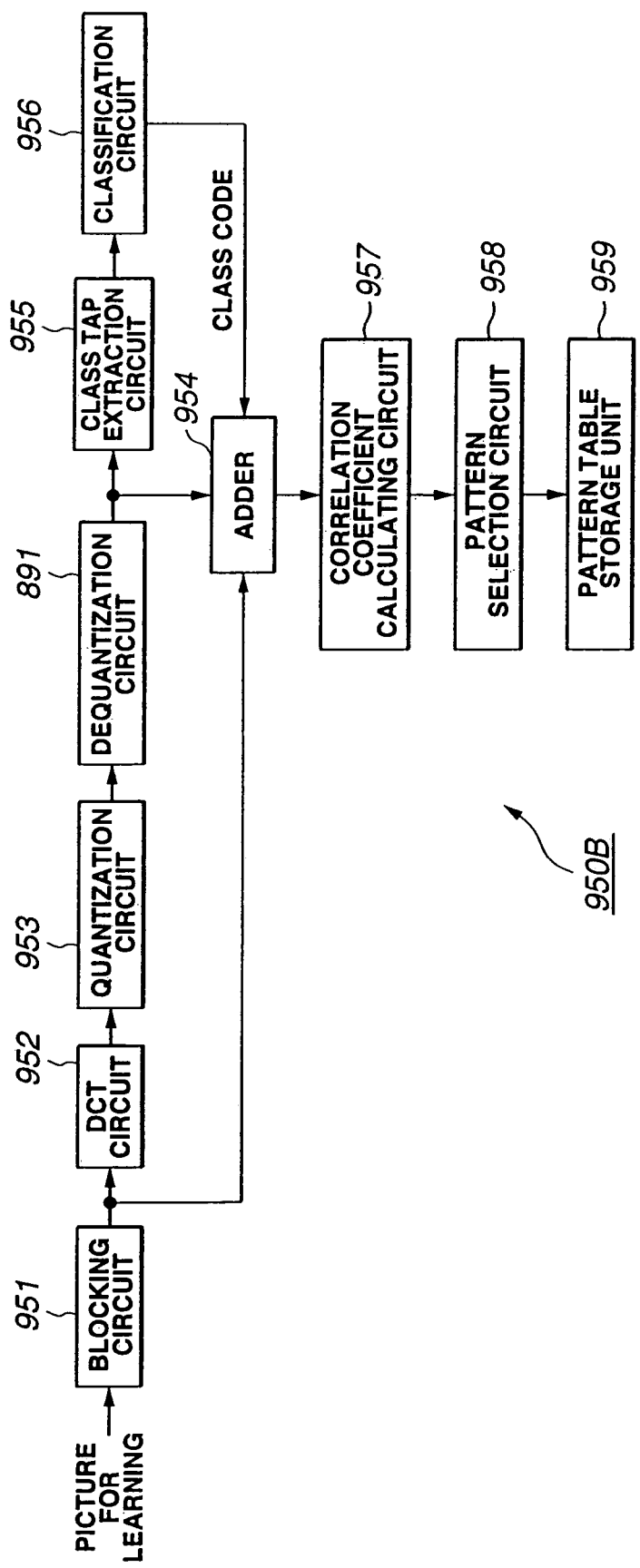
FIG. 91 is a block diagram showing another illustrative structure of the pattern learning device.

Thus, FIG. 91 shows an illustrative structure of a learning device 950B responsible for the learning processing of the pattern information stored in the pattern table storage unit 870 of FIG. 89. Meanwhile, the parts or components corresponding to those shown in FIG. 86 are depicted by the same reference numerals and the corresponding explanation is omitted for clarity. That is, the pattern learning device 950B shown in FIG. 91 is configured similarly to the device shown in FIG. 86 except that a dequantization circuit 891 is newly provided downstream of the quantization circuit 953.

In the pattern learning device 950B, the dequantization circuit 891 dequantizes the quantized DCT coefficients, output by the quantization circuit 953, in the same way as the dequantization circuit 871 of FIG. 89 or the dequantization circuit 881 of FIG. 90, and sends the resulting DCT coefficients to the summation circuit 954 and to the class tap extraction circuit 955.

So, the summation circuit 954 and the class tap extraction circuit 955 execute the processing not on the quantized DCT coefficients, but on the DCT coefficients. That is, the summation circuit 954 executes the summation calculations using the DCT coefficients output by the dequantization circuit 891 in place of the quantized DCT coefficients output by the quantization circuit 953 to form class taps. Similarly, the summation circuit 954 executes the summation calculations using the DCT coefficients output by the dequantization circuit 891 in place of the quantized DCT coefficients output by the quantization circuit 953 to form class taps. Subsequently the processing similar to that in FIG. 86 is performed to calculate the pattern information.

Figure 92:
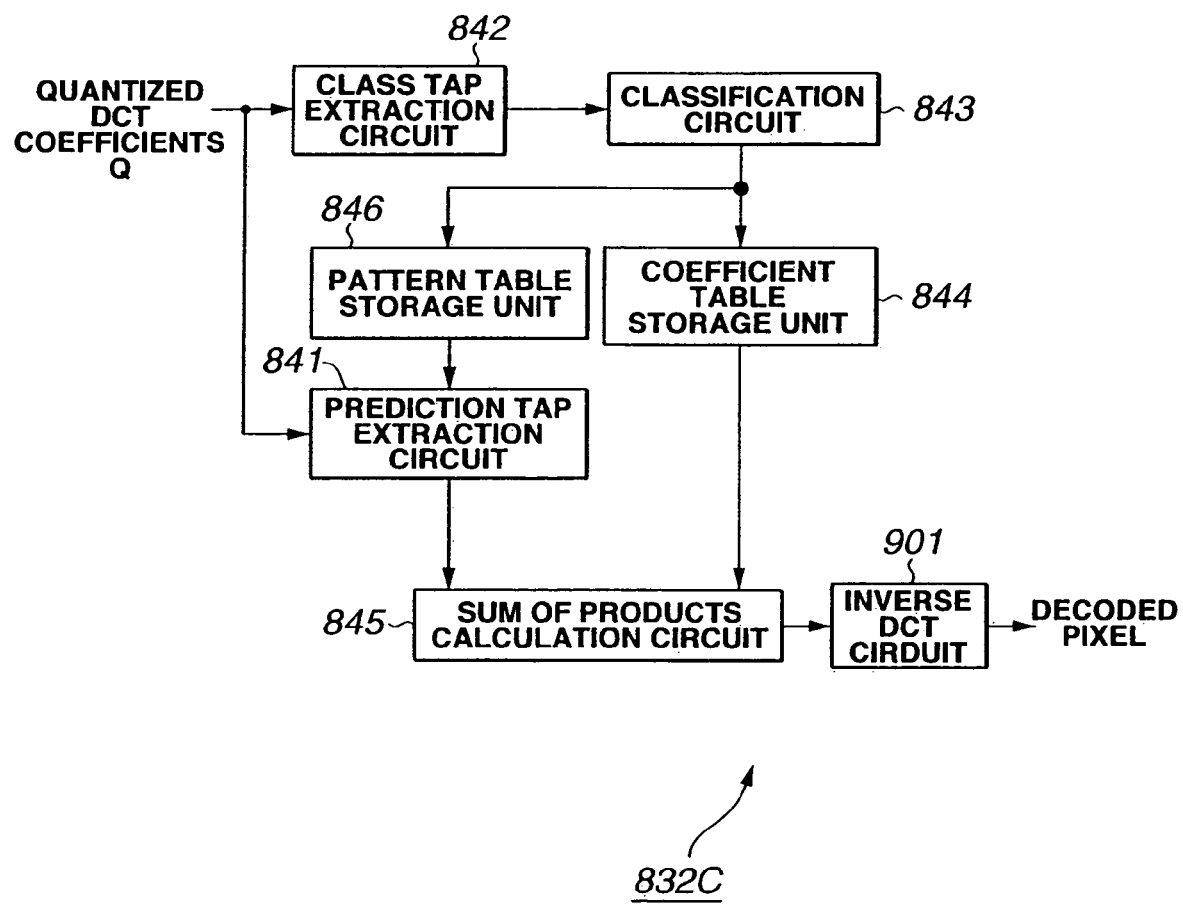
FIG. 92 is a block diagram showing another illustrative structure of the coefficient conversion circuit.

FIG. 92 shows an alternative structure of the coefficient conversion circuit 832 shown in FIG. 78. Meanwhile, the parts or components corresponding to those shown in FIG. 80 are depicted by the same reference numerals and the corresponding explanation is omitted for clarity. That is, the coefficient conversion circuit 832C shown in FIG. 91 is configured similarly to the device shown in FIG. 80 except that an inverse DCT circuit 901 is newly provided downstream of the sum-of-products circuit 845.

The inverse DCT circuit 901 applies inverse DCT to the output of the sum-of-products circuit 845 to decode the output into an output picture. Thus, in the coefficient conversion circuit 832C of FIG. 92, the sum-of-products circuit 845 executes sum-of-products processing, using the quantized DCT coefficients forming the prediction taps output by the prediction tap extraction circuit 841 and tap coefficients stored in the coefficient table storage unit 844, and outputs DCT coefficients.

Thus, in the coefficient conversion circuit 832C shown in FIG. 92, the quantized DCT coefficients are decoded into pixel values, not by quantized DCT coefficients being subjected to sum-of-products processing with the tap coefficients but by the quantized DCT coefficients being converted into DCT coefficients which are then inverse DCTed by the inverse DCT circuit 901. So, the tap coefficients stored in the coefficient table storage unit 844 need to be different from those in FIG. 80.

Figure 93:
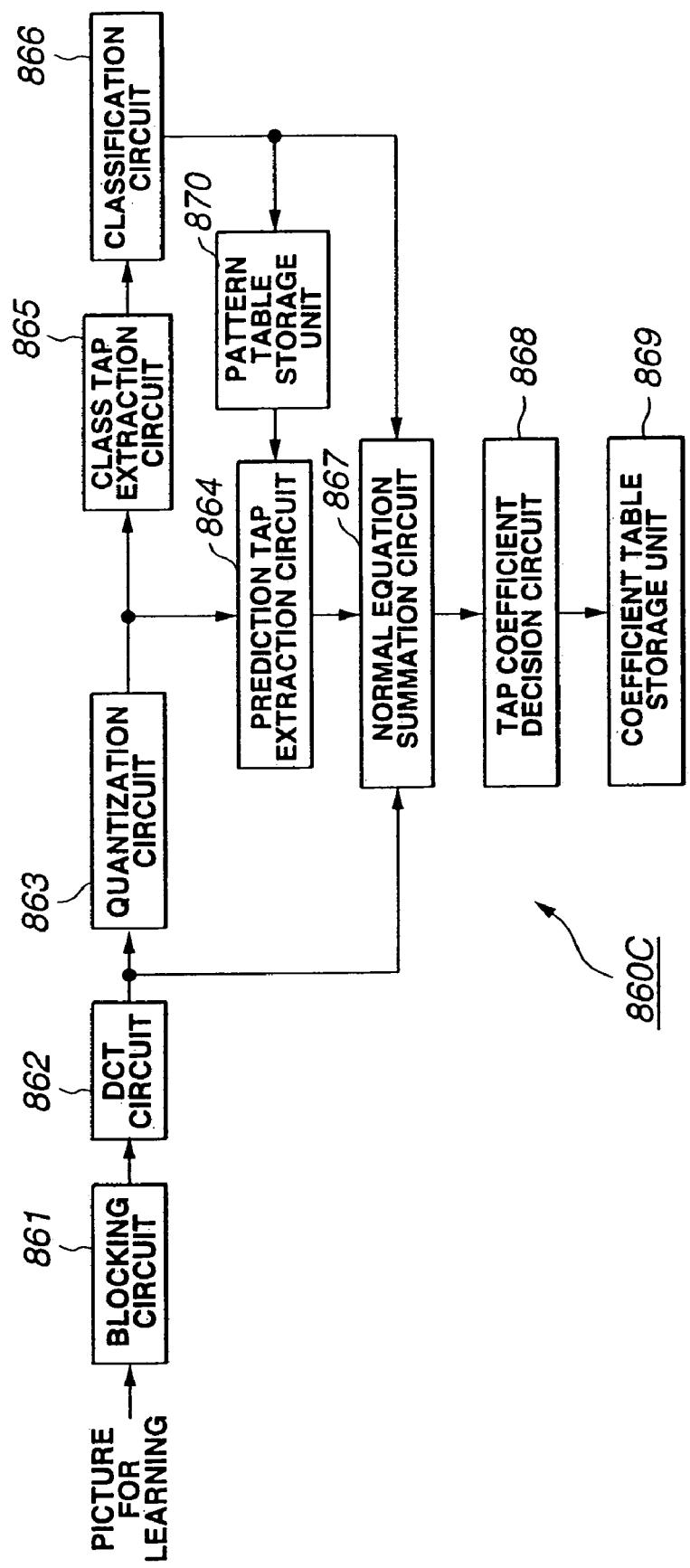
FIG. 93 is a block diagram showing still another illustrative structure of the tap coefficient learning device.

Thus, FIG. 93 shows an illustrative structure of a tap coefficient learning device 860C responsible for the learning processing of the tap coefficients, stored in the coefficient table storage unit 844 of FIG. 92. Meanwhile, the parts or components corresponding to those shown in FIG. 93 are depicted by the same reference numerals as those used in FIG. 84, and the corresponding explanation is omitted for clarity. That is, the tap coefficient learning device 860C shown in FIG. 93 is configured similarly to the device shown in FIG. 84 except that not the pixel values of a picture for learning but DCT coefficients from the DCT circuit 862, resulting from DCTing the picture for learning, are sent as teacher data to the normal equation summation circuit 867.

Thus, the normal equation summation circuit 667 in the tap coefficient learning device 860C, shown in FIG. 93, executes the above summation for the DCT coefficients output by the DCT circuit 862 as teacher data and for the quantized DCT coefficients forming the prediction taps output by the coefficient table storage unit 844 as pupil data. The tap coefficient decision circuit 868 solves the normal equation obtained by such summation to find tap coefficients. The result is that, in the learning device 860C of FIG. 93, such tap coefficients for converting the quantized DCT coefficients into DCT coefficients, in which the quantization error ascribable to the quantization by the quantization circuit 863 is reduced or suppressed, may be found.

In the coefficient conversion circuit 832C of FIG. 92, in which the sum-of-products circuit 845 executes the sum of product processing, using the aforementioned tap coefficients, an output is the quantized DCT coefficients from the prediction tap extraction circuit 841 converted into DCT coefficients having the quantization error reduced. These DCT coefficients are inverse DCTed by the inverse DCT circuit 901 to produce a decoded picture in which the picture quality deterioration due to the quantization error is suppressed to a lower value.

Figure 94:
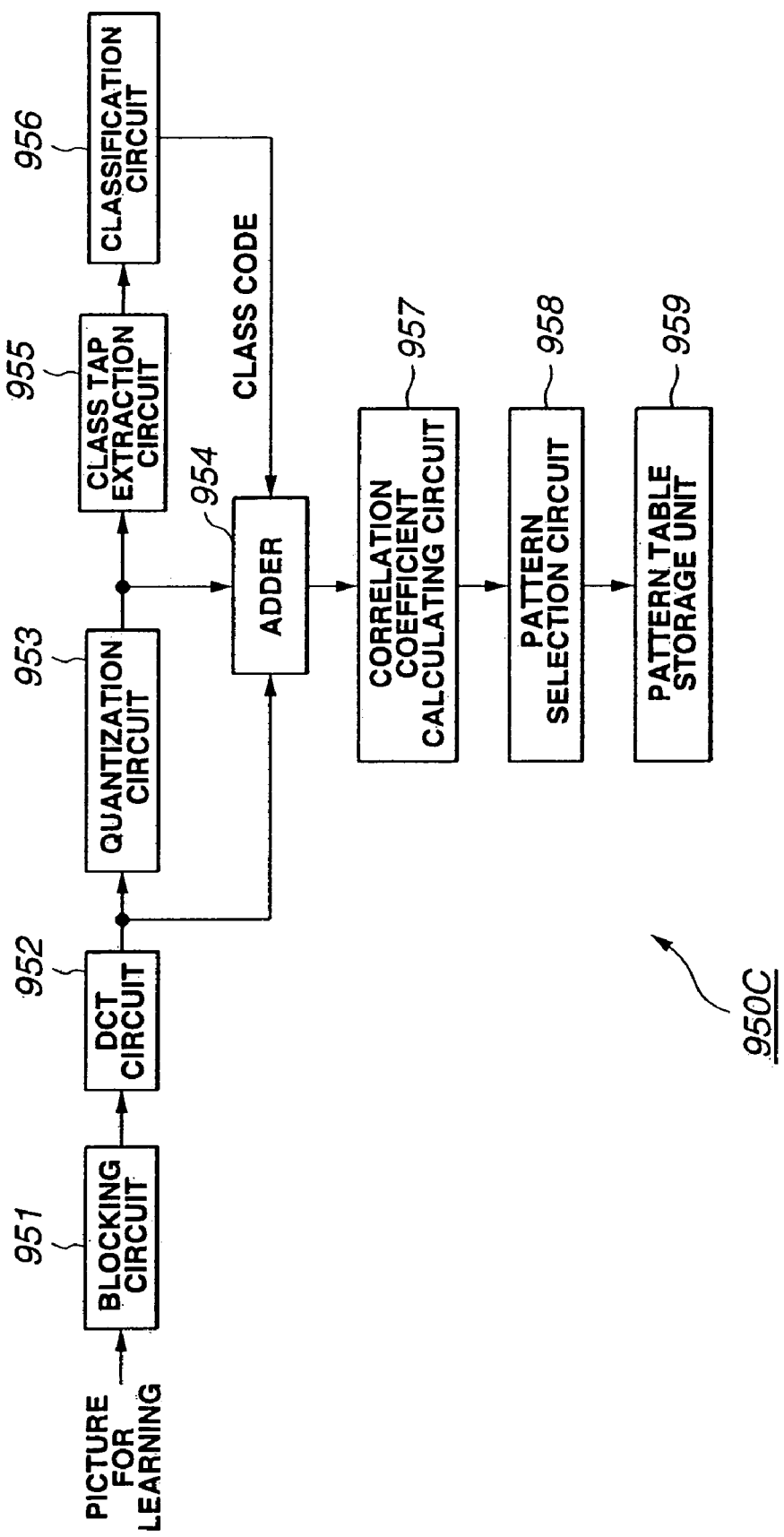
FIG. 94 is a block diagram showing another illustrative structure of the pattern learning device.

FIG. 94 shows an illustrative structure of a pattern learning device 950C responsible for learning processing of the pattern information stored in the pattern table storage unit 846 of FIG. 92 and in the pattern table storage unit 870 of FIG. 93. Meanwhile, the parts or components corresponding to those shown in FIG. 86 are depicted by the same reference numerals and the corresponding explanation is omitted for clarity. That is, the pattern learning device 950C shown in FIG. 94 is configured similarly to the device shown in FIG. 86 except that not the pixel of a picture for learning output by the blocking circuit 951 but DCT coefficients output by the DCT circuit 952 are sent to the summation circuit 954.

The pattern learning device 950A of FIG. 86 finds quantized DCT coefficients, showing position relationships of larger correlation with respect to a given pixel, by sum-of-products processing, employing quantized DCT coefficients and tap coefficients, forming the prediction taps, in order to decode the picture, and renders the position pattern of the quantized DCT coefficients the pattern information. In the pattern learning device 950C of FIG. 94, the quantized DCT coefficients showing a high correlation with respect to the DCT coefficients need to be found by sum-of-products processing employing the quantized DCT coefficients forming the prediction taps, and the tap coefficients, in order to produce DCT coefficients with a diminished quantization error, to find the position pattern of the quantized DCT coefficients as the pattern information.

Thus, in the pattern learning device 950C of FIG. 94, not the pixel block obtained in the blocking circuit 951, but the block of DCT coefficients obtained on DCTing the pixel block in the DCT circuit 952, are sequentially rendered pixel blocks of interest and, of the DCT coefficients of one such pixel block of interest, such DCT coefficients not as yet rendered the DCT coefficient of interest in the raster scanning sequence, is sequentially made into DCT coefficients of interest. The summation circuit 954 then performs summation calculations for each class code of the DCT coefficients of interest output by the classification circuit 956, for finding correlation values (cross-correlation values) between the DCT coefficients of interest and the quantized DCT coefficients output by the quantization circuit 953.

Figure 95A:
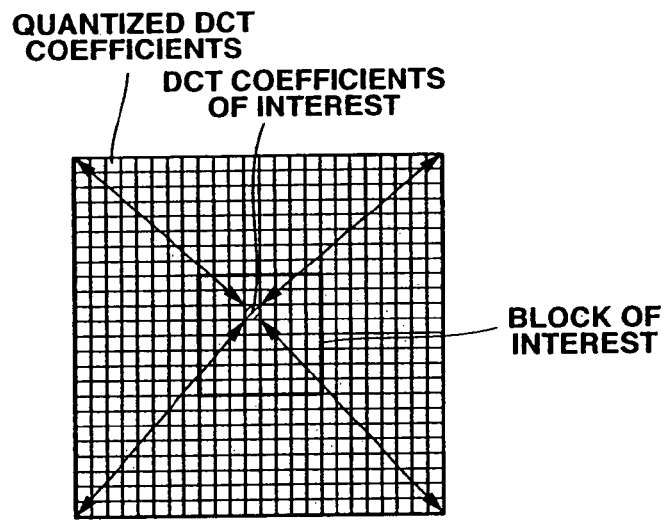
FIGS. 95A, 95B and 95C illustrate the processing of an adder circuit in the pattern learning device.
Figure 95B:
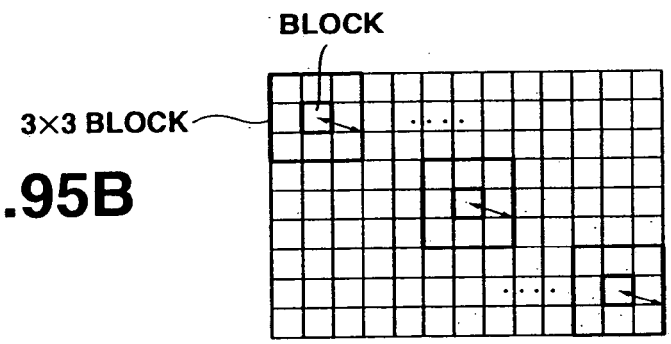
Figure 95C:
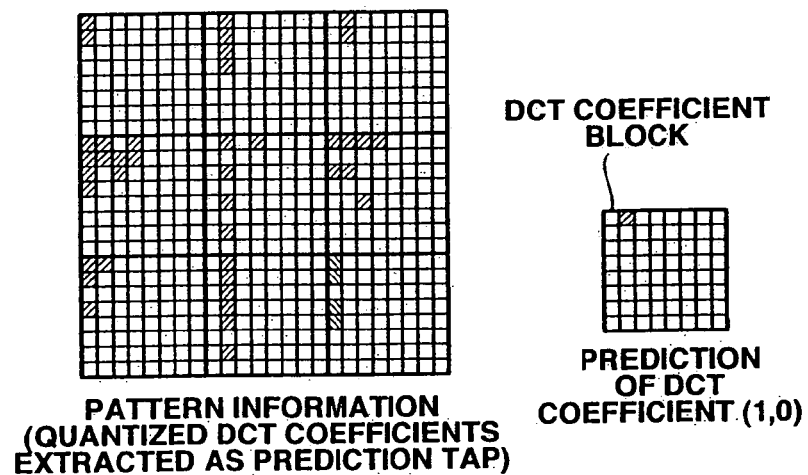

That is, in the learning processing by the pattern learning device 950C of FIG. 94, all of the quantized DCT coefficients of 3×3 DCT blocks, centered about a DCT block of quantized DCT coefficients corresponding to a block of interest including a given DCT coefficient of interest, are associated with the DCT coefficients of interest, as shown in FIG. 95A. This operation is carried out for all of the blocks of DCT coefficients obtained from the picture for learning, as shown in FIG. 95B, to calculate correlation values between DCT coefficients at respective positions of a given block of DCT coefficients and respective quantized DCT coefficients at respective positions of 3×3 DCT blocks centered about a DCT block corresponding to the block. Then, for each DCT coefficient of the block of the DCT coefficients, a position pattern of the quantized DCT coefficients exhibiting position relationships of larger correlation values with respect to the DCT coefficient, as indicated by ■, is rendered the pattern information. That is, in FIG. 95C, a position pattern of the quantized DCT coefficients showing position relationships of larger correlation with the DCT coefficient in a second column from left and in a first row from above of the block of DCT coefficients is represented by ■, this position pattern being the pattern information.

If a pixel in a number (x+1) column from left and in a number (y+1) row from above is represented by A(x,y), and the quantized DCT coefficients of 3×3 DCT blocks, centered about the DCT block corresponding to the block including the pixel, which quantized DCT coefficients each lie in the number (s+1) column from left in the number t+1 row from above, are denoted by B(s,t), the cross-correlation values $R_{A(x,y)B(s,t)}$ of the DCT coefficient A(x,y) with respect to the quantized DCT coefficients B(s,t) in a preset position relationship with respect to the DCT coefficient A(x,y) may be found as in the equations (10) to (13).

Reverting to FIG. 94, a correlative coefficient calculating circuit 957 uses the results of summation calculations performed by the summation circuit 954 to find the correlation values between the DCT coefficients and the quantized DCT coefficients. A pattern selection circuit 958 finds a position pattern of quantized DCT coefficients showing position relationships of enlarging the correlation value for use as pattern information.

FIG. 96 shows an alternative structure of the coefficient conversion circuit 832 shown in FIG. 78. Meanwhile, the parts or components corresponding to those shown in FIGS. 80, 89 or 92 are depicted by the same reference numerals and the corresponding explanation is omitted for clarity. That is, the coefficient conversion circuit 832D shown in FIG. 96 is configured similarly to the device shown in FIG. 80 except that an inverse DCT circuit 871 is newly provided as in FIG. 89 and that the inverse DCT circuit 901 is also provided as in FIG. 92.

Thus, in the prediction tap extraction circuit 841 and in the class tap extraction circuit 842, in the coefficient conversion circuit 832D shown in FIG. 96, the prediction and class taps are formed not on the quantized DCT coefficients but on the DCT coefficients. Moreover, in the coefficient conversion circuit 832D shown in FIG. 96, the sum-of-products circuit 845 performs sum-of-products processing, using the DCT coefficients forming the prediction taps output by the prediction tap extraction circuit 841 and tap coefficients stored in the coefficient table storage unit 844, to produce DCT coefficients having a reduced quantization error. These DCT coefficients are output to the inverse DCT circuit 901.

Figure 97:
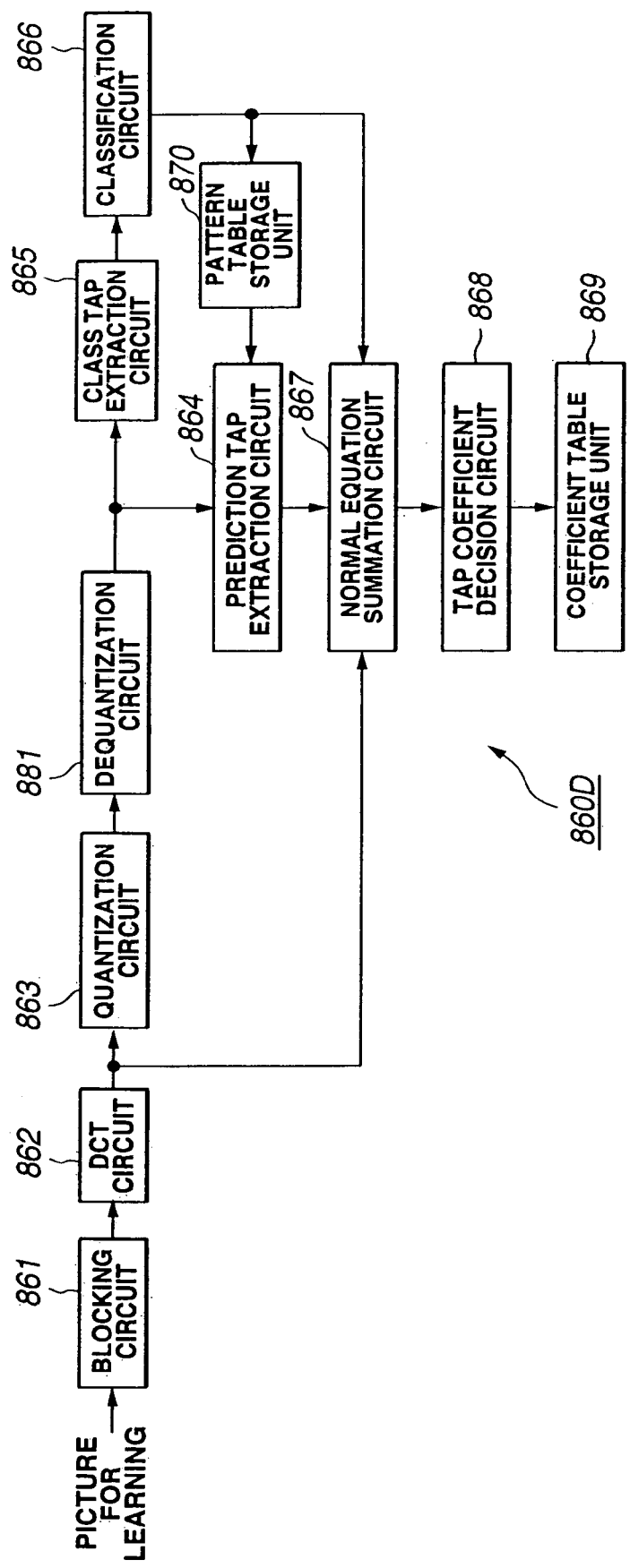
FIG. 97 is a block diagram showing another illustrative structure of the tap coefficient learning device.

Thus, FIG. 97 shows an illustrative structure of a tap coefficient learning device 860D responsible for learning processing of the tap coefficients, stored in the coefficient table storage unit 844 of FIG. 96. Meanwhile, the parts or components corresponding to those shown in FIG. 97 are depicted by the same reference as those used in FIGS. 84, 90 and 93, and the corresponding explanation is omitted for clarity. That is, the tap coefficient learning device 860D shown in FIG. 97 is configured similarly to the device shown in FIG. 84 except that a dequantization circuit 881 is newly provided as in FIG. 90 and that not the pixel values of a picture for learning but DCT coefficients from the DCT circuit 862, resulting from the DCTing of the picture for learning, are sent as teacher data to the normal equation summation circuit 867.

Thus, the normal equation summation circuit 867 in the tap coefficient learning device 860D, shown in FIG. 97, executes the above summation for the DCT coefficients output by the DCT circuit 862 as teacher data and for the quantized DCT coefficients (quantized and dequantized data) forming the prediction taps output by the coefficient table storage unit 844 as pupil data. The tap coefficient decision circuit 868 solves the normal equation obtained by such summation to find tap coefficients. The result is that, in the learning device 860D of FIG. 97, such tap coefficients for converting the quantized and dequantized DCT coefficients into DCT coefficients, in which the quantization error ascribable to the quantization and dequantization, is reduced or suppressed, may be found.

Figure 98:
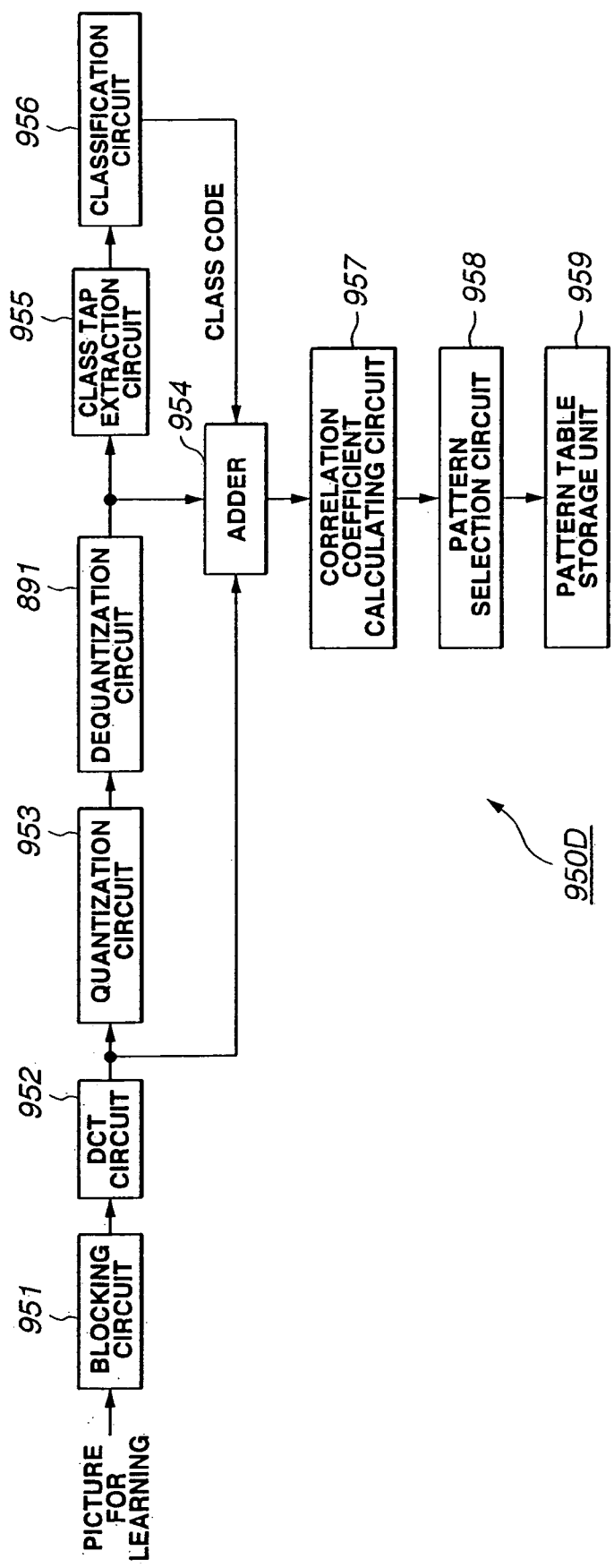
FIG. 98 is a block diagram showing another illustrative structure of the pattern learning device.

FIG. 98 shows an illustrative structure of a pattern learning device 950D responsible for learning processing of the pattern information stored in the pattern table storage unit 846 of FIG. 96 and in the pattern table storage unit 870 of FIG. 97. Meanwhile, the parts or components corresponding to those shown in FIGS. 86, 91 and 94 are depicted by the same reference numerals and the corresponding explanation is omitted for clarity. That is, the pattern learning device 950D shown in FIG. 98 is configured similarly to the device shown in FIG. 86, except that, as in FIG. 94, not the pixel of a picture for learning output by the blocking circuit 951 but DCT coefficients output by the DCT circuit 952 are sent to the summation circuit 954.

Thus, in the summation circuit 954 of the pattern learning device 950D of FIG. 98, not the pixel blocks obtained in the blocking circuit 951 but the blocks of DCT coefficients obtained on DCTing the pixel blocks in the DCT circuit 952, are sequentially made into blocks of interest, and the DCT coefficients of the pixels of interest not as yet made into the DCT coefficients of interest in the raster scanning sequence are made into DCT coefficients of interest. The summation circuit 954 then executed summation processing, from one class code of the DCT coefficients of interest output by the classification circuit 956 to another, in order to find a value of correlation (cross-correlation value) between the DCT coefficients of interest and the quantized and dequantized DCT coefficients output from the inverse quantization circuit 891. Using the result of the summation calculations, executed by the summation circuit 954, the correlation coefficient calculating circuit 957 finds correlation values between the DCT coefficients and the quantized and dequantized DCT coefficients. The pattern selection circuit 958 finds a position pattern of quantized and dequantized DCT coefficients showing the position relationships of enlarging the correlation value.

Figure 99:
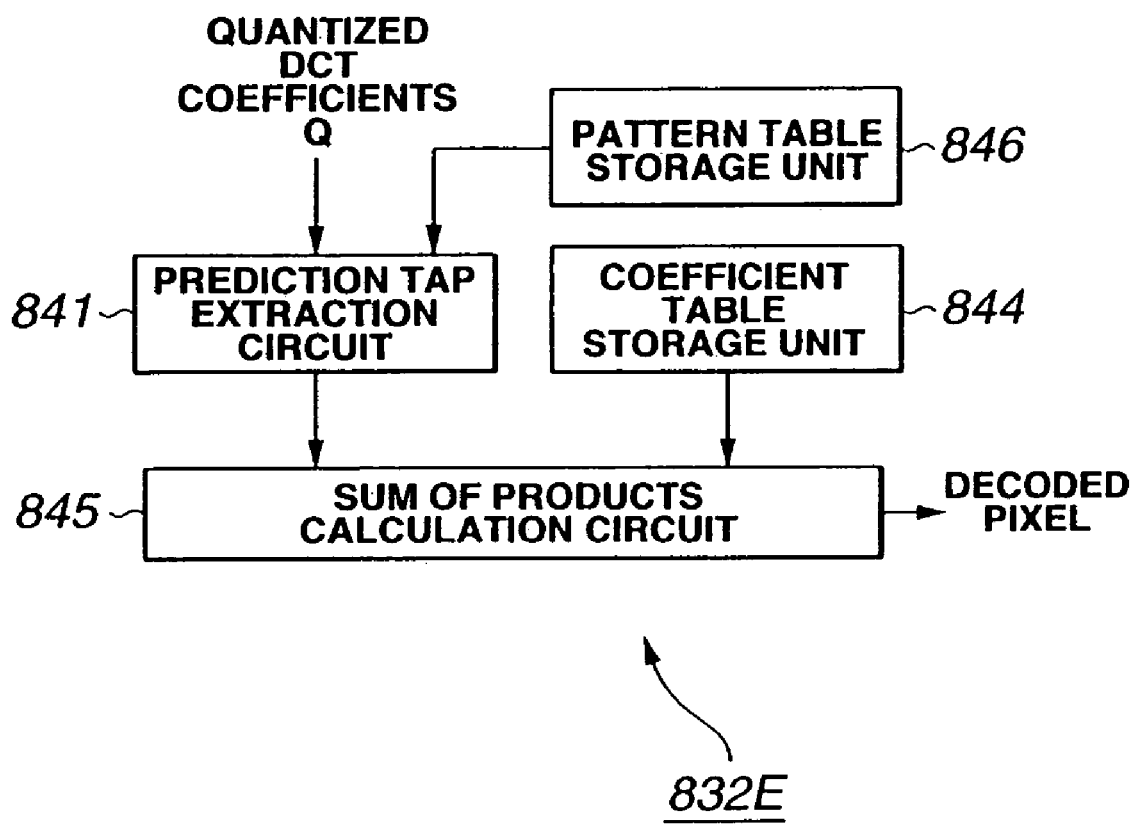
FIG. 99 is a block diagram showing another illustrative structure of the coefficient learning device.

FIG. 99 shows another illustrative structure of the coefficient conversion circuit 832 of FIG. 78. Meanwhile, parts or components of FIG. 99 corresponding to those shown in FIG. 80 are indicated by the same reference numerals and the corresponding explanation is sometimes omitted for clarity. That is, the coefficient conversion circuit 832E shown in FIG. 99 is basically configured similarly to the circuit shown in FIG. 80 except that the tap coefficient conversion circuit 832E shown in FIG. 99 is destitute of the class tap extraction circuit 842 or the classification circuit 843.

So, the coefficient conversion circuit 832E shown in FIG. 99 lacks in the concept of the class, which may be said to be equivalent to the number of the classes being one. Thus, only one class of the tap coefficients is stored in the coefficient table storage unit 844 such that processing is executed using this one class of the tap coefficients.

That is, in the coefficient conversion circuit 832E of FIG. 99, the tap coefficients memorized in the coefficient table storage unit 844 differ from those shown in FIG. 80.

Figure 100:
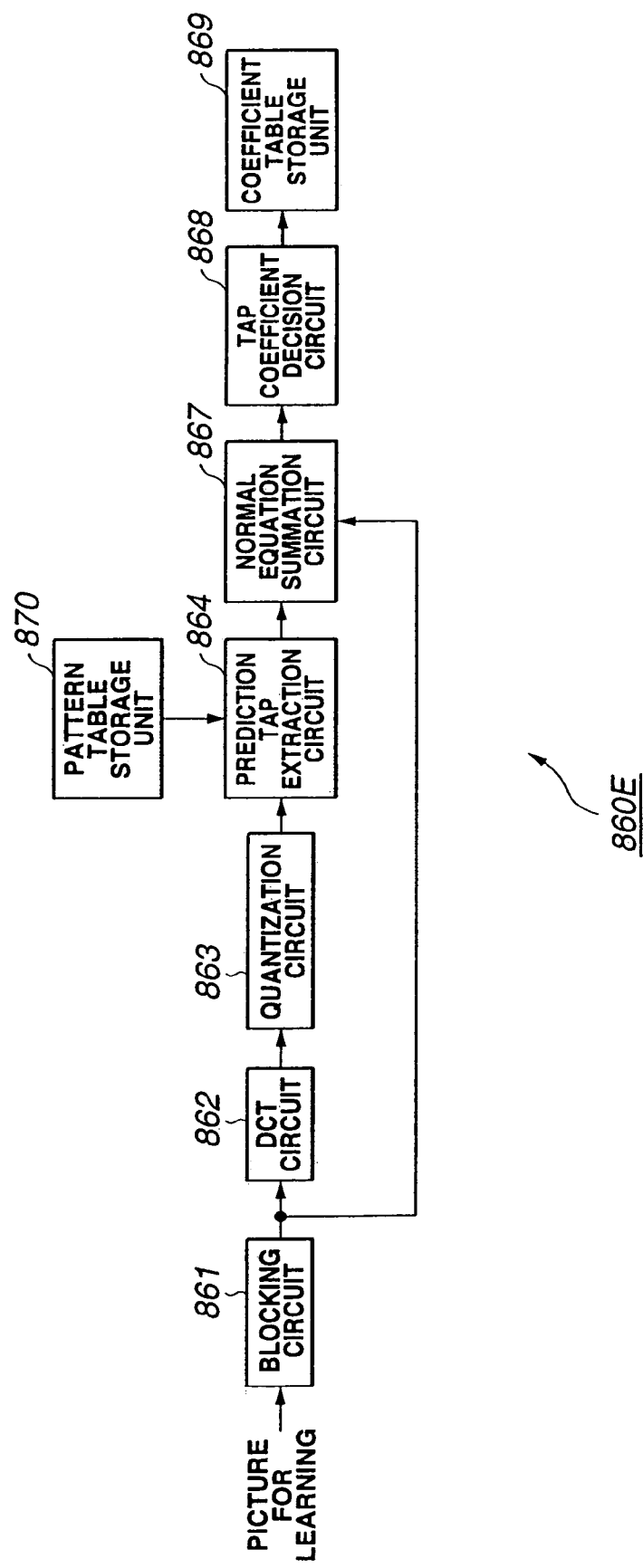
FIG. 100 is a block diagram showing still another illustrative structure of the tap coefficient learning device.

FIG. 100 shows an illustrative structure of the learning device 860E for executing the processing of learning the tap coefficients to be stored in the coefficient table storage unit 844 of FIG. 99. Meanwhile, the parts or components of FIG. 100 corresponding to those shown in FIG. 84 are indicated by the same reference numerals and the corresponding explanation is sometimes omitted for clarity. That is, the tap coefficient conversion circuit 860E shown in FIG. 100 is basically configured similarly to the circuit shown in FIG. 84 except that the tap coefficient conversion circuit 860E shown in FIG. 100 is destitute of the class tap extraction circuit 865 or the classification circuit 866.

Thus, in the tap coefficient learning device 860E of FIG. 100, the above-described summation is carried out without dependency on the class in the normal equation summation circuit 267 from one pixel position mode to another. The tap coefficient decision circuit 868 solves the normal equations generated from one pixel position mode to another to find the tap coefficients.

So, the coefficient conversion circuit 832E shown in FIG. 99 has only one class so that only one class of the pattern information is stored in the pattern table storage unit 846 of FIG. 99 or in the pattern table storage unit 870 of FIG. 100.

Figure 101:
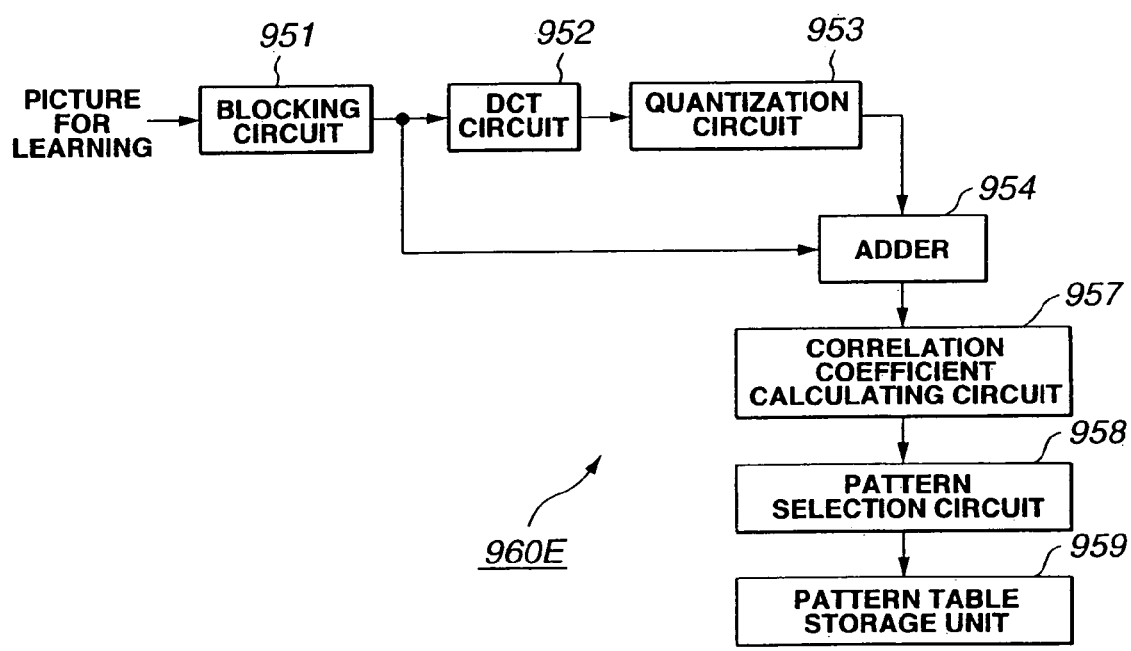
FIG. 101 is a block diagram showing still another illustrative structure of the pattern learning device.

FIG. 101 shows an illustrative structure of a pattern learning device 960E for executing the processing of learning the pattern information to be stored in the pattern table storage unit 846 of FIG. 99 and in the pattern table storage unit 870 of FIG. 100. Meanwhile, the parts or components of FIG. 101 corresponding to those shown in FIG. 86 are indicated by the same reference numerals and the corresponding explanation is sometimes omitted for clarity. That is, the pattern learning device 960E shown in FIG. 101 is basically configured similarly to the circuit shown in FIG. 86 except that it is destitute of the class tap extraction circuit 955 or the classification circuit 956.

Thus, in the pattern learning device 960E of FIG. 101, the above-described summation is carried out without dependency on the class in the summation circuit 954 from one pixel position mode to another. The correlative coefficient calculating circuit 957 also finds the pattern information from one pixel position mode to another to find the pattern information based on the correlation value obtained in the correlative coefficient calculating circuit 957.

In the coefficient conversion circuit 832A of FIG. 80, the class-based pattern information is stored in the pattern table storage unit 846, and the prediction tap is formed using the pattern information of the class corresponding to the class code output by the classification circuit 843. Alternatively, the one-class pattern information obtained in the learning device 960E of FIG. 101 may be stored in the pattern table storage unit 846 to form a prediction tap, using the pattern information, without dependency on the class.

The above-described sequence of operations may be performed on a hardware or a software. In the latter case, the program forming the software is installed in e.g., a general-purpose computer.

Figure 102:
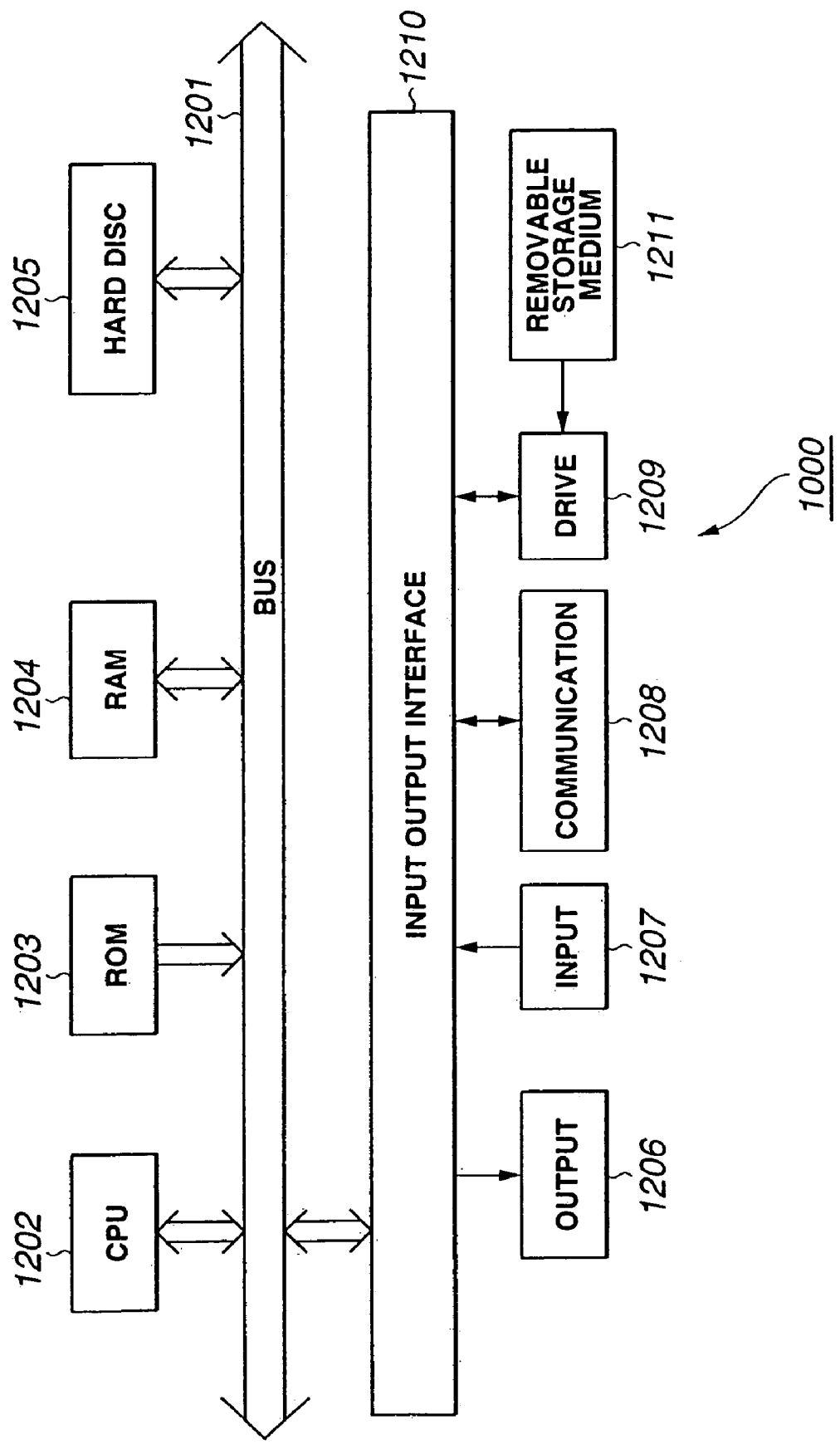
FIG. 102 is a block diagram showing illustrative structure of a embodiment of a computer embodying the present invention.

FIG. 102 shows an illustrative structure of a computer on which is installed the program adapted for executing the above-described sequence of operations.

The program may be pre-recorded on a head disc 1205 or a ROM 1203, as a recording medium enclosed in a computer 1000.

Alternatively, the program may be transiently or permanently stored (recorded) in a removable recording medium 1211, such as a floppy disc, CD-ROM (Compact Disc Read Only Memory), MO (Magneto-Optical) disc, a DVD (Digital Versatile Disc), a magnetic disc or on a semiconductor memory. This removable recording medium 1211 may be furnished as so-called package software.

Meanwhile, the program may not only be installed from the removable recording medium 1211 to the computer, but also may be transferred from a downloading site over an artificial satellite for digital satellite broadcast over a radio path to the computer, or transferred through a network, such as LAN (Local Area Network) or the Internet, over a cable to the computer, which then receives the program, thus transferred, in a communication unit 1208 to install the program in an enclosed hard disc 1205.

The computer 1000 has a built-in CPU (Central Processing Unit) 1202 to which is connected an input output interface over a bus 1201. If a command is input to the CPU 1202 through the input output interface 1210 by the user acting on an input unit 1207, such as keyboard, mouse or a microphone, the program stored in the ROM (Read Only Memory) 1203 is run. Alternatively, the CPU 1202 loads a program stored in the hard disc 1205, a program transferred from the satellite or network, received by the communication unit 1208 and installed on a hard disc 1205, or a program read out from the removable disc 1211 loaded on a drive 1209 and installed on the hard disc 1205, on the RAM (Random Access Memory) 1204, to execute the so loaded program. The processed results are output by the CPU 1202 through the input output interface 1210 via an output unit 1206 designed as an LCD (liquid crystal display) or a loudspeaker, transmitted from a communication unit 1208 or recorded on the hard disc 1205.

In the present specification, the processing steps stating the program designed for the computer to carry out a variety of processing operations are not necessarily processed chronologically in a sequence stated in the flowchart, but the processing also may include processing carried out in parallel or batch-wise, such as parallel processing or processing by an object.

The program may be processed by one computer or by a plural number of computers in a distributed fashion. The program may also be transferred to and executed by a remote computer.

The above-described respective embodiments are directed to picture data. The present invention may, however, be applied to e.g., speech data.

The above-described respective embodiments are directed to a picture JPEG encoded for compression encoding of a still picture. The present invention may, however, be applied to a picture encoded in accordance with MPEG for compression encoding a moving picture.

The above-described embodiments are directed to the decoding of the JPEG encoded data for DCT processing. The present invention may, however, be applied to decoding or conversion of data transformed from block to block, that is from one preset unit to another, by orthogonal transform or frequency transform. That is, the present invention may be applied to decoding sub-band encoded or Fourier-transformed data or to transforming the data into data lowered in e.g., quantization error.

In the above-described embodiments, tap coefficients used for decoding are pre-stored in the decoder 22. These tap coefficients may, however, be included in the encoded data and furnished to the decoder in this state. The same may be said of the pattern information.

Although decoding and transform are carried out by linear predictive calculations employing tap coefficients, the decoding or transform may also be carried out by higher order predictive calculations, such as order-two predictive calculations.

Although the predictive tap is comprised of quantized DCT coefficients of a DCT block corresponding to the pixel block of interest and a plural number of neighboring DCT blocks, cluster taps may also be formed in similar manner.

According to the present invention, as described above, converted data used in predictive calculations for decoding data of the data block of interest are extracted at least from the converted block corresponding to the data block other than the data block of interest, for use as prediction taps. Using the tap coefficients and the prediction taps, preset predictive calculations are carried out to decode the converted data into original data efficiently.

According to the present invention, teacher data as teacher are at least orthogonal or frequency transformed to form pupil data as pupils. Pupil data used for predictive calculations for decoding the teacher data of a teacher block of interest in a teacher block are extracted from a pupil block corresponding to the teacher block other than the teacher block of interest for use as prediction tap. Learning is carried out such as to statistically minimize the prediction errors of the predicted values of teacher data obtained on predictive calculations employing the tap and prediction coefficients. Using the tap coefficients, thus found, orthogonal or frequency transformed data can be decoded efficiently.

Moreover, according to the present invention, using first and second data for learning the extraction pattern, the correlation between the first data in the preset position relationships with respect to the second data at a preset position is found from one position relationship to another to set an extraction pattern of the first data to be used as prediction taps used for predictive calculations for the second data. Predictive calculations may be carried out using the first data extracted in accordance with the extraction pattern to convert e.g., the first data efficiently into the second data.

The invention claimed is:

1. A data processing apparatus for decoding converted data obtained at least on orthogonal or frequency transform and for learning tap coefficients used for predictive calculations for processing decoded results in a preset fashion, comprising:

quasi-teacher data generating means for processing teacher data as teacher, based on said preset processing, to produce quasi-teacher data;

pupil data generating means for generating pupil data as pupils on at least orthogonal or frequency transforming said quasi-teacher data; and learning means for effecting learning for statistically minimizing a prediction error of the predicted value of said teacher data obtained on predictive calculations employing said tap coefficients and the pupil data to find said tap coefficients.

2. The data processing apparatus according to claim 1 wherein said learning means effects learning so that the prediction error of the prediction value of said teacher data obtained on performing linear predictive calculations employing said tap coefficients and the pupil data will be statistically minimum.

3. The data processing apparatus according to claim 1 wherein said pupil data generating means generates said pupil data by orthogonal or frequency transforming and further quantizing said quasi-teacher data.

4. The data processing apparatus according to claim 1 wherein said learning means generates said pupil data by orthogonal or frequency transforming, quantizing and further dequantizing said quasi-teacher data.

5. The data processing apparatus according to claim 1 wherein said pupil data generating means generates said quasi-teacher data on at least discrete cosine transforming said quasi-teacher data.

6. The data processing apparatus according to claim 1 further comprising:
   prediction tap extracting means for extracting said pupil data used along with the tap coefficients for predicting the teacher data of interest in said teacher data and for outputting the extracted data as class taps;
   said learning means effecting learning so that a prediction error of the prediction value of said teacher data obtained on performing linear predictive calculations employing said prediction taps and the tap coefficients will be statistically minimum.

7. The data processing apparatus according to claim 6 comprising:
   class tap extraction means for extracting said pupil data used for assigning said teacher data of interest to one of a plurality of classes, by way of classification, and for outputting the extracted data as class taps; and
   classification means for finding the class of said teacher data of interest based on said class taps by way of classification;
   said learning means effecting learning for statistically minimizing a prediction error of the prediction value of said teacher data obtained on performing predictive calculations using said prediction taps and the tap coefficients corresponding to the class of said teacher data of interest to find the class-based tap coefficients.

8. The data processing apparatus according to claim 1 wherein said pupil data generating means at least orthogonal or frequency transforms said quasi-teacher data every preset unit to generate said pupil data.

9. The data processing apparatus according to claim 1 wherein said quasi-teacher data generating means generates said quasi-teacher data by processing said teacher data in a manner of deteriorating the data quality.

10. The data processing apparatus according to claim 1 wherein said teacher data is a moving picture or a still picture.

11. The data processing apparatus according to claim 10 wherein said quasi-teacher data generating means generates said quasi-teacher data by processing said picture data in a manner of deteriorating the picture quality.

12. The data processing apparatus according to claim 10 wherein said quasi-teacher data generating means generates said quasi-teacher data which is said picture data deteriorated in temporal or spatial resolution of said picture data.

* * * * *